US011156754B2

(12) United States Patent
Ito et al.

(10) Patent No.: US 11,156,754 B2
(45) Date of Patent: Oct. 26, 2021

(54) CURABLE COMPOSITION, LIGHT-SHIELDING FILM, COLOR FILTER, PATTERN FORMING METHOD, METHOD FOR MANUFACTURING COLOR FILTER, SOLID-STATE IMAGING ELEMENT, AND INFRARED SENSOR

(71) Applicant: FUJIFILM Corporation, Tokyo (JP)

(72) Inventors: Junichi Ito, Shizuoka (JP); Hideki Takakuwa, Shizuoka (JP); Daisuke Hamada, Shizuoka (JP); Yushi Kaneko, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 565 days.

(21) Appl. No.: 16/131,714

(22) Filed: Sep. 14, 2018

(65) Prior Publication Data

US 2019/0018174 A1    Jan. 17, 2019

Related U.S. Application Data

(63) Continuation of application No. PCT/JP2017/009166, filed on Mar. 8, 2017.

(30) Foreign Application Priority Data

Mar. 16, 2016 (JP) .............. JP2016-053054

(51) Int. Cl.
| | | |
|---|---|---|
| H01L 27/14 | (2006.01) | |
| G03F 7/004 | (2006.01) | |
| G02B 5/20 | (2006.01) | |
| G03F 7/038 | (2006.01) | |
| G03F 7/105 | (2006.01) | |
| H01L 31/0216 | (2014.01) | |
| G03F 7/033 | (2006.01) | |
| G02B 5/22 | (2006.01) | |
| G02B 5/00 | (2006.01) | |
| G03F 7/00 | (2006.01) | |
| H01L 27/146 | (2006.01) | |
| H01L 31/0232 | (2014.01) | |
| G03F 7/16 | (2006.01) | |

(Continued)

(52) U.S. Cl.
CPC .......... *G02B 5/208* (2013.01); *G02B 5/003* (2013.01); *G02B 5/20* (2013.01); *G02B 5/22* (2013.01); *G03F 7/0007* (2013.01); *G03F 7/033* (2013.01); *G03F 7/038* (2013.01); *G03F 7/105* (2013.01); *H01L 27/14* (2013.01); *H01L 27/14621* (2013.01); *H01L 27/14685* (2013.01); *H01L 31/02164* (2013.01); *H01L 31/02327* (2013.01); *G03F 7/16* (2013.01); *G03F 7/20* (2013.01); *G03F 7/30* (2013.01)

(58) Field of Classification Search
CPC ........ G03F 7/0007; G03F 7/027; G03F 7/028; G03F 7/031; G03F 7/004; G03F 7/033; G03F 7/038; G03F 7/105; G02B 5/003; G02B 5/22; G02B 5/223; G02B 5/208; G02F 1/133514; G02F 1/133516; H01L 27/14; H01L 27/14621; H01L 31/02164
See application file for complete search history.

(56) References Cited

U.S. PATENT DOCUMENTS

| | | | |
|---|---|---|---|
| 9,110,205 | B2 | 8/2015 | Kaneko |
| 2005/0254132 | A1* | 11/2005 | Ali .................... G03B 21/625 |
| | | | 359/619 |

(Continued)

FOREIGN PATENT DOCUMENTS

| | | |
|---|---|---|
| JP | 2009-244729 A | 10/2009 |
| JP | 2011-141512 A | 7/2011 |

(Continued)

OTHER PUBLICATIONS

Communication dated Mar. 24, 2020 from Japanese Patent Office in JP Application No. 2018-505846.
Office Action dated Sep. 10, 2019 issued in the corresponding Japanese patent Application No. 2018-505846.
Communication dated Apr. 29, 2020, from the Korean Intellectual Property Office in application No. 10-2018-7026517.
Communication dated Jan. 29, 2020, issued by the Korean Intellectual Property Office in Korean Application No. 10-2018-7026517.

(Continued)

*Primary Examiner* — John A McPherson
(74) *Attorney, Agent, or Firm* — Sughrue Mion, PLLC

(57) ABSTRACT

An object of the present invention is to provide a curable composition capable of forming a cured film having excellent linearity of a pattern, and a light-shielding film, a color filter, a solid-state imaging device, and an infrared sensor, each formed using the curable composition. Another object of the present invention is to provide a pattern forming method and a method for manufacturing a color filter, each using the curable composition.
The curable composition of the present invention is a curable composition containing a visible light-absorbing coloring agent, an infrared ray-absorbing coloring agent, a polymerizable compound, and a photopolymerization initiator,
  in which a minimum value in optical densities per 1 μm of a film thickness in a wavelength range of 380 to 1,100 nm of a coating film of the curable composition is 1 or more, and
the Δ optical density calculated by Formula (1) is 1 or less, Δ Optical density=|OD1−OD2|        Formula (1)

in Formula (1), OD1 represents a minimum value in optical densities per 1 μm of a film thickness in a wavelength range from 380 nm to 780 nm of the coating film, and OD2 represents a minimum value in optical densities per 1 μm of a film thickness in a wavelength range of more than 780 nm and 1,100 nm or less of the coating film.

16 Claims, No Drawings

(51) Int. Cl.
  *G03F 7/20*  (2006.01)
  *G03F 7/30*  (2006.01)

(56) References Cited

U.S. PATENT DOCUMENTS

| | | | |
|---|---|---|---|
| 2009/0236509 A1* | 9/2009 | Maruyama | G03F 7/031 |
| | | | 250/237 R |
| 2017/0010528 A1 | 1/2017 | Takishita et al. | |
| 2018/0057690 A1* | 3/2018 | Mori | G03F 7/26 |

FOREIGN PATENT DOCUMENTS

| | | |
|---|---|---|
| JP | 2011-209653 A | 10/2011 |
| JP | 2012-047948 A | 3/2012 |
| JP | 2012-203083 A | 10/2012 |
| JP | 2014-085396 A | 5/2014 |
| JP | 2016-210984 A | 12/2016 |
| KR | 10-2014-0147531 A | 12/2014 |
| WO | 2015/020076 A1 | 2/2015 |
| WO | 2015/166779 A1 | 11/2015 |

OTHER PUBLICATIONS

Communication dated Jun. 29, 2020 by the Taiwanese Patent Office in application No. 106108473.
Written Opinion of PCT/JP2017/009166 dated May 30, 2017.
International Preliminary Report on Patentability with English translation of the Written Opinion of PCT/JP2017/009166 dated Sep. 18, 2018.
International Search Report of PCT/JP2017/009166 dated May 30, 2017.

* cited by examiner

CURABLE COMPOSITION, LIGHT-SHIELDING FILM, COLOR FILTER, PATTERN FORMING METHOD, METHOD FOR MANUFACTURING COLOR FILTER, SOLID-STATE IMAGING ELEMENT, AND INFRARED SENSOR

CROSS-REFERENCE TO RELATED APPLICATIONS

This application is a Continuation of PCT International Application No. PCT/JP2017/009166 filed on Mar. 8, 2017, which claims priority under 35 U.S.C. § 119(a) to Japanese Patent Application No. 2016-053054 filed on Mar. 16, 2016. The above application is hereby expressly incorporated by reference, in its entirety, into the present application.

BACKGROUND OF THE INVENTION

1. Field of the Invention

The present invention relates to a curable composition, a light-shielding film, a color filter, a pattern forming method, a method for manufacturing a color filter, a solid-state imaging device, and an infrared sensor.

2. Description of the Related Art

A solid-state imaging device includes a taking lens, a solid-state imaging element such as a charge coupled device (CCD) and a complementary metal oxide film semiconductor (CMOS), disposed behind the taking lens, and a circuit board on which the solid-state imaging element is mounted. This solid-state imaging device is loaded in a digital camera, a mobile phone with a camera, a smartphone, or the like.

In the solid-state imaging device, generation of noises due to reflection of visible light may occur in some cases. Accordingly, in JP2009-244729A, it has been facilitated to inhibit noises from being generated by providing a predetermined light-shielding film in the solid-state imaging device. As a composition for forming a light-shielding film, a curable composition including a black pigment such as titanium black has been used.

SUMMARY OF THE INVENTION

The present inventors have produced a light-shielding film using the curable composition specifically disclosed in JP2009-244729A, and have conducted studies on the exposure and developability, and thus, have found that it is necessary to further improve the linearity of a pattern of a cured film formed. The present inventors have also found that in particular, in a case of performing exposure at a lower exposure dose, the linearity of a pattern of the cured film formed is noticeably deteriorated.

Taking the circumstances into consideration, the present invention has an object to provide a curable composition capable of forming a cured film having excellent linearity of a pattern.

Furthermore, the present invention also has an object to provide a light-shielding film, a color filter, a solid-state imaging device, and an infrared sensor, each formed using the curable composition.

In addition, the present invention also has an object to provide a pattern forming method and a method for manufacturing a color filter, each using the curable composition.

The present inventors have conducted extensive studies in order to accomplish the objects, and as a result, they have found that the objects can be accomplished by incorporating a visible light-absorbing coloring agent and an infrared ray-absorbing coloring agent into a curable composition to meet a specific optical density, thereby completing the present invention.

That is, the present inventors have found that the objects can be accomplished by the following configurations.

[1] A curable composition comprising:
a visible light-absorbing coloring agent;
an infrared ray-absorbing coloring agent;
a polymerizable compound; and
a photopolymerization initiator,
in which a minimum value in optical densities per 1 μm of a film thickness in a wavelength range of 380 to 1,100 nm of a coating film of the curable composition is 1 or more, and the Δ optical density calculated by Formula (1) is 1 or less, $$\Delta \text{ Optical density} = |OD1 - OD2| \quad \text{Formula (1)}$$

in Formula (1), OD1 represents a minimum value in optical densities per 1 μm of a film thickness in a wavelength range from 380 nm to 780 nm of the coating film, and OD2 represents a minimum value in optical densities per 1 μm of a film thickness in a wavelength range of more than 780 nm and 1,100 nm or less of the coating film.

[2] The curable composition as described in [1],
in which the average value of OD1 and OD2 is from 1 to 4.

[3] The curable composition as described in [1] or [2],
in which the infrared ray-absorbing coloring agent includes at least one selected from a pyrrolopyrrole-based compound, a phthalocyanine-based compound, a naphthalocyanine-based compound, a squarylium-based compound, a cyanine-based compound, a diimmonium-based compound, and a tungsten oxide-based compound.

[4] The curable composition as described in any one of [1] to [3],
in which the visible light-absorbing coloring agent includes at least one selected from titanium oxynitride, titanium nitride, carbon black, perylene black, Irgaphor Black, a red color-based organic pigment, a blue color-based organic pigment, a yellow color-based organic pigment, and a purple color-based organic pigment.

[5] The curable composition as described in any one of [1] to [4], further comprising an acrylic or methacrylic resin having an adsorptive group.

[6] The curable composition as described in any one of [1] to [5], further comprising an alkali-soluble resin.

[7] A curable composition comprising:
a visible light-absorbing coloring agent;
an infrared ray-absorbing coloring agent;
a polymerizable compound;
a photopolymerization initiator; and
an acrylic or methacrylic resin having an adsorptive group,
in which a content of the polymerizable compound with respect to the acrylic or methacrylic resin having an adsorptive group is 0.5 to 7 in terms of a mass ratio.

[8] The curable composition as described in [7],
in which the content of the photopolymerization initiator with respect to the acrylic or methacrylic resin having an adsorptive group is 0.1 to 2 in terms of a mass ratio.

[9] The curable composition as described in [7] or [8], further comprising an alkali-soluble resin.

[10] The curable composition as described in [9], in which a content of the alkali-soluble resin with respect to the acrylic or methacrylic resin having an adsorptive group is 5 or less in terms of a mass ratio.

[11] The curable composition as described in any one of [1] to [10], used for manufacturing a color filter.

[12] A light-shielding film formed by curing the curable composition as described in any one of [1] to [10].

[13] A color filter formed by curing the curable composition as described in any one of [1] to [10].

[14] A pattern forming method comprising:
a coating film forming step of forming a coating film on a substrate, using the curable composition as described in any one of [1] to [11];
an exposing step of patternwise exposing the coating film; and
a developing step of removing an unexposed area by development to form a cured film in a pattern shape,
in which a heating step is further provided after the exposing step or a heating treatment is further performed during the exposing step.

[15] A method for manufacturing a color filter, comprising the pattern forming method as described in [14].

[16] A solid-state imaging device comprising the color filter as described in [13].

[17] An infrared sensor comprising the color filter as described in [13].

According to the present invention, it is possible to provide a curable composition capable of forming a cured film having excellent linearity of a pattern.

Furthermore, according to the present invention, it is also possible to provide a light-shielding film, a color filter, a solid-state imaging device, and an infrared sensor, each formed using the curable composition.

In addition, the present invention can also provide a pattern forming method and a method for manufacturing a color filter, each using the curable composition.

DESCRIPTION OF THE PREFERRED EMBODIMENTS

Hereinafter, the present invention will be described in detail.

Description of configuration requirements described below may be made on the basis of representative embodiments of the present invention, but the present invention is not limited to such embodiments.

Furthermore, in the present specification, a numerical range expressed using "to" means a range that includes the preceding and succeeding numerical values of "to" as the lower limit value and the upper limit value, respectively.

In citations for a group (atomic group) in the present specification, in a case where the group (atomic group) is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "(meth)acrylate" represents acrylate and methacrylate, "(meth)acryl" represents acryl and methacryl, "(meth)acryloyl" represents acryloyl and methacryloyl, and "(meth)acrylamide" represents acrylamide and methacrylamide. Further, in the present specification, a "monomer" has the same definition as a "monomeric substance". The monomer in the present specification is distinguished from an oligomer and a polymer, and refers to a compound having a weight-average molecular weight of 2,000 or less. In the present specification, a polymerizable compound refers to a compound having a polymerizable group, and may be either a monomer or a polymer. The polymerizable group refers to a group that is involved in a polymerization reaction.

The curable composition of the present invention has a first embodiment and a second embodiment, which will be described later.

Hereinafter, the curable composition of the first embodiment of the present invention (hereinafter also referred to as a "first curable composition") will be first described.

[First Curable Composition]

The curable composition of the first embodiment of the present invention (hereinafter also referred to as a "first curable composition") is a curable composition containing:
a visible light-absorbing coloring agent (hereinafter also referred to as a "visible light-absorbing coloring agent"),
an infrared ray-absorbing coloring agent (hereinafter also referred to as an "infrared ray-absorbing coloring agent"),
a polymerizable compound, and
a photopolymerization initiator,
in which a minimum value in optical densities per 1 μm of a film thickness in a wavelength range of 380 to 1,100 nm of a coating film of the curable composition is 1 or more, and the Δ optical density calculated by Formula (1) is 1 or less, $$\Delta \text{ Optical density} = |OD1 - OD2| \qquad \text{Formula (1)}$$

in Formula (1), OD1 represents a minimum value in optical densities per 1 μm of a film thickness in a wavelength range from 380 nm to 780 nm of the coating film, and OD2 represents a minimum value in optical densities per 1 μm of a film thickness in a wavelength range of more than 780 nm and 1,100 nm or less of the coating film.

Furthermore, Formula (1) means an absolute value of a difference between OD1 and OD2.

The first curable composition can form a cured film having excellent linearity of a pattern even in a case of performing exposure at a lower exposure dose.

The reason therefore is not specifically clarified, but is presumed as follows by the present inventors.

First, the first curable composition includes a visible light-absorbing coloring agent and an infrared ray-absorbing coloring agent. In the present invention, the visible light-absorbing coloring agent means a compound having an absorption in a visible wavelength range, and the infrared ray-absorbing coloring agent means a compound having an absorption in an infrared wavelength range. Further, with regard to a coloring agent having an absorption in both of a visible light region and an infrared ray region, a visible light-absorbing coloring agent is used in a case where the wavelength showing a maximum absorption is in a range of 780 nm or less, and an infrared ray-absorbing coloring agent is used where the wavelength is in a range of 780 nm or less. Incidentally, the visible light region is intended to be a region at 400 to 780 nm, and an infrared ray region is intended to be a region of more than 780 nm to 1,100 nm. Further, the absorption wavelength of the visible light-absorbing coloring agent and the infrared ray-absorbing coloring agent can be measured using V-7200F (manufactured by JASCO Corporation).

Furthermore, "the minimum value in optical densities" in the present invention is a value calculated by the following method.

For instance, a method for measuring "a minimum value in optical densities per 1 μm of a film thickness in a wavelength range from 380 nm to 1,100 nm of the coating film of the first curable composition" will be described.

As a measurement sample, the first curable composition (concentration of solid content 30% by mass) was applied onto a transparent substrate (glass substrate), and a coating film formed such that the film thickness after drying became a predetermined film thickness (1 μm) was used.

Subsequently, with respect to the obtained coating film, a transmittance is measured using V-7200F (manufactured by JASCO Corporation), and this transmittance (% T) is converted by Formula B to calculate an optical density.

$$\text{Optical density(OD value)}=-\text{Log}(\% T/100) \quad \text{Formula B}$$

In addition, the minimum value in optical densities means a value of the lowest optical density in a wavelength range at a wavelength of 380 to 1,100 nm. In other words, it means an optical density at a wavelength with the highest transmittance (%).

Moreover, in the measurement of "the minimum value in optical densities per 1 μm of a film thickness in a wavelength range from 380 nm to 1,100 nm of the coating film of the first curable composition", a coating film formed from the above-mentioned first curable composition may be formed such that it has a film thickness (for example, 1.5 μm), in addition to 1 In this case, "the minimum value in optical densities per 1 μm of a film thickness in a wavelength range from 380 nm to 1,100 nm of the coating film of the first curable composition" is calculated by dividing the obtained measured value by the film thickness.

The first curable composition of the present invention includes a visible light-absorbing coloring agent and an infrared ray-absorbing coloring agent. That is, in Formula (1), OD1 is a minimum value in optical densities for an absorption by the visible light-absorbing coloring agent at a wavelength from 380 nm to 780 nm, and OD2 is a minimum value in optical densities for an adsorption by the infrared ray-absorbing coloring agent at a wavelength of more than 780 nm and 1,100 nm or less.

In a case where a coating film using the first curable composition is exposed and developed to form a pattern, the infrared ray-absorbing coloring agent is likely to absorb heat generated during the exposure (polymerization heat) and/or heat (infrared rays) caused by baking after the exposure. As a result, the photopolymerization initiator included in the coating film is likely to be cleaved to generate radicals, and the diffusion of the generated radicals is accelerated to make a good curing progress across a deep portion of a film.

That is, usually, upon exposure of the coating film at a low exposure dose, cleavage of the photopolymerization initiator does not proceed sufficiently and a small amount of radicals is generated in the exposed area. However, in the present invention, absorption of heat generated during exposure and heat by a heating treatment after the exposure by the infrared ray-absorbing coloring agent accelerates generation and diffusion of the above-mentioned radicals, which makes the curing in the exposed area further proceed, thereby obtaining a desired pattern.

Here, in a case where OD1-OD2 is more than 1, the light absorption by the infrared ray-absorbing coloring agent is relatively smaller than the light absorption of the visible light-absorbing coloring agent. In this case, the absorption of heat (infrared light) by the infrared ray-absorbing coloring agent cannot be sufficiently obtained, the curing of the coating film is insufficient, and the linearity of a pattern thus obtained is deteriorated. Further, since relatively a large amount of a visible light absorber is included, light (for example, i-rays) is hardly transmitted into the coating film, and also from this viewpoint, it is presumed that the linearity of a pattern is deteriorated.

On the other hand, in a case where OD1-OD2 is less than −1, the light absorption by the infrared ray-absorbing coloring agent is extremely increased. In the baking step after the exposure, heating is usually performed on the entire film. At this time, in a case where the light absorption by the infrared ray-absorbing coloring agent as above is extremely increased, cleavage of the photopolymerization initiator by the infrared ray-absorbing coloring agent in the unexposed area is easily generated to accelerate the curing, and therefore, the linearity of a pattern thus obtained is deteriorated.

Furthermore, from the viewpoint that the effect of the present invention is more excellent, in the first curable composition, it is preferable that the respective optical densities of the visible light-absorbing coloring agent and the infrared ray-absorbing coloring agent are approximated to each other, and it is more preferable that an average value ((OD1+OD2)/2) of OD1 and OD2 is from 1 to 4. By approximating OD1 and OD2 to each other, the content of the visible light-absorbing coloring agent and the infrared ray-absorbing coloring agent is not increased. In other words, the content of the other components (for example, a polymerizable compound and a development-accelerating component (for example, a dispersing resin)) included in the curable composition is not decreased and the energy generated upon the exposure can be efficiently converted to a curing-accelerating force of the film, and therefore, the linearity of a pattern is more excellent.

Moreover, an aspect of the case where the coating film is exposed at a low exposure dose has been described above, but the present invention is not limited to the aspect. For example, upon an exposure treatment that is performed together with a heating treatment, even in a case where the temperature for the heating treatment is a relatively low temperature (lower than 100° C.), the infrared ray-absorbing coloring agent in the first curable composition absorbs heat (infrared light) to accelerate the cleavage of the photopolymerization initiator, or the like, and therefore, a pattern having excellent linearity can be formed.

From the viewpoint of the light-shielding properties, the minimum value in optical densities per 1 μm of a film thickness in a wavelength range of 380 to 1,100 nm of a coating film in the first curable composition is 1 or more, and more preferably 2 or more. Further, the upper limit is preferably 4 or less.

In addition, from the viewpoint of further improving the light-shielding properties and the linearity, in Formula (1), OD1 is preferably in the range of 1 to 4, and more preferably 2 to 3.

Furthermore, OD2 is preferably in the range of 1 to 4, and more preferably 2 to 3.

The respective optical densities can be set to desired values by adjusting the contents and the types of various components contained in the curable composition.

Hereinafter, the respective components of the first curable composition of the present invention will be specifically described.

<Visible Light-Absorbing Coloring Agent>

The first curable composition contains a visible light-absorbing coloring agent.

In the present invention, the visible light-absorbing coloring agent means a compound having an absorption in a visible wavelength range (a wavelength of 400 to 780 nm). The wavelength exhibiting a maximum absorption of the visible light-absorbing coloring agent is preferably 780 nm or less, and more preferably 760 nm or less.

For the visible light-absorbing coloring agent, various known pigments and dyes can be used.

As the visible light-absorbing coloring dye, for example, in a case of using the visible light-absorbing coloring dye in the manufacture of a color filter, the coloring agents described in paragraphs 0027 to 0200 of JP2014-42375A can also be used, in addition to chromatic color-based dyes (chromatic dyes) such as red (R), green (G), and blue (B), which form color pixels of a color filter. Further, black color-based dyes (black dyes) which are generally used for forming a black matrix or for forming a light-shielding film system can be used.

Furthermore, as the visible light-absorbing coloring pigment, for example, in a case of using the visible light-absorbing coloring pigment in the manufacture of a color filter, chromatic color-based pigment such as (chromatic pigment) such as R (red), G (green), and B (blue), each of which forms a color pixel of a color filter, and a black color-based pigment (black pigment) which is generally used for forming a black matrix or a light-shielding film system can be used.

[Pigment]

(Chromatic Pigment)

As the chromatic color-based pigment, various inorganic pigments or organic pigments known in the related art can be used. Further, whether the pigments are inorganic or organic, taking into consideration the view that high transmittance is preferable, the pigments which are as fine as possible are preferably used, and taking handleability into consideration, the average primary particle diameter of the pigment is preferably 0.01 μm to 0.1 μm, and more preferably 0.01 μm to 0.05 μm.

Moreover, the average primary particle diameter of the pigments can be measured using a transmission electron microscope (TEM). As the transmission electron microscope, for example, a transmission microscope HT7700 manufactured by Hitachi High-Technologies Corporation can be used.

A maximum length (Dmax: a maximum length between two points on a contour of a particle image) and a maximum perpendicular length (DV-max: a shortest length connecting perpendicularly between two straight lines when the image is interposed between the two straight lines parallel with the maximum length) of a particle image acquired by using a transmission electron microscope are measured, and a geometric mean value $(Dmax \times DV\text{-}max)^{1/2}$ is defined as a particle diameter. The particle diameters of 100 particles are measured by this method, an arithmetic average value thereof is taken as the average particle diameter, which is defined as an average primary particle diameter of the pigments.

Moreover, examples of the inorganic pigment include metal compounds typified by metal oxides and metal complex salts, and specific examples thereof include metal oxides of iron, cobalt, aluminum, cadmium, lead, copper, titanium, magnesium, chromium, zinc, antimony, or the like, and composite oxides of the metals.

Examples of the chromatic pigment include the following pigments. The chromatic pigment is not limited thereto, but among those, chromatic organic pigments are preferable, and red color-based organic pigments, blue color-based organic pigments, yellow color-based organic pigments, and purple color-based organic pigments are more preferable.

In addition, these organic pigments can be used singly or in various combinations in order to enhance the color purity.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like, C. I. Pigment Orange 2, 5, 13, 16, 17:1, 31, 34, 36, 38, 43, 46, 48, 49, 51, 52, 55, 59, 60, 61, 62, 64, 71, 73, and the like, C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, C. I. Pigment Green 7, 10, 36, 37, 58, 59, C. I. Pigment Violet 1, 19, 23, 27, 32, 37, 42, C. I. Pigment Blue 1, 2, 15, 15:1, 15:2, 15:3, 15:4, 15:6, 16, 22, 60, 64, 66, 79, 80

(Black Pigment)

In the present invention, a black pigment can also be used as the pigment. Hereinafter, the black pigment will be described in more detail.

As the black pigment, various known black pigments can be used. Examples of the black pigment include carbon black, titanium black, titanium nitride, niobium nitride, vanadium nitride, titanium oxide, iron oxide, manganese oxide, graphite, perylene black, and Irgaphor Black. From the viewpoint that a high optical density can be realized at a small amount, carbon black, titanium black, titanium nitride, niobium nitride, vanadium nitride, titanium oxide, iron oxide, manganese oxide, or graphite is preferable, and among those, at least one of carbon black, titanium nitride, or titanium black is more preferable. Further, among those, from the viewpoint of less absorption in the light absorption wavelength range of an initiator involved in curing efficiency by exposure, the titanium black or the titanium nitride is particularly preferable. The titanium nitride is not particularly limited, but the titanium nitride described in WO2008/123097A, WO2010/147098A, or JP5577659B can be used.

Specific examples of the carbon black include, but are not limited to, organic pigments such as C. I. Pigment Black 1 and inorganic pigments such as Pigment Black 7, which are commercially available products.

Hereinafter, suitable aspects of the titanium black which is a black pigment will be described.

The titanium black is a black particle containing a titanium atom, and preferably lower titanium oxide, titanium oxynitride, or the like. The titanium black particle can have a surface thereof modified, if desired, for the purpose of improving the dispersibility, suppressing aggregating properties, and the like. For example, it is possible to coat the titanium black particle with silicon oxide, titanium oxide, germanium oxynitride, aluminum oxide, magnesium oxide, or zirconium oxide, and it is also possible to perform a surface treatment of the titanium black with a water-repellent material as shown in JP2007-302836A.

The titanium black is typically a titanium black particle, and it is preferable that the primary particle diameter and the average primary particle diameter of the individual particles are both small.

Specifically, the average primary particle diameter is preferably in a range of 10 nm to 45 nm. The average primary particle diameter can be measured by the same method as for chromatic pigment as described above.

The specific surface area of the titanium black is not particularly limited, and a value thereof measured by a Brunauer, Emmett, Teller (BET) method is preferably from 5 $m^2$/g to 150 $m^2$/g, and more preferably from 20 $m^2$/g to 120 $m^2$/g so that the water repellency of the titanium black after the surface treatment using a water-repellent agent exhibits a predetermined performance.

Examples of a commercially available product of the titanium black include Titanium Black 10S, 12S, 13R, 13M, 13M-C, 13R, 13R-N, and 13M-T (trade names, manufactured by Mitsubishi Materials Corporation), and Tilack D (trade name, manufactured by Akokasei Co., Ltd.).

Moreover, it is also preferable that the titanium black is contained as a dispersoid including the titanium black and Si atoms.

In this aspect, the titanium black is contained as a dispersoid in a composition, and the content ratio (Si/Ti) in the Si atoms to the Ti atoms in the dispersoid is preferably 0.05 or more, more preferably 0.05 to 0.5, and still more preferably 0.07 to 0.4, in terms of mass.

Here, the dispersoid includes both the titanium black in a state of primary particles and the titanium black in a state of aggregates (secondary particles).

To change the Si/Ti of the dispersoid (for example, to 0.05 or more), it is possible to use the following means.

First, a dispersion is obtained by dispersing titanium oxide and silica particles with a dispersing machine, and then the dispersion is subjected to a reduction treatment at a high temperature (for example, 850° C. to 1,000° C.). Thus, the dispersoid having the titanium black particles as a main component and containing Si and Ti can be obtained. The reduction treatment can also be carried out in an atmosphere of a reductive gas such as ammonia.

Examples of the titanium oxide include TTO-51N (trade name: manufactured by Ishihara Sangyo Kaisha, Ltd.).

Examples of the commercially available products of the silica particles include AEROSIL (trademark) 90, 130, 150, 200, 255, 300, and 380 (trade name: manufactured by Evonik).

Dispersion of the titanium oxide and the silica particles may be carried out using a dispersing resin. Examples of the dispersing resin include those described in the section of the dispersing resin which will be described later.

The dispersion may be carried out in a solvent. Examples of the solvent include water and organic solvents. Examples of the solvents include those described in the section of the organic solvent which will be described later.

The titanium black with the Si/Ti adjusted to, for example, 0.05 or more can be manufactured by the methods described in, for example, paragraph No. [0005], and paragraph Nos. [0016] to [0021] of JP2008-266045A.

By adjusting the content ratio (Si/Ti) of the Si atoms to the Ti atoms in the dispersoid including the titanium black and the Si atoms to a suitable range (for example, 0.05 or more), the amount of the residue derived from the composition, remaining on the outside of a region where the light-shielding film is formed is reduced in a case where the light-shielding film is formed by using the composition including the dispersoid. Further, the residue includes a component derived from the titanium black particles or a composition such as a resin component.

The reason why the amount of the residue is reduced has not been clarified yet, but the above-mentioned dispersoid tends to have a small particle diameter (for example, a particle diameter of 30 nm or less), and the adsorptivity to the underlying substrate of the whole film decreases as the component containing the Si atoms increases in the dispersoid. This is assumed to contribute to improvement of the development removability of uncured composition (in particular, titanium black) in the formation of the light-shielding film.

Furthermore, from the viewpoint that the titanium black has excellent light-shielding properties to light in wavelength ranges widely ranging from ultraviolet rays to infrared light, the light-shielding film formed using the dispersoid (preferably with the Si/Ti of 0.05 or more in terms of mass) including the titanium black and Si atoms exerts excellent light-shielding properties.

Incidentally, the content ratio (Si/Ti) of the Si atoms to the Ti atoms in the dispersoid can be measured using, for example, the method (1-1) or the method (1-2) described in paragraph 0033 of JP2013-249417A.

In addition, for the dispersoid contained in the light-shielding film obtained by curing the composition, it is determined whether the content ratio (Si/Ti) of the Si atoms to the Ti atoms in the dispersoid is 0.05 or more, using the method (2) described in paragraph 0035 of JP2013-249417A.

In the dispersoid including the titanium black and the Si atom, the titanium black as described above can be used.

Furthermore, in this dispersoid, one kind or two or more kinds of composite oxides such as Cu, Fe, Mn, V, and Ni, cobalt oxide, iron oxide, a black pigment formed of carbon black, aniline black, or the like may be combined as the dispersoid with the titanium black, for the purpose of adjusting dispersibility, colorability, and the like.

In this case, it is preferable that the dispersoid formed of the titanium black occupies 50% by mass or more of the whole dispersoid.

Incidentally, in the dispersoid, another coloring agent (organic pigments, dyes, or the like) may be used together with the titanium black as desired as long as the coloring agent does not impair the effects of the present invention, for the purpose of adjusting light-shielding properties or the like.

Hereinafter, the materials used in introducing the Si atoms into the dispersoid will be described. In a case where the Si atoms are introduced into the dispersoid, a Si-containing material such as silica may be used.

Examples of the silica used herein include precipitated silica, fumed silica, colloidal silica, and synthetic silica, and may be selected as appropriate.

In addition, since the light-shielding properties are superior if the particle diameter of the silica particle is smaller than the thickness of the film in the formation of a light-shielding film, it is preferable to use fine particle-type silica as the silica particle. Further, examples of the fine particle-type silica include the silica described in paragraph 0039 of JP2013-249417A, the contents of which are incorporated herein by reference.

[Dye]

As the dye, the coloring agents disclosed in, for example, JP1989-90403A (JP-S64-90403A) JP1989-91102A (JP-S64-91102A), JP1989-94301 A (JP-H01-94301A), JP1994-11614A (JP-H06-11614A), JP2592207B, US4808501A, US5667920A, US5059500A, JP1993-333207A (JP-H05-333207A), JP1994-35183A (JP-H06-35183A), JP1994-51115A (JP-H06-51115A), and JP1994-194828A (JP-H06-194828A) can be used. In terms of classification based on the chemical structure, it is possible to use a pyrazoleazo compound, a pyrromethene compound, an anilinoazo compound, a triphenylmethane compound, an anthraquinone compound, a benzylidene compound, an oxonol compound, a pyrazolotriazoleazo compound, a pyridoneazo compound, a phenothiazine compound, a pyrrolopyrazoleazomethine compound, or the like can be used. In addition, as the dye, a coloring agent multimer may be used. Examples of the coloring agent multimer include the compounds described in JP2011-213925A and JP2013-041097A.

The first curable composition may further include a powder pigment, as desired. Examples of the powder pigment include barium sulfate, barium carbonate, calcium carbonate, silica, basic magnesium carbonate, alumina white, gloss white, titanium white, and hydrotalcite. These powder pigments can be used singly or in combination of two or more kinds thereof. The amount of the powder pigment to be used is usually 0 to 100 parts by mass, preferably 5 to 50 parts by mass, and more preferably 10 to 40 parts by mass, with respect to 100 parts by mass of the coloring agent. In the present invention, the surfaces of the coloring agent and the powder pigments can be used, optionally after being modified with a polymer.

Among those, from the viewpoint of further improving the effect of the present invention, the visible light-absorbing coloring agent is preferably titanium oxynitride, titanium nitride, carbon black, perylene black, Irgaphor Black, a red color-based organic pigment, a blue color-based organic pigment, a yellow color-based organic pigment, or a purple color-based organic pigment, and more preferably titanium oxynitride, titanium nitride, or carbon black.

The visible light-absorbing coloring agent may be used singly or in combination of two or more kinds thereof.

The content of the visible light-absorbing coloring agent in the first curable composition is preferably 15% to 80% by mass, more preferably 20% to 70% by mass, and still more preferably 30% to 65% by mass, with respect to the total solid content of the composition.

<Infrared Ray-Absorbing Coloring Agent>

The first curable composition contains an infrared ray-absorbing coloring agent.

In the present invention, the infrared ray-absorbing coloring agent means a compound having an absorption in an infrared ray region (a wavelength of more than 780 nm and 1,100 nm or less). The infrared ray-absorbing coloring agent has a wavelength exhibiting a maximum absorption at preferably 780 nm or more, and more preferably 800 nm or more.

As the infrared ray-absorbing coloring agent, either of a pigment and a dye may be used, but the pigment is preferable for a reason that a curable composition capable of forming a film having excellent heat resistance is likely to be obtained. An average particle diameter (r) of the pigment satisfies preferably 20 nm≤r≤300 nm, more preferably 25 nm≤r≤250 nm, and still more preferably 30 nm≤r≤200 nm. In addition, regarding a particle diameter distribution of the secondary particles of the pigment (hereinafter, simply referred to as "particle diameter distribution") which can be used, it is preferable that secondary particles having a particle diameter of (average particle diameter±100) nm account for 70% by mass or more, and preferably 80% by mass or more in the pigment. Further, the average particle diameter of primary particles can be calculated by observing a pigment with a scanning electron microscope (SEM) or a transmission electron microscope (TEM), measuring particle diameters of 100 particles in a region in which particles are not aggregated, and calculating an average value of the measured particle diameters.

Examples of the infrared ray-absorbing coloring agent include a pyrrolopyrrole compound, a phthalocyanine compound, a naphthalocyanine compound, a squarylium compound, a cyanine compound, a diimmonium-based compound, a tungsten oxide-based compound, a copper compound, an iminium compound, a thiol complex-based compound, a transition metal oxide-based compound, quaterrylene compound, a dithiol metal complex-based compound, and a croconium compound, and among those, the pyrrolopyrrole-based compound, the phthalocyanine-based compound, the naphthalocyanine-based compound, the squarylium-based compound, the cyanine-based compound, the diimmonium-based compound, and the tungsten oxide-based compound are preferable.

The infrared ray-absorbing coloring agent may be used singly or in combination of two or more kinds thereof.

As the phthalocyanine compound, the naphthalocyanine compound, the iminium compound, the cyanine compound, the squarylium compound, or the croconium compound, for example, the compounds described in paragraphs 0010 to 0081 of JP2010-111750A may be used, the content of which are incorporated herein by reference. In addition, for the cyanine compound, reference can be made to, for example, "Functional Colorants by Makoto Okawara, Masaru Matsuoka, Teijiro Kitao, and Tsuneoka Hirashima, published by Kodansha Scientific Ltd.", the contents of which are incorporated herein by reference.

In the present invention, as the infrared ray-absorbing coloring agent, the compound described in paragraphs 0004 to 0016 of JP1995-164729A (JP-H07-164729A), a compound described in paragraphs 0027 to 0062 of JP2002-146254A, or near infrared ray absorbing particles described in paragraphs 0034 to 0067 of JP2011-164583A which are formed of crystallites of an oxide including Cu and/or P and have a number-average aggregated particle diameter of 5 to 200 nm may be used, the contents of which are incorporated herein by reference. In addition, for example, FD-25 (manufactured by Yamada Chemical Co., Ltd.), IRA842 (naphthalocyanine compound, manufactured by Exiton, Inc.), or the like may be used.

<<<Pyrrolopyrrole Compound>>>

The pyrrolopyrrole compound may be either a pigment or a dye used, but the pigment is preferable for a reason that because a curable composition capable of forming a film having excellent heat resistance is likely to be obtained.

As the pyrrolopyrrole compound, a compound represented by General Formula (1) is preferable. By using the compound represented by General Formula (1), excellent spectral characteristics can be obtained, and further, a film having excellent heat resistance can be formed.

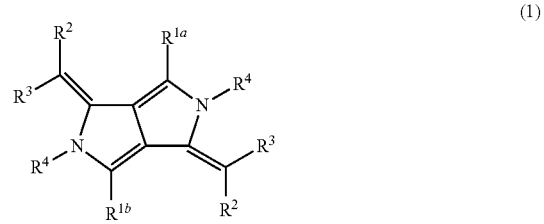

(1)

In Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, $-BR^{4A}R^{4B}$, or a metal atom, $R^4$ may form a covalent bond or a coordinate bond with at least one selected from $R^{1a}$, $R^{1b}$, and $R^3$, and $R^{4A}$ and $R^{4B}$ each independently represent a hydrogen atom or a substituent.

The alkyl group represented by $R^{1a}$ or $R^{1b}$ in General Formula (1) is an alkyl group having preferably 1 to 30 carbon atoms, more preferably 1 to 20 carbon atoms, and still more preferably 1 to 10 carbon atoms, and examples thereof include a methyl group, an ethyl group, an iso-propyl group, a tert-butyl group, an n-octyl group, an n-decyl group, an n-hexadecyl group, a cyclopropyl group, a cyclopentyl group, and a cyclohexyl group. The alkyl group may have a substituent or may be unsubstituted. Examples of the substituent include the substituent T which will be described later and the group represented by Formula A which will be described later.

The aryl group represented by $R^{1a}$ or $R^{1b}$ is an alkyl group having preferably 6 to 30 carbon atoms, more preferably 6 to 20 carbon atoms, and still more preferably 6 to 12 carbon atoms, and examples thereof include a phenyl group, an ortho-methylphenyl group, a para-methylphenyl group, a biphenyl group, a naphthyl group, an anthranil group, and a phenanthryl group. The aryl group may have a substituent or may be unsubstituted. Examples of the substituent include the substituent T which will be described later and the group represented by Formula A which will be described later.

It is preferable that the heteroaryl group represented by $R^{1a}$ or $R^{1b}$ is a 5- or 6-membered ring. In addition, the heteroaryl group is preferably a monocycle or a fused ring, more preferably a monocycle or a fused ring including 2 to 8 rings, and still more preferably a monocycle or a fused ring including 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. Specific examples of the heteroaryl group include an imidazolyl group, a pyridyl group, a quinolyl group, a furyl group, a thienyl group, a benzoxazolyl group, a benzimidazolyl group, a benzothiazolyl group, a naphthothiazolyl group, a benzoxazolyl group, an m-carbazolyl group, and an azepinyl group. The heteroaryl group may have a substituent or may be unsubstituted. Examples of the substituent include the substituent T which will be described later and the group represented by Formula A which will be described later.

It is preferable that the group represented by $R^{1a}$ or $R^{1b}$ is an aryl group which has an alkoxy group having a branched alkyl group. The number of carbon atoms in the branched alkyl group is preferably 3 to 30 and more preferably 3 to 20.

In General Formula (1), $R^{1a}$ and $R^{1b}$ may be the same as or different from each other.

$R^2$ and $R^3$ each independently represent a hydrogen atom or a substituent. $R^2$ and $R^3$ may be bonded to each other to form a ring. It is preferable that at least one of $R^2$ or $R^3$ represents an electron-withdrawing group. It is preferable that $R^2$ and $R^3$ each independently represent a cyano group or a heteroaryl group.

Examples of the substituent include substituents described in paragraphs 0020 to 0022 of 2009-263614A, the contents of which are incorporated herein by reference.

Examples of the substituent include the following substituent T.

(Substituent T)

Examples of the substituent T include an alkyl group (preferably having 1 to 30 carbon atoms; for example, a methyl group, an ethyl group, and a cyclohexyl group), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms; for example, a phenyl group, a para-methylphenyl group, a biphenyl group, and a naphthyl group), an amino group (preferably an amino group having 0 to 30 carbon atoms), an alkoxy group (preferably an alkoxy group having 1 to 30 carbon atoms; for example, a methoxy group and a 2-ethylhexyloxy group), an aryloxy group (preferably an aryloxy group having 6 to 30 carbon atoms; for example, a phenyloxy group, an 1-naphthyloxy group, and a 2-naphthyloxy group), a heteroaryloxy group (preferably a heteroaryloxy group having 1 to 30 carbon atoms; for example, a pyridyloxy group), an acyl group (preferably having an acyl group having 2 to 30 carbon atoms), an alkoxycarbonyl group (preferably an alkoxycarbonyl group having 1 to 30 carbon atoms), an aryloxycarbonyl group (preferably an aryloxycarbonyl group having 7 to 30 carbon atoms), an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfonylamino group (preferably a sulfonylamino group having 1 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably a heteroarylthio group having 1 to 30 carbon atoms), an alkylsulfinyl group (preferably an alkylsulfinyl group having 1 to 30 carbon atoms), an arylsulfinyl group (preferably an arylsulfinyl group having 6 to 30 carbon atoms), a ureido group (preferably a ureido group having 1 to 30 carbon atoms), a phosphoric amide group (preferably a phosphoric amide group having 1 to 30 carbon atoms), a hydroxy group, a mercapto group, a halogen atom (for example, a fluorine atom, a chlorine atom, a bromine atom, and an iodine atom), a cyano group, a sulfo group, a carboxy group, a nitro group, a hydroxamic acid group, a sulfino group, a hydrazino group, an imino group, and a heteroaryl group.

In a case where the above-described groups can further be substituted, the groups may further have a substituent. Examples of the substituent include the groups exemplified as the substituent T and a group represented by Formula A.

$$-L^1-X^1 \qquad\qquad A:$$

In the formula, $L^1$ represents a single bond or a divalent linking group, and $X^1$ represents a (meth)acryloyloxy group, an epoxy group, an oxetanyl group, an isocyanate group, a hydroxy group, an amino group, a carboxy group, a thiol group, an alkoxysilyl group, a methylol group, a vinyl group, a (meth)acrylamide group, a sulfo group, a styryl group, or a maleimide group.

In a case where $L^1$ represents a divalent linking group, $L^1$ is preferably an alkylene group having 2 to 20 carbon atoms, an arylene group having 6 to 18 carbon atoms, a heteroarylene group having 3 to 18 carbon atoms, —O—, —S—, —C(=O)—, or a group of a combination of the above-described groups.

$X^1$ is more preferably one or more groups selected from the group consisting of a (meth)acryloyloxy group, a vinyl group, an epoxy group, and an oxetanyl group, and still more preferably a (meth)acryloyloxy group.

It is preferable that at least one of $R^2$ or $R^3$ represents an electron-withdrawing group. A substituent having a positive Hammett sigma para value (σp value) functions as an electron-withdrawing group.

In the present invention, a substituent having a Hammett σp value of 0.2 or more can be used as an example of the electron-withdrawing group. The σp value is preferably 0.25 or more, more preferably 0.3 or more, and still more preferably 0.35 or more. The upper limit is not particularly limited and is preferably 0.80 or less.

Specific examples of the substituent include a cyano group (0.66), a carboxy group (—COOH; 0.45), an alkoxycarbonyl group (—COOMe; 0.45), an aryloxycarbonyl group (—COOPh; 0.44), a carbamoyl group (—CONH$_2$; 0.36), an alkylcarbonyl group (—COMe; 0.50), an arylcarbonyl group (—COPh; 0.43), an alkylsulfonyl group (—SO$_2$Me; 0.72), and an arylsulfonyl group (—SO$_2$Ph; 0.68), and the cyano group is preferable. Here, Me represents a methyl group, and Ph represents a phenyl group.

The details of the Hammett substituent constant a value can be found in paragraphs 0017 and 0018 of JP2011-68731A, the contents of which are incorporated herein by reference.

In a case where $R^2$ and $R^3$ are bonded to form a ring, it is preferable to form a 5- to 7-membered ring (preferably a 5- or 6-membered ring). Usually, the ring thus formed is preferably used as an acidic nucleus in merocyanine coloring agent, and for specific examples thereof, reference can be made to paragraph No. 0026 of JP2009-263614A, the contents of which are incorporated herein by reference.

Incidentally, the σp value of the $R^2$ and $R^3$ in a case of forming the ring cannot be defined, but in the present invention, the σp value in a case of forming the ring is defined, regarding that a partial structure of each ring is substituted at $R^2$ and $R^3$. For example, in a case of forming a 1,3-indandione ring, it is considered that a benzoyl group is each substituted at $R^2$ and $R^3$.

The ring formed by the mutual bonding of $R^2$ and $R^3$ is preferably a 1,3-dicarbonyl nucleus, a pyrazolinone nucleus, a 2,4,6-triketohexahydropyrimidine nucleus (also including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus, or an indanone nucleus, and more preferably a 1,3-dicarbonyl nucleus, a 2,4,6-triketohexahydropyrimidine nucleus (also including a thioketone form), a 3,5-pyrazolidinedione nucleus, a benzothiophen-3-one nucleus, or an indanone nucleus.

$R^3$ is particularly preferably a heteroaryl group. The heteroaryl group is preferably a 5- or 6-membered ring. In addition, the heteroaryl group is preferably a monocycle or a fused ring, more preferably a monocycle or a fused ring including 2 to 8 rings, and still more preferably a monocycle or a fused ring including 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. The heteroaryl group is preferably a quinoline group, a benzothiazole group, or a naphthothiazol group, and is more preferably a benzothiazole group. The heteroaryl group may have a substituent or may be unsubstituted. Examples of the substituent include the above-described substituent T and the above-described group represented by Formula A.

In General Formula (1), two $R^2$'s may be the same as or different from each other, and two $R^3$'s may be the same as or different from each other.

In a case where $R^4$ represents an alkyl group, an aryl group, or a heteroaryl group, the alkyl group, the aryl group, and the heteroaryl group represented by $R^4$ have the same definitions as those described for $R^{1a}$ and $R^{1b}$, and preferred ranges thereof are also the same.

In a case where $R^4$ represents —$BR^{4A}R^{4B}$, $R^{4A}$ and $R^{4B}$ each independently represent a hydrogen atom or a substituent, and $R^{4A}$ and $R^{4B}$ may be bonded to each other to form a ring. Examples of the substituent represented by $R^{4A}$ and $R^{4B}$ include the above-described substituent T. In particular, a halogen atom, an alkyl group, an alkoxy group, an aryl group, or a heteroaryl group is preferable, an alkyl group, an aryl group, or a heteroaryl group is more preferable, and an aryl group is still more preferable. Specific examples of the group represented by —$BR^{4A}R^{4B}$ include difluoroboron, diphenylboron, dibutylboron, dinaphthylboron, and catecholboron. Among those, diphenylboron is preferable.

In a case where $R^4$ represents a metal atom, examples of the metal atom include magnesium, aluminum, calcium, barium, zinc, tin, aluminum, vanadium, iron, cobalt, nickel, copper, palladium, iridium, and platinum, and aluminum, zinc, vanadium, iron, copper, palladium, iridium, or platinum is preferable.

$R^4$ may form a covalent bond or a coordinate bond with at least one of $R^{1a}$, $R^{1b}$, or $R^3$, and it is particularly preferable that $R^4$ and $R^3$ form a coordinate bond.

$R^4$ is preferably a hydrogen atom or a group (particularly diphenylboron) represented by $BR^{4A}R^{4B}$.

In Formula (1), two $R^4$'s may be the same as or different from each other.

The compound represented by General Formula (1) is preferably a compound represented by any one of General Formula (2), (3), or (4).

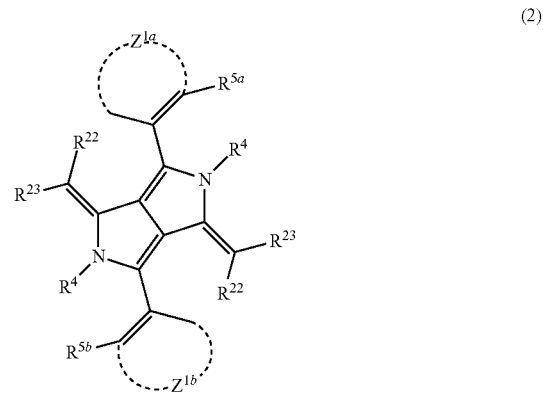

(2)

In General Formula (2), $Z^{1a}$ and $Z^{1b}$ each independently represent an atomic group which forms an aryl ring or a heteroaryl ring. $R^{5a}$ and $R^{5b}$ each independently represent an aryl group having 6 to 20 carbon atoms, a heteroaryl group having 4 to 20 carbon atoms, an alkyl group having 1 to 20 carbon atoms, an alkoxy group having 1 to 20 carbon atoms, an alkoxycarbonyl group having 1 to 20 carbon atoms, a carboxy group, a carbamoyl group having 1 to 20 carbon atoms, a halogen atom, or a cyano group, and $R^{5a}$ or $R^{5b}$ may be bonded to $Z^{1a}$ or $Z^{1b}$ to form a fused ring. $R^{22}$ and $R^{23}$ each independently represent a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 20 carbon atoms. $R^{22}$ and $R^{23}$ may be bonded to each other to form a cyclic acid nucleus. $R^4$ represents a hydrogen atom, an alkyl group having 1 to 20 carbon atoms, an aryl group having 6 to 20 carbon atoms, a heteroaryl group having 4 to 20 carbon atoms, —$BR^{4A}R^{4B}$, or a metal atom, and may form a covalent bond or a coordinate bond with $R^{23}$. $R^{4A}$ and $R^{4B}$ each independently represent a hydrogen atom, a halogen atom, an alkyl group having 1 to 10 carbon atoms, an alkoxy group having 1 to 10 carbon atoms, an aryl group having 6 to 20 carbon atoms, or a heteroaryl group having 4 to 20 carbon atoms.

In General Formula (2), $Z^{1a}$ and $Z^{1b}$ each independently represent an atomic group which forms an aryl ring or a heteroaryl ring. The formed aryl ring and the formed heteroaryl ring have the same definitions as those of the aryl group and the heteroaryl group described as the substituent of $R^2$ and $R^3$ in General Formula (1), and preferable ranges thereof are also the same. It is preferable that $Z^{1a}$ and $Z^{1b}$ are the same as each other.

$R^{5a}$ and $R^{5b}$ have the same definitions as those of the examples described for $R^2$ and $R^3$ in General Formula (1), and preferred ranges thereof are also the same. It is preferable that $R^{5a}$ and $R^{5b}$ are the same as each other.

$R^{5a}$ or $R^{5b}$ may be bonded to $Z^{1a}$ or $Z^{1b}$ to form a fused ring. Examples of the fused ring include a naphthyl ring and a quinoline ring. By introducing the group represented by $R^{5a}$ or $R^{5b}$ into the aryl ring or the heteroaryl ring which is formed by $Z^{1a}$ or $Z^{1b}$, invisibility can be significantly improved.

$R^{22}$ and $R^{23}$ have the same definitions as those of the examples described for $R^2$ and $R^3$ in General Formula (1), and preferred ranges thereof are also the same.

$R^4$ has the same definition as $R^4$ in General Formula (1), and a preferred range thereof is also the same. $R^4$ may form a covalent bond or a coordinate bond with $R^{23}$.

The compound represented by General Formula (2) may further have a substituent, this substituent has the same definition as for the substituent of $R^2$ and $R^3$, and a preferred range thereof is also the same.

As a preferred combination in General Formula (2), there is a case where $Z^{1a}$ and $Z^{1b}$ each independently form a benzene ring or a pyridine ring, $R^{5a}$ and $R^{5b}$ are each independently an alkyl group, an alkoxy group, a halogen atom, or a cyano group, $R^{22}$ and $R^{23}$ are each independently a heteroaryl group, a cyano group, an acyl group, an alkoxycarbonyl group, or a cyclic acid nucleus which is formed by $R^{22}$ and $R^{23}$ being bonded to each other, and $R^4$ is a hydrogen atom, —$BR^{4A}R^{4B}$, a transition metal atom, magnesium, aluminum, calcium, barium, zinc, or tin. As a more preferred combination, there is a case where both $Z^{1a}$ and $Z^{1b}$ form a benzene ring, both $R^{5a}$ and $R^{5b}$ are an alkyl group, a halogen atom, or a cyano group, $R^{22}$ and $R^{23}$ are each independently a combination of a nitrogen-containing heteroaryl group with a cyano group or an alkoxycarbonyl group, or a cyclic acid nucleus which is formed by $R^{22}$ and $R^{23}$ being bonded to each other, and $R^4$ is a hydrogen atom, —$BR^{4A}R^{4B}$, aluminum, zinc, vanadium, iron, copper, palladium, iridium, or platinum.

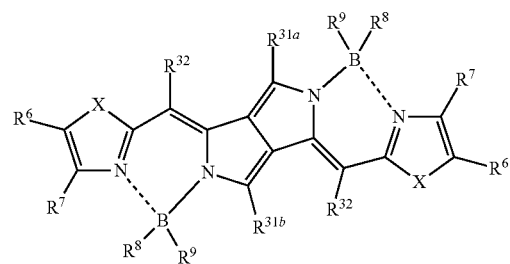

(3)

In General Formula (3), $R^{31a}$ and $R^{31b}$ each independently represent an alkyl group having 1 to 20 carbon atoms, an aryl group having 6 to 20 carbon atoms, or a heteroaryl group having 3 to 20 carbon atoms. $R^{32}$ represents a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms. $R^6$ and $R^7$ each independently represent a hydrogen atom, an alkyl group having 1 to 10 carbon atoms, an aryl group having 6 to 10 carbon atoms, or a heteroaryl group having 4 to 10 carbon atoms. $R^6$ and $R^7$ may be bonded to each other to form a fused ring, and the formed ring is preferably an alicyclic ring having 5 to 10 carbon atoms, an aryl ring having 6 to 10 carbon atoms, or a heteroaryl ring having 3 to 10 carbon atoms. $R^8$ and $R^9$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms. X represents an oxygen atom, a sulfur atom, —NR—, or —CRR'—, and R and R' represent a hydrogen atom, an alkyl group having 1 to 10 carbon atoms, or an aryl group having 6 to 10 carbon atoms.

In General Formula (3), $R^{31a}$ and $R^{31b}$ have the same definitions as those of the examples described for $R^{1a}$ and $R^{1b}$ in General Formula (1), and preferred ranges thereof are also the same. It is preferable that $R^{31a}$ and $R^{31b}$ are the same as each other.

$R^{32}$ has the same definition as those of the example of $R^2$ in General Formula (1), and a preferred range thereof is also the same.

$R^6$ and $R^7$ have the same definition and the same preferable range as those of the examples of the substituent of $R^2$ and $R^3$ in General Formula (1). In addition, $R^6$ and $R^7$ may be bonded to each other to form a ring, and the formed ring is an alicyclic ring having 5 to 10 carbon atoms, an aryl ring having 6 to 10 carbon atoms, or a heteroaryl ring having 3 to 10 carbon atoms, and preferable examples thereof include a benzene ring, a naphthalene ring, and a pyridine ring. In a case where $R^6$ and $R^7$ represent a boron complex obtained by introducing a substituted 5-membered nitrogen-containing heteroaryl ring, an infrared absorbing colorant having high fastness and high invisibility at the same time can be realized.

$R^8$ and $R^9$ have the same definitions as those of the examples of the substituent of $R^2$ and $R^3$ in General Formula (1), and preferred ranges thereof are also the same.

X represents an oxygen atom, a sulfur atom, —NR—, or —CRR'—. R and R' each independently represent a hydrogen atom, an alkyl group having 1 to 10 carbon atoms, or an aryl group having 6 to 10 carbon atoms, and preferably represents a hydrogen atom, an alkyl group having 1 to 6 carbon atoms, or a phenyl group.

As a preferred combination in General Formula (3), there is a case where $R^{31a}$ and $R^{31b}$ are each independently an alkyl group having 1 to 10 carbon atoms, a benzene ring, or a pyridine ring, $R^{32}$ is a cyano group or an alkoxycarbonyl group, $R^6$ and $R^7$ are bonded to each other to form a benzene ring, a pyridine ring, a pyrazine ring, or a pyrimidine ring, $R^8$ and $R^9$ are each independently an alkyl group having 1 to 6 carbon atoms, a phenyl group, or a naphthyl group, X is an oxygen atom, a sulfur atom, —NR—, or —CRR'—, and R and R' are each independently a hydrogen atom, an alkyl group having 1 to 6 carbon atoms, or a phenyl group. As a more preferred combination, there is a case where both $R^{31a}$ and $R^{31b}$ are each an alkyl group having 1 to 10 carbon atoms or a benzene ring, $R^{32}$ is a cyano group, $R^6$ and $R^7$ are bonded to each other to form a benzene ring or a pyridine ring, $R^8$ and $R^9$ are each independently an alkyl group having 1 to 6 carbon atoms, a phenyl group, or a naphthyl group, and X is an oxygen atom or a sulfur atom.

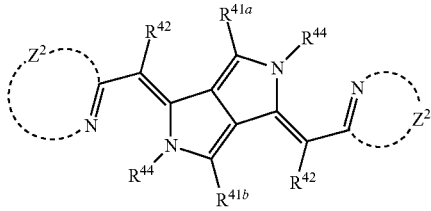

(4)

In General Formula (4), $R^{41a}$ and $R^{41b}$ represent groups which are different from each other, and represent an alkyl group having 1 to 20 carbon atoms, an aryl group having 6 to 20 carbon atoms, or a heteroaryl group having 3 to 20 carbon atoms. $R^{42}$ represents a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms. $Z^2$ represents an atomic group which forms a nitrogen-containing 5- or 6-membered ring with —C=N—, and examples of the nitrogen-containing heteroaryl ring include a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, a benzo fused ring or a naphtho fused ring thereof, or a fused ring complex thereof. $R^{44}$ represents a hydrogen atom, an alkyl group having 1 to 20 carbon atoms, an aryl group having 6 to 20 carbon atoms, a heteroaryl group having 4 to 20 carbon atoms, —$BR^{44A}R^{44B}$, or a metal atom, $R^{44}$ may form a covalent bond or a coordinate bond with a nitrogen-containing heterocycle formed by $Z^2$, and $R^{44A}$ and $R^{44B}$ each independently represent a hydrogen atom, a halogen atom, an alkyl group having 1 to 10 carbon atoms, an aryl group having 6 to 20 carbon atoms, or a heteroaryl group having 4 to 20 carbon atoms.

In General Formula (4), $R^{41a}$ and $R^{41b}$ have the same definitions as those of the examples described for $R^{1a}$ and $R^{1b}$ in General Formula (1), and preferred ranges thereof are also the same. In this case, $R^{41a}$ and $R^{41b}$ represent groups which are different from each other.

$R^{42}$ has the same definition as $R^2$ in General Formula (1), and a preferred range thereof is also the same.

$Z^2$ represents an atomic group which forms a nitrogen-containing 5- or 6-membered ring with —C=N—, and examples of the nitrogen-containing heteroaryl ring include a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, a benzo fused ring or a naphtho fused ring thereof, or a fused ring complex thereof.

$R^{44}$ represents a hydrogen atom, an alkyl group having 1 to 20 carbon atoms, an aryl group having 6 to 20 carbon atoms, a heteroaryl group having 4 to 20 carbon atoms, —$BR^{44A}R^{44B}$, or a metal atom, $R^{44}$ may form a covalent bond or a coordinate bond with a nitrogen-containing heterocycle formed by $Z^2$, and $R^{44A}$ and $R^{44B}$ each independently represent a hydrogen atom, a halogen atom, an alkyl group having 1 to 10 carbon atoms, an aryl group having 6 to 20 carbon atoms, or a heteroaryl group having 4 to 20 carbon atoms.

By introducing the groups represented by the $R^{41a}$ and $R^{41b}$ which are different from each other and introducing the nitrogen-containing 5- or 6-membered heterocycle which is formed by $Z^2$ and —C=N—, high fastness, high invisibility, excellent dispersibility, and high solubility in an organic solvent can be imparted.

As a preferred combination in General Formula (4), there is a case where $R^{41a}$ and $R^{41b}$ are each independently an alkyl group having 1 to 10 carbon atoms, a benzene ring, or a pyridine ring, $R^{42}$ is a cyano group, an alkylsulfinyl or arylsulfinyl group having 1 to 10 carbon atoms, or an alkoxycarbonyl group, $Z^2$ and —C=N— form a thiazole ring, an oxazole ring, an imidazole ring, a thiadiazole ring, a triazole ring, a pyridine ring, a pyrimidine ring, a pyrazine ring, or a benzo fused ring or a naphtho fused ring thereof, and $R^{44}$ is a hydrogen atom, —$BR^{44A}R^{44B}$, a transition metal atom, magnesium, aluminum, calcium, barium, zinc, or tin. As a more preferred combination, there is a case where $R^{41a}$ and $R^{41b}$ are each independently an alkyl group having 1 to 10 carbon atoms or a benzene ring, $R^{42}$ is a cyano group, $Z^2$ and —C=N— form a thiazole ring, an oxazole ring, an imidazole ring, a triazole ring, a pyridine ring, a pyrimidine ring, or a benzo fused ring or a naphtho fused ring thereof, and $R^{44}$ is a hydrogen atom, —$BR^{44A}R^{44B}$ (in which $R^{44A}$ and $R^{44B}$ are each independently an alkyl group having 1 to 10 carbon atoms, a benzene ring, a pyridine ring, or a thiophene ring), aluminum, zinc, vanadium, iron, copper, palladium, iridium, or platinum.

As the pyrrolopyrrole compound, a compound represented by General Formula (5) is particularly preferable.

(5)

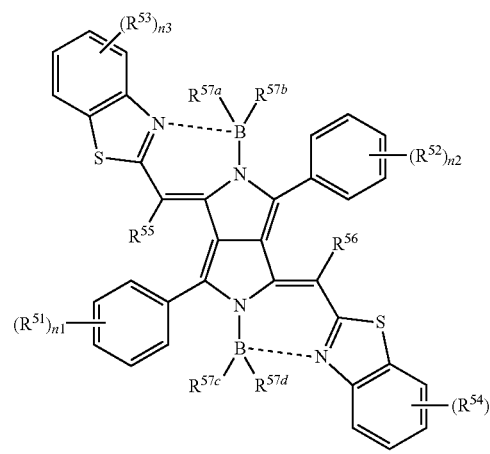

In General Formula (5), $R^{51}$ to $R^{54}$ each independently represent a substituent.

$R^{55}$ and $R^{56}$ each independently represent a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms.

$R^{57a}$ to $R^{57d}$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms.

n1 and n2 each independently represent an integer of 0 to 5.

n3 and n4 each independently represent an integer of 0 to 4.

Examples of the substituent represented by $R^{51}$ and $R^{52}$ include the substituents described above for the substituent T.

$R^{51}$ and $R^{52}$ preferably each independently represent an alkyl group, an aryl group, an alkoxy group, an aryloxy group, a heteroaryloxy group, a halogen atom, or a cyano group, more preferably an alkoxy group or an aryloxy group, and still more preferably an alkoxy group.

The number of carbon atoms in the alkyl group is preferably 1 to 30 and more preferably 1 to 20. The alkyl group may be linear, branched, or cyclic, and is preferably linear or branched.

The number of carbon atoms in the aryl group or the aryloxy group is preferably 6 to 30 and more preferably 6 to 20.

The number of carbon atoms in the alkoxy group is preferably 1 to 30 and more preferably 1 to 20. The alkoxy group is preferably linear or branched and more preferably branched.

A heteroaryl ring included in the heteroaryloxy group is preferably a 5- or 6-membered ring. In addition, the heteroaryl ring is preferably a monocycle or a fused ring, more preferably a monocycle or a fused ring including 2 to 8 rings, and still more preferably a monocycle or a fused ring including 2 to 4 rings. The number of heteroatoms constituting the heteroaryl ring is preferably 1 to 3 and more preferably 1 or 2. Examples of the heteroatom include a nitrogen atom, an oxygen atom, and a sulfur atom.

Examples of the substituent represented by $R^{53}$ and $R^{54}$ include the substituents described above for the substituent T.

$R^{53}$ and $R^{54}$ are each independently preferably an alkyl group, an aryl group, an alkoxy group, an aryloxy group, a heteroaryloxy group, a halogen atom, or a cyano group.

$R^{55}$ and $R^{56}$ each independently represent preferably a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, a nitrogen-containing heteroaryl group having 3 to 10 carbon atoms, or a cyano group.

$R^{57a}$ to $R^{57d}$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms, preferably an alkyl group having 1 to 10 carbon atoms or an aryl group having 6 to 20 carbon atoms, more preferably an aryl group having 6 to 20 carbon atoms, and still more preferably a phenyl group.

n1 and n2 each independently represent an integer of 0 to 5, and are preferably 0 to 3, more preferably 0 to 2, and still more preferably 1. A combination in which n1 and n2 are each 1, and $R^{51}$ and $R^{52}$ are each an alkoxy group is particularly preferable.

n3 and n4 each independently represent an integer of 0 to 4 and are each preferably 0 to 2.

Specific examples of the compound represented by General Formula (1) include the following compounds. In addition, other examples include the compounds described in paragraph Nos. 0049 to 0058 of JP2009-263614A.

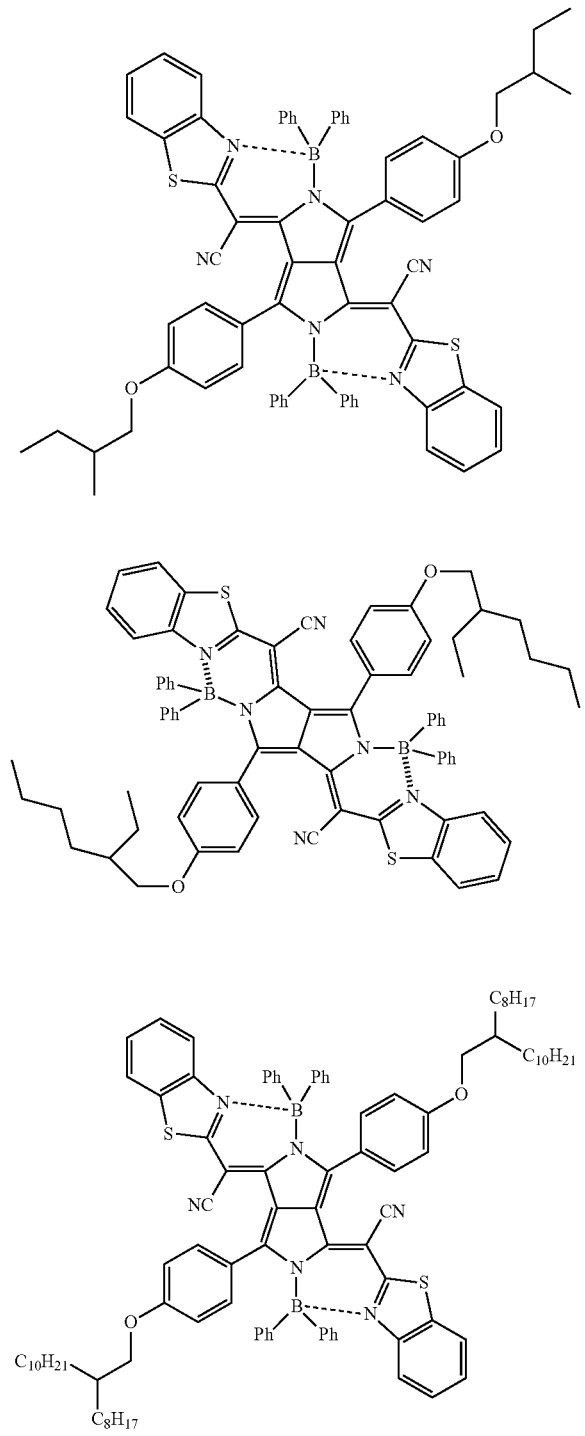

-continued

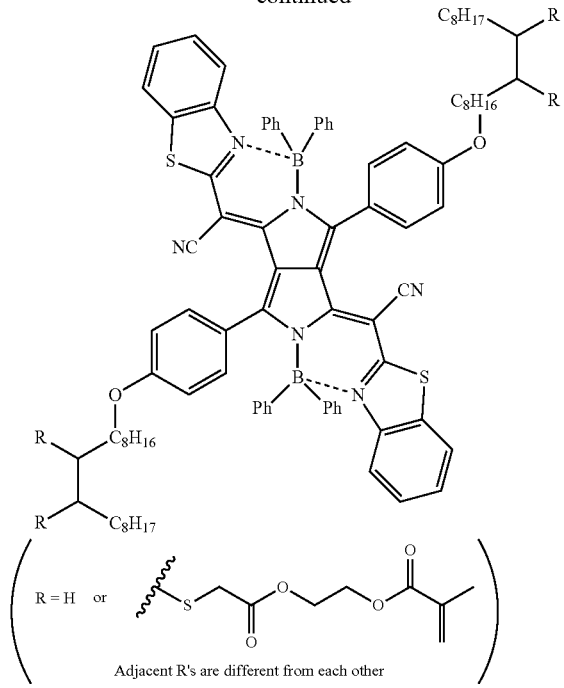

<<<Phthalocyanine Compound>>>

The phthalocyanine compound is preferably oxotitanyl phthalocyanine.

The oxotitanyl phthalocyanine is preferably a compound represented by Formula (PC).

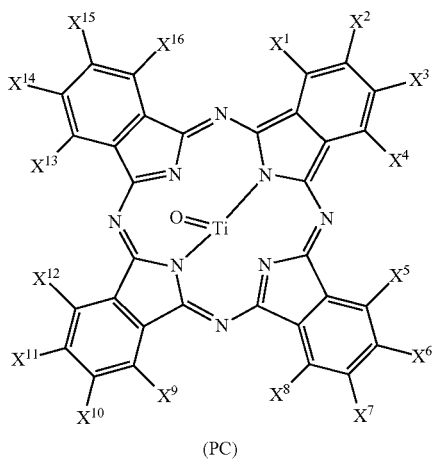

(PC)

In the formula, $X^1$ to $X^{16}$ each independently represent a hydrogen atom or a halogen atom.

The number of halogen atoms among $X^1$ to $X^{16}$ is preferably 0 to 16, more preferably 0 to 4, still more preferably 0 or 1, and particularly preferably 0.

The oxotitanyl phthalocyanine may be any one of an α type, a β type, and an γ type and is preferably an α type from the viewpoint of spectral characteristics.

<<<Naphthalocyanine Compound>>>

The naphthalocyanine compound is preferably oxovanadyl naphthalocyanine.

The oxovanadyl naphthalocyanine is preferably a compound represented by Formula (NPC).

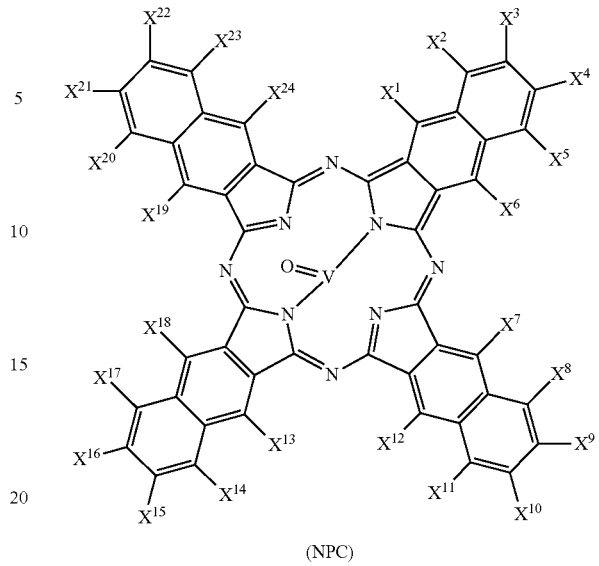

(NPC)

In the formula, $X^1$ to $X^{24}$ each independently represent a hydrogen atom or a halogen atom.

The number of halogen atoms among $X^1$ to $X^{24}$ is preferably 0 to 24, more preferably 0 to 4, still more preferably 0 or 1, and particularly preferably 0.

<<<Squarylium Compound>>>

The squarylium compound is preferably a compound represented by General Formula (1).

General Formula (1)

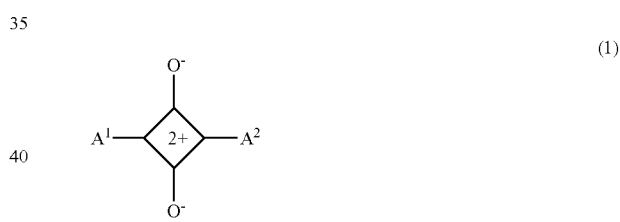

In General Formula (1), $A^1$ and $A^2$ each independently represent an aryl group, a heterocyclic group, or a group represented by General Formula (2).

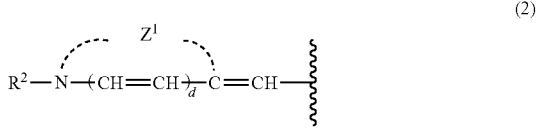

In General Formula (2), $Z^1$ represents a non-metal atomic group which forms a nitrogen-containing heterocycle, $R^2$ represents an alkyl group, an alkenyl group, or an aralkyl group, d represents 0 or 1, and a wave line represents a linking arm to General Formula (1).

In General Formula (1), $A^1$ and $A^2$ each independently represent an aryl group, a heterocyclic group, or a group represented by General Formula (2), and preferably a group represented by General Formula (2).

The number of carbon atoms in the aryl group represented by $A^1$ and $A^2$ is preferably 6 to 48, more preferably 6 to 24, and still more preferably 6 to 12. Specific examples include a phenyl group and a naphthyl group. In a case where the aryl group has a substituent, the number of carbon atoms in the aryl group denotes the number of carbon atoms excluding the number of carbon atoms in the substituent.

The heterocyclic group represented by $A^1$ and $A^2$ is preferably a 5- or 6-membered ring. In addition, the heterocyclic group is preferably a monocycle or a fused ring, more preferably a monocycle or a fused ring including 2 to 8 rings, still more preferably a monocycle or a fused ring including 2 to 4 rings, and particularly preferably a monocycle or a fused ring including 2 or 3 rings. Examples of a heteroatom included in the heterocyclic group include a nitrogen atom, an oxygen atom, and a sulfur atom, and the heteroatom is preferably a nitrogen atom or a sulfur atom. The number of heteroatoms is preferably 1 to 3 and more preferably 1 or 2. Specific examples include a heterocyclic group derived from a monocycle or a polycyclic aromatic ring such as a 5- or 6-membered ring containing at least one of a nitrogen atom, an oxygen atom, or a sulfur atom.

The aryl group and the heterocyclic group may have a substituent. Examples of the substituent include a halogen atom, a hydroxy group, a cyano group, a nitro group, an alkyl group, an alkenyl group, an alkynyl group, an aryl group, a heteroaryl group, an aralkyl group, an alkoxy group, an aryloxy group, a heteroaryloxy group, an alkylthio group, an arylthio group, a heteroarylthio group, $-NR^{a1}R^{a2}$, $COR^{a3}$, $-COOR^{a4}$, $-OCOR^{a5}$, $-NHCOR^{a6}$, $-CONR^{a7}R^{a8}$, $-NHCONR^{a9}R^{a10}$, $-NHCOOR^{a11}$, $-SO_2R^{a12}$, $-SO_2OR^{a13}$, $-NHSO_2R^{a14}$ and $SO_2NR^{a15}R^{a16}$. $R^{a1}$ to $R^{a16}$ each independently represent a hydrogen atom, an alkyl group, an alkenyl group, an alkynyl group, an aryl group, or a heteroaryl group.

Examples of the halogen atom include a fluorine atom, a chlorine atom, a bromine atom, and an iodine atom.

The number of carbon atoms in the alkyl group, the alkoxy group, and the arylthio group is preferably 1 to 20, more preferably 1 to 15, and still more preferably 1 to 8. The alkyl group may be linear, branched, or cyclic, and is preferably linear or branched.

The number of carbon atoms in the alkenyl group is preferably 2 to 20, more preferably 2 to 12, and still more preferably 2 to 8. The alkenyl group may be linear, branched, or cyclic, and is preferably linear or branched.

The number of carbon atoms in the alkynyl group is preferably 2 to 40, more preferably 2 to 30, and still more preferably 2 to 25. The alkynyl group may be linear, branched, or cyclic, and is preferably linear or branched.

The number of carbon atoms in the aryl group is preferably 6 to 30, more preferably 6 to 20, and still more preferably 6 to 12.

Examples of the aryl group included in the aryloxy group and the arylthio group are the above-mentioned groups, and preferable ranges thereof are also the same.

An alkyl moiety of the aralkyl group is the same as the above-described alkyl group. An aryl moiety of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring including 2 to 8 rings, and still more preferably a monocycle or a fused ring including 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12.

Examples of the heteroaryl group included in the heteroaryloxy group and the heteroarylthio group include the above-mentioned groups, and preferable ranges thereof are also the same.

A substituent which may be included in the aryl group and the heterocyclic group is preferably a halogen atom, an alkyl group, a hydroxy group, $-NR^{a1}R^{a2}$, or $-NHCOR^{a6}$.

In a case where the aryl group and the heterocyclic group have two or more substituents, the plurality of substituents may be the same as or different from each other.

Next, the group represented by General Formula (2) which is represented by $A^1$ and $A^2$ will be described.

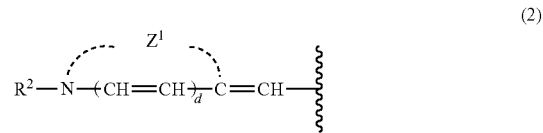

(2)

In General Formula (2), $Z^1$ represents a non-metal atomic group which forms a nitrogen-containing heterocycle, $R^2$ represents an alkyl group, an alkenyl group, or an aralkyl group, d represents 0 or 1, and a wave line represents a linking arm to General Formula (1).

In General Formula (2), $R^2$ represents an alkyl group, an alkenyl group, or an aralkyl group, and preferably an alkyl group.

The number of carbon atoms in the alkyl group is preferably 1 to 30, more preferably 1 to 20, still more preferably 1 to 12, and particularly preferably 2 to 8.

The number of carbon atoms in the alkenyl group is preferably 2 to 30, more preferably 2 to 20, and still more preferably 2 to 12.

The alkyl group and the alkenyl group may be linear, branched, or cyclic, and is preferably linear or branched.

The number of carbon atoms in the aralkyl group is preferably 7 to 30 and more preferably 7 to 20.

In General Formula (2), the nitrogen-containing heterocycle formed by $Z^1$ is preferably a 5- or 6-membered ring. In addition, the nitrogen-containing heterocycle is preferably a monocycle or a fused ring, more preferably a monocycle or a fused ring including 2 to 8 rings, still more preferably a monocycle or a fused ring including 2 to 4 rings, and particularly preferably a fused ring including 2 or 3 rings. In addition to a nitrogen atom, the nitrogen-containing heterocycle may include a sulfur atom. In addition, the nitrogen-containing heterocycle may have a substituent. Examples of the substituent include the substituents which may be included in the aryl group or the heterocyclic group as described above, and preferable ranges thereof are also the same. For example, a halogen atom, an alkyl group, a hydroxy group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

The group represented by General Formula (2) is preferably a group represented by General Formula (3) or (4).

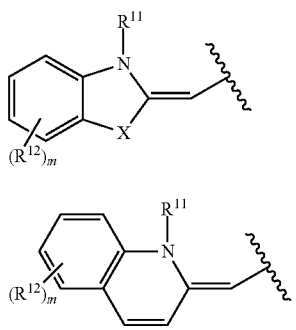

(3)

(4)

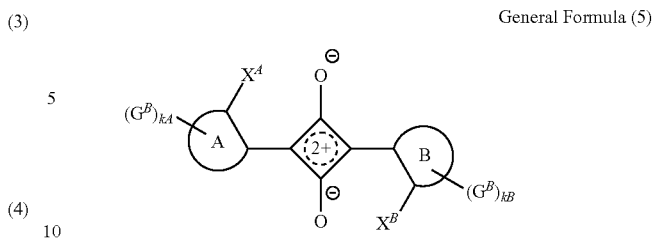

In General Formulae (3) and (4), $R^{11}$ represents an alkyl group, an alkenyl group, or an aralkyl group, $R^{12}$ represents a substituent, in a case where m represents 2 or more, $R^{12}$'s may be linked to each other to form a ring, X represents a nitrogen atom or $CR^{13}R^{14}$, $R^{13}$ and $R^{14}$ each independently represent a hydrogen atom or a substituent, m represents an integer of 0 to 4, and a wave line represents a linking arm to General Formula (1).

$R^{11}$ in General Formulae (3) and (4) has the same definition as $R^2$ in General Formula (2), and a preferred range thereof is also the same.

$R^{12}$ in General Formulae (3) and (4) represents a substituent. Examples of the substituent include the substituents which may be included in the aryl group or the heterocyclic group as described above. For example, a halogen atom, an alkyl group, a hydroxy group, —$NR^{a1}R^{a2}$ or —$NHCOR^{a6}$ is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

In a case where m is 2 or more, $R^{12}$'s may be linked to each other to form a ring. Examples of the ring include an alicyclic ring (a non-aromatic hydrocarbon ring), an aromatic ring, and a heterocycle. The ring may be a monocycle or a polycycle. In a case where substituents are linked to each other to form a ring, a linking group may be a divalent linking group selected from the group consisting of —CO—, —O—, —NH—, a divalent aliphatic group, a divalent aromatic group, and a combination thereof. For example, it is preferable that $R^{12}$'s may be linked to each other to form a benzene ring.

In General Formula (3), X represents a nitrogen atom or $CR^{13}R^{14}$, and $R^{13}$ and $R^{14}$ each independently represent a hydrogen atom or a substituent. Examples of the substituent include the substituents which may be included in the aryl group or the heterocyclic group as described above. For example, the substituent is an alkyl group. The number of carbon atoms in the alkyl group is preferably 1 to 20, more preferably 1 to 10, still more preferably 1 to 5, particularly preferably 1 to 3, and most preferably 1. The alkyl group is preferably linear or branched, and particularly preferably linear.

m represents an integer of 0 to 4, and is preferably 0 to 2.

It is preferable that the squarylium compound is a compound represented by General Formula (5).

General Formula (5)

In General Formula (5), a ring A and a ring B each independently represent an aromatic ring or a hetero-aromatic ring.

$X^A$ and $X^B$ each independently represent a substituent.

$G^A$ and $G^B$ each independently represent a substituent.

kA represents an integer of 0 to nA, and kB represents an integer of 0 to nB.

nA represents an integer representing the maximum number of $G^A$'s which may be substituted in the ring A, and nB represents an integer representing the maximum number of $G^B$'s which may be substituted in the ring B.

$X^A$ and $G^A$, or $X^B$ and $G^B$ may be bonded to each other to form a ring, and in a case where a plurality of $G^A$'s and a plurality of $G^B$'s are present, $G^A$'s and $G^B$'s may be bonded to each other to form rings, respectively.

$G^A$ and $G^B$ each independently represent a substituent. Examples of the substituent include the substituents which may be included in the aryl group or the heterocyclic group as described above.

$X^A$ and $X^B$ each independently represent a substituent. As the substituent, a group having active hydrogen is preferable, —OH, —SH, —COOH, —$SO_3H$, —$NR^{X1}R^{X2}$, —$NHCOR^{X1}$, —$CONR^{X1}R^{X2}$, —$NHCONR^{X1}R^{X2}$, —$NHCOOR^{X1}$, —$NHSO_2R^{X1}$, —$B(OH)_2$, or $PO(OH)_2$ is more preferable, —OH, —SH, or $NR^{X1}R^{X2}$ is still more preferable, and —$NR^{X1}R^{X2}$ is particularly preferable.

$R^{X1}$ and $R^{X2}$ each independently represent a hydrogen atom or a substituent. Examples of the substituent include an alkyl group, an alkenyl group, an alkynyl group, an aryl group, and a heteroaryl group. The details of the alkyl group, the alkenyl group, the alkynyl group, the aryl group, and the heteroaryl group are the same as the ranges described above for the substituents which may be included in the aryl group or the heterocyclic group.

The ring A and the ring B each independently represent an aromatic ring or a hetero-aromatic ring. The aromatic ring and the hetero-aromatic ring may be a monocycle or a fused ring. Specific examples of the aromatic ring and the hetero-aromatic ring include a benzene ring, a naphthalene ring, a pentalene ring, an indene ring, an azulene ring, a heptalene ring, an indecene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring, with the benzene ring or the naphthalene ring being preferable. The aromatic ring may be unsubstituted or may have a substituent. Examples of the substituent include the substituents which may be included in the aryl group or the heterocyclic group as described above.

$X^A$ and $G^A$, or $X^B$ and $G^B$ may be bonded to each other to form a ring, and in a case where a plurality of $G^A$'s and $G^B$'s are present, they may be bonded to each other, respectively, to form a ring.

The ring is preferably a 5- or 6-membered ring. The ring may be a monocycle or a polycycle.

In a case where $X^A$ and $G^A$, or $X^B$ and $G^B$, $G^A$'s or $G^{B_1}$ are bonded to each other to form a ring, the groups may be directly bonded to each other to form a ring, or may be bonded to each other through a divalent linking group selected from the group consisting of an alkylene group, —CO—, —O—, —NH—, —BR—, and a combination thereof to form a ring. It is preferable that $X^A$ and $G^A$, or $X^B$ and $G^B$, $G^A$'s or $G^{B_1}$ are bonded to each other through —BR— to form a ring.

R represents a hydrogen atom or a substituent. Examples of the substituent include the substituents described for $G^A$ and $G^B$.

kA represents an integer of 0 to nA, kB represents an integer of 0 to nB, nA represents an integer representing the maximum number of $G^A$'s which may be substituted in the ring A, and nB represents an integer representing the maximum number of $G^B$'s which may be substituted in the ring B.

kA and kB are each independently preferably an integer of 0 to 4, more preferably 0 to 2, and still more preferably 0 or 1.

Specific examples of the squarylium compound are as follows. Other examples of the squarylium compound include a compound described in paragraph Nos. 0044 to 0049 of JP2011-208101A and a compound described in paragraph Nos. 0072 to 0079 of JP2015-40895A, the contents of which are incorporated herein by reference.

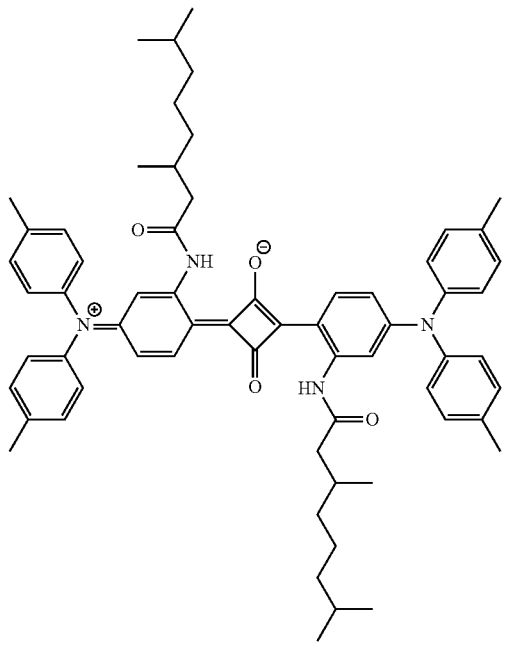

Q-2

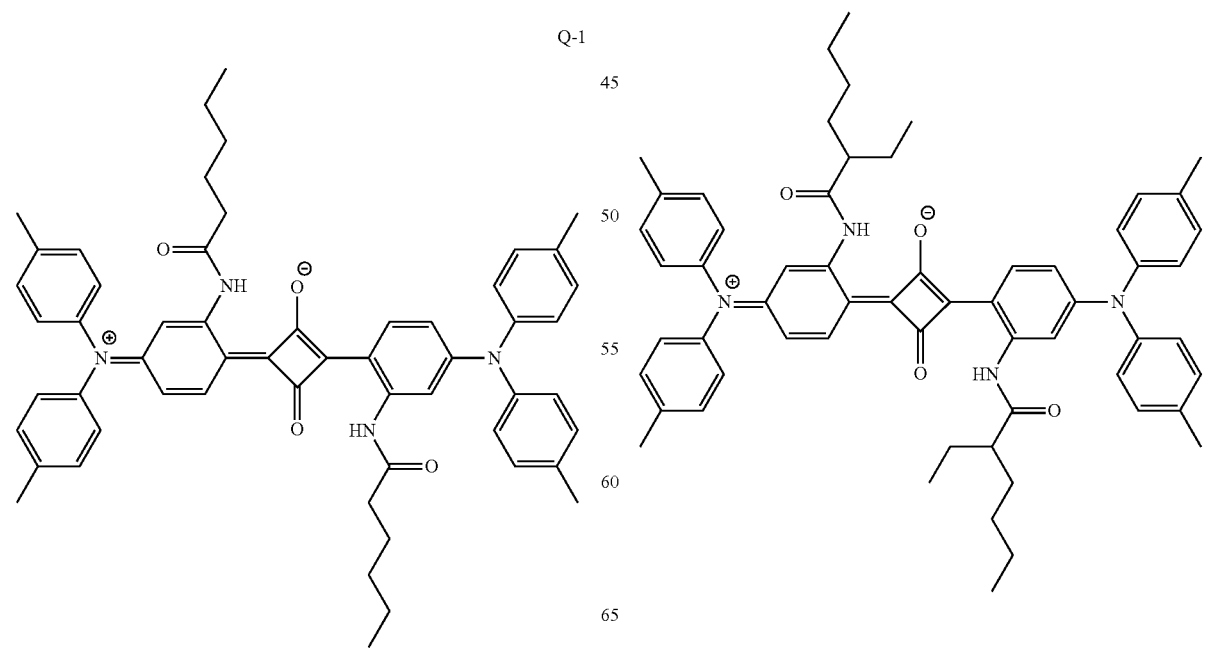

Q-1

Q-3

-continued
Q-4
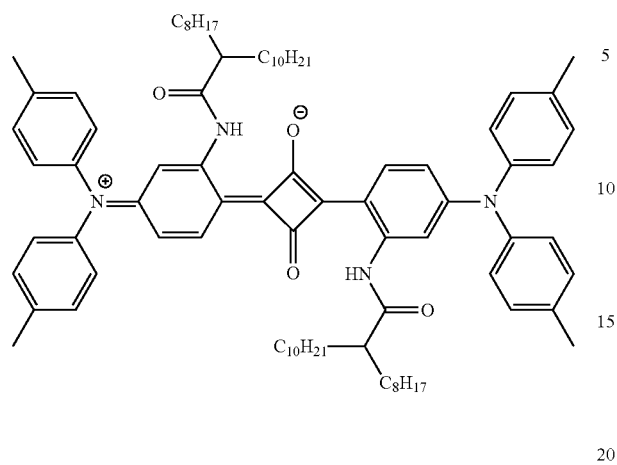
Q-5
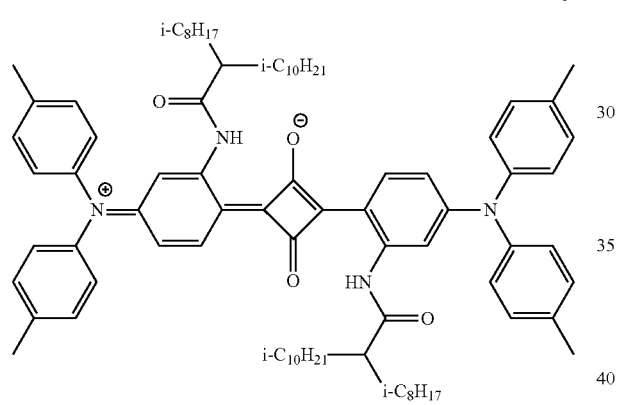
Q-6
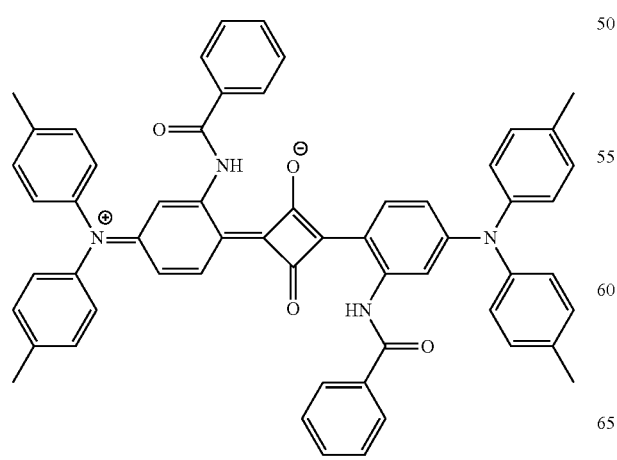
-continued
Q-7
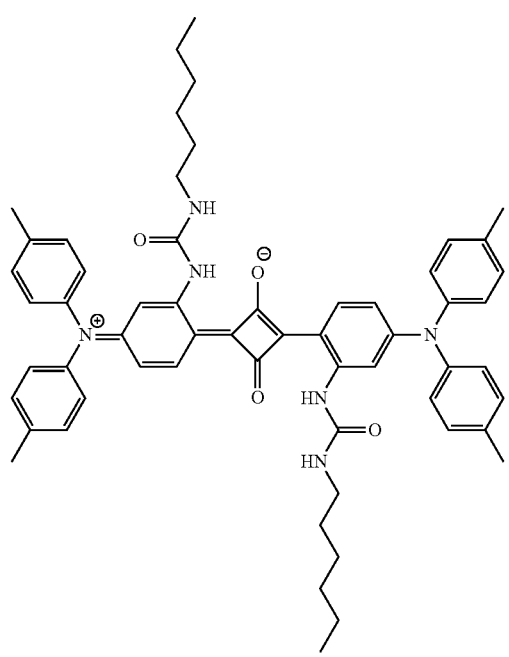
Q-8
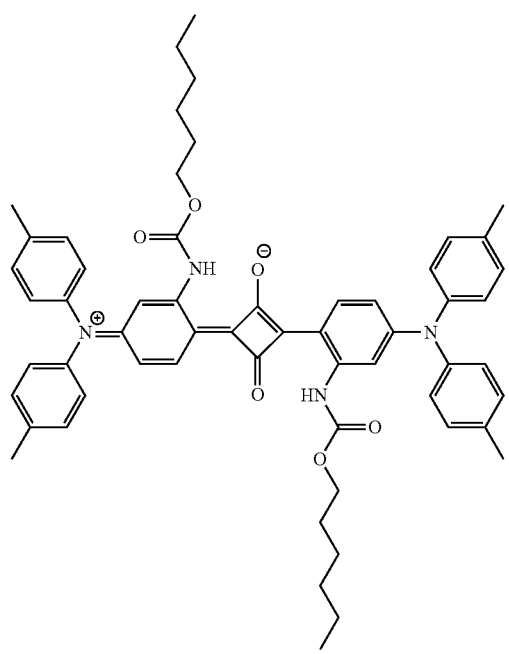

Q-9
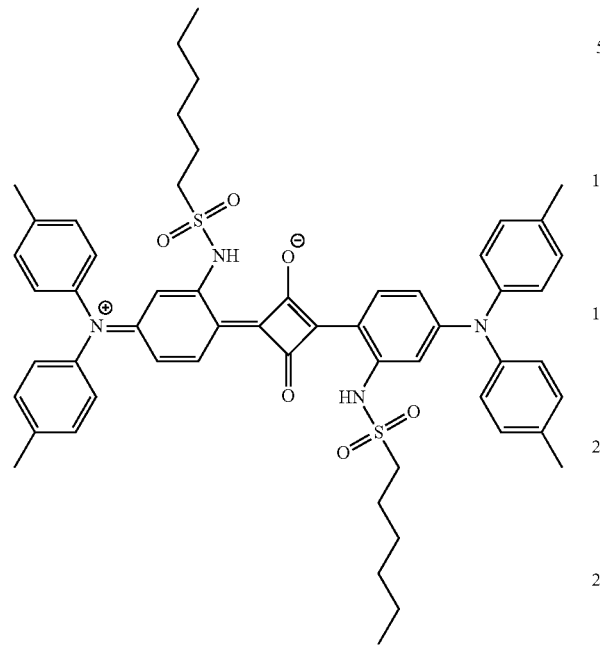
Q-10
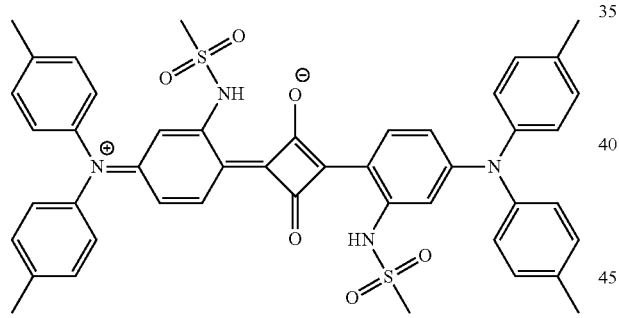
Q-11
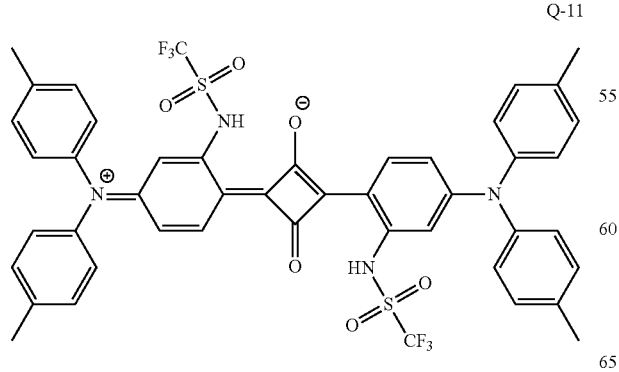
Q-12
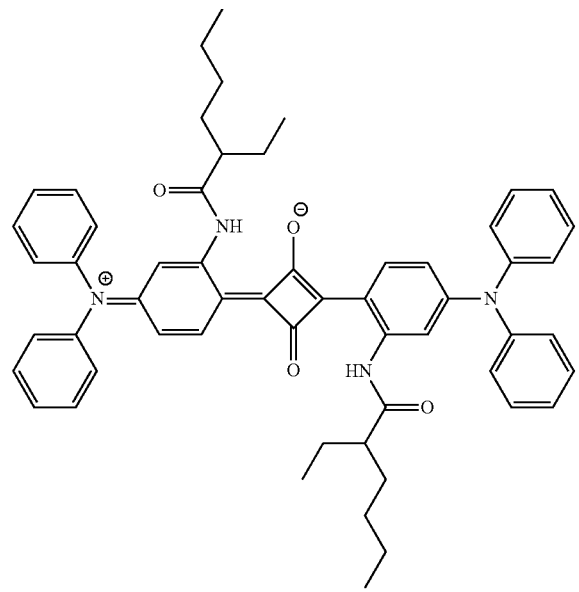
Q-13
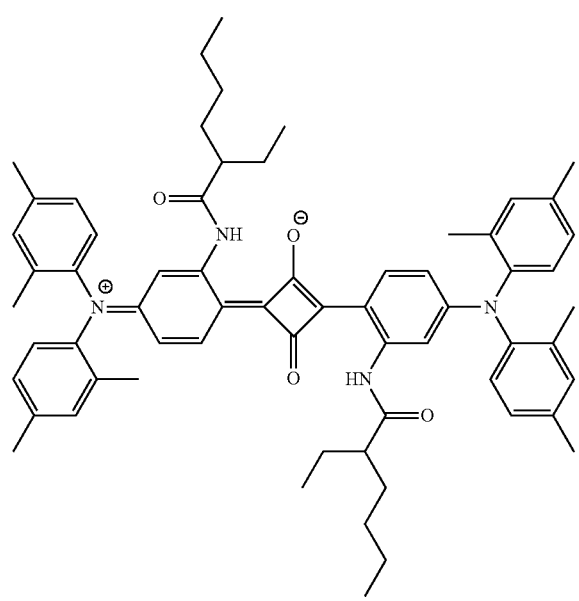

Q-14
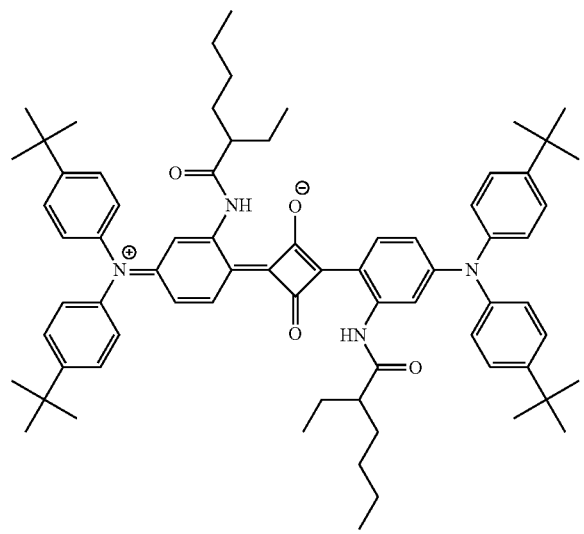
Q-15
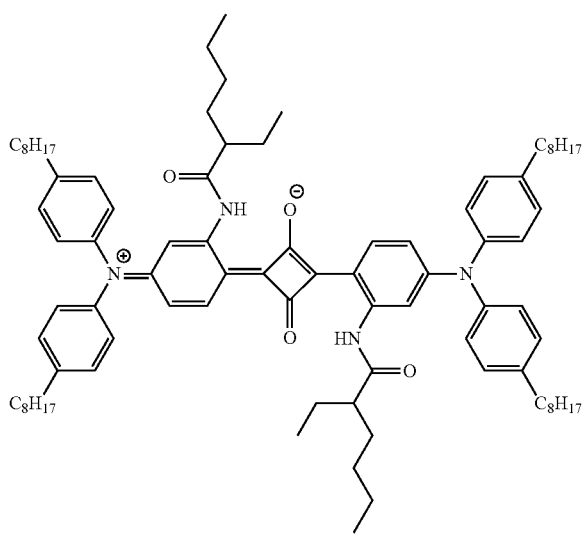
Q-16
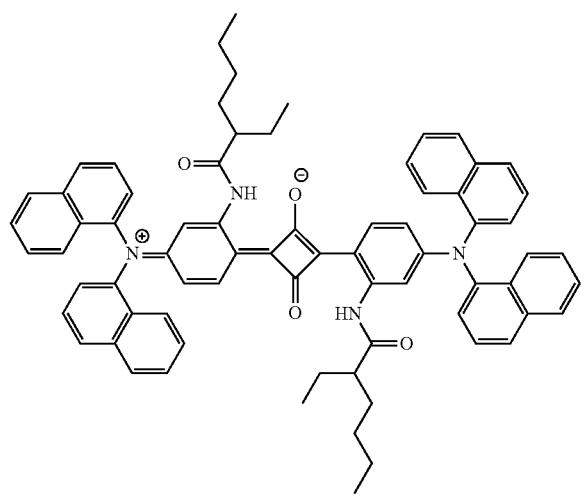
Q-17
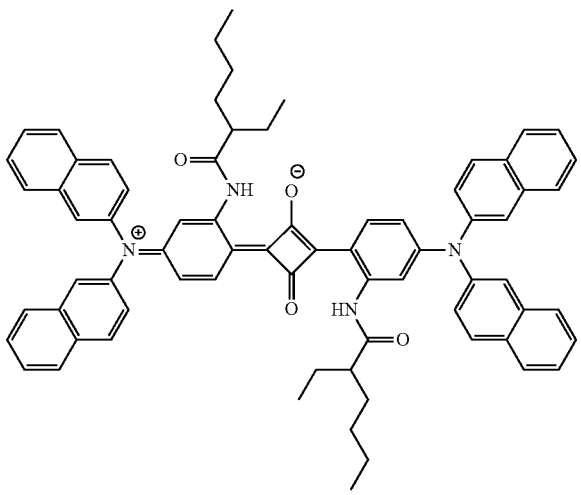
Q-18
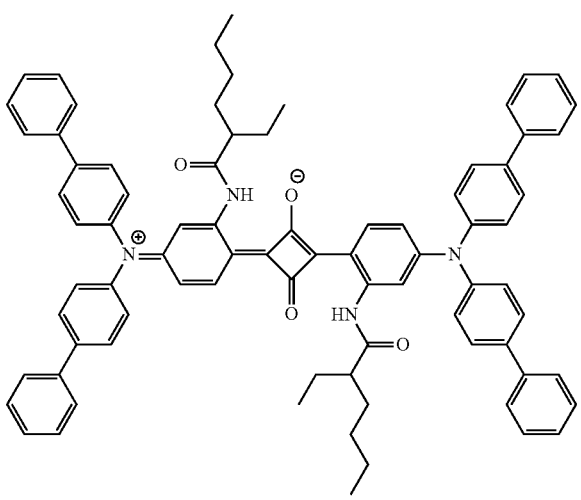
Q-19
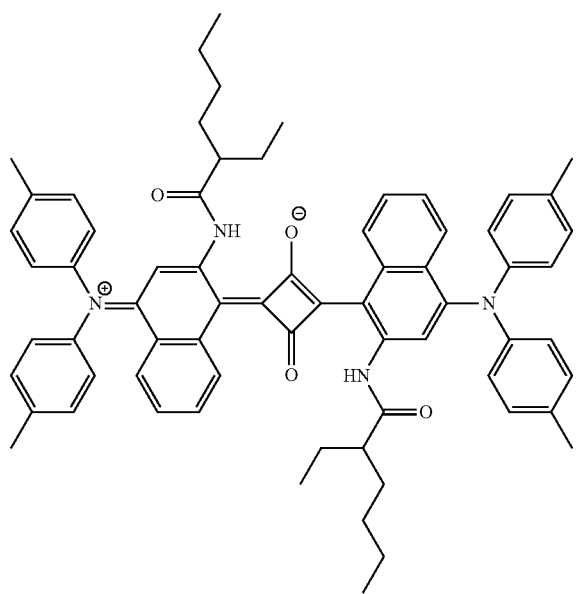

Q-20
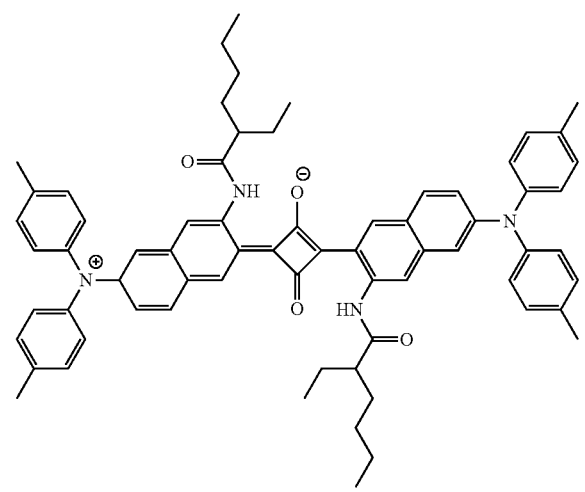
Q-21
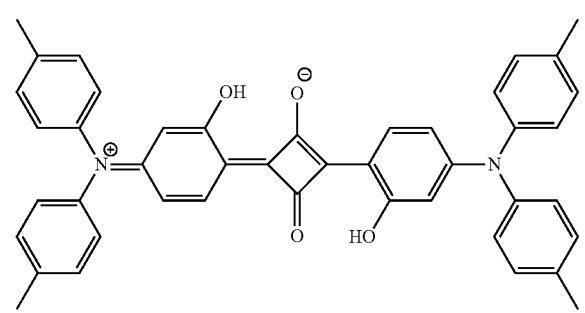
Q-22
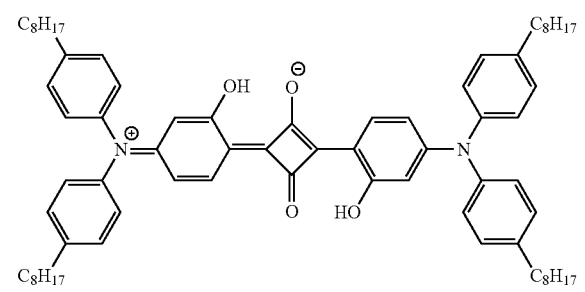
Q-23
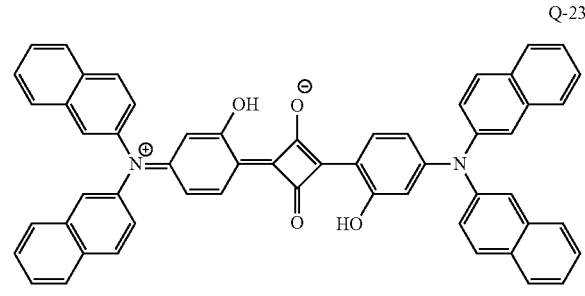
Q-24
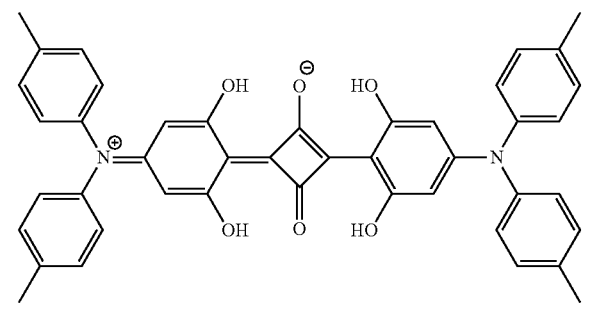
Q-25
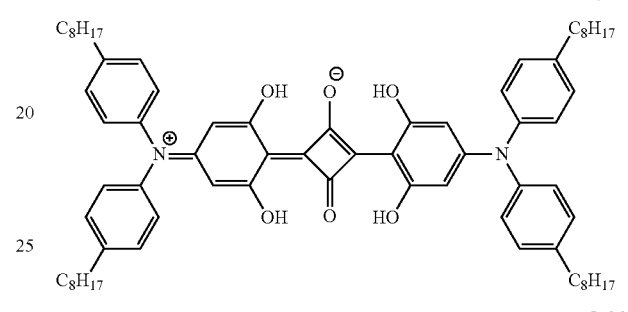
Q-26
Q-27
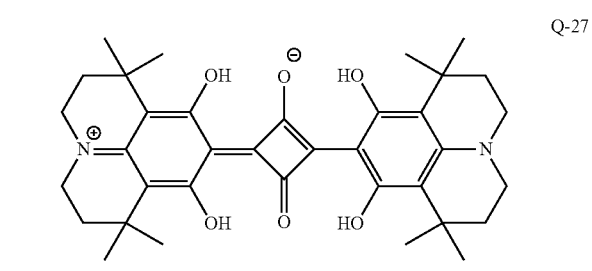
Q-28
Q-29

Q-30
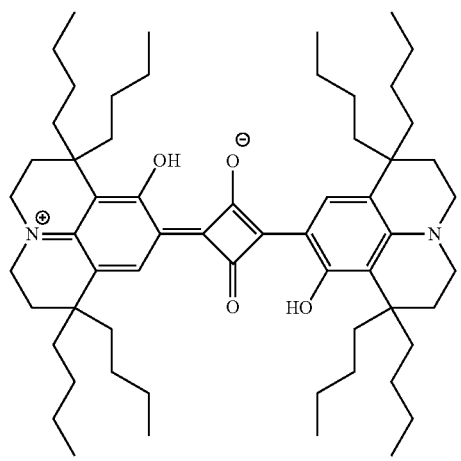
Q-31
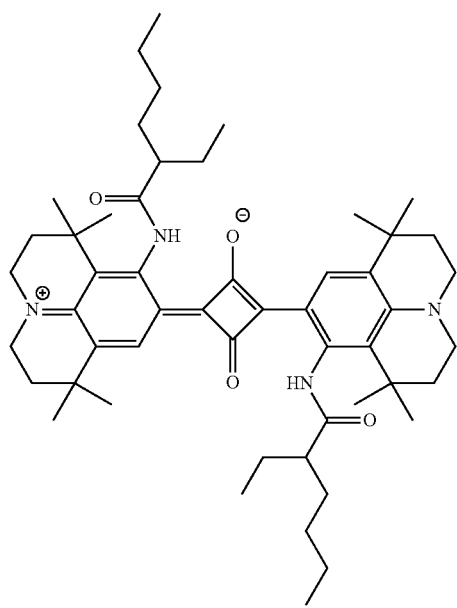
Q-32
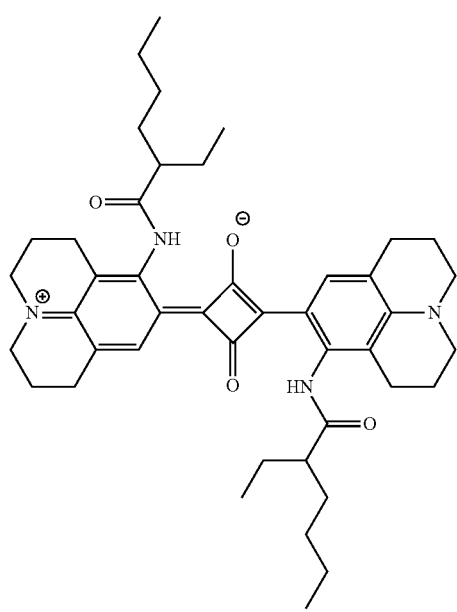
Q-33
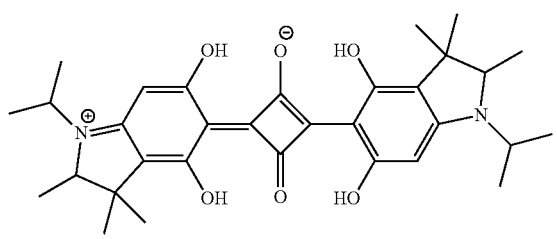
Q-34
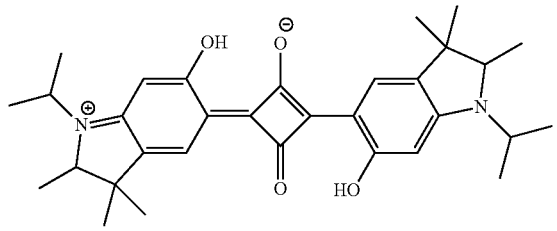
Q-35
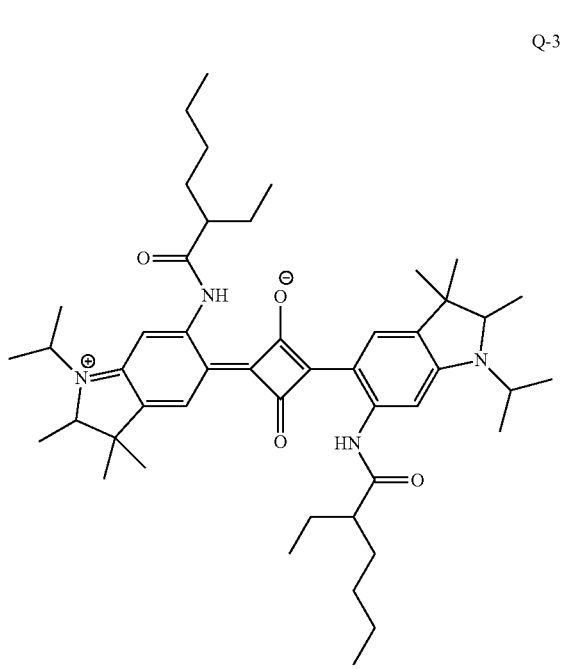

Q-36
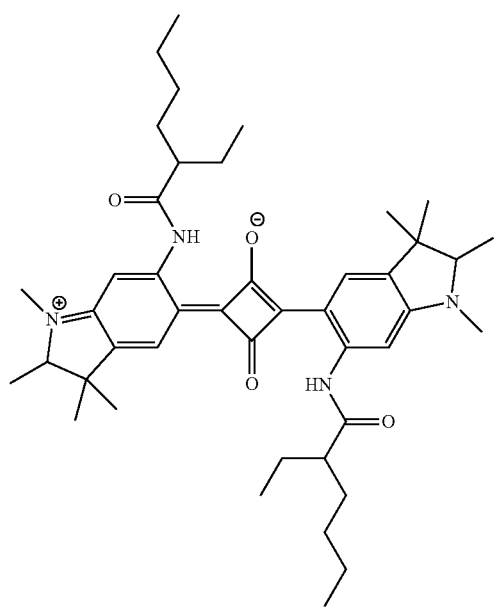
Q-37
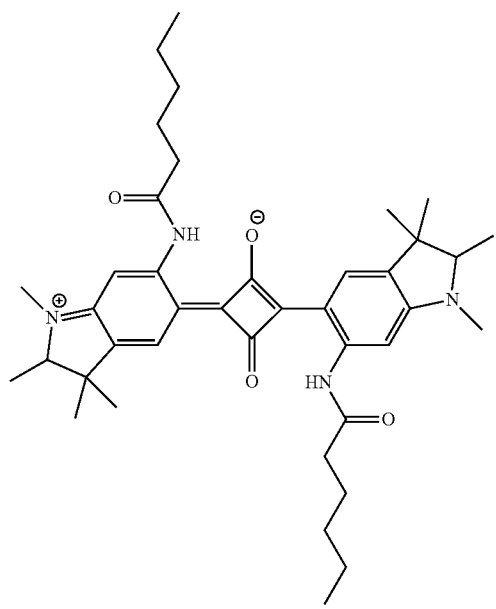
Q-38
Q-39
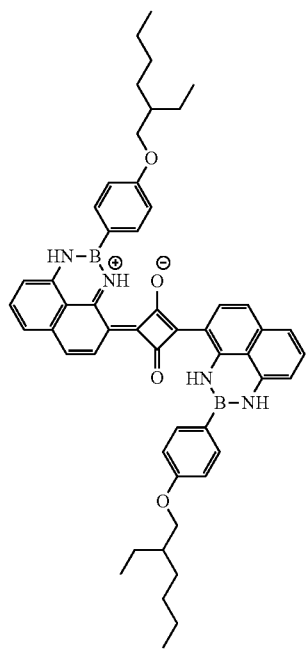
Q-40
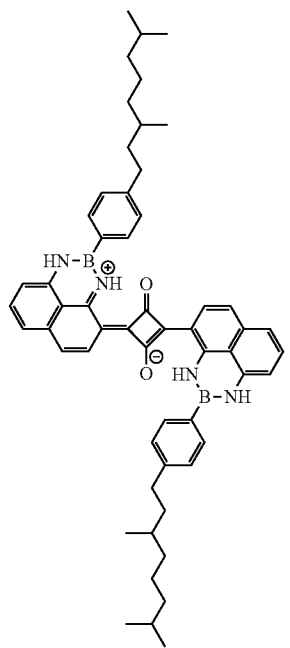

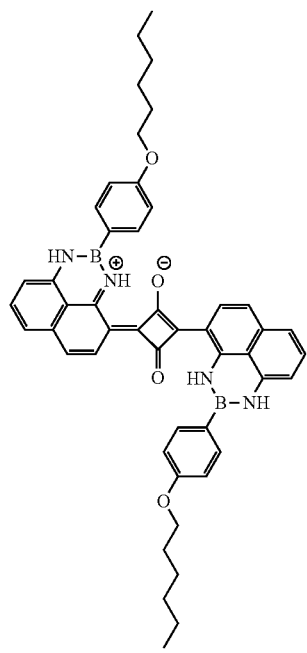
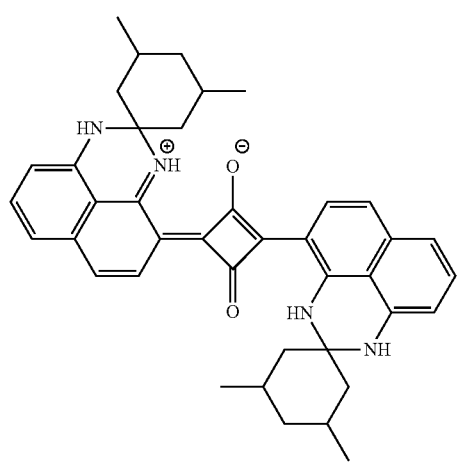
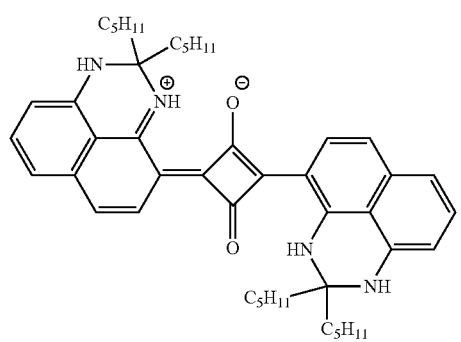
Q-41
Q-42
Q-43
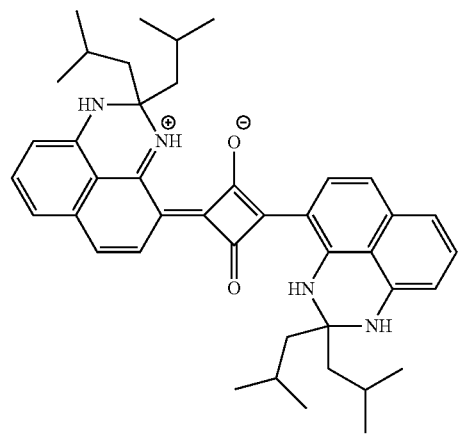
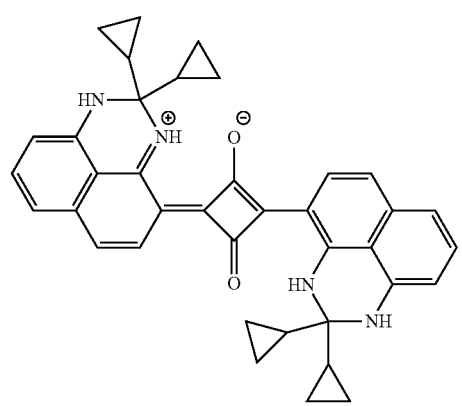
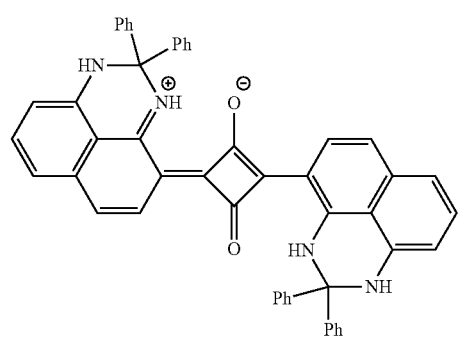
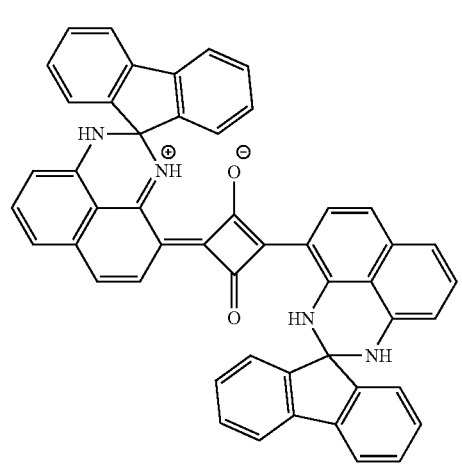
Q-44
Q-45
Q-46
Q-47

Q-48
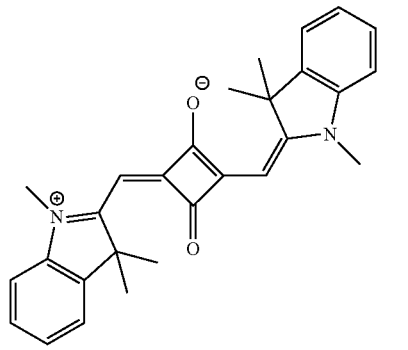
Q-49
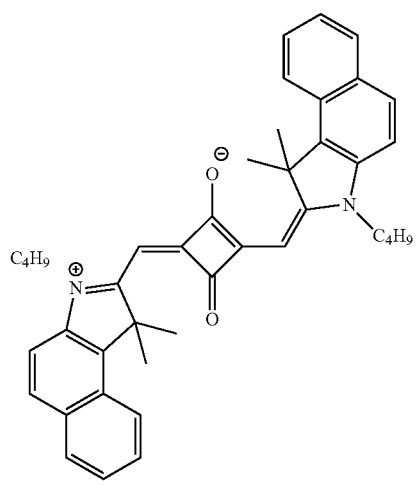
Q-50
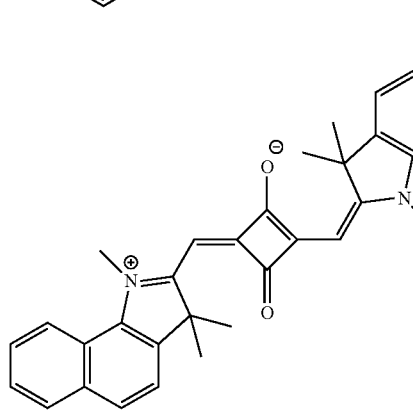
Q-51
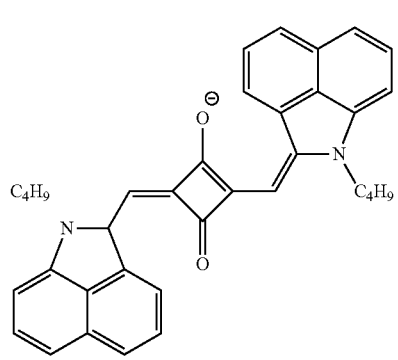
Q-52
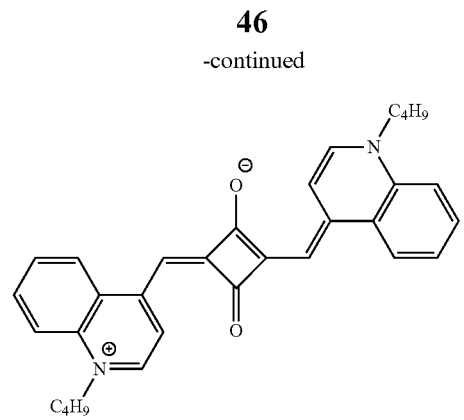
Q-53
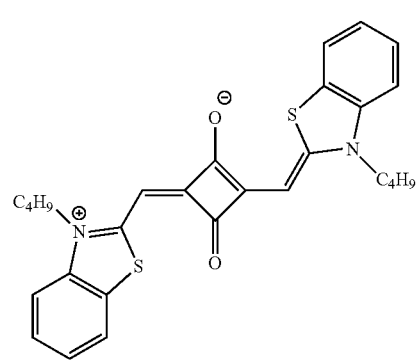
Q-54
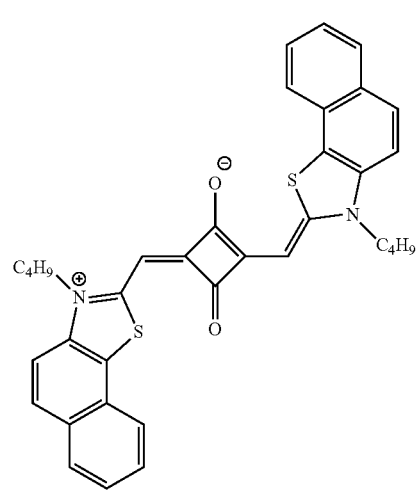
Q-55
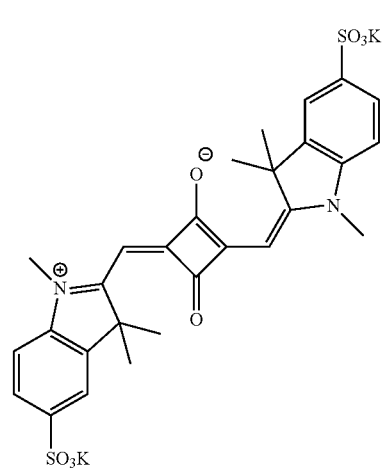

-continued
Q-56
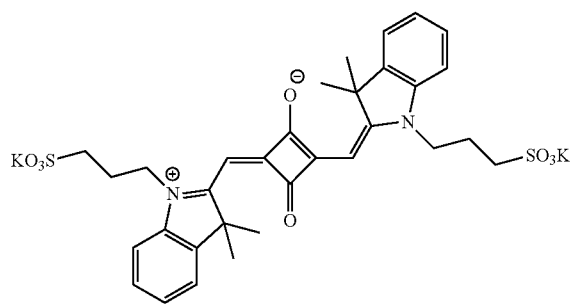
Q-57
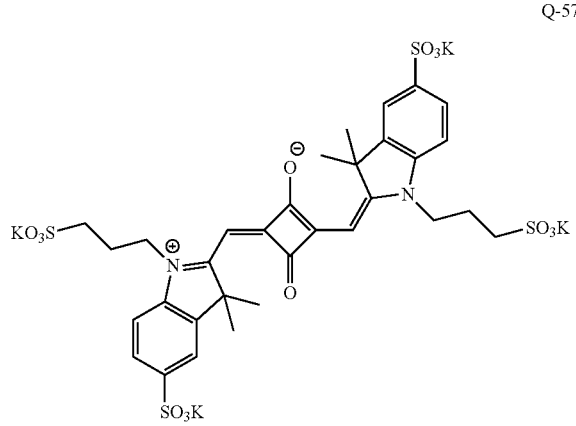
Q-58
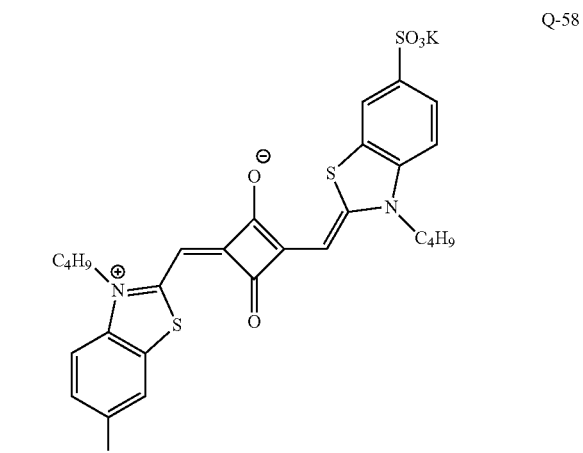
Q-59
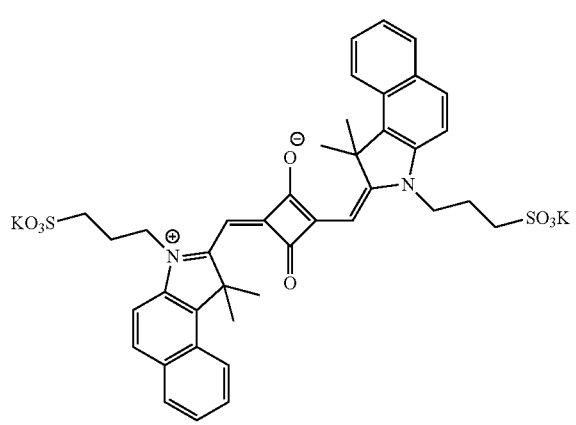
-continued
Q-60
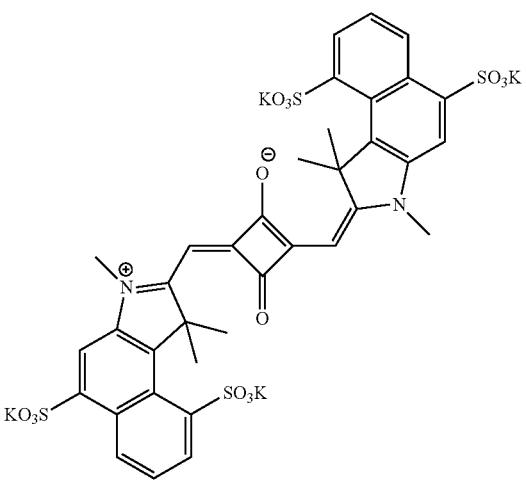
Q-61
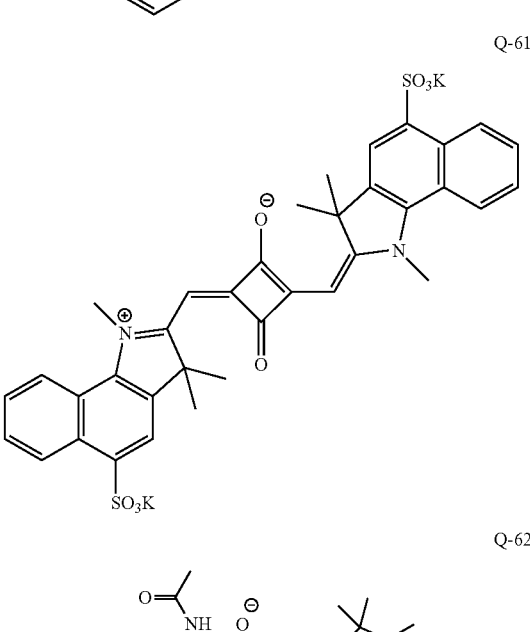
Q-62
Q-63
<<<Cyanine Compound>>>
The cyanine compound is preferably a compound represented by General Formula (10).

General Formula (10)

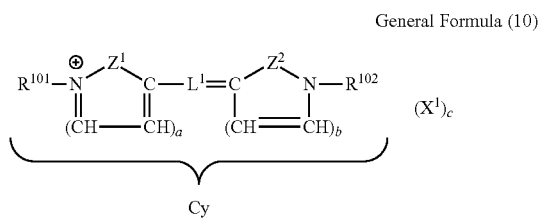

In the formula, $Z^1$ and $Z^2$ are each independently a non-metal atomic group for forming a 5- or 6-membered nitrogen-containing heterocycle which may be fused, $R^{101}$ and $R^{102}$ each independently represent an alkyl group, an alkenyl group, an alkynyl group, an aralkyl group, or an aryl group, $L^1$ represents a methine chain including an odd number of methine groups, a and b each independently represent 0 or 1, in a case where a represents 0, a carbon atom and a nitrogen atom are bonded through a double bond; and in a case where b represents 0, a carbon atom and a nitrogen atom are bonded through a single bond, and in a case where a site represented by Cy in the formula is a cationic site, $X^1$ represents an anion, and c represents the number of $X^1$'s for balancing charge; in a case where a site represented by Cy in the formula is an anion site, $X^1$ represents a cation, and c represents the number of $X^1$'s for balancing charge; and in a case where charge of a site represented by Cy in the formula is neutralized in a molecule, c is 0.

$Z^1$ and $Z^2$ each independently represent a non-metal atomic group for forming a 5- or 6-membered nitrogen-containing heterocycle which may be fused.

Another heterocycle, an aromatic ring, or an aliphatic ring may be fused to the nitrogen-containing heterocycle. It is preferable that the nitrogen-containing heterocycle is a 5-membered ring. A structure in which a benzene ring or a naphthalene ring is fused to the 5-membered nitrogen-containing heterocycle is more preferable. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazol ring, an indolenine ring, a benzoindolenine ring, an imidazole ring, a benzoimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring, and the nitrogen-containing heterocycle is preferably a quinoline ring, an indolenine ring, a benzoindolenine ring, a benzoxazole ring, a benzothiazole ring, or a benzoimidazole ring, and more preferably an indolenine ring, a benzothiazole ring, or a benzoimidazole ring.

The nitrogen-containing heterocycle and a ring fused thereto may have a substituent. Examples of the substituent include a halogen atom, a cyano group, a nitro group, an alkyl group, an alkenyl group, an alkynyl group, an aralkyl group, an aryl group, a heteroaryl group, $-OR^{c1}$, $-COR^{c2}$, $-COOR^{c3}$, $-OCOR^{c4}$, $-NR^{c5}R^{c6}$, $-NHCOR^{c7}$, $-CONR^{c8}R^{c9}$, $-NHCONR^{c10}R^{c11}$, $-NHCOOR^{c12}$, $-SR^{c13}$, $-SO_2R^{c14}$, $-SO_2OR^{c15}$, $-NHSO_2R^{c16}$, and $SO_2NR^{c17}R^{c18}$. $R^{c1}$ to $R^{c18}$ each independently represent a hydrogen atom, an alkyl group, an alkenyl group, an alkynyl group, an aryl group, or a heteroaryl group. In a case where $R^{c3}$ in $-COOR^{c3}$ represents a hydrogen atom (that is, a carboxy group), the hydrogen atom may be dissociable (that is, a carbonate group) or may be in the form of a salt. In a case where $R^{c15}$ in $-SO_2OR^{c15}$ represents a hydrogen atom (that is, a sulfo group), the hydrogen atom may be dissociable (that is, a sulfonate group) or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 12, and still more preferably 1 to 8. The alkyl group may be linear, branched, or cyclic. The alkyl group may be unsubstituted or may have a substituent. Examples of the substituent include a halogen atom, a hydroxy group, a carboxy group, a sulfo group, an alkoxy group, and an amino group, and the substituent is preferably a carboxy group or a sulfo group, and more preferably a sulfo group. In the carboxy group and the sulfo group, a hydrogen atom may be dissociable or may be in the form of a salt.

The number of carbon atoms in the alkenyl group is preferably 2 to 20, more preferably 2 to 12, and still more preferably 2 to 8. The alkenyl group may be linear, branched, or cyclic. The alkenyl group may be unsubstituted or may have a substituent. Examples of the substituent include the substituents which may be included in the alkyl group as described above, and a preferable range thereof is also the same.

The number of carbon atoms in the alkynyl group is preferably 2 to 20, more preferably 2 to 12, and still more preferably 2 to 8. The alkynyl group may be linear, branched, or cyclic. The alkynyl group may be unsubstituted or may have a substituent. Examples of the substituent include the substituents which may be included in the alkyl group as described above, and a preferable range thereof is also the same.

The number of carbon atoms in the aryl group is preferably 6 to 25, more preferably 6 to 15, and still more preferably 6 to 10. The aryl group may be unsubstituted or may have a substituent. Examples of the substituent include the substituents which may be included in the alkyl group as described above, and a preferable range thereof is also the same.

An alkyl moiety of the aralkyl group is the same as the above-described alkyl group. An aryl moiety of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring including 2 to 8 rings, and still more preferably a monocycle or a fused ring including 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12. The heteroaryl group may have a substituent or may be unsubstituted. Examples of the substituent include the substituents which may be included in the alkyl group as described above, and preferable ranges thereof are also the same.

$R^{101}$ and $R^{102}$ each independently represent an alkyl group, an alkenyl group, an alkynyl group, an aralkyl group, or an aryl group. Examples of the alkyl group, the alkenyl group, the alkynyl group, the aralkyl group, and the aryl group include the groups as described above for the substituents, and preferable ranges thereof are also the same. The alkyl group, the alkenyl group, the alkynyl group, the aralkyl group, and the aryl group may have a substituent or may be unsubstituted. Examples of the substituent include a halogen atom, a hydroxy group, a carboxy group, a sulfo group, an alkoxy group, and an amino group, and the substituent is preferably a carboxy group or a sulfo group, and more preferably a sulfo group. In the carboxy group and the sulfo group, a hydrogen atom may be dissociable or may be in the form of a salt.

$L^1$ represents a methine chain including an odd number of methine groups. $L^1$ is preferably a methine chain including 3, 5, or 7 methine groups.

The methine group may have a substituent. It is preferable that the methine group having a substituent is a methine group positioned at the center (meso position). Specific examples of the substituent include a substituent which may be included in the nitrogen-containing heterocycle represented by $Z^1$ and $Z^2$, and a group represented by Formula (a). In addition, two substituents in the methine chain may be bonded to each other to form a 5- or 6-membered ring.

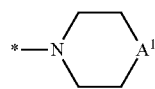

(a)

In Formula (a), * represents a linking portion to the methine chain, and $A^1$ represents an oxygen atom or a sulfur atom.

a and b each independently represent 0 or 1. In a case where a is 0, a carbon atom and a nitrogen atom are bonded through a double bond. In a case where b is 0, a carbon atom and a nitrogen atom are bonded through a single bond. It is preferable that both a and b are 0. In a case where both a and b are 0, General Formula (10) is shown as below.

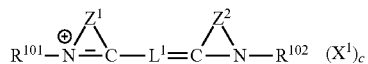

In a case where in General Formula (10), a site represented by Cy in the formula is a cationic moiety, $X^1$ represents an anion, and c represents the number of $X^1$'s for balancing charge. Examples of the anion include an halide ion (Cl⁻, Br⁻, I⁻), a para-toluenesulfonate ion, an ethyl sulfate ion, $PF_6^-$, $BF_4^-$ or $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), a tetracyanoborate anion, and an anion represented by Formula A.

Formula A

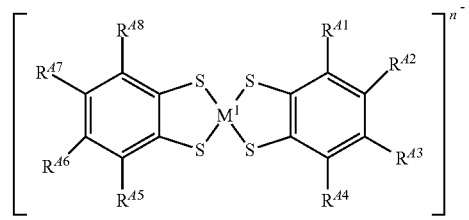

$M^1$ represents a transition metal, n represents an integer of 1 or 2, and $R^{41}$ to $R^{48}$ each independently represent a hydrogen atom or a substituent.

Examples of the transition metal include Cu, Co, Ni, Fe, Pd, Pt, Ti, V, Zn, Ru, Rh, and Zr, and the transition metal is preferably Cu, Co, Ni, Fe, Pd, or Pt, and more preferably Cu or Ni.

Examples of the substituent include a halogen atom, a cyano group, a nitro group, an alkyl group, an alkenyl group, an alkynyl group, an aralkyl group, an aryl group, a heteroaryl group, $-OR^{201}$, $-COR^{202}$, $-COOR^{203}$, $-OCOR^{204}$, $-NR^{205}R^{2006}$, $-NHCOR^{207}$, $-CONR^{208}R^{209}$, $-NHCONR^{210}R^{211}$, $-NHCOOR^{212}$, $-SR^{213}$, $-SO_2R^{214}$, $-SO_2OR^{215}$, $-NHSO_2R^{216}$, or $SO_2NR^{217}R^{218}$. $R^{201}$ to $R^{218}$ each independently represent a hydrogen atom, an alkyl group, an alkenyl group, an alkynyl group, an aryl group, or a heteroaryl group. In a case where $R^{203}$ in $-COOR^{203}$ represents a hydrogen atom (that is, a carbonate group), the hydrogen atom may be dissociable (that is, a sulfonate group) or may be in the form of a salt. In a case where $R^{215}$ in $-SO_2OR^{215}$ represents a hydrogen atom (that is, a sulfo group), the hydrogen atom may be dissociable or may be in the form of a salt. Examples of the alkyl group, the alkenyl group, the alkynyl group, the aralkyl group, the aryl group, and the heteroaryl group include those described above for the substituents, and preferable ranges thereof are also the same.

In a case where a site represented by Cy in General Formula (10) is an anion site, $X^1$ represents a cation, and c represents the number of $X^1$'s for balancing charge. Examples of the cation include an alkali metal ion (Li⁺, Na⁺, K⁺, and the like), an alkali earth metal ion ($Mg^{2+}$, $Ca^{2+}$, $Ba^{2+}$, $Sr^{2+}$, and the like), a transition metal ion (Ag⁺, $Fe^{2+}$, $Co^{2+}$, $Ni^{2+}$, $Cu^{2+}$, $Zn^{2+}$, and the like), other metal ions (for example, $Al^{3+}$), an ammonium ion, a triethylammonium ion, a tributylammonium ion, a pyridinium ion, a tetrabutylammonium ion, a guanidinium ion, a tetramethylguanidium ion, and diazabicycloundecenium. As the cation, Na⁺, K⁺, $Mg^{2+}$, $Ca^{2+}$, $Zn^{2+}$, or diazabicycloundecenium is preferable.

In a case where a charge of a site represented by Cy in General Formula (10) is neutralized in a molecule, $X^1$ is not present. That is, c is 0.

It is also preferable that the compound represented by General Formula (10) is a compound represented by Formula (11) or (12). This compound has excellent heat resistance.

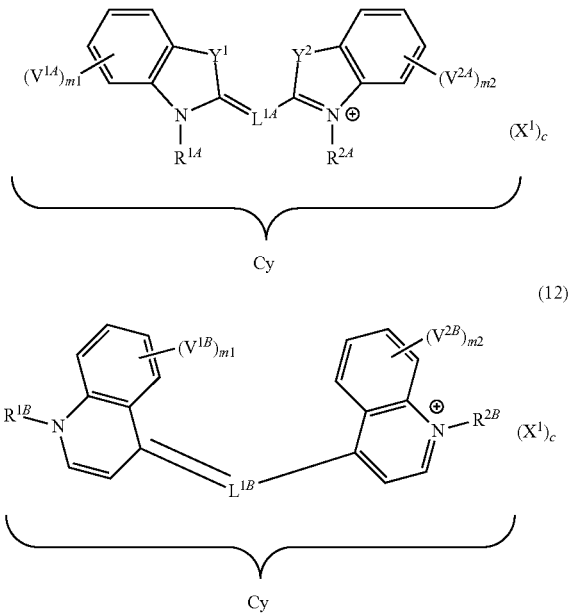

In Formulae (11) and (12), $R^{1A}$, $R^{2A}$, $R^{1B}$, and $R^{2B}$ each independently represent an alkyl group, an alkenyl group, an alkynyl group, an aralkyl group, or an aryl group.

$L^{1A}$ and $L^{1B}$ each independently represent a methine chain including an odd number of methine groups.

$Y^1$ and $Y^2$ each independently represent —S—, —O—, —$NR^{X1}$—, or —$CR^{X2}R^{X3}$—.

$R^{x1}$, $R^{x2}$, and $R^{x3}$ each independently represent a hydrogen atom or an alkyl group.

$V^{1A}$, $V^{2A}$, $V^{1B}$, and $V^{2B}$ each independently represent a halogen atom, a cyano group, a nitro group, an alkyl group, an alkenyl group, an alkynyl group, an aralkyl group, an aryl group, a heteroaryl group, —$OR^{c1}$, —$COR^{c2}$, —$COOR^{c3}$, —$OCOR^{c4}$, —$NR^{c5}R^{c6}$, —$NHCOR^{c7}$, —$CONR^{c8}R^{c9}$, —$NHCONR^{c10}R^{c11}$, —$NHCOOR^{c12}$, —$SR^{c13}$, —$SO_2R^{c14}$, —$SO_2OR^{c15}$, —$NHSO_2R^{c16}$, or $SO_2NR^{c17}R^{c18}$. $V^{1A}$, $V^{2A}$, $V^{1B}$, and $V^{2B}$ may form a fused ring.

$R^{c1}$ to $R^{c18}$ each independently represent a hydrogen atom, an alkyl group, an alkenyl group, an alkynyl group, an aryl group, or a heteroaryl group.

In a case where $R^{c3}$ of —$COOR^{c3}$ represents a hydrogen atom and in a case where $R^{c15}$ of —$SO_2OR^{c15}$ represents a hydrogen atom, the hydrogen atom may be dissociable or may be in the form of a salt.

m1 and m2 each independently represent 0 to 4.

In a case where a site represented by Cy in the formula is a cationic moiety, $X^1$ represents an anion, and c represents the number of $X^1$'s for balancing charge.

In a case where a site represented by Cy in the formula is an anion site, $X^1$ represents a cation, and c represents the number of $X^1$'s for balancing charge.

In a case where charge of a site represented by Cy in the formula is neutralized in a molecule, c is 0.

The groups represented by $R^{1A}$, $R^{2A}$, $R^{1B}$, and $R^{2B}$ have the same definitions as those of the alkyl group, the alkenyl group, the alkynyl group, the aralkyl group, and the aryl group described above for $R^{101}$ and $R^{102}$ of General Formula (10), and preferable ranges thereof are also the same. These groups may be unsubstituted or may have a substituent.

Examples of the substituent include a halogen atom, a hydroxy group, a carboxy group, a sulfo group, an alkoxy group, and an amino group, and the substituent is preferably a carboxy group or a sulfo group, and more preferably a sulfo group. In the carboxy group and the sulfo group, a hydrogen atom may be dissociable or may be in the form of a salt.

In a case where $R^{1A}$, $R^{2A}$, $R^{1B}$, and $R^{2B}$ represent an alkyl group, it is more preferable that the alkyl group is linear.

$Y^1$ and $Y^2$ each independently represent —S—, —O—, —$NR^{X1}$—, or —$CR^{X2}R^{X3}$—, and preferably —$NR^{X1}$—.

$R^{x1}$, $R^{x2}$, and $R^{x3}$ each independently represent a hydrogen atom or an alkyl group, and preferably an alkyl group. The number of carbon atoms in the alkyl group is preferably 1 to 10, more preferably 1 to 5, and still more preferably 1 to 3. The alkyl group may be linear, branched, or cyclic, and is preferably linear or branched and more preferably linear. The alkyl group is still more preferably a methyl group or an ethyl group.

$L^{1A}$ and $L^{1B}$ have the same definitions as those of $L^1$ in General Formula (10), and preferable ranges thereof are also the same.

The groups represented by $V^{1A}$, $V^{2A}$, $V^{1B}$, and $V^{2B}$ have the same definitions as those of the substituents which may be included in the nitrogen-containing heterocycle represented by $Z^1$ and $Z^2$ in General Formula (10), and preferable ranges thereof are also the same.

m1 and m2 each independently represent 0 to 4 and preferably 0 to 2.

The anion and the cation represented by $X^1$ have the same definitions as those described above for $X^1$ in General Formula (10), and preferable ranges thereof are also the same.

The compound represented by General Formula (10) is preferably a compound represented by any one of General Formulae (10-1) to (10-6).

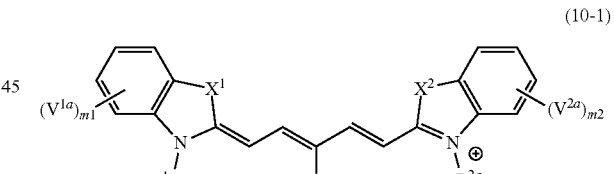

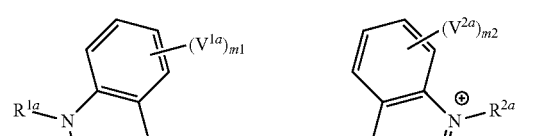

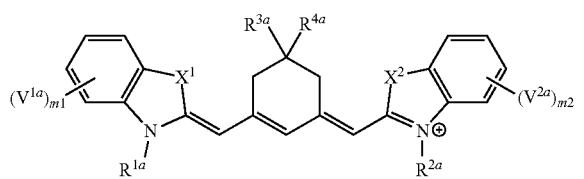

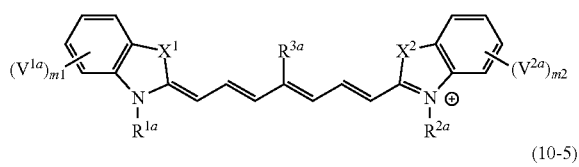

(10-4)

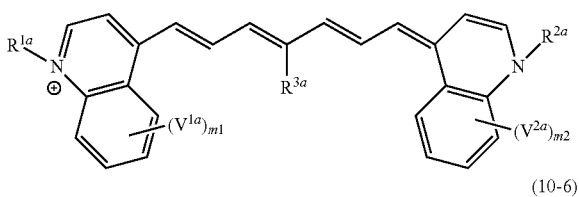

(10-5)

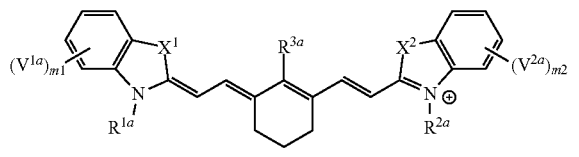

(10-6)

In Formulae (10-1) to (10-6), $R^{1a}$ and $R^{2a}$ each independently represent an alkyl group, an alkenyl group, an alkynyl group, an aralkyl group, or an aryl group.

$X^1$ and $X^2$ each independently represent —S—, —O—, —NR$^{X1}$—, or —CR$^{X2}$R$^{X3}$—.

$R^{x1}$, $R^{x2}$, and $R^{x3}$ each independently represent a hydrogen atom or an alkyl group.

$R^{3a}$ and $R^{4a}$ each independently represent a halogen atom, a cyano group, a nitro group, an alkyl group, an alkenyl group, an alkynyl group, an aralkyl group, an aryl group, a heteroaryl group, —OR$^{c1}$, —COR$^{c2}$, —COOR$^{c3}$, —OCOR$^{c4}$, —NR$^{c5}$R$^{c6}$, —NHCOR$^{c7}$, —NHCONR$^{c10}$R$^{c11}$, —NHCOOR$^{c12}$, —SR$^{c13}$, —SO$_2$R$^{c14}$, —SO$_2$OR$^{c15}$, —NHSO$_2$R$^{c16}$, —SO$_2$NR$^{c17}$R$^{c18}$, or a group represented by Formula (a).

$V^{1a}$ and $V^{2a}$ each independently represent a halogen atom, a cyano group, a nitro group, an alkyl group, an alkenyl group, an alkynyl group, an aralkyl group, an aryl group, a heteroaryl group, —OR$^{c1}$, —COR$^{c2}$, —COOR$^{c3}$, —OCOR$^{c4}$, —NR$^{c5}$R$^{c6}$, —NHCOR$^{c7}$, —CONR$^{c8}$R$^{c9}$, —NHCONR$^{c10}$R$^{c11}$, —NHCOOR$^{c12}$, —SR$^{c13}$, —SO$_2$R$^{c14}$, —SO$_2$OR$^{c15}$, —NHSO$_2$R$^{c16}$, or SO$_2$NR$^{c17}$R$^{c18}$.

$V^{1a}$ and $V^{2a}$ may form a fused ring.

$R^{c1}$ to $R^{c18}$ each independently represent a hydrogen atom, an alkyl group, an alkenyl group, an alkynyl group, an aryl group, or a heteroaryl group.

In a case where $R^{c3}$ of —COOR$^{c3}$ represents a hydrogen atom and in a case where $R^{c15}$ of —SO$_2$OR$^{c15}$ represents a hydrogen atom, the hydrogen atom may be dissociable or may be in the form of a salt.

m1 and m2 each independently represent 0 to 4.

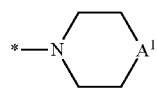

(a)

In Formula (a), * represents a linking portion to the methine chain, and $A^1$ represents an oxygen atom or a sulfur atom.

The groups represented by $R^{1a}$ and $R^{2a}$ have the same definitions those of $R^{1A}$ and $R^{1B}$ in General Formula (11), and preferable ranges thereof are also the same. In a case where $R^{1a}$ and $R^{2a}$ represent an alkyl group, it is more preferable that the alkyl group is linear.

$X^1$ and $X^2$ have the same definitions as those of $Y^1$ and $Y^2$ in General Formula (11), and preferable ranges thereof are also the same.

$R^{3a}$ and $R^{4a}$ have the same definitions as the ranges described for the substituents which may be included in $L^1$ described in General Formula (10), and a preferred aspect thereof is also the same.

The groups represented by $V^{1a}$ and $V^{2a}$ have the same definitions as the ranges described for the substituents which may be included in the nitrogen-containing heterocycle and the ring fused thereto described in General Formula (10), and preferred ranges thereof are also the same.

m1 and m2 each independently represent 0 to 4, and are preferably 0 to 2.

Specific examples of the compound represented by General Formula (10) are shown below. Further, in the following tables, Me represents a methyl group, Et represents an ethyl group, Bu represents a butyl group, Bn represents a benzyl group, Ph represents a phenyl group, PRS represents $C_3H_6SO_3^-$, and BUS represents $C_4H_9SO_3^-$. In addition, the numerical values added to structural formulae in the tables represent binding positions of $V^1$ and $V^2$.

In addition, other examples include the compounds described in paragraph Nos. 0044 and 0045 of JP2009-108267A, the compounds described in JP2014-214262A, the compounds described in paragraph Nos. 0051 to 0068 of JP2015-40895A, the contents of which are incorporated herein by reference.

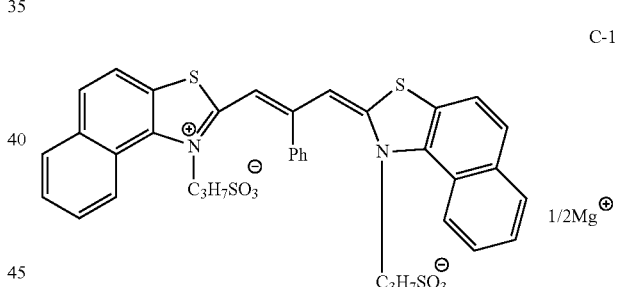

C-1

C-2

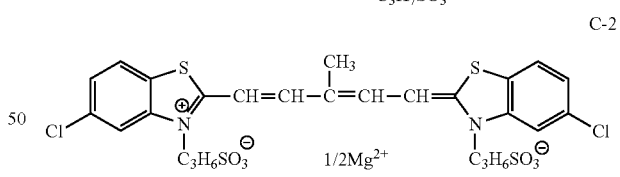

C-3

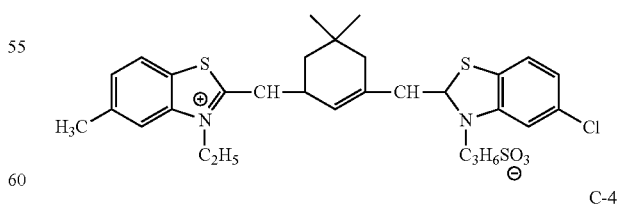

C-4

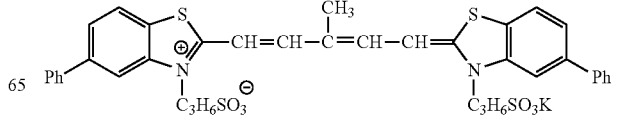

-continued

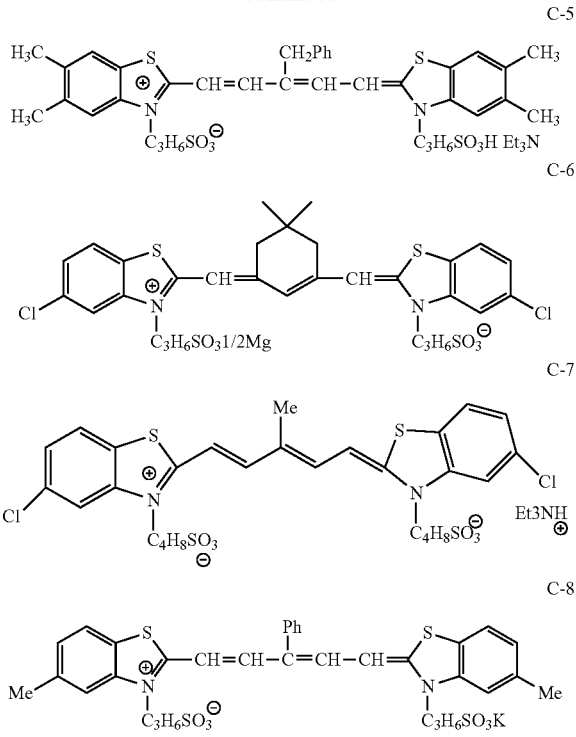

TABLE 1

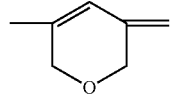

| Compound No. | R | L | V¹ | m | M |
|---|---|---|---|---|---|
| C-9 | PRS | (3-methyl-5-methylenecyclopent-2-enyl) | 5:Cl | 1 | K |
| C-10 | PRS | (3-methyl-5-methylene-3,6-dihydro-2H-pyran) | 5:Cl | 1 | K |
| C-11 | PRS | (2-methyl-3-phenyl-6-methylenecyclohex-1-enyl) | 6:Cl | 1 | K |
| C-12 | BUS | (2-methyl-3-phenyl-6-methylenecyclohex-1-enyl) | 5:COOH | 1 | K |
| C-13 | PRS | (3-methyl-5-methylenecyclopent-2-enyl) | 5:Cl | 1 | Na |
| C-14 | PRS | (3-methyl-5-methylenecyclopent-2-enyl) | 5:Cl | 1 | ½Mg |

TABLE 2

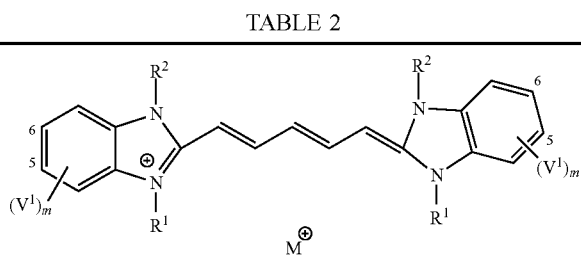

| Compound No. | R1 | R2 | V¹ | m | M |
|---|---|---|---|---|---|
| C-15 | PRS | Et | 5:Cl 6:Cl | 2 | Na |
| C-16 | PRS | Me | 5:Cl 6:Cl | 2 | K |
| C-17 | BUS | Et | 5:Cl 6:Cl | 2 | K |
| C-18 | BUS | CF3CH2 | 5:Cl 6:Cl | 2 | ½Ca |
| C-19 | PRS | Et | 5:Cl 6:Cl | 2 | K |
| C-20 | PRS | Et | 5:Cl 6:Cl | 2 | ½Mg |

TABLE 2-continued
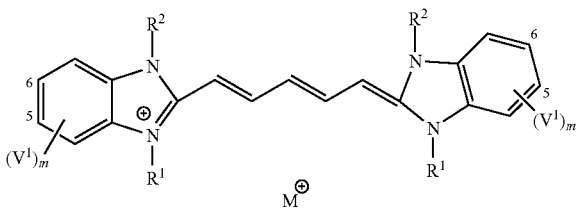
| Compound No. | R1 | R2 | V¹ | m | M |
|---|---|---|---|---|---|
| C-21 | BUS | Et | 5:Cl<br>6:Cl | 2 | Na |
| C-22 | PRS | Me | 5:Cl<br>6:Cl | 2 | 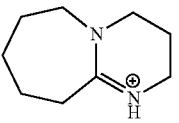 |
| C-23 | PRS | 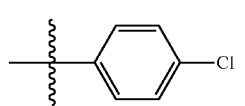 | 5:Cl<br>6:Cl | 2 | Na |
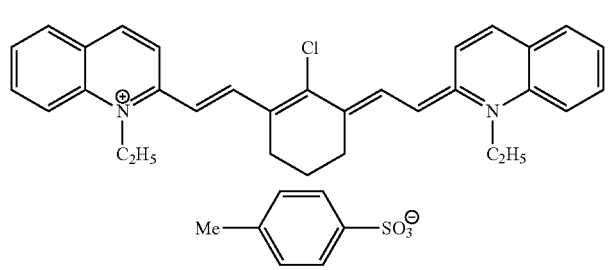
C-24
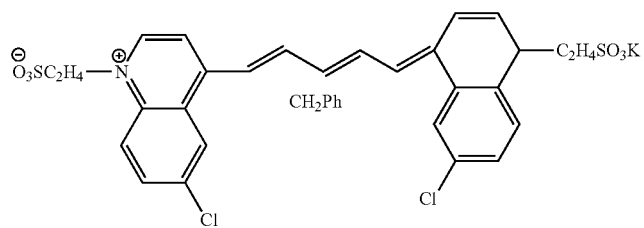
C-25
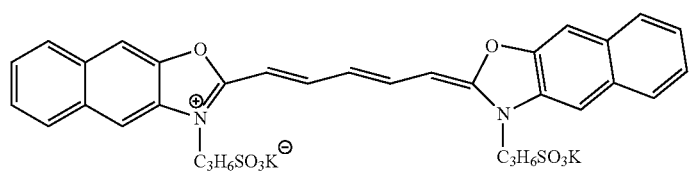
C-26
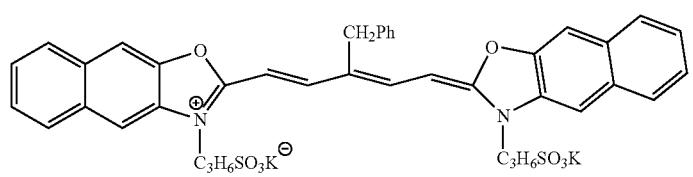
C-27

-continued
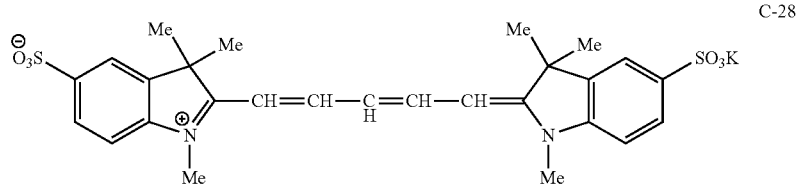
C-28
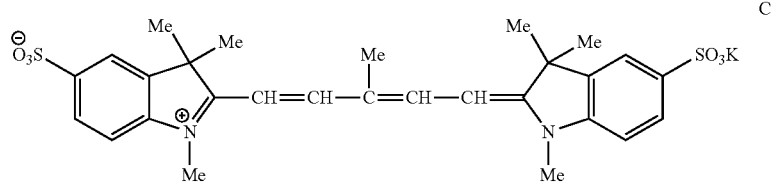
C-29
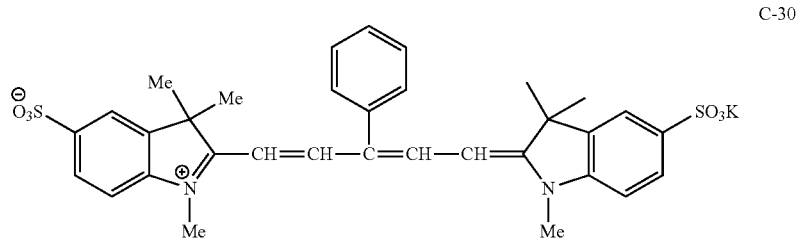
C-30
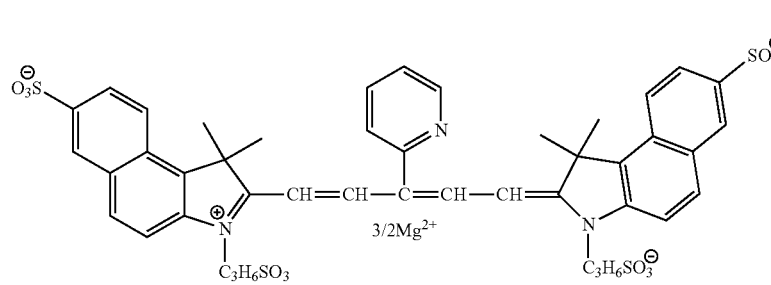
C-31
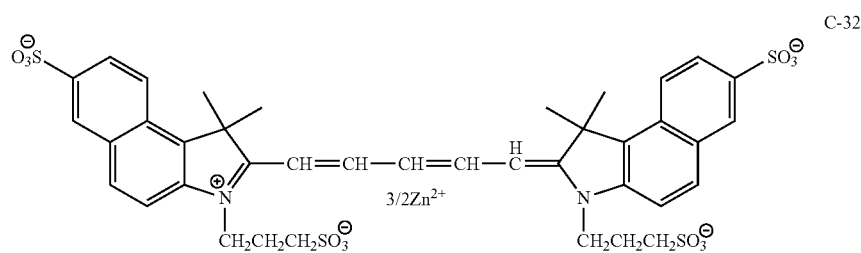
C-32
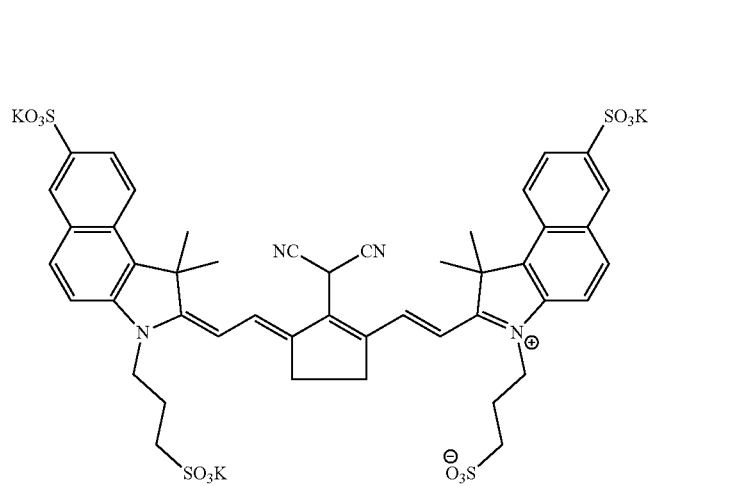
C-33

-continued
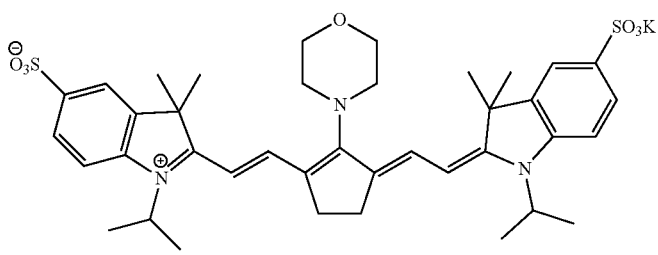
C-34
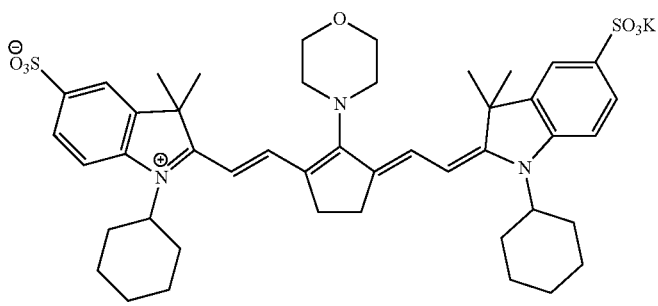
C-35
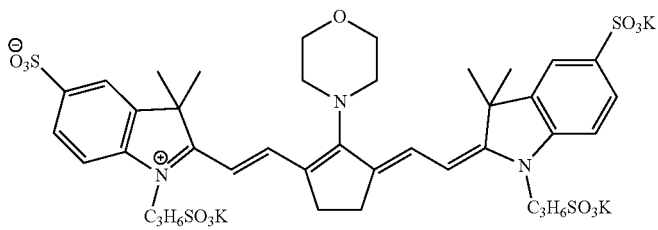
C-36
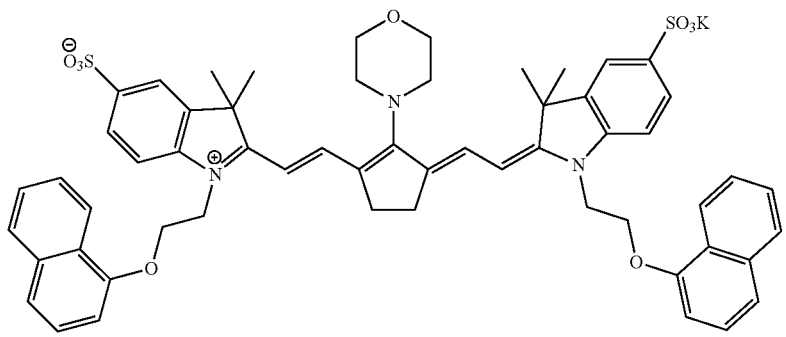
C-37
TABLE 3
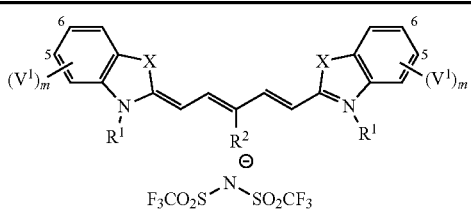
| Compound No. | X | $R^1$ | $R^2$ | $V^1$ | m |
|---|---|---|---|---|---|
| S-1 | S | Et | H | — | 0 |
| S-2 | O | Et | Me | — | 0 |
| S-3 | N—Et | Et | H | 5:Cl 6:Cl | 2 |
| S-4 | S | n-Bu | Bn | 5:Cl | 1 |

TABLE 4

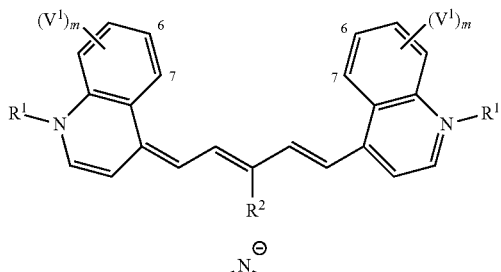

| Compound No. | $R^1$ | $R^2$ | $V^1$ | m |
|---|---|---|---|---|
| S-5 | Et | H | — | 0 |
| S-6 | Et | Me | — | 0 |
| S-7 | Et | Bn | 6:Cl<br>7:Cl | 2 |
| S-8 | n-Bu | Bn | 6:Cl | 1 |

TABLE 5

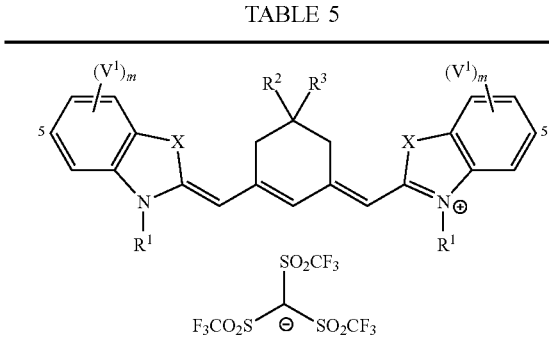

| Compound No. | X | $R^1$ | $R^2$ | $R^3$ | $V^1$ | m |
|---|---|---|---|---|---|---|
| S-9 | S | Et | H | H | — | 0 |
| S-10 | O | Et | H | Me | — | 0 |
| S-11 | S | Et | Me | Me | 5:MeO | 1 |
| S-12 | S | n-Bu | H | Ph | 5:Cl | 1 |

TABLE 6

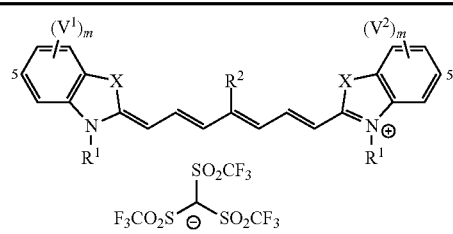

| Compound No. | X | $R^1$ | $R^2$ | $V^1$ | m1 | $V^2$ | m2 |
|---|---|---|---|---|---|---|---|
| S-13 | S | Et | H | — | 0 | — | 0 |
| S-14 | O | Et | H | 5:Cl | 1 | — | 0 |
| S-15 | S | Et | Me | 5:MeO | 1 | 5:MeO | 1 |
| S-16 | S | n-Bu | Bn | 5:Cl | 1 | 5:Cl | 1 |

TABLE 7

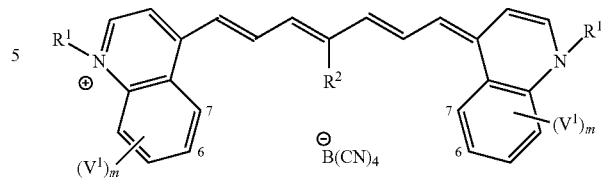

| Compound No. | $R^1$ | $R^2$ | $V^1$ | m |
|---|---|---|---|---|
| S-17 | Et | H | — | 0 |
| S-18 | Et | Me | — | 0 |
| S-19 | Et | Bn | 6:Cl<br>7:Cl | 2 |
| S-20 | n-Bu | Bn | 6:Cl | 1 |

TABLE 8

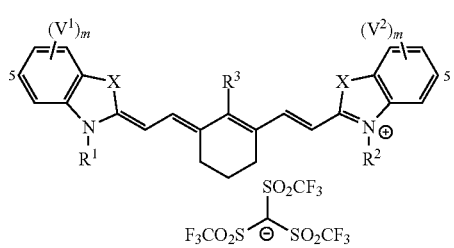

| Compound No. | X | $R^1$ | $R^2$ | $R^3$ | $V^1$ | m |
|---|---|---|---|---|---|---|
| S-21 | S | Et | Et | H | — | 0 |
| S-22 | O | Et | Et | Cl | — | 0 |
| S-23 | S | n-Bu | n-Bu | H | 5:MeO | 1 |
| S-24 | S | Et | Et | Ph | 5:Cl | 1 |

S-25

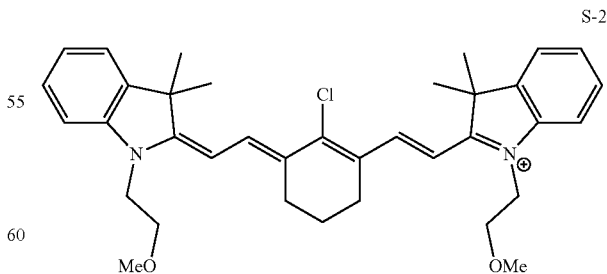

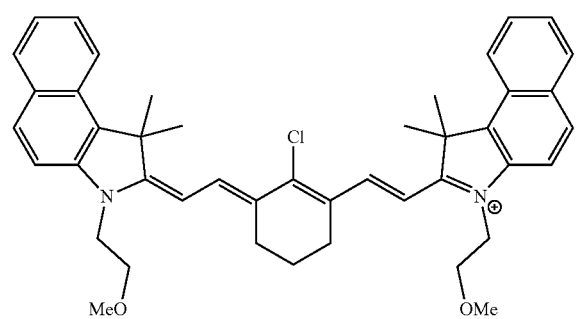
S-26
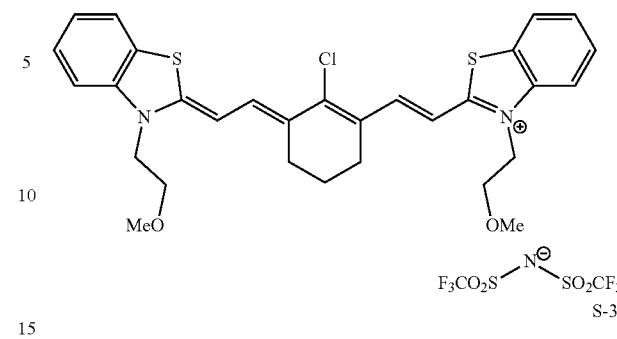
S-30
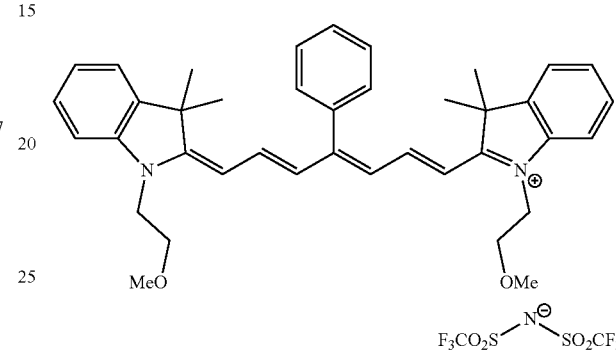
S-31
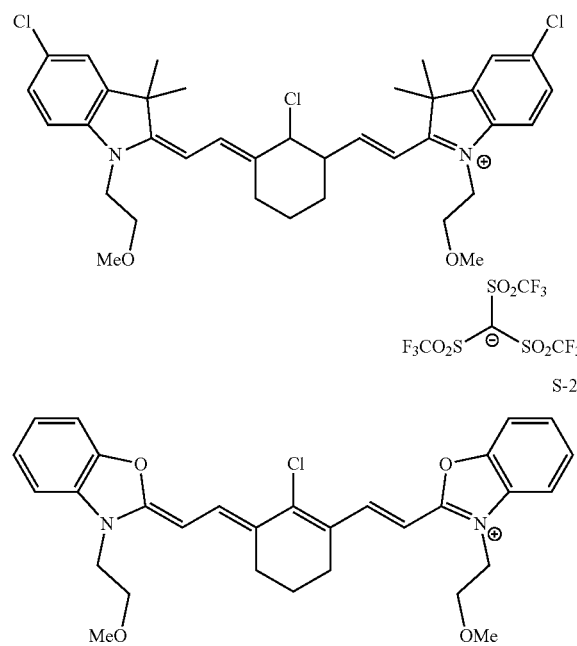
S-27
S-28
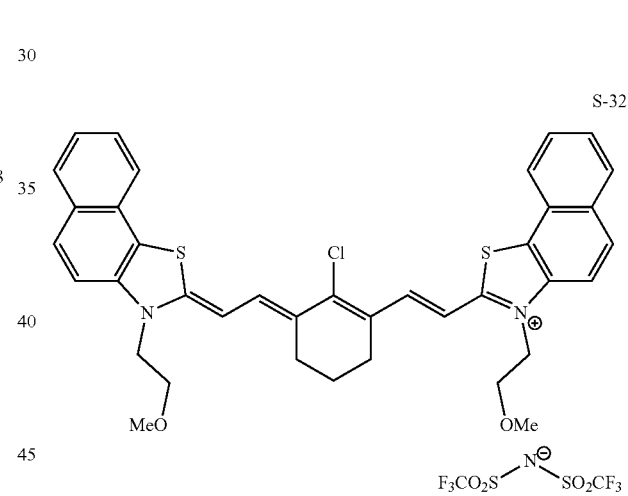
S-32
S-33
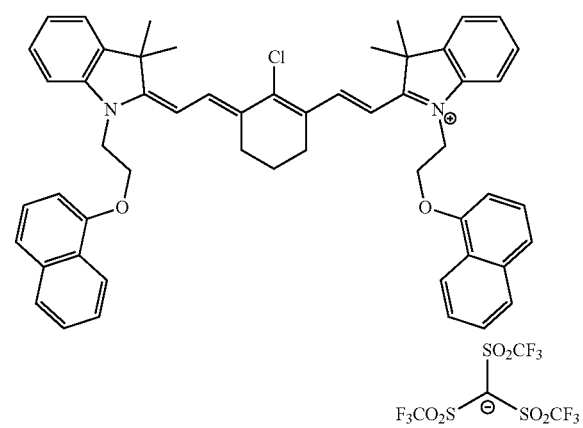
S-29

TABLE 9

| Compound No. | R¹ | R² | R³ | V¹ | m1 | V² | m2 |
|---|---|---|---|---|---|---|---|
| I-1 | Et | Et | H | — | 0 | — | 0 |
| I-2 | CH$_2$CH$_2$OMe | CH$_2$CH$_2$OMe | H | — | 0 | — | 0 |
| I-3 | | | | | | | |
| I-4 | Et | Et | Me | 5:Cl | 1 | 5:Cl | 1 |

TABLE 10

| Compound | R¹ | R² | R³ | V¹ | m1 | V² | m2 |
|---|---|---|---|---|---|---|---|
| I-5 | Et | Et | H | — | 0 | — | 0 |
| I-6 | CH$_2$CH$_2$OMe | CH$_2$CH$_2$OMe | H | — | 0 | — | 0 |
| I-7 | | | | | | | |
| I-8 | Et | Et | Me | 5:Cl | 1 | 5:Cl | 1 |

TABLE 11

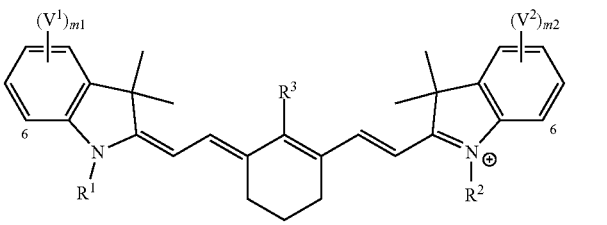

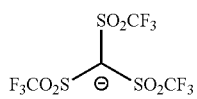

| Compound No. | $R^1$ | $R^2$ | $R^3$ | $V^1$ | m1 | $V^2$ | m2 |
|---|---|---|---|---|---|---|---|
| I-9 | Et | Et | H | — | 0 | — | 0 |
| I-10 | CH$_2$CH$_2$OMe | CH$_2$CH$_2$OMe | H | — | 0 | — | 0 |
| I-11 | | | | | | | |
| I-12 | Et | Et | Cl | 6:MeO | 1 | 6:MeO | 1 |

<<<Tungsten Oxide-Based Compound>>>

The tungsten oxide-based compound is preferably a tungsten oxide-based compound represented by General Formula (Compositional Formula) (I).

$$M_xW_yO_z \quad (I)$$

M represents a metal, W represents tungsten, and O represents oxygen.

$$0.001 \leq x/y \leq 1.1$$

$$2.2 \leq z/y \leq 3.0$$

Examples of the metal of M include an alkali metal, an alkaline earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi, and the metal is preferably an alkali metal. The metal of M may be used singly or in combination of two or more kinds thereof.

M is preferably an alkali metal, more preferably Rb or Cs, and still more preferably Cs.

By setting x/y to 0.001 or more, the infrared rays can be sufficiently blocked, and by setting x/y to 1.1 or less, production of an impurity phase in the tungsten oxide-based compound can be more reliably avoided.

By setting z/y to 2.2 or more, chemical stability as the material can be more enhanced, and by setting z/y to 3.0 or less, the infrared rays can be sufficiently blocked.

Specific examples of the tungsten oxide-based compound represented by General Formula (I) include Cs$_{0.33}$WO$_3$, Rb$_{0.33}$WO$_3$, K$_{0.33}$WO$_3$, and Ba$_{0.33}$WO$_3$, and the tungsten oxide-based compound is preferably Cs$_{0.33}$WO$_3$ or Rb$_{0.33}$WO$_3$, and more preferably Cs$_{0.33}$WO$_3$.

The tungsten oxide-based compound is preferably a fine particle. The average primary particle diameter of the tungsten oxide-based compound is preferably 800 nm or less, more preferably 400 nm or less, and still more preferably 200 nm or less. By setting the average primary particle diameter to such the range, the tungsten oxide-based compound is scarcely allowed to block the visible light because of light scattering, so that light transparency in the visible light region can be more successfully ensured. In a view of avoiding light scattering, the average primary particle diameter is preferably smaller, but for the reason of easy handling or the like at the production, the average primary particle diameter of the tungsten oxide-based compound is usually 1 nm or more.

The tungsten oxide-based compound can be obtained by a method of subjecting a tungsten compound to a heat treatment in an inert gas atmosphere or a reducing gas atmosphere (refer to JP4096205B).

Furthermore, the tungsten oxide-based compound is also available as a dispersion of tungsten fine particles, such as YMF-02A manufactured by Sumitomo Metal Industries, Ltd.

<<<Diimmonium-Based Compound>>>

The diimmonium-based compound is preferably a compound represented by General Formula (III-1).

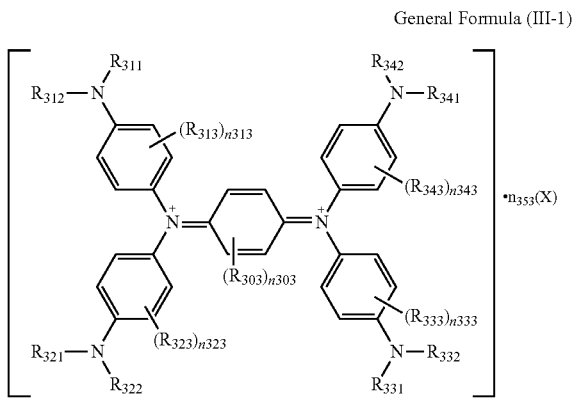

General Formula (III-1)

In General Formula (III-1), $R_{311}$, $R_{312}$, $R_{321}$, $R_{322}$, $R_{331}$, $R_{332}$, $R_{341}$, and $R_{342}$ each independently represent a hydrogen atom, or an aliphatic group or aromatic group, $R_{303}$, $R_{313}$, $R_{323}$, $R_{333}$, and $R_{343}$ each independently represent a substituent, n303, n313, n323, n333, and n343 each independently represent an integer of 0 to 4, X represents a monovalent or divalent anion, $n_{353}$ represents 1 or 2, and a production of the valence of X and $n_{353}$ is 2.

$R_{311}$, $R_{312}$, $R_{321}$, $R_{322}$, $R_{331}$, $R_{332}$, $R_{341}$, or $R_{342}$ is preferably a hydrogen atom, an alkyl group, an alkenyl group, an alkynyl group, or an aryl group; more preferably a hydrogen atom, an alkyl group having 1 to 20 carbon atoms, an alkenyl group having 2 to 20 carbon atoms, an alkynyl group having 2 to 20 carbon atoms, or an aryl group having 6 to 20 carbon atoms; still more preferably an alkyl group having 1 to 10 carbon atoms, an alkenyl group having 2 to 10 carbon atoms, or an aryl group having 6 to 10 carbon atoms; particularly preferably an alkyl group having 1 to 8 carbon atoms or an aryl group having 6 to 8 carbon atoms; and most preferably an alkyl group having 2 to 6 carbon atoms.

In addition, it is also preferable that $R_{311}$, $R_{312}$, $R_{321}$, $R_{322}$, $R_{331}$, $R_{332}$, $R_{341}$, and $R_{342}$ are all the same.

$R_{303}$, $R_{313}$, $R_{323}$, $R_{333}$, or $R_{343}$ is preferably a halogen atom, an alkyl group, an alkenyl group, alkynyl group, an aryl group, a cyano group, a hydroxyl group, a carboxyl group, an alkoxy group, an aryloxy group, a silyloxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a sulfamoyl group, a sulfo group, an alkyl- or arylsulfinyl group, an alkylsulfonyl or arylsulfonyl group, an acyl group, an aryloxycarbonyl group, an alkoxycarbonyl group, a carbamoyl group, an imide group, a phosphino group, a phosphinyl group, a phosphinyloxy group, a phosphinylamino group, or a silyl group; more preferably a halogen atom, an alkyl group, an alkenyl group, an aryl group, a cyano group, a hydroxyl group, a carboxyl group, an alkoxy group, an aryloxy group, a silyloxy group, an amino group, an alkylthio group, an arylthio group, an imide group, or a silyl group; still more preferably a halogen atom, an alkyl group, an aryl group, an alkoxy group, an aryloxy group, a silyloxy group, or an amino group; and most preferably an alkyl group.

Furthermore, it is also preferable that $R_{313}$, $R_{323}$, $R_{333}$, and $R_{343}$ are all the same.

$n_{303}$, $n_{313}$, $n_{323}$, $n_{333}$, or $n_{343}$ is preferably 0 to 3, more preferably 0 to 2, still more preferably 0 or 1, and particularly preferably 0.

X represents a monovalent or divalent anion. X is preferably a perchloric ion, a carboxylic ion, a sulfonic ion, a hexafluorophosphoric ion, a tetrafluoroboric ion, or a hexafluoroantimonic ion; more preferably a perchloric ion, a sulfonic ion, a hexafluorophosphoric ion, a tetrafluoroboric ion, or a hexafluoroantimonic ion; still more preferably a sulfonic ion, a hexafluorophosphoric ion, a tetrafluoroboric ion, or a hexafluoroantimonic ion; and particularly preferably a hexafluorophosphoric ion, a tetrafluoroboric ion, or a hexafluoroantimonic ion.

In addition, it is also preferable that X is an anion represented by General Formula (D).

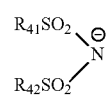

(D)

(In the formula, $R_{41}$ and $R_{42}$ each independently represent a fluorine atom-substituted alkyl group, a fluorine atom-substituted aryl group, or a fluorine atom-substituted heteroaryl group. $R_{41}$ and $R_{42}$ may be the same as or different from each other. $R_{41}$ and $R_{42}$ may be bonded to each other to form a fluoroalkylene group.)

In General Formula (D), $R_{41}$ or $R_{42}$ is preferably a fluorine atom-substituted alkyl group having 1 to 20 carbon atoms, an aryl group, or a heteroaryl group, more preferably a fluorine atom-substituted alkyl group having 1 to 15 carbon atoms or an aryl group, and still more preferably having a perfluoroalkyl group having 1 to 15 carbon atoms.

Specific examples of the compound represented by General Formula (III-1) of the present invention are shown below, but the present invention is not limited thereto.

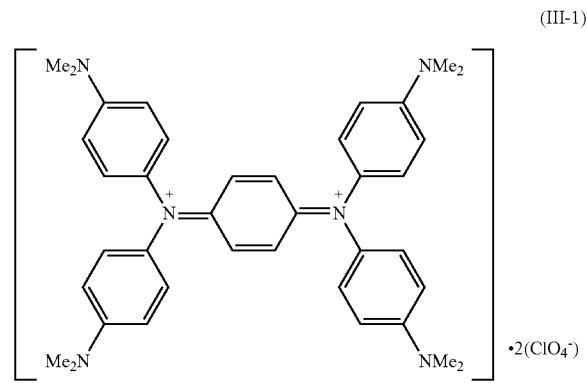

(III-1)

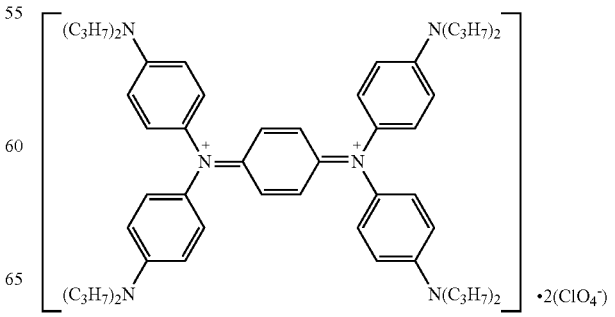

(III-2)

(III-3)
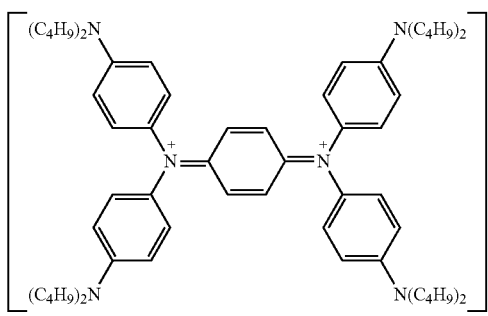
•2(ClO₄⁻)
(III-4)
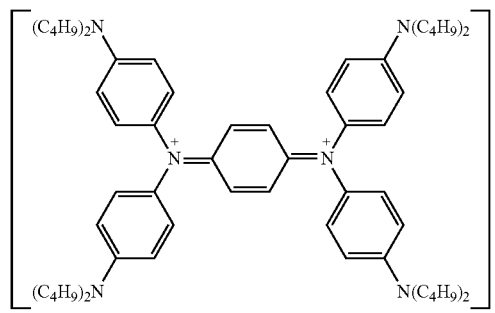
•2(PF₆⁻)
(III-5)
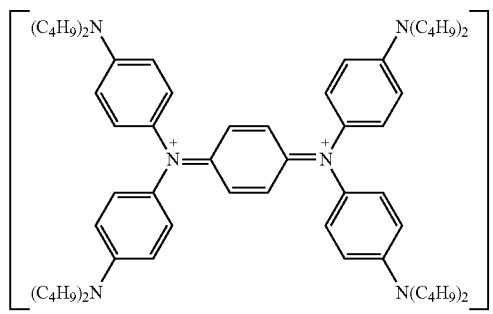
•2(BF₄⁻)
(III-6)
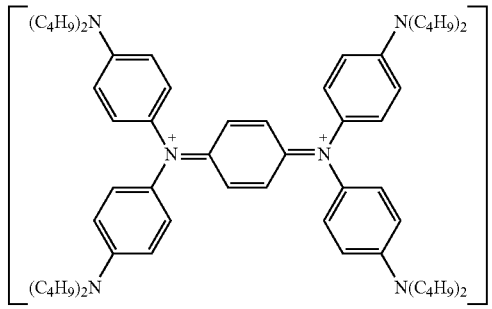
•2(SbF₆⁻)
(III-7)
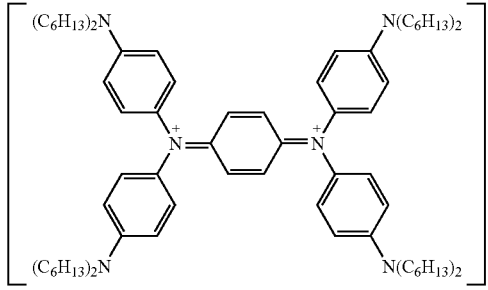
•2(ClO₄⁻)
(III-8)
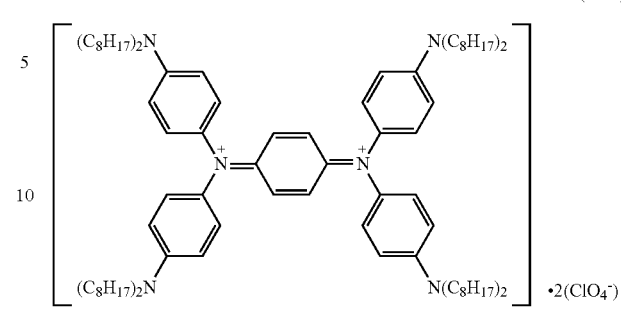
•2(ClO₄⁻)
(III-9)
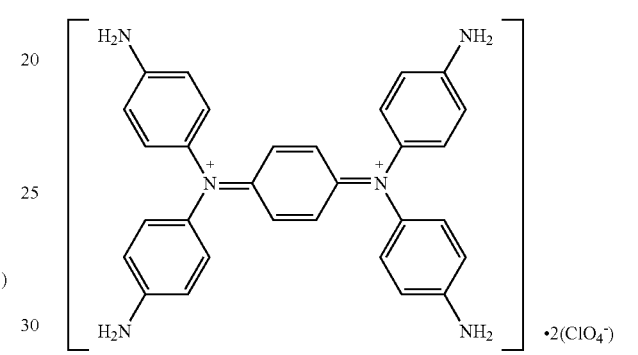
•2(ClO₄⁻)
(III-10)
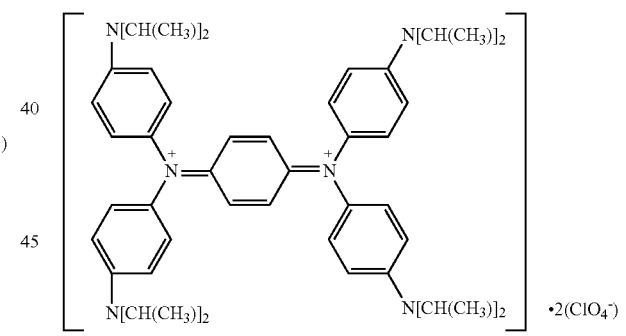
•2(ClO₄⁻)
(III-11)
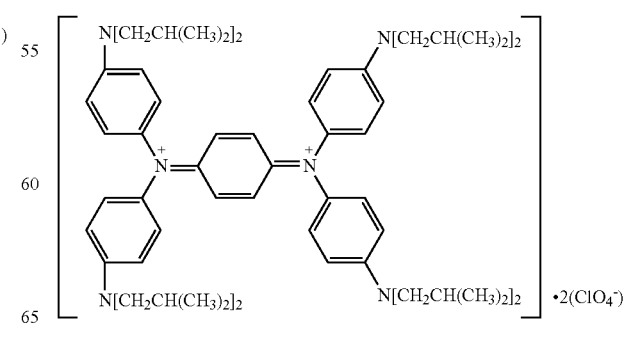
•2(ClO₄⁻)

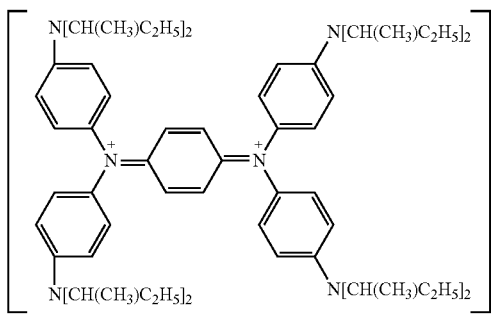
(III-12)
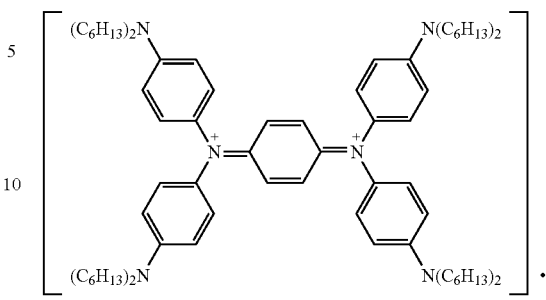
(III-17)
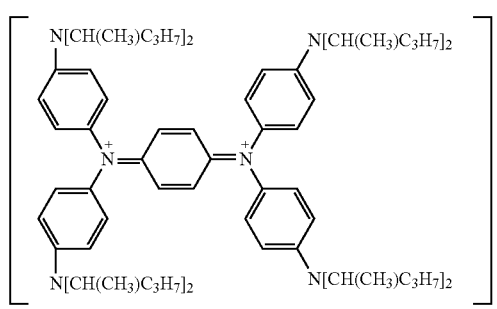
(III-13)
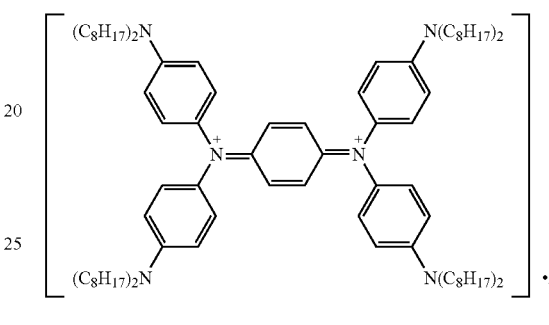
(III-18)
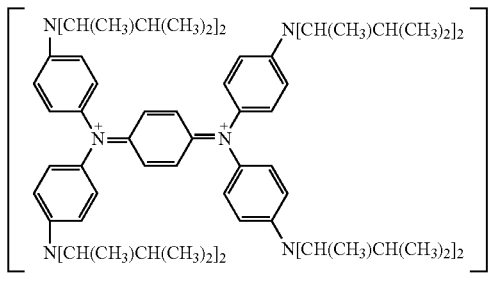
(III-14)
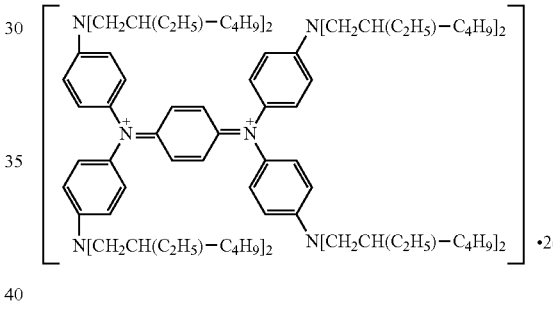
(III-19)
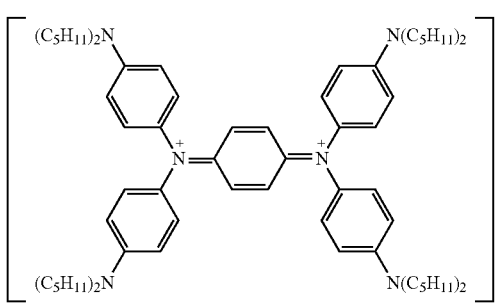
(III-15)
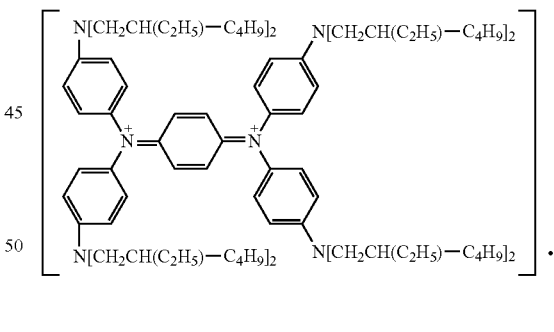
(III-20)
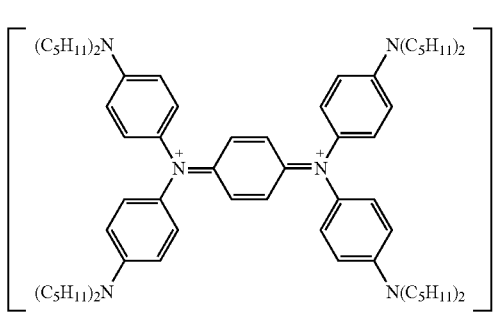
(III-16)
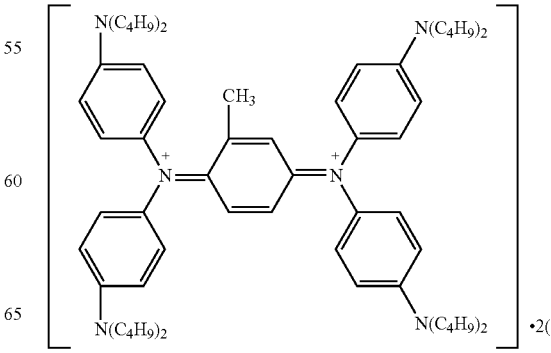
(III-21)

-continued
(III-22)
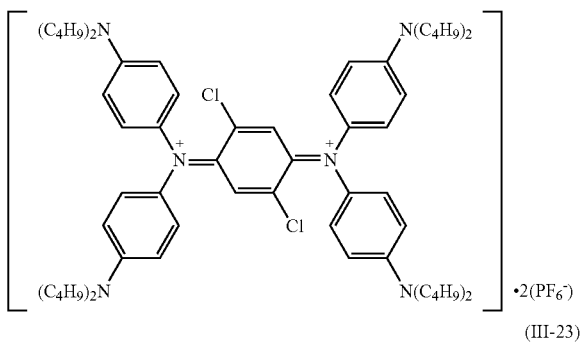
(III-23)
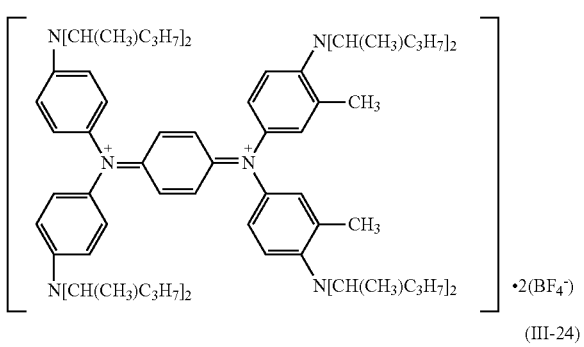
(III-24)
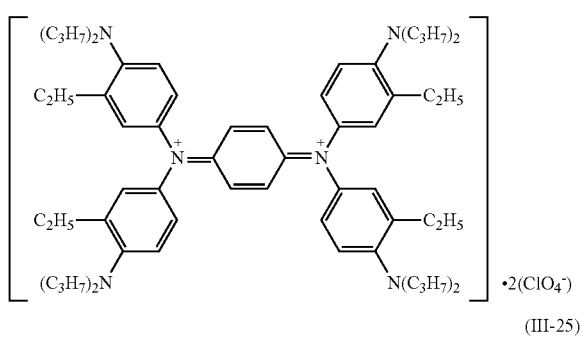
(III-25)
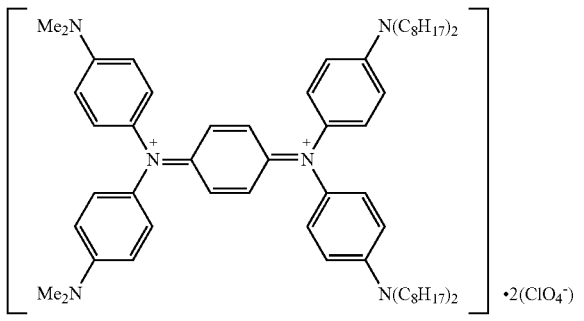
(III-26)
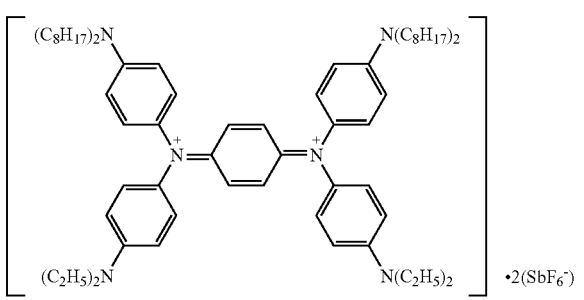
-continued
(III-27)
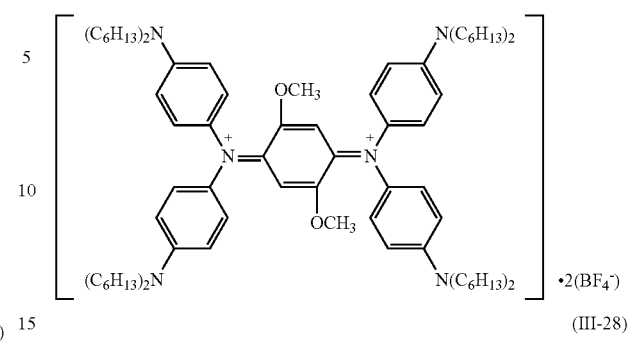
(III-28)
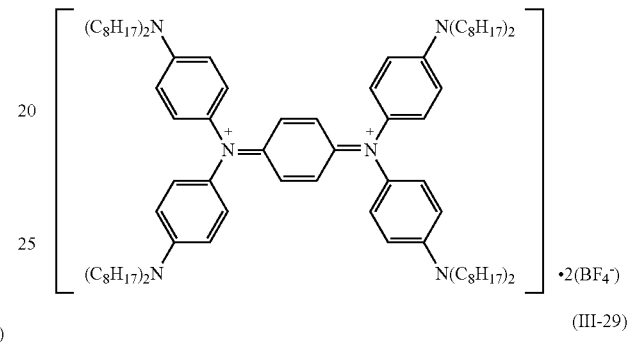
(III-29)
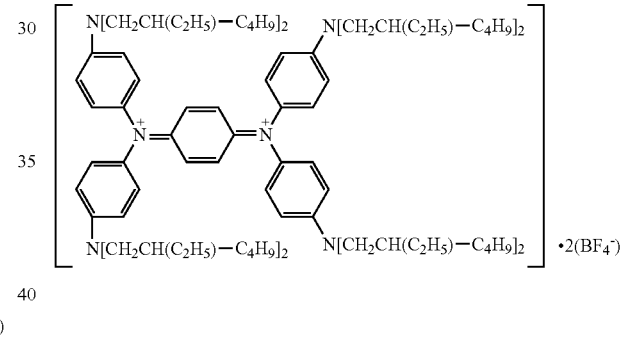
(III-30)
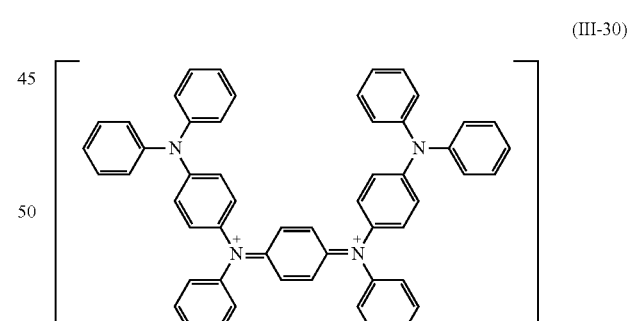
Such a compound can be easily synthesized by, for example, the synthesis method described in JP2007-254682A.
As the diimmonium-based compound in the present invention, a compound represented by General Formula (1) is also preferable.

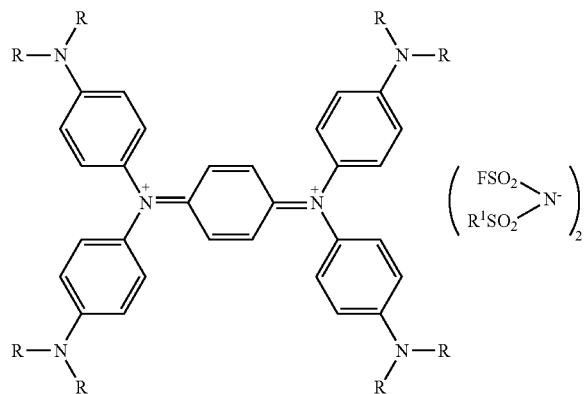

(In the formulae, R's each independently represent an alkyl group, a halogenated alkyl group, a cyanoalkyl group, an aryl group, a hydroxyl group, a phenyl group, a phenylalkylene group, or an alkoxy group, and $R^1$ represents a fluorine atom or a fluorinated alkyl group.)

In General Formula (1), in a case where $R^1$ is a fluorine atom, the compound is a diimmonium salt compound having a bis(fluorosulfonyl)imidic acid as an anion component, and in General Formula (1), in a case where $R^1$ is a fluorinated alkyl group, the compound is a diimmonium salt compound having a fluorinated alkanesulfonylfluorosulfonylimidic acid as an anion component.

In the fluorinated alkyl group in $R^1$ of General Formula (1), the number of fluorine atoms to be substituted or the number of carbon atoms is not particularly limited, but preferred examples thereof include a perfluoroalkyl group having 1 to 8 carbon atoms. In particular, trifluoromethane, pentafluoroethane, or the like is still more preferable in terms of a near-infrared ray-absorbing ability.

Examples of a synthesis method for the diimmonium salt compound of General Formula (1) include the synthesis methods described in JP2006-298989A.

As the diimmonium-based compound, the compounds described in JP1989-113482A (JP-H01-113482A), JP1999-180922A (JP-H10-180922A), WO2003/5076A, WO2004/48480A, WO2005/44782A, WO2006/120888A, JP2007-246464A, and WO2007/148595A can also be used.

Moreover, examples of a commercially available product thereof include EPOLIGHT 1178 and EPOLIGHT 7551 (manufactured by Epolin Inc.).

The content of the infrared ray-absorbing coloring agent in the first curable composition is preferably 0.1% to 10% by mass, more preferably 0.5% to 5% by mass, and still more preferably 1% to 4% by mass, with respect to the total solid content of the composition.

<Polymerizable Compound>

The first curable composition contains a polymerizable compound.

The polymerizable compound is preferably a compound containing a group having one or more ethylenically unsaturated bonds, more preferably a compound containing a group having two or more ethylenically unsaturated bonds, still more preferably a compound containing a group having three or more ethylenically unsaturated bonds, and particularly preferably a compound containing a group having five or more ethylenically unsaturated bonds. The upper limit is, for example, 15 or less. Examples of the group having an ethylenically unsaturated bond include a vinyl group, a (meth)allyl group, and a (meth)acryloyl group.

The polymerizable compound may be any chemical form of, for example, a monomer, a prepolymer, and an oligomer, or a mixture thereof and a multimer thereof, and the like. The polymerizable compound is preferably a monomer.

The molecular weight of the polymerizable compound is preferably 100 to 3,000, and more preferably 250 to 1,500.

The polymerizable compound is preferably a trifunctional to pentadecafunctional (meth)acrylate compound, and more preferably a trifunctional to hexafunctional (meth)acrylate compound.

Examples of the monomer and the prepolymer, unsaturated carboxylic acids (for example, acrylic acid, methacrylic acid, itaconic acid, crotonic acid, isocrotonic acid, and maleic acid) or esters thereof, amides thereof, and multimers thereof may be included and preferably esters of unsaturated carboxylic acids and aliphatic polyhydric alcohol compounds and amides of unsaturated carboxylic acids and an aliphatic polyvalent amine compounds and multimers thereof are included. Further, addition reaction products of unsaturated carboxylic esters or amides having nucleophilic substituents such as a hydroxyl group, an amino group, a mercapto group or the like and monofunctional or polyfunctional isocyanates or epoxies, or dehydration condensation reaction products with monofunctional or polyfunctional carboxylic acids or the like are suitably used. In addition, reaction products of unsaturated carboxylates or amides having electrophilic substituents such as an isocyanate group or an epoxy group and monofunctional or polyfunctional alcohols, amines, or thiols, or reaction products of unsaturated carboxylates or amides having dissociating substituents such as a halogen group or a tosyloxy group and monofunctional or polyfunctional alcohols, amines, or thiols are also suitably used. In addition, as other examples, a compound group substituted with a vinyl benzene derivative such as unsaturated phosphonic acid and styrene, vinyl ether, allyl ether, or the like instead of the unsaturated carboxylic acids can also be used.

As the specific examples of these compounds, the compounds described in paragraph Nos. [0095] to [0108] of JP2009-288705A can also be suitably used in the present invention.

In the present invention, as the polymerizable compound, a compound having a boiling point of 100° C. or higher at normal pressure, which has one or more groups having an ethylenically unsaturated bond, are also preferable. With regard to examples thereof, reference can be made to the compounds described in paragraph 0227 of JP2013-29760A and the compounds described in paragraph Nos. 0254 to 0257 of JP2008-292970A, the contents of which are incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E manufactured by Shin-Nakamura Chemical Co., Ltd.), a structure (for example, SR454 and SR499, commercially available from Sartomer Company, Inc.) in which an ethylene glycol or propylene glycol residue is interposed between these (meth)acryloyl groups is preferable. Oligomer types of these can also be used. In addition, NK ESTER A-TMMT (pentaerythritol tetraacrylate, manufactured by Shin-Nakamura Chemical Co., Ltd.), KAYARAD RP-1040 (manufactured by Nippon Kayaku Co., Ltd.), or the like can also be used.

Preferred aspects of the polymerizable compound will be shown below.

The polymerizable compound may have an acid group such as a carboxyl group, a sulfonic acid group, and a phosphoric acid group. The polymerizable compound having an acid group is preferably an ester of an aliphatic polyhydroxy compound with an unsaturated carboxylic acid, and more preferably a polymerizable compound in which a non-aromatic carboxylic acid anhydride is reacted with an unreacted hydroxyl group of the aliphatic polyhydroxy compound to make an acid group bonded thereto. Particularly preferably in this ester, the aliphatic polyhydroxy compound is pentaerythritol and/or dipentaerythritol. Examples of the commercially available product thereof include ARONIX TO-2349, M-305, M-510, and M-520, manufactured by Toagosei Co., Ltd.

The acid value of the polymerizable compound having an acid group is preferably 0.1 to 40 mgKOH/g, and particularly preferably 5 to 30 mgKOH/g. In a case where the acid value of the polymerizable compound is 0.1 mgKOH/g or more, the development and dissolution characteristics are good, whereas if the acid value is 40 mgKOH/g or less, it is advantageous in production or handling. In addition, the photopolymerization performance is good and the curability is excellent.

It is also a preferred aspect that the polymerizable compound is a compound having a caprolactone structure.

The compound having a caprolactone structure is not particularly limited as long as it has a caprolactone structure in a molecule thereof, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among those, a compound having a caprolactone structure represented by General Formula (Z-1) is preferable.

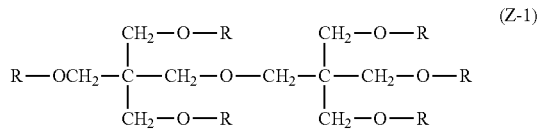

(Z-1)

In General Formula (Z-1), all of six R's are a group represented by General Formula (Z-2). Alternatively, one to five out of six R's are a group represented by General Formula (Z-2), and the remainder is a group represented by General Formula (Z-3).

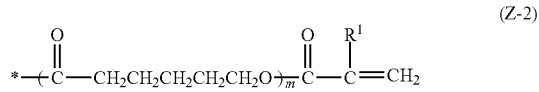

(Z-2)

In General Formula (Z-2), represents a hydrogen atom or a methyl group, m represents a number 1 or 2, and "*" represents a binding arm.

(Z-3)

In General Formula (Z-3), $R^1$ represents a hydrogen atom or a methyl group, and "*" represents a binding arm.

The polymerizable compound having a structure derived from caprolactone is commercially available from Nippon Kayaku Co., Ltd., as a KAYARAD DPCA series, and examples thereof include DPCA-20 (a compound in which m is 1, the number of R's which are the groups represented by Formula (Z-2) is 2, and all of $R^1$'s are hydrogen atoms in Formulae (Z-1) to (Z-3)), DPCA-30 (a compound in which m is 1, the number of R's which are the groups represented by Formula (Z-2) is 3, and all of $R^1$'s are hydrogen atoms in Formulae (Z-1) to (Z-3)), DPCA-60 (a compound in which m is 1, the number of R's which are the groups represented by Formula (Z-2) is 6, and all of $R^1$'s are hydrogen atoms in Formulae (Z-1) to (Z-3)), and DPCA-120 (a compound in which m is 2, the number of R's which are the groups represented by Formula (Z-2) is 6, and all of $R^1$'s are hydrogen atoms in Formulae (Z-1) to (Z-3)).

As the polymerizable compound, a compound represented by General Formula (Z-4) or (Z-5) can also be used.

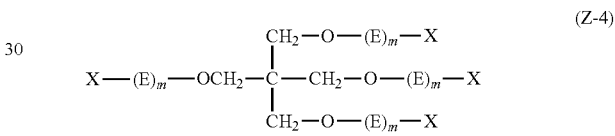

(Z-4)

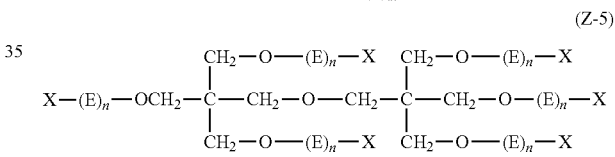

(Z-5)

In General Formulae (Z-4) and (Z-5), E's each independently represent —($(CH_2)_y CH_2 O$)— or —($(CH_2)_y CH(CH_3) O$)—, y's each independently represent an integer of 0 to 10, and X's each independently represent a (meth)acryloyl group, a hydrogen atom, or a carboxyl group.

In General Formula (Z-4), the sum of the (meth)acryloyl groups is 3 or 4, m's each independently represent an integer of 0 to 10, and the sum of the respective m's is an integer of 0 to 40.

In General Formula (Z-5), the sum of the (meth)acryloyl groups is 5 or 6, n's each independently represent an integer of 0 to 10, and the sum of the respective n's is an integer of 0 to 60.

In General Formula (Z-4), m is preferably an integer of 0 to 6, and more preferably an integer of 0 to 4.

Furthermore, the sum of the respective m's is preferably an integer of 2 to 40, more preferably an integer of 2 to 16, and particularly preferably an integer of 4 to 8.

In General Formula (Z-5), n is preferably an integer of 0 to 6, and more preferably an integer of 0 to 4.

Furthermore, the sum of the respective n's is preferably an integer of 3 to 60, more preferably an integer of 3 to 24, and particularly preferably an integer of 6 to 12.

In addition, —($(CH_2)_y CH_2 O$)— or —($(CH_2)_y CH(CH_3) O$)— in General Formula (Z-4) or (Z-5) is preferably in the form in which the terminal at an oxygen atom side binds to X.

The compound represented by General Formula (Z-4) or (Z-5) may be used singly or in combination of two or more kinds thereof. In particular, a form in which all of six X's in General Formula (Z-5) are an acryloyl group, and an aspect of a mixture of a compound in which in General Formula (Z-5), all of six X's are an acryloyl group and a compound in which at least one of six X's is a hydrogen atom is preferable. By adopting such a configuration, developability can be more improved.

Moreover, the total content of the compound represented by General Formula (Z-4) or (Z-5) in the polymerizable compound is preferably 20% by mass or more, and more preferably 50% by mass or more.

The compound represented by General Formula (Z-4) or (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, a person skilled in the art can easily synthesize the compound represented by General Formula (Z-4) or (Z-5).

Among the compounds represented by General Formula (Z-4) or (Z-5), a pentaerythritol derivative and/or a dipentaerythritol derivative is/are more preferable.

Specific examples of the compounds include compounds represented by Formulae (a) to (f) (hereinafter also referred to as "exemplary compounds (a) to (f)"). Among those, the exemplary compounds (a), (b), (e), and (f) are preferable.

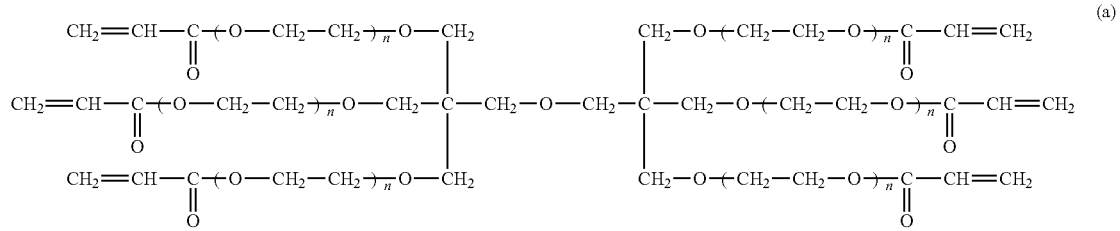

(a)

( the sum of the respective n's is 6)

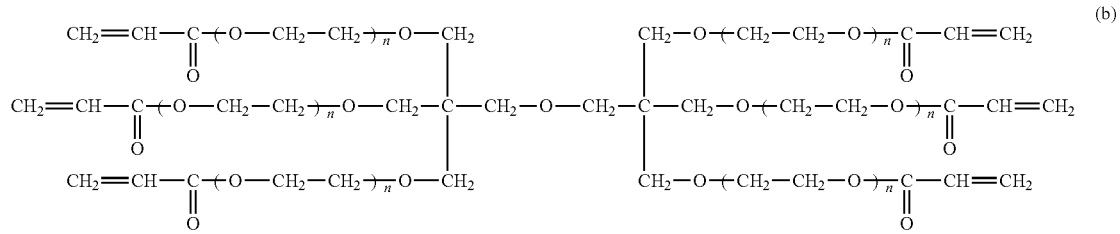

(b)

( the sum of the respective n's is 12)

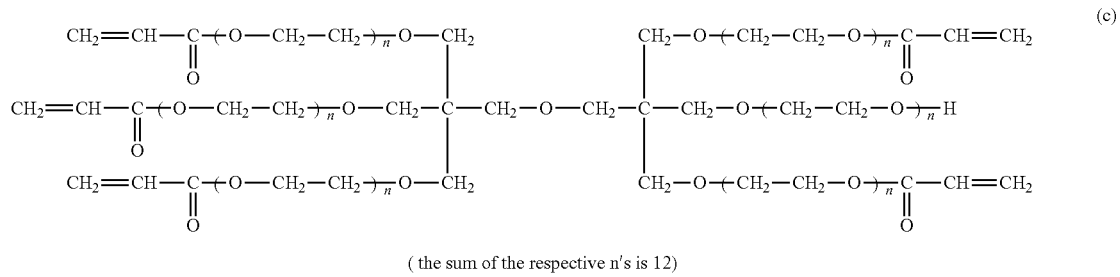

(c)

( the sum of the respective n's is 12)

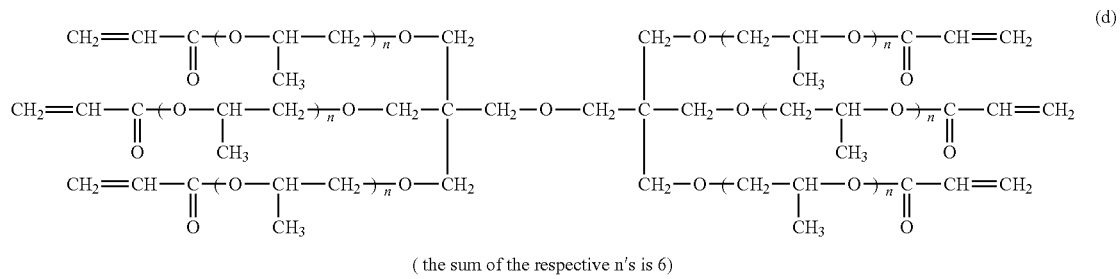

(d)

( the sum of the respective n's is 6)

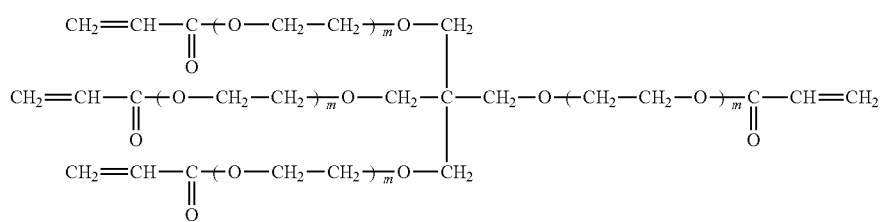

(the sum of the respective m's is 4)

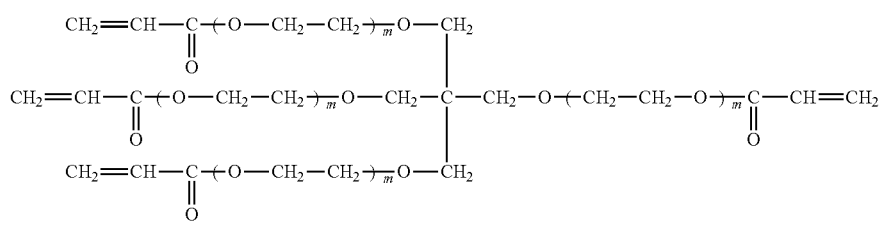

(the sum of the respective m's is 12)

Examples of the commercially available product of the polymerizable compound represented by General Formula (Z-4) or (Z-5) include SR-494 which is a tetrafunctional acrylate having four ethyleneoxy chains, manufactured by Sartomer, and DPCA-60 which is a hexafunctional acrylate having six pentyleneoxy chains, and TPA-330 which is a trifunctional acrylate having three isobutyleneoxy chains, manufactured by Nippon Kayaku Co., Ltd.

As polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also suitable. In addition, by using addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A), as the polymerizable compounds, a curable composition which is extremely excellent in photosensitization speed can be obtained.

Examples of commercially available products thereof include urethane oligomers UAS-10 and UAB-140 (manufactured by Sanyo-Kokusaku Pulp, Co., Ltd.), UA-7200 (manufactured by Nippon Kayaku Co., Ltd.), DPHA-40H (manufactured by Nippon Kayaku Co., Ltd.), and UA-306H, UA-306T, UA-306I, AH-600, T-600, and AI-600 (manufactured by KYOEISHA CHEMICAL CO., LTD.).

Furthermore, the polymerizable compound used in the present invention has a solubility parameter (SP) value of preferably 9.50 or more, more preferably 10.40 or more, and still more preferably 10.60 or more.

Incidentally, the SP value in the present specification is calculated by a Hoy method (H. L. Hoy Journal of Painting, 1970, Vol. 42, 76-118) unless otherwise indicated. Further, for the SP value, the unit is not shown but is $cal^{1/2} \, cm^{-3/2}$.

The content of the polymerizable compound in the first curable composition is preferably 0.1% to 40% by mass with respect to the total solid content of the composition. The lower limit is, for example, more preferably 5% by mass or more, and still more preferably 10% by mass or more. The upper limit is, for example, more preferably 35% by mass or less, and still more preferably 30% by mass or less.

The polymerizable compound may be used singly or in combination of two or more kinds thereof. In a case where the polymerizable compound is used in combination of two or more kinds thereof, the total amount thereof preferably falls within the range.

<Photopolymerization Initiator>

The first curable composition contains a photopolymerization initiator.

The photopolymerization initiator is not particularly limited as long as it has an ability to initiate the polymerization of the polymerizable compound, and can be selected from well-known photopolymerization initiators. For example, a photopolymerization initiator having photosensitivity to light in a range from the ultraviolet range to the visible range is preferable. In addition, the photopolymerization initiator may be an activator which causes an action with a photo-excited sensitizer to generate active radicals, or may be an initiator which initiates cation polymerization depending on the kinds of monomers.

In addition, it is preferable that the photopolymerization initiator is at least one compound having a molar light absorption coefficient of at least 50 in a range of about 300 nm to 800 nm (preferably 330 nm to 500 nm).

Specific examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, ketooxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in DE3337024A, a compound described in J. Org. Chem.; 29, 1527 (1964) by F. C. Schaefer et al., a compound described in JP1987-

58241A (JP-S62-58241A), a compound described in JP1993-281728A (JP-H5-281728A), a compound described in JP1993-34920A (JP-S5-34920A), and a compound described in U.S. Pat. No. 4,212,976A (for example, a compound having an oxadiazole skeleton).

In addition, from the viewpoint of exposure sensitivity, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, and a halomethyl oxadiazole compound, a 3-aryl-substituted coumarin compound is preferable.

A trihalomethyltriazine compound, an α-amino ketone compound, an acylphosphine compound, a phosphine oxide compound, an oxime compound, a triarylimidazole dimer, an onium compound, a benzophenone compound, or an aminoacetophenone compound is more preferable, and at least one compound selected from the group consisting of a trihalomethyltriazine compound, an α-amino ketone compound, an oxime compound, a triarylimidazole dimer, and a benzophenone compound is still more preferable.

In particular, in a case where the cured film of the present invention is used for preparation of a light-shielding film of a solid-state imaging element, it is necessary to form a fine pattern in a sharp shape, and thus it is important to obtain excellent curability and perform development without a residue remaining in an unexposed area. From such the viewpoint, it is preferable that an oxime compound is used as the photopolymerization initiator. In particular, in a case where a fine pattern is formed in a solid-state imaging element, a stepper is used for exposure for curing, and this exposure device may be damaged by halogen, and it is also necessary to reduce the addition amount of the photopolymerization initiator to be small. Therefore, in consideration of these points, it is more preferable that an oxime compound is used as the photopolymerization initiator for forming a fine pattern in a solid-state imaging element or the like. In addition, by using the oxime compound, color transfer properties can further be improved, and also the pattern linearity is also more excellent.

Specific examples of the photopolymerization initiator can be found in paragraphs 0265 to 0268 of JP2013-29760A, the contents of which are incorporated herein by reference.

As the photopolymerization initiator, a hydroxyacetophenone compound, an aminoacetophenone compound, or an acylphosphine compound can also be preferably used. More specifically, for example, an aminoacetophenone-based initiator described in JP1998-291969A (JP-H10-291969A) or an acylphosphine-based initiator described in JP4225898B can also be suitably used.

As the hydroxyacetophenone-based initiator, for example, IRGACURE-184, DAROCUR-1173, IRGACURE-500, IRGACURE-2959, or IRGACURE-127 (trade name, all of which are manufactured by BASF) can be used.

As the aminoacetophenone-based initiator, IRGACURE-907, IRGACURE-369, or IRGACURE-379EG (trade name, all of which are manufactured by BASF) which is a commercially available product can be used. As the aminoacetophenone-based initiator, a compound described in JP2009-191179A whose absorption wavelength is adjusted to match with that of a light source having a wavelength of, for example, 365 nm or 405 nm can also be used.

As the acylphosphine-based initiator, IRGACURE-819, or DAROCUR-TPO (trade name, all of which are manufactured by BASF) which is a commercially available product can be used.

The curable composition preferably includes an oxime compound represented by any one of Formulae (I) to (II) as the polymerization initiator.

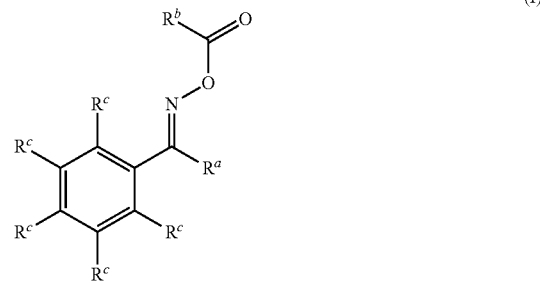

In Formula (I), $R^a$ represents an alkyl group, an acyl group, an aryl group, or a heterocyclic group, and $R^b$ represents an alkyl group, an aryl group, or a heterocyclic group, a plurality of $R_c$ each independently represent a hydrogen atom, an alkyl group, or a group represented by —$OR^h$. $R^h$ represents an electron-withdrawing group or an alkyl ether group, provided that at least one of a plurality of $R^c$'s represents a group represented by —$OR^h$.

In Formula (I), $R^a$ represents an alkyl group, an acyl group, an aryl group, or a heterocyclic group, and is preferably an aryl group or a heterocyclic group, and more preferably a heterocyclic group.

The number of carbon atoms of the alkyl group is preferably 1 to 20, more preferably 1 to 15, still more preferably 1 to 10, and particularly preferably 1 to 4. The alkyl group may be linear, branched, or cyclic, and is preferably linear or branched.

The number of carbon atoms of the acyl group is preferably 2 to 20, and more preferably 2 to 15. Examples of the acyl group include an acetyl group and a benzoyl group.

The number of carbon atoms of the aryl group is preferably 6 to 20, more preferably 6 to 15, and still more preferably 6 to 10. The aryl group may be a monocycle or a fused ring.

The heterocyclic group is preferably a 5- or 6-membered ring. The heterocyclic group may be a monocycle or a fused ring. The number of fused rings is preferably 2 to 8, more preferably 2 to 6, still more preferably 3 to 5, and particularly preferably 3 or 4. The number of carbon atoms constituting the heterocyclic group is preferably 3 to 40, more preferably 3 to 30, and still more preferably 3 to 20. The number of heteroatoms constituting the heterocyclic group is preferably 1 to 3. The heteroatom constituting the heterocyclic group is preferably a nitrogen atom, an oxygen atom, or a sulfur atom, and more preferably a nitrogen atom.

The above-mentioned group represented by $R^a$ may be unsubstituted or may have a substituent. Examples of the substituent include an alkyl group, an aryl group, a heterocyclic group, nitro group, a cyano group, halogen atom, —$OR^{X1}$, —$SR^{X1}$, —$COR^{X1}$, —$COOR^{X1}$, —$OCOR^{X1}$, —$NR^{X1}R^{X2}$, —$NHCOR^{X1}$, —$CONR^{X1}R^{X2}$, —$NHCONR^{X1}R^{X2}$, —$NHCOOR^{X1}$, —$SO_2R^{X1}$, —$SO_2OR^{X1}$, and —$NHSO_2R^{X1}$. $R^{X1}$ and $R^{X2}$ each independently represent a hydrogen atom, an alkyl group, an aryl group, or a heterocyclic group.

Examples of the halogen atom include a fluorine atom, a chlorine atom, a bromine atom, and an iodine atom, and the halogen atom is preferably a fluorine atom.

The number of carbon atoms of the alkyl group as the substituent, and the alkyl group represented by $R^{X1}$ or $R^{X2}$ is preferably 1 to 20. The alkyl group may be in any one of linear, branched, and cyclic forms, and is preferably linear or branched. A part or all of the hydrogen atoms of the alkyl group may be substituted with halogen atoms (preferably fluorine atoms). Further, a part or all of the hydrogen atoms of the alkyl group may be substituted with the substituents.

The number of carbon atoms of the aryl group as the substituent, and the aryl group represented by $R^{X1}$ or $R^{X2}$ is preferably 6 to 20, more preferably 6 to 15, and still more preferably 6 to 10. The aryl group may be a monocycle or a fused ring. A part or all of the hydrogen atoms of the aryl group may be substituted with the substituents.

The heterocyclic group as the substituent, and the heterocyclic group represented by $R^{X1}$ or $R^{X2}$ are preferably a 5- or 6-membered ring. The heterocyclic group may be a monocycle or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. The heteroatom constituting the heterocyclic group is preferably a nitrogen atom, an oxygen atom, or a sulfur atom. Further, a part or all of the hydrogen atoms of the hetero group may be substituted with the substituents.

The heterocyclic group represented by $R^a$ is preferably a group represented by Formula (II).

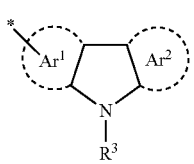

(II)

In Formula (II), $Ar^1$ and $Ar^2$ each independently represent an aromatic hydrocarbon ring which may have a substituent, $R^3$ represents an alkyl group or an aryl group, and * represents a binding position.

In Formula (II), $Ar^1$ and $Ar^2$ each independently represent an aromatic hydrocarbon ring which may have a substituent.

The aromatic hydrocarbon ring may be a monocycle or a fused ring. The number of carbon atoms constituting the ring of the aromatic hydrocarbon ring is preferably 6 to 20, more preferably 6 to 15, and particularly preferably 6 to 10. The aromatic hydrocarbon ring is preferably a benzene ring and naphthalene ring. Among those, at least one of $Ar^1$ or $Ar^2$ is preferably a benzene ring, and $Ar^1$ is more preferably a benzene ring. $Ar^1$ is preferably a benzene ring or a naphthalene ring, and $Ar^1$ is more preferably a naphthalene ring.

Examples of the substituent which may be contained in the $Ar^1$ or $Ar^2$ include the substituents described for W.

It is preferable that $Ar^1$ is unsubstituted. $Ar^1$ may be unsubstituted or may have a substituent. The substituent is preferably —$COR^{X1}$. $R^{X1}$ is preferably an alkyl group, an aryl group, or a heterocyclic group, and more preferably an aryl group. The aryl group may have a substituent or may be unsubstituted. Examples of the substituent include having an alkyl group having 1 to 10 carbon atoms.

In Formula (II), $R^3$ represents an alkyl group or an aryl group, and is preferably an alkyl group. The alkyl group and the aryl group may be unsubstituted or may have a substituent. Examples of the substituent include the above-mentioned substituents described for $R^a$.

The number of carbon atoms of the alkyl group is preferably 1 to 20, more preferably 1 to 15, and still more preferably 1 to 10. The alkyl group may be linear, branched, or cyclic, and is preferably linear or branched.

The number of carbon atoms of the aryl group is preferably 6 to 20, more preferably 6 to 15, and still more preferably 6 to 10. The aryl group may be a monocycle or a fused ring.

In Formula (I), $R^b$ represents an alkyl group, an aryl group, or a heterocyclic group, and is preferably an alkyl group or an aryl group, and more preferably an alkyl group. The alkyl group, the aryl group, and the heterocyclic group have the same definitions as the groups described for W. These groups may be unsubstituted or may have a substituent. Examples of the substituent include the substituents described for $R^a$.

In Formula (I), a plurality of $R^c$'s each independently represent a hydrogen atom, an alkyl group, or a group represented by —$OR^h$. $R^h$ represents an electron-withdrawing group or an alkyl ether group, provided that at least one of a plurality of $R^c$'s represents a group represented by —$OR^h$.

The number of carbon atoms of the alkyl group represented by $R^c$ is preferably 1 to 20, more preferably 1 to 15, still more preferably 1 to 10, and particularly preferably 1 to 4. The alkyl group may be linear, branched, or cyclic, and is preferably linear or branched.

Examples of the electron-withdrawing group represented by $R^h$ in —$OR^h$ include a nitro group, a cyano group, a fluorine atom, and an alkyl group having 1 to 20 carbon atoms in which at least one hydrogen atom is substituted with a fluorine atom.

Among those, the alkyl group having 1 to 20 carbon atoms in which at least one hydrogen atom is substituted with a fluorine atom is preferable. The number of carbon atoms of the alkyl group is preferably 1 to 15, more preferably 1 to 10, and still more preferably 1 to 4, and the alkyl group may be linear, branched, or cyclic, but is preferably linear or branched.

The alkyl ether group represented by $R^h$ in —$OR^h$ means an alkyl group substituted with an alkoxy group. The number of carbon atoms of the alkyl group in the alkyl ether group, and the alkyl group in the alkoxy group in the alkyl ether group is preferably 1 to 20, more preferably 1 to 15, still more preferably 1 to 10, and particularly preferably 1 to 4. The alkyl group may be linear, branched, or cyclic, but is preferably linear or branched.

The total number of carbon atoms of the alkyl ether group is preferably 2 to 8, more preferably 2 to 6, and still more preferably 2 to 4.

It is preferable that one or two of the plurality of $R^c$'s are groups represented by —$OR^h$. Here, in a case where $R^h$ in —$OR^h$ is an electron-withdrawing group (for example, an electron-withdrawing group in which at least one hydrogen atom is substituted with a fluorine atom an alkyl group having 1 to 20 carbon atoms), the remaining $R^c$'s are hydrogen atoms. On the other hand, in a case where $R^h$ in —$OR^h$ is an alkyl ether group, the remaining $R^c$'s are composed of one alkyl group and the other hydrogen atoms.

Furthermore, in the benzene ring to which $R^c$ is bonded, for one carbon to which $R^c$ is not bonded, the alkyl group represented by $R^c$, or the group represented by —$OR^h$ is preferably positioned at an ortho- or para-position.

Specific examples of the photopolymerization initiator represented by Formula (I) or (II) include the following compounds.
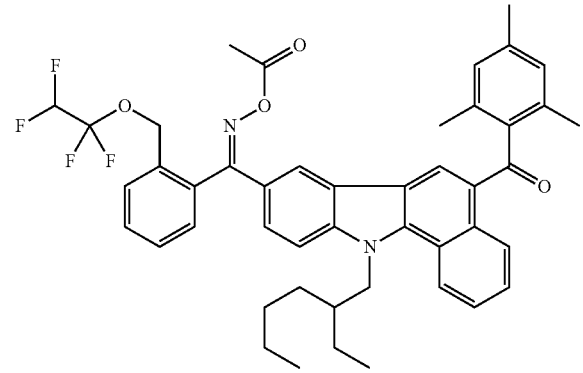
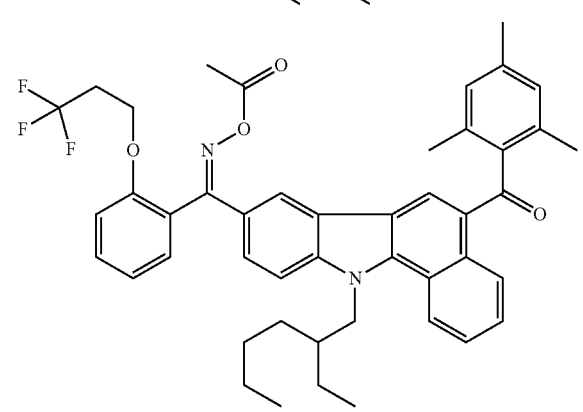
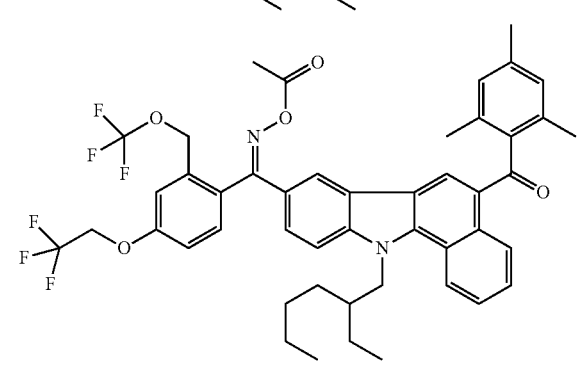
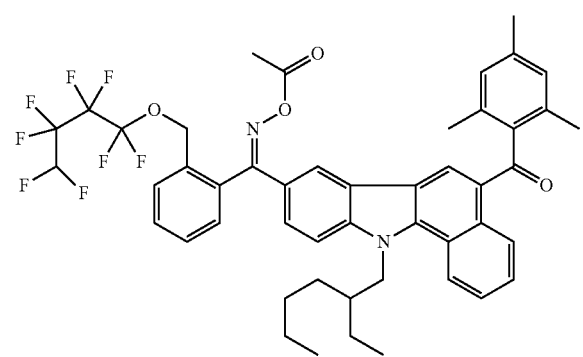
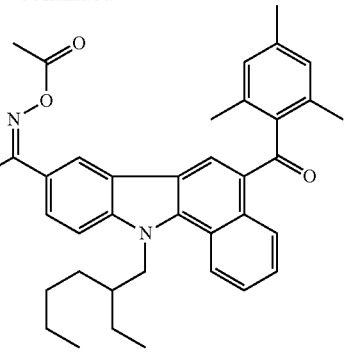
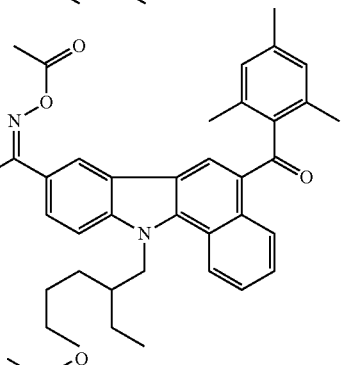
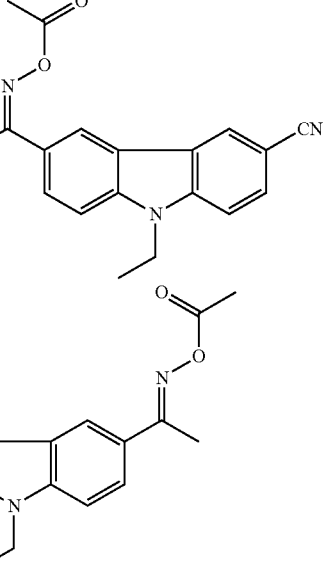
It is also preferable that the curable composition includes an oxime compound represented by Formula (III) as the polymerization initiator.
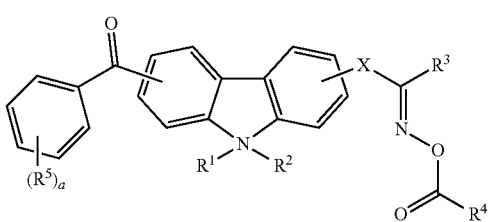

In Formula (III), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms, in a case where $R^1$ and $R^2$ are phenyl groups, the phenyl groups may be bonded to each other to form a fluorene group, $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms, and X represents a direct bond or a carbonyl group.

In Formula (III), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents an alkyl group having 1 to 20 carbon atoms, an aryl group having 6 to 30 carbon atoms, an arylalkyl group having 7 to 30 carbon atoms, or a heterocyclic group having 4 to 20 carbon atoms, X represents a direct bond or a carbonyl group, and a represents an integer of 0 to 4.

In Formula (III), it is preferable that $R^1$ and $R^2$ each independently represent a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Specific examples of the compound represented by Formula (III) include the compounds described in paragraph Nos. 0076 to 0079 of JP2014-137466A, the contents of which are incorporated herein by reference.

Specific examples of the oxime compound represented by General Formula (III) are shown below, but the present invention is not limited thereto.

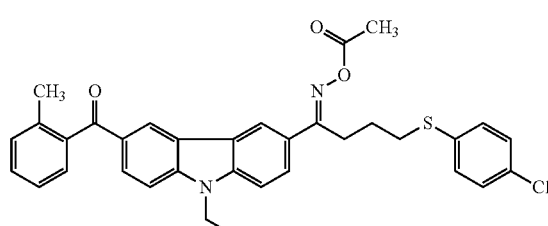

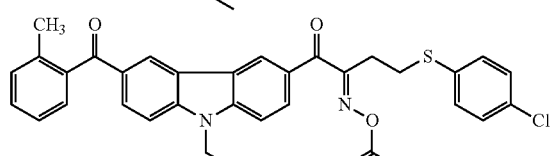

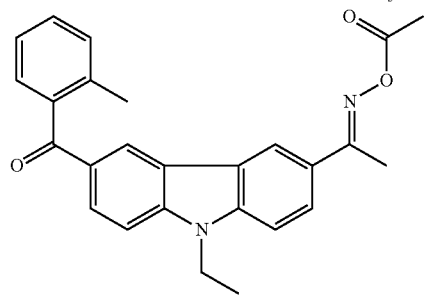

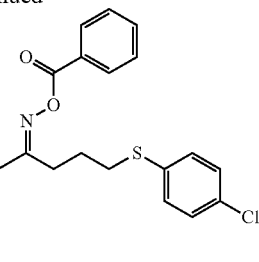

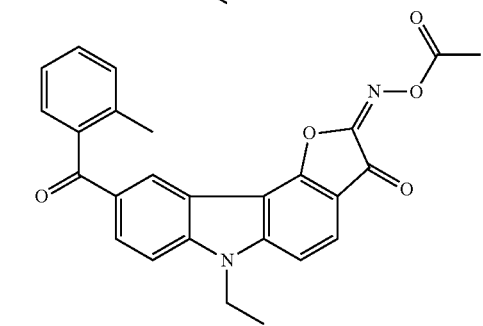

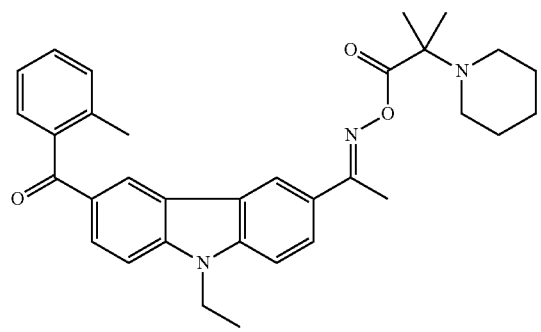

Moreover, commercially available polymerization initiators are not particularly limited, but examples thereof include IRGACURE OXE 01 (1,2-octanedione, 1-[4-(phenylthio)-,2-(O-benzoyloxime)]) and IRGACURE-OXE 02 (ethanone,1-[9-ethyl-6-(2-methylbenzoyl)-9H-carbazol-3-yl]-,1-(O-acetyloxime)) manufactured by BASF Japan, Ltd., 2-(acetyloxyiminomethyl)thioxanthen-9-one, and an O-acyloxime-based compound (for example, ADEKA OPTOMER N-1919 and ADEKA ARKLS NCI-831 manufactured by Adeka Corporation), and ADEKA ARKLS NCI-930, the contents of which are incorporated herein by reference.

In addition, oxime-based initiators having the following structures can also be used.

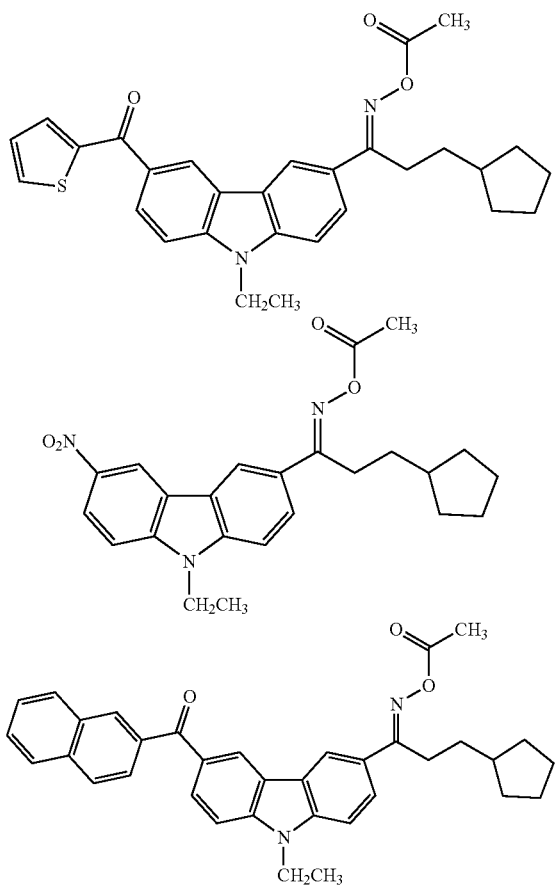

The content of the photopolymerization initiator in the first curable composition is preferably 0.1% to 30% by mass, more preferably 0.5% to 20% by mass, still more preferably 1% to 15% by mass, and particularly preferably 1% to 10% by mass, with respect to the total solid content of the composition.

The photopolymerization initiator may be used singly or in combination of two or more kinds thereof. In a case where two or more kinds of the photopolymerization initiators are used, the total amount thereof preferably falls within the range.

<Acrylic or Methacrylic Resin Having Adsorptive Group>

The first curable composition preferably contains an acrylic or methacrylic resin having an adsorptive group (hereinafter also referred to as a "dispersing resin"). The dispersing resin contributes to improvement of the dispersibility of a coloring pigment such as the visible light-absorbing coloring agent and the infrared ray-absorbing coloring agent as described above, other pigments to be used in combination, depending on purposes, and the like.

The acrylic or methacrylic resin (hereinafter also referred to as a "(meth)acrylic resin") which is a dispersing resin is a resin having a structural unit derived from a monomer having a (meth)acryloyl group (hereinafter also referred to as a "(meth)acrylate structural unit"). The (meth)acrylic resin may include only one kind of a (meth)acrylate structural unit or include two or more kinds of (meth)acrylate structural units. Further, the (meth)acrylic resin having two or more kinds of (meth)acrylate structural units corresponds to a so-called (meth)acrylic polymer. In addition, the (meth) acrylic resin may include structural units other than the (meth)acrylate structural unit.

Furthermore, the (meth)acrylic resin may be a modified type having a graft chain introduced therein.

In addition, in a case where the dispersing resin is a (meth)acrylic copolymer, the amount of the (meth)acrylate structural units in the copolymer with respect to the total structural units is preferably 70% by mole, more preferably 85% by mole, still more preferably 95% by mole, and particularly preferably 100% by mole.

The adsorptive group means a functional group that can be adsorbed to a coloring agent such as the visible light-absorbing coloring agent and the infrared ray-absorbing coloring agent as described above, and other pigments to be used in combination according to purposes, and examples thereof include an acid group, a basic group, a coordinative group, and a reactive functional group.

Hereinafter, a dispersing resin that is suitable for the curable composition of the present invention will be described.

The dispersing resin (hereinafter also referred to as a "polymer compound") can further be classified into a linear polymer, a terminal-modified polymer, a graft-type polymer, and a block-type polymer, depending on its structure.

The polymer compound is adsorbed on a surface of a dispersoid such as a visible light-absorbing coloring agent, an infrared ray-absorbing coloring agent, and a pigment to be used in combination according to purposes, and thus, acts so as to prevent re-aggregation. For this reason, examples of a preferable structure thereof include a terminal-modified polymer, a graft-type polymer, and a block-type polymer, which have an anchoring site for a pigment surface.

On the other hand, the adsorptivity of the polymer compound onto the dispersoid can also be enhanced by modifying the surface of the visible light-absorbing coloring agent and the infrared ray-absorbing coloring agent.

The polymer compound preferably has a structural unit with a graft chain. Further, in the present specification, the "structural unit" has the same definition as the "repeating unit".

Such a polymer compound having a structural unit with a graft chain has an affinity for a solvent due to the graft chain, so that the polymer compound is excellent in the dispersibility of a coloring pigment and the dispersion stability over time. Further, due to the presence of a graft chain, the composition has an affinity for a polymerizable compound, other resins which can be possibly combined, or the like, so that it is less likely that the alkali development generates a residue.

In a case where the graft chain is long, a steric repulsion effect is high and the dispersibility is improved. However, if the graft chain is too long, the adsorption force to a coloring agent is reduced, so that the dispersibility tends to be lowered. As a result, the number of atoms other than hydrogen atoms in the graft chain is preferably in a range of 40 to 10,000, the number of atoms other than hydrogen atoms is more preferably in a range of 50 to 2,000, and the number of atoms other than hydrogen atoms is still more preferably in a range of 60 to 500.

Here, the graft chain refers to a portion from the base (an atom which is in a group which is branched from the main chain and bonded to the main chain) of the main chain of a copolymer to the end of the group which is branched from the main chain.

The graft chain preferably has a polymer structure, and examples of such the polymer structure include a poly(meth) acrylate structure (for example, a poly(meth)acrylic structure), a polyester structure, a polyurethane structure, a polyurea structure, a polyamide structure, and a polyether structure.

In order to improve the interaction between the graft chain and a solvent, thereby increasing the dispersibility, it is preferable that the graft chain is a graft chain having at least one selected from the group consisting of the polyester structure, the polyether structure, and the poly(meth)acrylate structure. It is more preferable that the graft chain has at least one of the polyester structure or the polyether structure.

A macromonomer having such a polymer structure as a graft chain is not particularly limited, but preferably, a macromonomer with a reactive double-bond forming group can be suitably used.

As a commercially available macromonomer which is suitably used in the synthesis of the polymer compound in correspondence to the structural unit with a graft chain contained in the polymer compound, AA-6 (trade name, TOAGOSEI Co., Ltd.), AA-10 (trade name, manufactured by TOAGOSEI CO., Ltd.), AB-6 (trade name, manufactured by TOAGOSEI Co., Ltd.), AW-6 (trade name, manufactured by TOAGOSEI Co., Ltd.), AA-714 (trade name, manufactured by TOAGOSEI Co., Ltd.), AY-707 (trade name, manufactured by TOAGOSEI Co., Ltd.), AY-714 (trade name, manufactured by TOAGOSEI Co., Ltd.), ARONIX M-110 (trade name, manufactured by TOAGOSEI Co., Ltd.), ARONIX M-5300 (trade name, manufactured by TOAGOSEI Co., Ltd.), ARONIX M-5400 (trade name, manufactured by TOAGOSEI Co., Ltd.), ARONIX M-5700 (trade name, manufactured by TOAGOSEI Co., Ltd.), BLEMMER PP-100 (trade name, manufactured by NOF Co., Ltd.), BLEMMER PP-500 (trade name, NOF Corporation), BLEMMER PP-800 (trade name, manufactured by NOF Co., Ltd.), BLEMMER PP-1000 (trade name, manufactured by NOF Co., Ltd.), BLEMMER 55-PET-800 (trade name, manufactured by NOF Co., Ltd.), BLEMMER PME-4000 (trade name, manufactured by NOF Co., Ltd.), BLEMMER PSE-400 (trade name, manufactured by NOF Co., Ltd.), BLEMMER PSE-1300 (trade name, manufactured by NOF Co., Ltd.), BLEMMER 43PAPE-600B (trade name, manufactured by NOF Co., Ltd.), or the like is used. Among those, AA-6 (trade name, manufactured by TOAGOSEI Co., Ltd.), AA-10 (trade name, TOAGOSEI Co., Ltd.), AB-6 (trade name, manufactured by TOAGOSEI Co., Ltd.), AS-6 (trade name, TOAGOSEI Co., Ltd.), AN-6 (trade name, manufactured by TOAGOSEI Co. Ltd.), ARONIX M-110 (trade name, manufactured by TOAGOSEI Co., Ltd.), ARONIX M-5300 (trade name, manufactured by TOAGOSEI Co., Ltd.), BLEMMER PME-4000 (trade name, manufactured by NOF Co., Ltd.), or the like is preferably used.

The polymer compound preferably includes a structural unit represented by any one of Formulae (1) to (4) as the structural unit with a graft chain, and more preferably contains a structural unit represented by any one of Formulae (1A), (2A), (3A), (3B), and (4) as the structural unit with a graft chain.

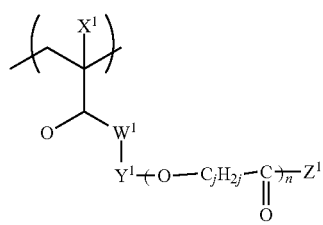
(1)

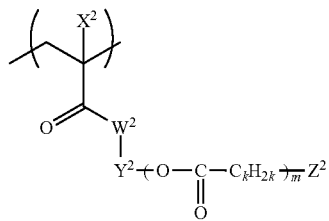
(2)

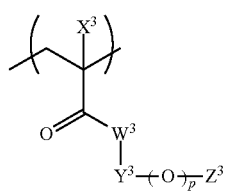
(3)

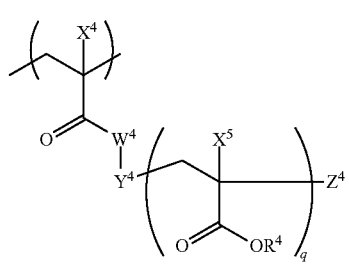
(4)

In Formulae (1) to (4), $W^1$, $W^2$, $W^3$, and $W^4$ each independently represent an oxygen atom or NH. $W^1$, $W^2$, $W^3$, and $W^4$ are preferably each an oxygen atom.

In Formulae (1) to (4), $X^1$, $X^2$, $X^3$, $X^4$, and $X^5$ each independently represent a hydrogen atom or a monovalent organic group. In terms of constraints of synthesis, it is preferable that $X^1$, $X^2$, $X^3$, $X^4$, and $X^5$ each independently represent a hydrogen atom or an alkyl group having 1 to 12 carbon atoms. It is more preferable that $X^1$, $X^2$, $X^3$, $X^4$, and $X^5$ each independently represent a hydrogen atom or a methyl group, with the methyl group being still more preferable.

In Formulae (1) to (4), $Y^1$, $Y^2$, $Y^3$, and $Y^4$ each independently represent a divalent linking group, and the linking group is not particularly limited in terms of its structure. Specific examples of the divalent linking groups represented by $Y^1$, $Y^2$, $Y^3$, and $Y^4$ include linking groups represented by the following (Y-1) to (Y-21). In the structures shown below, A and B means binding sites to a left terminal group and a right terminal group, respectively, in Formulae (1) to (4). Among the structures shown below, (Y-2) or (Y-13) is more preferable in terms of easiness of synthesis.

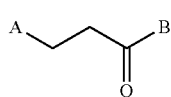
(Y-1)

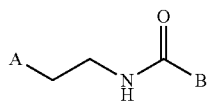
(Y-2)

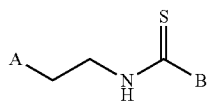
(Y-3)

-continued

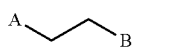 (Y-4)

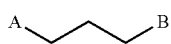 (Y-5)

 (Y-6)

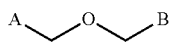 (Y-7)

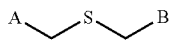 (Y-8)

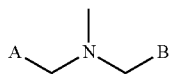 (Y-9)

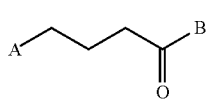 (Y-10)

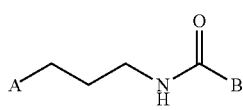 (Y-11)

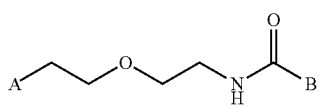 (Y-12)

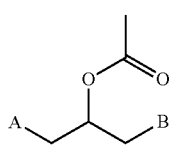 (Y-13)

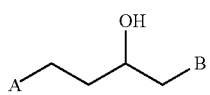 (Y-14)

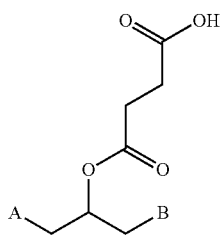 (Y-15)

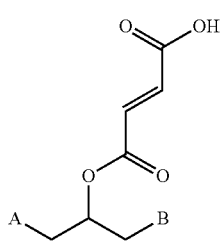 (Y-16)

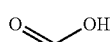 (Y-17)

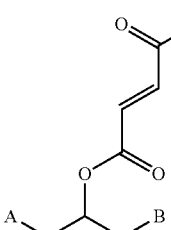 (Y-18)

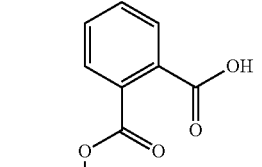 (Y-19)

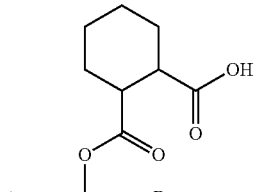 (Y-20)

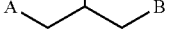 (Y-21)

In Formulae (1) to (4), $Z^1$, $Z^2$, $Z^3$, and $Z^4$ each independently represent a monovalent organic group. The structure of the organic group is not particularly limited, but specific examples thereof include an alkyl group, a hydroxyl group, an alkoxy group, an aryloxy group, heteroaryloxy group, an alkylthioether group, an arylthioether group, a heteroarylthioether group, and an amino group. Among those, ones having the steric repulsion effect are preferable as the organic groups represented by $Z^1$, $Z^2$, $Z^3$, and $Z^4$, in particular from the viewpoint of improving the dispersibility. It is preferable that $Z^1$, $Z^2$, $Z^3$, and $Z^4$ each independently represent an alkyl group alkoxy group having 5 to 24 carbon atoms. Among those, it is particularly preferable that $Z^1$, $Z^2$, $Z^3$, and $Z^4$ each independently represent a branched alkyl group having 5 to 24 carbon atoms, a cyclic alkyl group having 5 to 24 carbon atoms, or an alkoxy group having 5 to 24 carbon atoms. In addition, the alkyl group included in the alkoxy group may be linear, branched, or cyclic.

In Formulae (1) to (4), n, m, p, and q are each independently an integer of 1 to 500.

Furthermore, in Formulae (1) and (2), j and k each independently represent an integer of 2 to 8. j and k in Formulae (1) and (2) are preferably an integer of 4 to 6, and more preferably 5, from the viewpoint of dispersion stability or developability.

In Formula (3), $R^3$ represents a branched or linear alkylene group, and is preferably an alkylene group having 1 to 10 carbon atoms, and more preferably an alkylene group having 2 or 3 carbon atoms. In a case where p is 2 to 500, $R^3$ which are present in plural numbers may be the same as or different from each other.

In Formula (4), $R^4$ represents a hydrogen atom or a monovalent organic group, and the monovalent organic group is not particularly limited in terms of its structure. $R^4$ is preferably a hydrogen atom, an alkyl group, an aryl group, or a heteroaryl group, and more preferably a hydrogen atom or an alkyl group. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is still more preferable. In Formula (4), in a case where q is 2 to 500, $X^5$ and $R^4$ which are present in plural numbers in a graft copolymer may be the same as or different from each other.

Moreover, the polymer compound may have two or more structural units with a graft chain, which differ from each other in structure. That is, the structural units represented by Formulae (1) to (4), which differ from each other in structure, may be included in the molecule of the polymer compound. Further, in Formulae (1) to (4), in a case where n, m, p, and q each represent an integer of 2 or more, j and k may include different structures in the side chains in Formulae (1) and (2). In Formulae (3) and (4), $R^3$, $R^4$, and $X^5$ which are present in plural numbers in the molecules may be the same as or different from each other.

As for the structural unit represented by Formula (1), a structural unit represented by Formula (1A) is more preferable from the viewpoints of dispersion stability or developability.

Furthermore, as the structural unit represented by Formula (2), a structural unit represented by Formula (2A) is more preferable from the viewpoint of dispersion stability or developability.

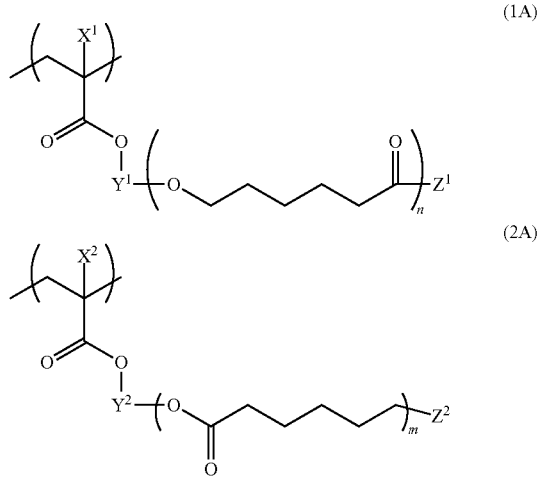

In Formula (1A), $X^1$, $Y^1$, $Z^1$, and n have the same definitions as $X^1$, $Y^1$, $Z^1$, and n in formula (1), and preferred ranges thereof are also the same. In Formula (2A), $X^2$, $Y^2$, $Z^2$, and m have the same definitions as $X^2$, $Y^2$, $Z^2$, and m in Formula (2), and preferred ranges thereof are also the same.

Furthermore, as the structural unit represented by Formula (3), a structural unit represented by Formula (3A) or (3B) is more preferable from the viewpoint of dispersion stability or developability.

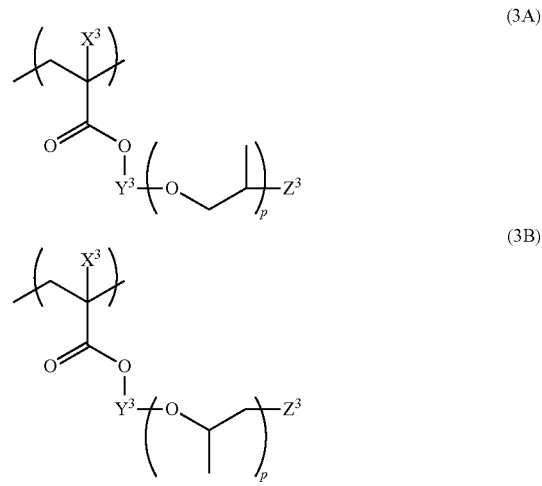

In Formula (3A) or (3B), $X^3$, $Y^3$, $Z^3$, and p have the same definitions as $X^3$, $Y^3$, $Z^3$, and p in Formula (3), and preferred ranges thereof are also the same.

It is more preferable that the polymer compound has the structural unit represented by Formula (1A) as the structural unit having a graft chain.

In the polymer compound, the structural unit with a graft chain (for example, the structural units represented by Formulae (1) to (4)) is included preferably in a range of 2% to 90%, and more preferably in a range of 5% to 30%, in terms of mass, with respect to the total mass of the polymer compound. In a case where the structural unit with a graft chain is included within this range, the dispersibility of the coloring pigment is high and the developability at the time of forming a film is excellent.

Moreover, the polymer compound preferably has a hydrophobic structural unit which differs from the structural unit with a graft chain (that is, which does not correspond to the structural unit with a graft chain). Meanwhile, in the present invention, the hydrophobic structural unit is a structural unit having no acid group (for example, a carboxylic acid group, a sulfonic acid group, a phosphoric acid group, and a phenolic hydroxyl group).

The hydrophobic structural unit is preferably a structural unit which is derived from (corresponds to) a compound (monomer) having the C log P value of 1.2 or more, and more preferably a structural unit derived from a compound having the C log P value of 1.2 to 8. Thus, the effects of the present invention are expressed with more reliability.

A C log P value is a value calculated by the program "C LOG P", which is available from Daylight Chemical Information System, Inc. This program provides values of "calculated log P" calculated using Hansch and Leo's fragment approach (refer to the documents below). The fragment approach is based on the chemical structure of a compound, and divides the chemical structure into partial structures (fragments) and sums the log P contribution allocated to each fragment. Thus the log P value of the compound is estimated. The details thereof are described in the following documents. In the present invention, the C log P values calculated by the program C LOG P v4.82 are used.

A. J. Leo, Comprehensive Medicinal Chemistry, Vol. 4, C. Hansch, P. G. Sammnens, J. B. Taylor and C. A. Ramsden, Eds., p. 295, Pergamon Press, 1990 C. Hansch & A. J. Leo. Substituent Constants For Correlation Analysis in Chemistry and Biology. John Wiley & Sons. A. J. Leo. Calculating logPoct from structure. Chem. Rev., 93, 1281-1306, 1993.

The log P refers to the common logarithm of a partition coefficient P. The log P is a value of a physical property, being a quantitative numeric value, representing how an organic compound is distributed in an equilibrium of the two-phase system of oil (typically 1-octanol) and water. The log P is expressed in the following expression.

log $P$=log($C$oil/$C$water)

In the expression, Coil represents the molar concentration of the compound in the oil phase, and Cwater represents the molar concentration of the compound in the water phase.

Oil solubility increases as the value of log P crosses zero and increases in the positive direction and water solubility increases as an absolute value increases in the negative direction. The log P has a negative correlation with the water solubility of the organic compound and is widely used as a parameter for estimating the hydrophilic or hydrophobic properties of an organic compound.

It is preferable that the polymer compound has at least one structural unit selected from structural units derived from monomers represented by General Formulae (i) to (iii) as the hydrophobic structural unit.

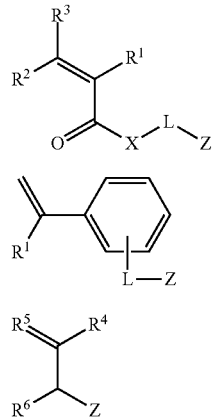

In Formulae (i) to (iii), $R^1$, $R^2$, and $R^3$ each independently represent a hydrogen atom, a halogen atom (for example, fluorine, chlorine, and bromine), or an alkyl group having 1 to 6 carbon atoms (for example, a methyl group, an ethyl group, and a propyl group).

$R^1$, $R^2$, and $R^3$ are each more preferably a hydrogen atom or an alkyl group having 1 to 3 carbon atoms, and most preferably a hydrogen atom or a methyl group. $R^2$ and $R^3$ are each particularly preferably a hydrogen atom.

X represents an oxygen atom (—O—) or an imino group (—NH—), and is preferably an oxygen atom.

L is a single bond or a divalent linking group. Examples of the divalent linking groups include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group, an oxygen atom (—O—), a sulfur atom (—S—), an imino group (—NH—), a substituted imino group (—NR$^{31}$—, in which R$^{31}$ is an aliphatic group, an aromatic group, or a heterocyclic group), a carbonyl group (—CO—), and a combination thereof.

The divalent aliphatic group may have a cyclic structure or a branched structure. The number of carbon atoms in the aliphatic group is preferably 1 to 20, more preferably 1 to 15, and still more preferably 1 to 10. The aliphatic group may be a saturated aliphatic group or an unsaturated aliphatic group, but is preferably a saturated aliphatic group. Further, the aliphatic group may have a substituent. Examples of the substituents include a halogen atom, an aromatic group, and a heterocyclic group.

The number of carbon atoms in the divalent aromatic group is preferably 6 to 20, more preferably 6 to 15, and still more preferably 6 to 10. The aromatic group may have a substituent. Examples of the substituents include a halogen atom, an aliphatic group, an aromatic group, and a heterocyclic group.

The divalent heterocyclic group preferably has a 5- or 6-membered ring as the heterocyclic ring. Another heterocyclic ring, an aliphatic ring, or an aromatic ring may be fused with the heterocyclic ring. The heterocyclic group may have a substituent. Examples of the substituents include a halogen atom, a hydroxyl group, an oxo group (=O), a thioxo group (=S), an imino group (=NH), a substituted imino group (=N—R$^{32}$ in which R$^{32}$ represents an aliphatic group, an aromatic group, or a heterocyclic group), an aliphatic group, an aromatic group, and a heterocyclic group.

L is preferably a single bond or a divalent linking group including an alkylene group or an oxyalkylene structure. The oxyalkylene structure is more preferably an oxyethylene structure or an oxypropylene structure. Further, L may include a polyoxyalkylene structure including two or more repeating oxyalkylene structures. The polyoxyalkylene structure is preferably a polyoxyethylene structure or a polyoxypropylene structure. The polyoxyethylene structure is represented by —(OCH$_2$CH$_2$)n-, and n is preferably an integer of 2 or more, and more preferably an integer of 2 to 10.

Examples of Z include an aliphatic group (for example, an alkyl group, a substituted alkyl group, an unsaturated alkyl group, and a substituted unsaturated alkyl group), an aromatic group (for example, an acyl group, a substituted aryl group, an arylene group and a substituted arylene group), a heterocyclic group, and a combination thereof. These groups may include an oxygen atom (—O—), a sulfur atom (—S—), an imino group (—NH—), a substituted imino group (—NR$^{31}$— in which R$^{31}$ represents an aliphatic group, an aromatic group, or a heterocyclic group), or a carbonyl group (—CO—).

The aliphatic group may have a cyclic structure or a branched structure. The number of carbon atoms in the aliphatic group is preferably 1 to 20, more preferably 1 to 15, and still more preferably 1 to 10. Further, the aliphatic group includes a ring assembly hydrocarbon group or a crosslinked cyclic hydrocarbon ring. Examples of the ring assembly hydrocarbon groups include a bicyclohexyl group, a perhydronaphthalenyl group, a biphenyl group, and a 4-cyclohexyl phenyl group. Examples of the crosslinked cyclic hydrocarbon rings include a bicyclic hydrocarbon ring such as pinane, bornane, norpinane, norbornane, a bicyclooctane ring (a bicyclo[2.2.2]octane ring, a bicyclo[3.2.1]octane ring, and the like), a tricyclic hydrocarbon ring such as homobredane, adamantane, tricyclo[5.2.1.0$^{2,6}$]decane, a tricyclo[4.3.1.1$^{2,5}$]undecane ring, and a tetracyclic hydrocarbon ring such as tetracyclic[4.4.0.1$^{2,5}$.1$^{7,10}$]dodecane and perhydro-1,4-methano-5,8-methanonaphthalene rings. In addition, the crosslinked cyclic hydrocarbon rings include fused cyclic hydrocarbon rings which are a plurality of fused rings of 5- to 8-membered cycloalkane rings such as perhydronaphthalene (decalin), perhydroanthracene, perhydrophenanthrene, perhydroacenaphthene, perhydrofluorene, perhydroindene, and perhydrophenalene rings.

As the aliphatic group, a saturated aliphatic group is more preferable than an unsaturated aliphatic group. Further, the aliphatic group may have a substituent. Examples of the substituents include a halogen atom, an aromatic group, and a heterocyclic group. However, the aliphatic group has no acid group as the substituent.

The number of carbon atoms in the above-mentioned aromatic group is preferably 6 to 20, more preferably 6 to 15, and still more preferably 6 to 10. Further, the aromatic group may have a substituent. Examples of the substituents include a halogen atom, an aliphatic group, an aromatic group, and a heterocyclic group. However, the aromatic group has no acid group as the substituent.

The heterocyclic group preferably has a 5- or 6-membered ring as the heterocyclic ring. Another heterocyclic ring, aliphatic ring, or aromatic ring may be fused with the heterocyclic ring. The heterocyclic group may have a substituent. Examples of the substituents include a halogen atom, a hydroxyl group, an oxo group (=O), a thioxo group (=S), an imino group (=NH), a substituted imino group (=N—R$^{32}$ in which R$^{32}$ is an aliphatic group, an aromatic group, or a heterocyclic group), an aliphatic group, an aromatic group, and a heterocyclic group. However, the heterocyclic group has no acid group as the substituent.

In Formula (iii), R$^4$, R$^5$, and R$^6$ each independently represent a hydrogen atom, a halogen atom (for example, fluorine, chlorine, and bromine), an alkyl group having 1 to 6 carbon atoms (for example, a methyl group, an ethyl group, and a propyl group), Z, or -L-Z. Here, L and Z have the same definitions as those defined above. As each of R$^4$, R$^5$, and R$^6$, a hydrogen atom or an alkyl group having 1 to 3 carbon atoms is preferable, and a hydrogen atom is more preferable.

In the present invention, as the monomer represented by General Formula (i), a compound in which R$^1$, R$^2$, and R$^3$ are each a hydrogen atom or a methyl group, L is a single bond, an alkylene group, or a divalent linking group including an oxyalkylene structure, X is an oxygen atom or an imino group, and Z is an aliphatic group, a heterocyclic group, or an aromatic group is preferable.

Furthermore, as the monomer represented by General Formula (ii), a compound in which R$^1$ is a hydrogen atom or a methyl group, L is an alkylene group, Z is an aliphatic group, a heterocyclic group, or an aromatic group, and Y is a methine group is preferable. Further, as the monomer represented by General Formula (III), a compound in which R$^4$, R$^5$, and R$^6$ are each a hydrogen atom or a methyl group, and Z is an aliphatic group, a heterocyclic group, or an aromatic group is preferable.

Examples of the typical compounds represented by Formulae (i) to (iii) include radically polymerizable compounds selected from acrylic acid esters, methacrylic acid esters, and styrenes.

In addition, with regard to the examples of the typical compounds represented by Formulae (i) to (iii), reference can be made to the compounds described in paragraphs 0089 to 0093 of JP2013-249417A, the contents of which are incorporated herein by reference.

In the polymer compound, the hydrophobic structural unit is preferably included in the amount in a range of 10% to 90%, and more preferably included in the amount in a range of 20% to 80%, in terms of mass, with respect to the total mass of the polymer compound. In a case where the content is within the above range, sufficient pattern formation is achieved.

The polymer compound has a functional group capable of interacting with a coloring pigment, in other words, a functional group capable of being adsorbed on the coloring agent. It is more preferable that the polymer compound further has a structural unit having a functional group capable of being adsorbed on the coloring agent.

Examples of the functional group capable of being adsorbed on the coloring agent an acid group, a basic group, a coordinating group, and a reactive functional group.

In a case where the polymer compound has the acid group, the basic group, the coordinating group, or the reactive functional group, it preferably has a structural unit having the acid group, a structural unit having the basic group, a structural unit having the coordinating group, or a structural unit having the reactivity, respectively.

In particular, by further having an alkali-soluble group such as a carboxylic acid group, as an acid group, the polymer compound is provided with developability for pattern formation through alkali development.

That is, by introducing the alkali-soluble group to the polymer compound, the polymer compound as a dispersing resin that contributes to the dispersion of the coloring agent, can have alkali solubility in the curable composition. Such a composition containing the polymer compound is excellent in light-shielding properties in the exposed area, and improves alkali-developability of an unexposed area.

In addition, by incorporating a structural unit having an acid group into the polymer compound, the polymer compound has an affinity for the solvent so that the coatability also tends to be improved.

It is assumed that the acid group in the structural unit having the acid group is likely to interact with the coloring agent, and the polymer compound disperses the coloring agent stably. It is also assumed that the viscosity of the polymer compound that disperses the coloring agent is reduced, so that the polymer compound itself is likely to be dispersed stably.

Meanwhile, the structural unit having the alkali-soluble group as the acid group may be the same as or different from the above-described structural unit having the graft chain. However, the structural unit having the alkali-soluble group as the acid group differs from the above-described hydrophobic structural unit (that is, the structural unit having the alkali-soluble group as the acid group does not correspond to the above-described hydrophobic structural unit).

Examples of the acid group which is a functional group capable of being adsorbed on the coloring agent include a carboxylic acid group, a sulfonic acid group, a phosphoric acid group, and a phenolic hydroxyl group, and the acid group is preferably at least one of a carboxylic acid group, a sulfonic acid group, or a phosphoric acid group, and particularly preferably a carboxylic acid group which has an excellent adsorption force on a coloring agent and high dispersibility in the coloring agent.

That is, it is preferable that the polymer compound further has a structural unit having at least one of a carboxylic acid group, a sulfonic acid group, or a phosphoric acid group.

The polymer compound may have one kind or two or more kinds of structural units having an acid group.

The polymer compound may or may not contain a structural unit having an acid group. In a case where the polymer compound contains a structural unit having an acid group, the content of the structural unit having an acid group is preferably 5% to 80%, with respect to the total mass of the polymer compound, in terms of mass, and more preferably 10% to 60% from the viewpoint of suppressing a damage to image intensity caused by alkali development.

Examples of the basic group which is a functional group capable of being adsorbed on the coloring agent include a primary amino group, a secondary amino group, a tertiary amino group, a heterocyclic ring containing an N atom, and an amido group, and the basic group is particularly preferably a tertiary amino group which has an excellent adsorption force on a coloring agent and high dispersibility in the coloring agent. The polymer compound may have one kind or two or more kinds of the basic groups.

The polymer compound may or may not contain a structural unit having a basic group. In a case where the polymer compound contains the structural unit having a basic group, the content of the structural unit having a basic group, in terms of mass, with respect to the total mass of the polymer compound, is preferably from 0.01% to 50%, and more preferably from 0.01% to 30%, from the viewpoint of suppressing the development inhibition.

Examples of the coordinating group which is a functional group capable of being adsorbed on the coloring agent, and the reactive functional group include an acetylacetoxy group, a trialkoxysilyl group, an isocyanate group, an acid anhydride, and an acid chloride. The coordinating group is particularly preferably an acetylacetoxy group which has a good adsorption force on a coloring agent and high dispersibility in the coloring agent. The polymer compound may have one kind or two or more kinds of the groups.

The polymer compound may or may not contain a structural unit having a coordinating group or a structural unit having a reactive functional group. In a case where the polymer compound contains the structural unit having a coordinating group or the structural unit having a reactive functional group, the content of the structural unit, in terms of mass, with respect to the total mass of the polymer compound, is preferably from 10% to 80%, and more preferably from 20% to 60%, from the viewpoint of suppressing the development inhibition.

In the polymer compound, how the functional group capable of being adsorbed on the coloring agent is introduced is not particularly limited, but it is preferable that the polymer compound has at least one structural unit selected from the structural units derived from monomers represented by General Formulae (iv) to (vi).

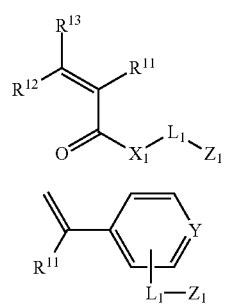

(iv)

(v)

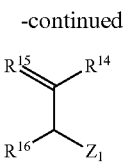

(vi)

In General Formulae (iv) to (vi), $R^{11}$, $R^{12}$, and $R^{13}$ each independently represent a hydrogen atom, a halogen atom (for example, a fluorine atom, a chlorine atom, and a bromine atom), or an alkyl group (for example, a methyl group, an ethyl group, and a propyl group) having 1 to 6 carbon atoms.

In General Formulae (iv) to (vi), it is more preferable that $R^{11}$, $R^{12}$, and $R^{13}$ are each independently a hydrogen atom or an alkyl group having 1 to 3 carbon atoms, and it is the most preferable that $R^{11}$, $R^{12}$, and $R^{13}$ are each independently a hydrogen atom or a methyl group. In General Formula (iv), it is particularly preferable that $R^{12}$ and $R^{13}$ are each a hydrogen atom.

In General Formula (iv), $X_1$ represents an oxygen atom (—O—) or an imino group (—NH—), and is preferably an oxygen atom.

Furthermore, in General Formula (v), Y represents a methine group or a nitrogen atom.

Moreover, in General Formulae (iv) to (v), $L_1$ represents a single bond or a divalent linking group. Examples of the divalent linking groups include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group, an oxygen atom (—O—), a sulfur atom (—S—), an imino group (—NH—), a substituted imino bond (—$NR^{31'}$— in which $R^{31'}$ is an aliphatic group, an aromatic group, or a heterocyclic group), a carbonyl bond (—CO—), and a combination thereof.

The divalent aliphatic group may have a cyclic structure or a branched structure. The number of carbon atoms in the aliphatic group is preferably 1 to 20, more preferably 1 to 15, and still more preferably 1 to 10. As the aliphatic group, a saturated aliphatic group is more preferable than an unsaturated aliphatic group. The aliphatic group may have a substituent. Examples of the substituents include a halogen atom, a hydroxyl group, an aromatic group, and a heterocyclic group.

The number of carbon atoms in the above-mentioned divalent aromatic group is preferably 6 to 20, more preferably 6 to 15, and most preferably 6 to 10. The aromatic group may have a substituent. Examples of the substituents include a halogen atom, a hydroxyl group, an aliphatic group, an aromatic group, and a heterocyclic group.

The divalent heterocyclic group preferably has a 5- or 6-membered ring as the heterocyclic ring. One or more of another heterocyclic ring, aliphatic ring, or aromatic ring may be fused with the heterocyclic ring. The heterocyclic group may have a substituent. Examples of the substituents include a halogen atom, a hydroxyl group, an oxo group (=O), a thioxo group (=S), an imino group (=NH), a substituted imino group (=N—$R^{32}$ in which $R^{32}$ represents an aliphatic group, an aromatic group, or a heterocyclic group), an aliphatic group, an aromatic group, and a heterocyclic group.

It is preferable that $L_1$ is a single bond, an alkylene group, or a divalent linking group containing an oxyalkylene structure. It is more preferable that the oxyalkylene structure is an oxyethylene structure or an oxypropylene structure. Further, $L_1$ may include a polyoxyalkylene structure including two or more repeating oxyalkylene structures. As the polyoxyalkylene structure, a polyoxyethylene structure or a polyoxypropylene structure is preferable. The polyoxyethylene structure is represented by $-(OCH_2CH_2)n-$ in which n is preferably an integer of 2 or more, and more preferably an integer of 2 to 10.

In General Formulae (iv) to (vi), $Z_1$ represents a functional group capable of being adsorbed with the coloring agent, other than the graft chain, and is preferably a carboxylic acid group or a tertiary amino group, and more preferably a carboxylic acid group.

In General Formula (vi), $R^{14}$, $R^{15}$, and $R^{16}$ each independently represents a hydrogen atom, a halogen atom (for example, fluorine, chlorine, and bromine), an alkyl group having 1 to 6 carbon atoms (for example, a methyl group, an ethyl group, and a propyl group), $-Z_1$, or $-L_1-Z_1$. Here, $L_1$ and $Z_1$ have the same definitions as $L_1$ and $Z_1$ above, respectively, and the preferred examples thereof are also the same. It is preferable that $R^{14}$, $R^{15}$, and $R^{16}$ each independently represent a hydrogen atom or an alkyl group having 1 to 3 carbon atoms, and more preferably a hydrogen atom.

In the present invention, as the monomer represented by General Formula (iv), a compound in which $R^{11}$, $R^{12}$, and $R^{13}$ are each independently a hydrogen atom or a methyl group, $L_1$ is an alkylene group or a divalent linking group including an oxyalkylene structure, $X_1$ is an oxygen atom or an imino group, and $Z_1$ is a carboxylic acid group is preferable.

Furthermore, as the monomer represented by General Formula (v), a compound in which $R^{11}$ is a hydrogen atom or a methyl group, $L_1$ is an alkylene group, $Z_1$ is a carboxylic acid group, and Y is a methine group is preferable.

In addition, as the monomer represented by General Formula (vi), a compound in which $R^{14}$, $R^{15}$, and $R^{16}$ are each independently a hydrogen atom or a methyl group, $L_1$ is a single bond or an alkylene group, and Z is a carboxylic acid group is preferable.

Typical examples of the monomers (compounds) represented by General Formulae (iv) to (vi) are shown below.

Examples of the monomers include methacrylic acid, crotonic acid, isocrotonic acid, a reaction product of succinic anhydride and a compound (for example, 2-hydroxyethyl methacrylate) having an addition-polymerizable double bond and a hydroxyl group in the molecule, a reaction product of phthalic anhydride and a compound having an addition-polymerizable double bond and a hydroxyl group in the molecule, a reaction product of tetrahydroxy phthalic anhydride and a compound having an addition-polymerizable double bond and a hydroxyl group in the molecule, a reaction product of trimellitic anhydride and a compound having an addition-polymerizable double bond and a hydroxyl group in the molecule, a reaction product of pyromellitic anhydride and a compound having an addition-polymerizable double bond and a hydroxyl group in the molecule, an acrylic acid, an acrylic acid dimer, an acrylic acid oligomer, maleic acid, itaconic acid, fumaric acid, 4-vinylbenzoic acid, vinyl phenol, and 4-hydroxyphenyl methacrylamide.

From the viewpoints of the adsorptivity with the coloring pigment, the dispersion stability, and the permeability of a developer, the content of the structural unit having a functional group capable of be adsorbed on the coloring agent is preferably 0.05% to 90% by mass, more preferably 1.0% to 80% by mass, and still more preferably 10% to 70% by mass, with respect to the total mass of the polymer compound.

Furthermore, for the purpose of improving various types of performance, such as image intensity, the polymer compound may further have other structural units (for example, a structural unit having a functional group with an affinity for a dispersion medium used for a dispersion) having various functions which differ from the structural unit with a graft chain, the hydrophobic structural unit, and the structural unit having a functional group capable of being adsorbed on the coloring agent as long as it does not impair the effects of the present invention.

Examples of such other structural units include a structural unit derived from a radically polymerizable compound selected from acrylonitriles, methacrylonitriles, and the like.

The polymer compound may use one kind or two or more kinds of such other structural units. The content thereof is preferably from 0% to 80%, and more preferably from 10% to 60%, in terms of mass, with respect to the total mass of the polymer compound. In a case where the content is within the range, sufficient pattern forming properties are maintained.

The acid value of the polymer compound is preferably in the range from 0 mgKOH/g to 160 mgKOH/g, more preferably in the range from 10 mgKOH/g to 140 mgKOH/g, and still more preferably in the range from 20 mgKOH/g to 120 mgKOH/g.

In a case where the acid value of the polymer compound is 160 mgKOH/g or less, the peeling of the pattern during the development at the time of forming a film is more effectively inhibited. Further, in a case where the acid value of the polymer compound is 10 mgKOH/g or more, the alkali developability is improved. In addition, in a case where the acid value of the polymer compound is 20 mgKOH/g or more, precipitation of the coloring agent can further be suppressed, the number of coarse particles can further be reduced, and the temporal stability of the composition can further be improved.

In the present invention, the acid value of the polymer compound can be calculated from the average content of the acid groups in the polymer compound, for example. Further, a resin having a desired acid value can be obtained by changing the content of a structural unit containing an acid group, which is a constituent of the polymer compound.

At the time of forming the cured film, the weight-average molecular weight of the polymer compound in the present invention is preferably from 4,000 to 300,000, more preferably from 5,000 to 200,000, still more preferably from 6,000 to 100,000, and particularly preferably from 7,500 to 50,000, as a value in terms of polystyrene measured by a gel permeation chromatography (GPC) method, from the viewpoints of suppression of the peeling of the pattern during the development and the developability.

The GPC method uses HLC-8020GPC (manufactured by Tosoh Corporation), and is based on a method using TSKgel SuperHZM-H, TSKgel SuperHZ4000, or TSKgel SuperHZ2000 (manufactured by Tosoh Corporation, 4.6 mmID×15 cm) as a column and tetrahydrofuran (THF) as an eluent.

The polymer compound is synthesized based on a known method. Examples of solvents used for synthesizing the polymer compound include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N- dimethylformamide, N, N-dimethylacetamide, dimethyl sulfoxide, toluene, ethyl acetate, methyl lactate, and ethyl lactate. These solvents may be used singly or as a mixture of two or more kinds thereof.

Specific examples of the polymer compounds which can be used in the present invention include "DA-7301" manufactured by Kusumoto Chemicals, Ltd.; "EFKA 4400 to 4402 (modified polyacrylate), and "POLYFLOW No. 50E, No. 300 (acrylic copolymer)" manufactured by KYOEISHA CHEMICAL Co., LTD.

In addition, examples of a commercially available product of the amphoteric resin include DISPERBYK-130, DISPERBYK-140, DISPERBYK-142, DISPERBYK-145, DISPERBYK-180, DISPERBYK-187, DISPERBYK-191, DISPERBYK-2001, DISPERBYK-2010, DISPERBYK-2012, DISPERBYK-2025, and BYK-9076 manufactured by BYK-Chemie, and AJISPUR PB821, AJISPUR PB822, and AJISPUR PB881 manufactured by Ajinomoto Fine Techno Co., Inc.

These polymer compounds may be used singly or in combination of two or more kinds thereof.

Furthermore, with regard to specific examples of the polymer compound, reference can be made to the polymer compounds described in paragraphs 0127 to 0129 of JP2013-249417A, the contents of which are incorporated herein by reference.

Moreover, as the dispersing resin, in addition to the above-mentioned polymer compounds, the graft copolymers in paragraphs 0037 to 0115 of JP2010-106268A (the sections of paragraphs 0075 to 0133 of the corresponding US2011/0124824A), the contents of which can be cited and incorporated herein by reference, can be used.

Furthermore, in addition to the above, the polymer compounds in paragraphs 0028 to 0084 of JP2011-153283A (the sections of paragraphs 0075 to 0133 of the corresponding US2011/0279759A), including constituents having a side chain structure formed by the bonding of acidic groups via a linking group, can be used, the contents of which can be cited and incorporated herein by reference.

The content of the dispersing resin in the first curable composition is preferably 1% to 50% by mass, more preferably 1% to 35% by mass, and still more preferably 5% to 30% by mass, with respect to the total solid content of the composition.

Furthermore, examples of a process for dispersing a coloring agent (particularly a pigment) include processes using compression, pressing, impact, shear, cavitation, and the like as a mechanical force used for dispersion. Specific examples of these processes include a beads mill, a sand mill, a roll mill, a high-speed impeller, a sand grinder, a flow jet mixer, high-pressure wet atomization, ultrasonic dispersion, and a microfluidizer. In addition, the process and dispersing machine described in "Dispersion Technology Comprehension" issued by Johokiko Co., Ltd., Jul. 15, 2005; and "Actual comprehensive data collection on dispersion technology and industrial application centered on suspension (solid/liquid dispersion system), issued by Publication Department, Management Development Center, Oct. 10, 1978" can be suitably used. A fining treatment of a pigment by a salt milling step may be carried out. As the materials, equipment, and treatment conditions used in the salt milling step, for example, those described in JP2015-194521A and JP2012-046629A can be used.

Among those, sand mill (beads mill) is preferable. Further, in the pulverization of the pigment in the sand mill (beads mill), a treatment under the condition for enhancing pulverization efficiency by using beads having a small diameter, increasing a filling rate of beads, and the like is preferable, and further, removal of subatomic particles by filtration, centrifugation, and the like after the pulverization treatment is preferable.

<Binder Resin>

The first curable composition may include binder resins, among which an alkali-soluble resin is preferably included.

The binder resin is not particularly limited, but a linear organic polymer is preferably used. As such a linear organic polymer, known ones can be used arbitrarily.

The molecular weight of the binder resin is not particularly calculated, and the weight-average molecular weight (Mw) as a value in terms of polystyrene by means of a gel permeation chromatography (GPC) method is preferably 5,000 to 100,000. Further, the number-average molecular weight (Mn) is preferably 1,000 to 20,000.

The GPC method is based on a method using HLC-8020 GPC (manufactured by Tosoh Corporation), TSKgel Super-HZM-H, TSKgel Super HZ4000, and TSKgel Super HZ2000 (manufactured by Tosoh Corporation, 4.6 mmID× 15 cm) as columns, and tetrahydrofuran (THF) as an eluent.

As described above, the first curable composition can have exposure properties and developability. Accordingly, in a case where the first curable composition is a photosensitive resin composition, the binder resin is preferably a resin which allows water development or weakly alkaline water development, and more preferably a linear organic polymer which is soluble or swellable in water or weakly alkaline water. Among those, the binder resin is still more preferably an alkali-soluble resin (resin having a group enhancing alkali solubility).

The molecular weight of the alkali-soluble resin is not particularly limited, and the weight-average molecular weight (Mw) is preferably 5,000 to 100,000. In addition, the number-average molecular weight (Mn) is preferably 1,000 to 20,000. The weight-average molecular weight and the number-average molecular weight can be measured by the above-mentioned method.

The alkali-soluble resin may be a linear organic polymer and can be appropriately selected from alkali-soluble resins having at least one group for accelerating alkali dissolution in a molecule (preferably a molecule having an acrylic copolymer or a styrene copolymer as a main chain).

As the alkali-soluble resin, from the viewpoint of heat resistance, a polyhydroxystyrene-based resin, a polysiloxane-based resin, an acrylic resin, an acrylamide-based resin, and an acryl/acrylamide copolymer resin are preferable, and further, from the viewpoint of controlling developability, an acrylic resin, an acrylamide-based resin, and an acryl/acrylamide copolymer resin are preferable.

Examples of the group enhancing alkali-solubility (hereinafter also referred to as an acid group) include a carboxyl group, a phosphoric acid group, a sulfonic acid group, and a phenolic hydroxyl group. The group enhancing alkali-solubility is preferably a group which is soluble in an organic solvent and can be developed by an aqueous weak alkaline solution. These acid groups may be used singly or in combination of two or more kinds thereof.

For the production of the alkali-soluble resin, for example, a method using known radical polymerization can be applied. The polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer disclosed in JP1998-300922A (JP-H10-300922A) include N-phenylmaleimide and N-cyclohexylmaleimide. Further, other monomers copolymerizable with the (meth)acrylic acids may be used singly or in combination of two or more kinds thereof.

Moreover, in order to improve the crosslinking efficiency of the first curable composition, an alkali-soluble resin having a polymerizable group may be used. Examples of the polymerizable group include a (meth)allyl group and a (meth)acryloyl group. As the alkali-soluble resin having a polymerizable group, an alkali-soluble resin containing a polymerizable group on a side chain thereof, and the like are useful.

Examples of the alkali-soluble resin having a polymerizable group include DIANAL NR Series (manufactured by Mitsubishi Rayon Co., Ltd.), PHOTOMER 6173 (polyurethane acrylic oligomer containing COOH, manufactured by Diamond Shamrock Co., Ltd.), VISCOAT R-264, and KS RESIST 106 (both manufactured by Osaka Organic Chemical Industry, Ltd.), CYCLOMER P Series (for example, ACA230AA) and PLACCEL CF200 Series (both manufactured by Daicel Corporation), EBECRYL 3800 (manufactured by Daicel-UCB Co., Ltd.), and ACRYCURE RD-F8 (manufactured by Nippon Shokubai Co., Ltd.).

As the alkali-soluble resin, a benzyl (meth)acrylate/(meth)acrylic acid copolymer, benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. As the alkali-soluble resin, those obtained by copolymerizing 2-hydroxyethyl methacrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl (meth)acrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can be preferably used.

Furthermore, as the commercially available product, for example, FF-426 (manufactured by Fujikura Kasei Co., Ltd.) or the like can also be used.

It is also preferable that the alkali-soluble resin includes a polymer (a) obtained by polymerizing monomer components including a compound represented by General Formula (ED1) and/or a compound represented by General Formula (ED2) (these compounds are hereinafter also referred to as an "ether dimer" in some cases).

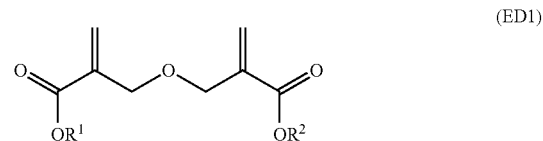

(ED1)

In General Formula (ED1), $R^1$ and $R^2$ each independently represent a hydrogen atom or a hydrocarbon group having 1 to 25 carbon atoms, which may have a substituent.

(ED2)

In General Formula (ED2), R represents a hydrogen atom or an organic group having 1 to 30 carbon atoms. With regard to the specific examples of General Formula (ED2), reference can be made to the descriptions in JP2010-168539A.

In General Formula (ED1), the hydrocarbon group having 1 to 25 carbon atoms, represented by $R^1$ and $R^2$, which may have a substituent, is not particularly limited, and examples thereof include linear or branched alkyl groups such as a methyl group, an ethyl group, an n-propyl group, an isopropyl group, an n-butyl group, an isobutyl group, a tert-butyl group, a tert-amyl group, a stearyl group, a lauryl group, and a 2-ethylhexyl group; aryl groups such as a phenyl group; alicyclic groups such as a cyclohexyl group, a tert-butylcyclohexyl group, a dicyclopentadienyl group, a tricyclodecanyl group, an isobornyl group, an adamantyl, and a 2-methyl-2-adamantyl group; alkyl groups substituted with alkoxy, such as a 1-methoxyethyl group and a 1-ethoxyethyl group; and alkyl groups substituted with an aryl group, such as a benzyl group. Among those, from the viewpoint of heat resistance, substituents of primary or secondary carbon, which are not easily eliminated by an acid or heat, such as a methyl group, an ethyl group, a cyclohexyl group, and a benzyl group, are particularly preferable.

Specific examples of the ether dimer include those described in paragraph 0317 of JP2013-29760A, the contents of which are incorporated herein by reference. These ether dimers may be used singly or in combination of two or more kinds thereof. The structure derived from the compound represented by General Formula (ED) may be copolymerized with other monomers.

The alkali-soluble resin may include a structural unit derived from a compound represented by Formula (X).

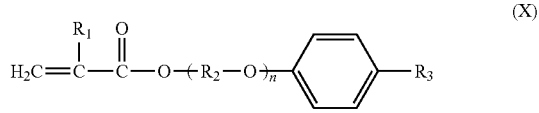

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may include a benzene ring, and n represents an integer of 1 to 15.

In Formula (X), the number of carbon atoms of the alkylene group of $R_2$ is preferably 2 or 3. Further, the number of carbon atoms of the alkyl group of $R_3$ is 1 to 20, and more preferably 1 to 10, and the alkyl group of $R_3$ may include a benzene ring. Examples of the alkyl group including a benzene ring, represented by $R_3$, include a benzyl group and a 2-phenyl(iso)propyl group.

Specific examples of the alkali-soluble resin include the following resins. Further, "Me" means a methyl group.

32767A and the alkali-soluble resins used in Examples of the document; the binder resins described in paragraph Nos. 0088 to 0098 of JP2012-208474A and the binder resins used in Examples of the document; the binder resins described in paragraph Nos. 0022 to 0032 of JP2012-137531A and the binder resins in Examples of the document; the binder resins described in paragraph Nos. 0132 to 0143 of JP2013-024934A and the binder resins used in Examples of the document; the binder resins described in paragraph Nos. 0092 to 0098 of JP2011-242752A and used in Examples; or the binder resins described in paragraph Nos. 0030 to 0072 of JP2012-032770A, the contents of which are incorporated herein by reference.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g

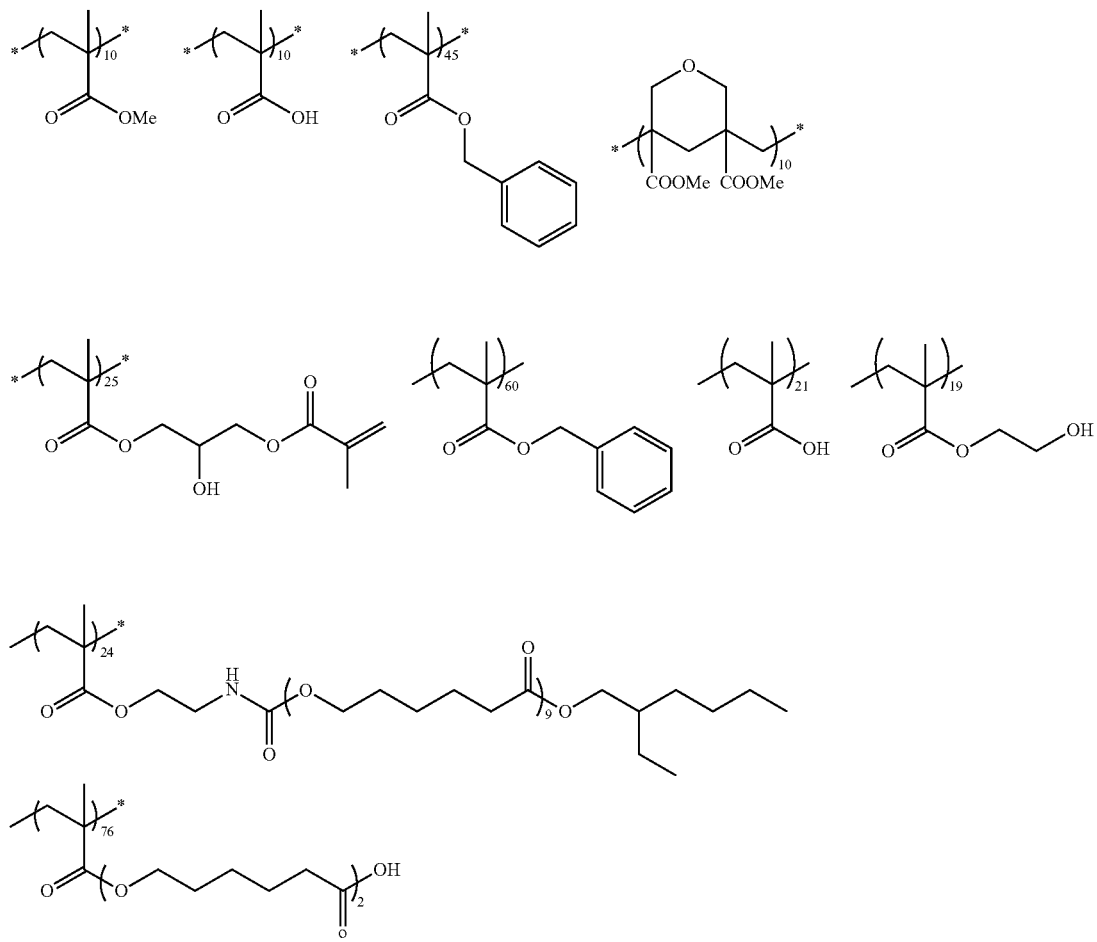

With regard to the alkali-soluble resin, reference can be made to the descriptions in paragraphs 0558 to 0571 of JP2012-208494A ([0685] to [0700] of the corresponding US2012/0235099A), the contents of which are incorporated herein by reference.

Moreover, it is possible to use the copolymers (B) described in paragraph Nos. 0029 to 0063 of JP2012- or less, still more preferably 200 mgKOH/g or less, particularly preferably 150 mgKOH/g or less, and still further preferably 120 mgKOH/g or less.

Furthermore, it is also preferable that the first curable composition contains a resin represented by Structure (a1), for example, as the binder resin.

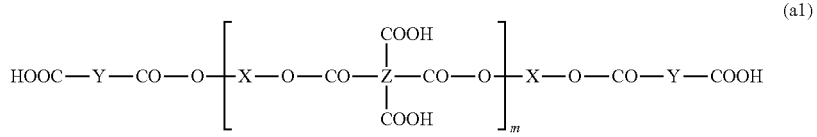

(a1)

In Formula (a1), X represents a group represented by Formula (a2).

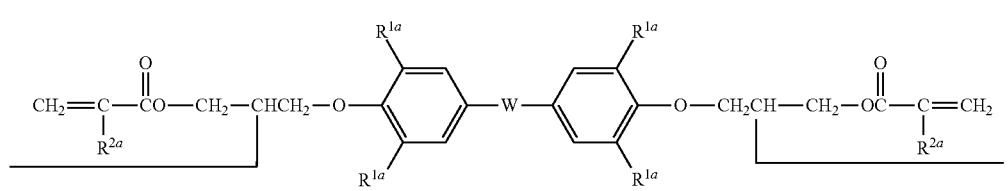

(a2)

In Formula (a2), $R^{1a}$'s each independently represent a hydrogen atom, a hydrocarbon group having 1 to 6 carbon atoms, or a halogen atom, $R^{2a}$'s each independently represent a hydrogen atom or a methyl group, and W represents a single bond or a group represented by Formula (a3).

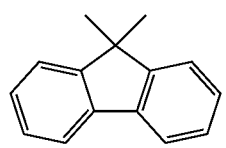

(a3)

Furthermore, in Formula (a1), Y represents a residue obtained by removing an acid anhydride group (—CO—O—CO—) from a dicarboxylic anhydride. Examples of the dicarboxylic anhydride include maleic anhydride, succinic anhydride, itaconic anhydride, phthalic anhydride, tetrahydrophthalic anhydride, hexahydrophthalic anhydride, methyl endomethylene tetrahydrophthalic anhydride, chlorendic anhydride, methyl tetrahydrophthalic phthalic anhydride, and glutaric anhydride.

Moreover, in Formula (a1), Z represents a residue obtained by removing two acid anhydride groups from a tetracarboxylic dianhydride. Examples of the tetracarboxylic dianhydride include pyromellitic anhydride, benzophenone tetracarboxylic dianhydride, biphenyl tetracarboxylic dianhydride, and biphenyl ether tetracarboxylic dianhydride.

In addition, in Formula (a1), m represents an integer of 0 to 20.

Moreover, the mass average molecular weight of the resin represented by Structure (a1) is preferably 1,000 to 40,000, and more preferably 2,000 to 30,000. By setting the mass average molecular weight to 1,000 or more, it is possible to obtain good heat resistance and film strength, which is thus preferable. In addition, by setting the mass average molecular weight to 40,000 or less, it is possible to obtain good developability, which is thus preferable.

In addition, the acid value of the resin represented by Structure (a1) preferably 10 to 150 mgKOH/g, and more preferably 70 to 110 mgKOH/g, in terms of a resin solid content. By setting the acid value to 10 mgKOH/g or more, a sufficient solubility in a developer is obtained, which is thus preferable. Further, by setting the acid value to 150 mgKOH/g or less, it is possible to obtain sufficient curability to improve the surface properties, which is thus preferable.

Furthermore, it is also preferable that the first curable composition contains a polyimide resin, for example, as the binder resin.

The polyimide resin is a non-photosensitive resin, is formed by ring closure imidization by heating a polyamic acid as a precursor. The polyamic acid resin is generally obtained by an addition polymerization reaction between a compound having an acid anhydride group and a diamine compound at a temperature of 40° C. to 100° C., and has a repeating structural unit represented by General Formula (3). The polyimide resin in which the polyamic acid resin is subjected to partial ring closure is an amic acid structure represented by General Formula (4), a structure represented by General Formula (5) in which an amic acid structure is subjected to partial ring closure imidization, and an imide structure represented by General Formula (6) in which an amic acid structure is subjected to full ring closure imidization.

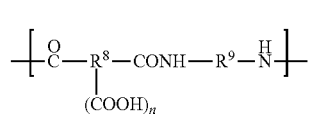

(3)

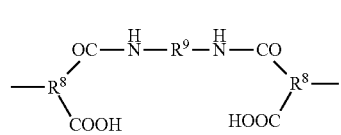

(4)

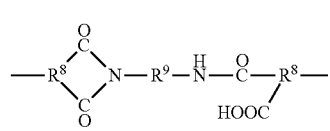

(5)

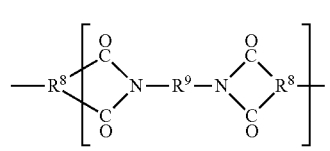

(6)

In General Formulae (3) to (6), $R^8$ represents a trivalent or tetravalent organic group having 2 to 22 carbon atoms, $R^9$ represents a divalent organic group having 1 to 22 carbon atoms, and n is an integer of 1 or 2, but as each of the organic groups, an organic group in which an aromatic tetracarboxylic acid constituting the polyimide imparts a preferred aromatic tetracarboxylic dianhydride which will be described later is preferable.

To increase the heat resistance and the insulation properties of the polyimide resin, an aromatic diamine compound is preferable as a diamine compound used for obtaining the polyamic acid resin, and an acid dianhydride is preferable as a compound having an acid anhydride group.

As the aromatic diamine compound, for example, para-phenylenediamine, meta-phenylenediamine, 3,3'-diaminodiphenyl ether, 4,4'-diaminodiphenyl ether, 3,4'-diaminodiphenyl ether, 4,4'-diaminodiphenylmethane, 3,3'-diaminodiphenylsulfone, 4,4'-diaminodiphenylsulfone, 3,3'-diaminodiphenylsulfide, 4,4'-diaminodiphenylsulfide, 1,3-bis(4-aminophenoxy)benzene, 1,4-bis(4-aminophenoxy)benzene, 2,2-bis(trifluoromethyl)benzidine, 9,9'-bis(4-aminophenyl)fluorine, 4,4'-diaminodiphenylamine, 3,4'-diaminodiphenylamine, 3,3'-diaminodiphenylamine, 2,4'-diaminodiphenylamine, 4,4'-diaminodibenzylamine, 2,2'-diaminodibenzylamine, 3,4'-diaminodibenzylamine, 3,3'-diaminodibenzylamine, N,N'-bis-(4-amino-3-methylphenyl)ethylenediamine, 4,4'-diaminobenzanilide, 3,4'-diaminobenzanilide, 3,3'-diaminobenzanilide, 4,3'-diaminobenzanilide, 2,4'-diaminobenzanilide, N,N'-p-phenylenebis-p-aminobenzamide, N,N'-p-phenylenebis-m-aminobenzamide, N,N'-m-phenylenebis-p-aminobenzamide, N,N'-m-phenylenebis-m-aminobenzamide, N,N'-dimethyl-N,N'-p-phenylenebis-p-aminobenzamide, N,N'-dimethyl-N,N'-p-phenylenebis-m-aminobenzamide, N,N'-diphenyl-N,N'-p-phenylenebis-p-aminobenzamide and N,N'-diphenyl-N,N'-p-phenylenebis-m-aminobenzamide, but the aromatic diamine compound is preferably para-phenylenediamine, meta-henylenediamine, 3,3'-diaminodiphenyl ether, 4,4'-diaminodiphenyl ether, 3,4'-diaminodiphenyl ether, 3,3'-diaminodiphenylsulfone, 4,4'-diaminodiphenylsulfone, 9,9'-bis(4-aminophenyl)fluorene, or 4,4'-diaminobenzanilide.

Examples of the aromatic tetracarboxylic acid include 4,4'-oxydiphthalic dianhydride, 3,3',4,4'-benzophenonetetracarboxylic dianhydride, pyromellitic dianhydride, 3,4,9,10-perylenetetracarboxylic dianhydride, 3,3',4,4'-diphenylsulfonetetracarboxylic dianhydride, 3,3',4,4'-biphenyltetracarboxylic dianhydride, 1,2,5,6-naphthalenetetracarboxylic dianhydride, 3,3',4,4'-para-terphenyltetracarboxylic dianhydride, and 3,3',4,4'-meta-terphenyltetracarboxylic dianhydride, but the aromatic tetracarboxylic acid is preferably 4,4'-biphenyltetracarboxylic dianhydride, 4,4'-benzophenonetetracarboxylic dianhydride, or pyromellitic dianhydride. Further, in a case where a fluorine-based tetracarboxylic dianhydride such as 4,4'-(hexafluoroisopropylidene)diphthalic dianhydride is used, a polyimide having good transparency in a short wavelength range can be obtained.

In the addition polymerization of a compound having an acid anhydride group and a diamine compound to obtain a polyamic acid resin, an acid anhydride such as maleic anhydride or phthalic anhydride may be added, as desired, as an end capping agent. Further, in order to improve the adhesiveness to inorganic substances such as a glass plate and a silicon wafer, a Si-based acid anhydride or a Si-based diamine may be used. As the So-based diamine, a siloxanediamine such as bis-3-(aminopropyl)tetramethylsiloxane is preferable. The proportion of the siloxanediamine with respect to the total diamine is preferably 1% to 20% by mole.

In a case where the siloxanediamine is less than 1% by mole, the adhesiveness is not sufficiently improved in some cases. On the other hand, in a case where the proportion is more than 20% by mole, there occurs a problem in that the heat resistance is reduced or a film remains during alkali development due to excessive adhesiveness.

As the compound having an acid anhydride group and the diamine compound to obtain a polyamic acid resin, an alicyclic acid dianhydride or an alicyclic diamine may be used. Examples of the alicyclic acid dianhydride or the alicyclic diamine include 1,2,4,5-cyclohexanetetracarboxylic dianhydride, bicyclo[2.2.2]oct-7-ene-2,3,5,6-tetracarboxylic dianhydride, bicyclo[2.2.1]heptan-2-endo-3-endo-5-exo-6-exo-2,3,5,6-tetracarboxylic dianhydride, bicyclo[2.2.1]heptan-2-exo-3-exo-5-exo-6-exo-2,3,5,6-tetracarboxylic dianhydride, bicyclo[2.2.1]heptane-2,3,5,6-tetracarboxylic dianhydride or decahydrodimethanonaphthalenetetracarboxylic dianhydride or bis[2-(3-aminopropoxy)ethyl]ether, 1,4-butanediol-bis(3-aminopropyl)ether, 3,9-bis(3-aminopropyl)-2,4,8,10-tetraspiro-5,5-undecane, 1,2-bis(2-aminoethoxy)ethane, 1,2-bis(3-aminopropoxy)ethane, triethylene glycol-bis(3-aminopropyl)ether, polyethylene glycol-bis(3-aminopropyl)ether, 3,9-bis(3-aminopropyl)-2,4,8,10-tetraspiro-5,5-undecane, and 1,4-butanediol-bis(3-aminopropyl) ether.

In a case where the first curable composition contains a binder resin (preferably an alkali-soluble resin), the content of the binder resin is preferably 0.01% to 45% by mass with respect to the total solid content of the composition. The lower limit is more preferably 0.1% by mass or more, still more preferably 0.5% by mass or more, particularly preferably 1% by mass or more, and most preferably 1.5% by mass or more. The upper limit is more preferably 40% by mass or less, still more preferably 35% by mass or less, and even still more preferably 30% by mass or less. The curable composition may include only one kind or two or more kinds of the binder resins. In a case where two or more kinds of the binder resins are included, the total amount thereof preferably falls within the range.

<Organic Solvent>

The first curable composition may contain an organic solvent.

Basically, the organic solvent is not particularly limited as long as it satisfies the solubility of the respective components or the coatability of the first curable composition, but is preferably selected in consideration of the solubility, the coatability, and the safety of a polymerizable compound, an alkali-soluble resin, or the like.

Suitable examples of the organic solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl oxyacetate esters (for example: methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), alkyl 3-oxypropionate esters (for example: methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate)), alkyl 2-oxypropionate esters (for example: methyl 2-oxypropionate, ethyl 2-oxypropionate, propyl 2-oxypropionate, and the like (for example, methyl 2-methoxypropionate, ethyl 2-methoxypropionate, propyl 2-methoxypropionate, methyl 2-ethoxypropionate, and ethyl 2-ethoxypropionate)), methyl 2-oxy-2-methyl propionate and ethyl 2-oxy-2-methyl propionate (for example: methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol methyl ether acetate (PGMEA), propylene glycol ethyl ether acetate, and propylene glycol propyl ether acetate; ketones such as methyl ethyl ketone, cyclohexanone, cyclopentanone, 2-heptanone, and 3-heptanone; and aromatic hydrocarbons such as toluene and xylene.

From the viewpoints of the solubility of a polymerizable compound, an alkali-soluble resin, or the like, the improvement in the shape of coated surfaces, and the like, it is also preferable to mix two or more kinds of these organic solvents. A mixed solution consisting of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate is particularly preferable.

In the present invention, the organic solvent preferably has a content of peroxides of 0.8 mmol/L or less, and the solvent which does not substantially include peroxides is more preferably used.

From the viewpoint of coatability, the content of the organic solvent in the first curable composition is preferably set such that the concentration of the total solid content of the composition becomes 5% to 80% by mass, more preferably 5% to 60% by mass, and still more preferably 10% to 50% by mass.

The first curable composition may include only one kind or two or more kinds of the organic solvent. In a case where the first curable composition includes two or more kinds of the solvent, the total amount thereof preferably falls within the range.

<Surfactant>

From the viewpoint of further improving coatability, various surfactants may be incorporated into the first curable composition. As the surfactants, various surfactants such as a fluorine-based surfactant, a non-ionic surfactant, a cationic surfactant, an anionic surfactant, and a silicon-based surfactant can be used.

For example, by incorporating a fluorine-based surfactant into the first curable composition, liquid characteristics (in particular, fluidity) are further improved in the preparation of a coating liquid. That is, in the case where a film is formed, using a coating liquid to which the composition containing a fluorine-based surfactant has been applied, the interface tension between a surface to be coated and the coating liquid is reduced to improve wettability with respect to the surface to be coated, and enhance coatability with respect to the surface to be coated. Therefore, a film with a uniform thickness which exhibits a small extent of thickness unevenness can be more suitably formed.

The fluorine content in the fluorine-based surfactant is suitably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film or liquid saving properties, and the solubility of the surfactant in the composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and RS-72-K (all manufactured by DIC Corporation); FLUORAD FC430, FC431, and FC171 (all manufactured by Sumitomo 3M); SURFLON S-382, SURFLON SC-101, SURFLON SC-103, SURFLON SC-104, SURFLON SC-105, SURFLON SC1068, SURFLON SC-381, SURFLON SC-383, SURFLON 5393, and SURFLON KH-40 (all manufactured by ASAHI GLASS Co., Ltd.); and PF636, PF656, PF6320, PF6520, and PF7002 (manufactured by OMNOVA). As the fluorine-based surfactant, the compounds described in paragraphs 0015 to 0158 of JP2015-117327A can also be used. As the fluorine-based surfactant, a block polymer can also be used, and specific examples thereof include the compounds described in JP2011-89090A.

The fluorine-based surfactant can also preferably use a high molecular fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups), the following compounds are also exemplified as a fluorine-based surfactant for use in the present invention.

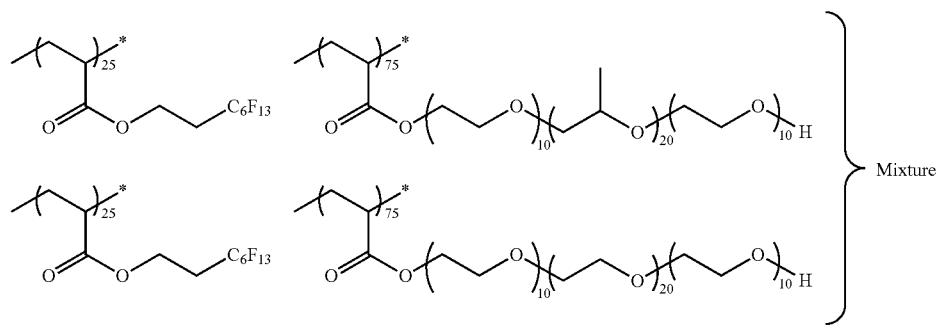

The weight-average molecular weight of the compound is preferably 3,000 to 50,000, and is, for example, 14,000.

A fluorine-containing polymer having an ethylenically unsaturated group in a side chain can also be used as the fluorine-based surfactant. Specific examples thereof include the compounds described in paragraphs 0050 to 0090 and paragraphs 0289 to 0295 of JP2010-164965A, such as MEGAFACE RS-101, RS-102, RS-718K, and RS-72-K, all manufactured by DIC Corporation.

Specific examples of the non-ionic surfactant include glycerol, trimethylolpropane, trimethylolethane, and ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2, and TETRONIC 304, 701, 704, 901, 904, and 150R1 manufactured by BASF), and SOLSEPERSE 20000 (manufactured by Lubrizol Japan Ltd.). Further, NCW-101, NCW-1001, or NCW-1002 (manufactured by Wako Pure Chemical Industries, Ltd.) can also be used.

Specific examples of the cationic surfactant include phthalocyanine derivatives (trade name: EFKA-745, manufactured by MORISHITA KAGAKU SANGYO Corporation), organosiloxane polymer KP341 (manufactured by Shin-Etsu Chemical Co., Ltd.), (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.), and SANDET BL manufactured by Sanyo Chemical Industries, Ltd.

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and BYK307, BYK323, and BYK330 (all manufactured by BYK Chemie).

The surfactants may be used singly or in combination of two or more kinds thereof. The content of the surfactant is preferably 0.001% to 2.0% by mass, and more preferably 0.005% to 1.0% by mass, with respect to the total solid content of the composition of the present invention.

<Other Additives>

Various additives, for example, a filler, an adhesion promoter, an antioxidant, a polymerization inhibitor, an aggregation inhibitor, a surfactant, and an ultraviolet absorber can be blended into the first curable composition, if desired. Examples of these additives include those described in paragraphs 0155 to 0156 of JP2004-295116A, the contents of which are incorporated herein by reference.

The curable composition can contain the sensitizer or the light stabilizer described in paragraph 0078 of JP2004-295116A, or the thermal polymerization inhibitor described in paragraph 0081 of the same publication.

[Second Curable Composition]

Next, the curable composition of the second embodiment of the present invention (hereinafter also referred to as a "second curable composition") will be described.

The second curable composition contains:
a visible light-absorbing coloring agent (hereinafter also referred to as a "visible light-absorbing coloring agent"),
an infrared ray-absorbing coloring agent (hereinafter also referred to as an "infrared ray-absorbing coloring agent"),
a polymerizable compound, and
an acrylic or methacrylic resin having an adsorptive group (hereinafter also referred to as a "dispersing resin"),
in which a content of the polymerizable compound with respect to the acrylic or methacrylic resin having an adsorptive group is 0.5 to 7 in terms of a mass ratio.

The second curable composition is capable of forming a cured film having excellent linearity of a pattern, even in a case of performing an exposure at a lower exposure dose.

Although the reason therefor is not specifically clear, it is presumed as follows by the present inventors.

The acrylic or methacrylic resin having an adsorptive group has a function of improving the dispersibility of the coloring components in the composition by adsorption onto the visible light-absorbing coloring agent and the infrared ray-absorbing coloring agent. In a case where a coating film using the second curable composition is exposed and developed to form a pattern, the infrared ray-absorbing coloring agent easily absorbs heat generated during the exposure (polymerization heat and the like) and/or heat caused by baking after the exposure. As a result, the photopolymerization initiator included in the coating film is likely to be cleaved to generate radicals, and the diffusion of the generated radicals is accelerated to make a good curing progress across a deep portion of a film.

That is, for example, in a case where the coating film is exposed at a low exposure dose, cleavage of the photopolymerization initiator does not proceed sufficiently in the exposed area, and a small amount of radicals is generated. However, in the present invention, absorption of heat generated by the infrared ray-absorbing coloring agent during exposure and heat by a heating treatment after the exposure accelerates generation and diffusion of the above-mentioned radicals, and thus, the curing in the exposed area is further undergone, thereby obtaining a desired pattern.

Here, in a case where the content of the polymerizable compound with respect to the acrylic or methacrylic resin having an adsorptive group is less than 0.5 in terms of a mass ratio, the amount of curable components is small, and therefore, curing does not sufficiently proceed and the linearity of the pattern is deteriorated.

In a case where the content of the polymerizable compound with respect to the acrylic or methacrylic resin having an adsorptive group is more than 7, diffusion of radicals generated by various compounds included in the coating film by heat absorption by the infrared ray-absorbing coloring agent is accelerated, but the amount of curable components is extremely large, and therefore, curing occurs even in the unexposed area, thus, development is hardly performed and the linearity of a pattern thus obtained is deteriorated.

By setting the content of the polymerizable compound with respect to the acrylic or methacrylic resin having an adsorptive group to 0.5 to 7 in terms of a mass ratio, the developability becomes excellent, and further, the linearity of a pattern becomes excellent. Among those, the mass ratio is preferably 0.55 to 6, and more preferably 0.6 to 5.

The second curable composition may further include a photopolymerization initiator.

From the viewpoint of further improving the effects of the present invention, in a case where the composition contains a photopolymerization initiator, the content of the photopolymerization initiator with respect to the acrylic or methacrylic resin having an adsorptive group is preferably 0.1 to 2, and more preferably 0.15 to 1.5, in terms of a mass ratio.

Moreover, from the viewpoint of developability, the second curable composition may further include an alkali-soluble resin.

From the viewpoint of further improving the effect of the present invention, in a case where the composition contains an alkali-soluble resin, a content of the alkali-soluble resin with respect to the acrylic or methacrylic resin having an adsorptive group is preferably 5 or less, and more preferably 4 or less, in terms of a mass ratio.

From the viewpoint of further improving the effect of the present invention, the total content of the infrared ray-absorbing coloring agent and the visible light-absorbing coloring agent with respect to the acrylic or methacrylic resin having an adsorptive group is preferably 1 to 5, and more preferably 2 to 5, in terms of a mass ratio.

The components which are contained or may be contained in the second curable composition of the present invention are the same as the above-mentioned first curable composition, and a preferred aspect thereof is also the same.

[Method of Preparing Curable Composition]

The curable composition of the present invention can be prepared by mixing the above-mentioned various components using known mixing methods (for example, a stirrer, a homogenizer, a high-pressure emulsifier, a wet pulverizer and a wet disperser).

Furthermore, in the preparation of the curable composition of the present invention, it is preferable that the method includes a step of filtering the curable composition with a filter for the purpose of removal of foreign matters, reduction in defects, or the like.

Moreover, it is preferable that the curable composition of the present invention does not include impurities such as a metal, a metal salt including halogen, an acid, and an alkali. The content of the impurities included in these materials is preferably 1 ppm or less, more preferably 1 ppb or less, still more preferably 100 ppt or less, and particularly preferably 10 ppt or less, and most preferably, the impurities are not substantially included (no higher than a detection limit of a measurement device).

Examples of a method for removing impurities such as metals from the various materials include filtration using a filter and a purification step by distillation (in particular, thin-film distillation and molecular distillation). As for the purification step by distillation, for example, "<Factory Operation Series> Augmentation/Distillation, issued on Jul. 31, 1992, Chemical Industry Co., Ltd.", "Chemical Engineering Handbook, published on Sep. 30, 2004", Asakura Shoten, pages 95 to 102", and the like may be mentioned. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. The filter may be formed of a composite material formed by combining this material with an ion exchange medium. As the filter, a filter which had been washed with an organic solvent in advance may be used. In the step of filtration using a filter, plural kinds of filters may be connected in series or in parallel, and used. In a case of using plural kinds of filters, a combination of filters having different pore diameters and/or materials may be used. In addition, various materials may be filtered plural times, and a step of filtering plural times may be a circulatory filtration step.

Furthermore, as a method for reducing the impurities such as metals included in various materials, metal content selects the less material as a raw material constituting the various materials, performing filter filtration of the raw material constituting the various materials, equipment the inner and a method such as performing distillation under conditions suppressing as much as possible equal to contamination is lined with Teflon (registered trademark). Preferred conditions in the filter filtration to be performed on the raw material constituting the various materials are similar to the above-mentioned conditions.

Other filter filtration may be performed to remove impurities by the adsorbent and may be used in combination with filter and filtration adsorbent. The adsorbent can be a known adsorbent, and for example, an inorganic adsorbent such as silica gel and zeolite, or an organic adsorbent such as activated carbon can be used.

[Cured Film]

A cured film formed by curing the above-mentioned curable composition can be suitably used as a so-called light-shielding film, or the like in a case where a black pigment is used as the coloring agent.

The thickness of the light-shielding film is not particularly limited, and is preferably 0.2 to 25 μm, and more preferably 1.0 to 10 μm.

The thickness is an average thickness, which is a value obtained by measuring the thickness at arbitrary 5 or more points of the light-shielding film, and arithmetically averaging the values.

The method for producing the cured film is not particularly limited, and examples thereof include a method in which the above-mentioned curable composition is applied onto a substrate to form a coating film, and the coating film is subjected to a curing treatment to produce a cured film.

The method for the curing treatment is not particularly limited, but examples thereof include a photocuring treatment and a thermosetting treatment, and from the viewpoint of easiness of pattern formation, the photocuring treatment (in particular, a treatment by irradiation with ultraviolet rays) is preferable.

In addition, the type of a substrate to be used is not particularly limited, and preferred examples of the substrate include various members (for example, an infrared cut filter, an outer peripheral portion of a solid-state imaging element, an outer peripheral portion of a wafer level lens, and a back surface of a solid-state imaging element) in a solid-state imaging device.

Suitable aspects in a case of producing a cured film in the pattern shape include an aspect including a step of applying the curable composition of the present invention onto a substrate to form a coating film (pigment layer) (hereinafter appropriately simply referred to as a "coating film forming step"), a step of patternwise exposing the coating film through a mask (hereinafter appropriately simply referred to as an "exposing step"), and a step of developing the exposed coating film to remove an unexposed area, thereby forming a cured film (cured film in the pattern shape) (hereinafter appropriately simply referred to as a "developing step").

Specifically, a cured film in the pattern shape can be produced by applying the curable composition of the present invention onto a substrate directly or through another layer to form a coating film (coating film forming step), exposing the coating film through a predetermined mask pattern and curing only the coating film portion irradiated with light (exposing step), and developing the coating film irradiated with light using a developer (developing step).

Furthermore, the curable composition of the present invention contains a visible light-absorbing coloring agent and an infrared ray-absorbing coloring agent as described above, and a reaction in the exposed area is accelerated due to heat absorption of the infrared ray-absorbing coloring agent. Accordingly, from the viewpoint of further improving the effect of the present invention, it is preferable that the method further has a heating step after the exposing step and before the developing step. Hereinafter, each of the steps will be specifically described.

[Coating Film Forming Step]

In the coating film forming step, the curable composition of the present invention is applied onto a substrate to form a coating film.

Examples of a method for applying the curable composition of the present invention on the substrate include various application methods such as slit coating, an ink jet method, rotation coating, cast coating, roll coating, and a screen printing method for a coating film.

The curable composition applied to the substrate is usually dried under the conditions of a temperature from 70° C. to 110° C. for a period from approximately 2 minutes to 4 minutes to form a coating film.

[Exposing Step]

In the exposing step, the coating film formed in the coating film forming step is exposed through a mask to cure only the coating film portion irradiated with light.

The exposure is preferably performed by the irradiation with radiation. As the radiation, in particular, ultraviolet rays such as g-rays, h-rays, and i-rays are preferably used. Further, as a light source, a high-pressure mercury lamp is preferable. The exposure dose is preferably from 50 mJ/cm$^2$ to 1700 mJ/cm$^2$, more preferably from 100 mJ/cm$^2$ to 1000 mJ/cm$^2$. In addition, the exposure time is preferably 0.01 to 2 seconds, more preferably 0.05 to 1 second, and still more preferably 0.1 to 0.75 seconds.

[Heating Step]

In a case where the method has a heating step, the heating temperature is preferably 50° C. to 300° C., and more preferably 150° C. to 230° C. Further, the heating time is preferably 30 to 1,200 seconds, more preferably 60 to 60 seconds, and still more preferably 120 to 480 seconds.

The heating can be performed using a means equipped with an ordinary exposure developing device, and may be performed using a hot plate or the like. By performing the heating step (baking), a reaction in the exposed area is further accelerated due to heat absorption of the infrared ray-absorbing coloring agent, and the sensitivity and the linearity of a pattern are further improved.

[Developing Step]

Following the exposing step, a developing treatment (developing step) is performed to elute a portion not irradiated with light in the exposing step into a developer (for example, an aqueous alkali solution), and as a result, only a photocured portion remains.

An organic alkaline developer is preferably used as the developer. The development temperature is usually from 20° C. to 30° C., and the development time is from 20 seconds to 90 seconds.

Examples of the aqueous alkali solution include an inorganic developer and an organic developer. Examples of the inorganic developer include an aqueous solution in which sodium hydroxide, potassium hydroxide, sodium carbonate, sodium hydrogen carbonate, sodium silicate, or sodium metasilicate is dissolved to a concentration of 0.001% to 10% by mass, preferably 0.005% to 1.0% by mass, and more preferably 0.01% to 0.6% by mass. Examples of the organic alkaline developer include an aqueous solution in which an alkaline compound such as aqueous ammonia, ethylamine, diethylamine, dimethylethanolamine, tetramethylammonium hydroxide (alternative name: tetramethylammonium hydroxide (TMAH)), tetraethylammonium hydroxide, tetrapropylammonium hydroxide, tetrabutylammonium hydroxide, benzyltrimethylammonium hydroxide, choline, pyrrole, piperidine, and 1,8-diazabicyclo-[5,4,0]-7-ubdecene is dissolved to a concentration of 0.001% to 10% by mass, and preferably 0.005% to 0.5% by mass. For example, a suitable amount of a water-soluble organic solvent such as methanol and ethanol and/or a surfactant, or the like may also be included in the aqueous alkali solution. Further, in a case where a developer formed of such an aqueous alkali solution is used, it is generally preferable that the pattern is washed (rinsed) with pure water after development. Examples of the developing method include puddle development.

In addition, after performing the coating film forming step, the exposing step, and the developing step, a curing step of curing the formed cured film in the pattern shape by heating and/or exposure may also be carried out, if desired.

Furthermore, other aspects in which a cured film in a pattern shape is produced using the curable composition of the present invention include an aspect including a coating film forming step of forming a coating film on a substrate, an exposing step of patternwise exposing the coating film, and a developing step of removing an unexposed area by development to form a cured film in a pattern shape, and further including performing a heating treatment during the exposing step. That is, an aspect in which exposure is performed while performing heating can be mentioned.

In the present aspect, the exposure dose is not particularly limited. Further, since the curable composition includes an infrared ray-absorbing coloring agent, curing is sufficiently accelerated only with heat generation during the polymerization in some cases, and at this time, a heating step to be performed during or after the exposure is preferably performed at a low temperature (preferably at a temperature of lower than 100° C.).

In the present aspect, the definitions of the coating film forming step and the developing step are the same as in the above-mentioned aspect, and preferred ranges thereof are also the same.

The definition of the exposing step is the same as the above-mentioned aspect. The exposure dose in the exposing step is preferably from 50 mJ/cm$^2$ to 1,700 mJ/cm$^2$, and more preferably from 100 mJ/cm$^2$ to 1,000 mJ/cm$^2$. Further, the exposure time is preferably 0.01 to 2 seconds, more preferably 0.05 to 1 second, and still more preferably 0.1 to 0.75 seconds.

The heating temperature is preferably 50° C. to 300° C., and more preferably 150° C. to 230° C. Further, the heating time is preferably 30 to 1,200 seconds, more preferably 60 to 600 seconds, and still more preferably 120 to 480 seconds.

[Light-Shielding Film and Solid-State Imaging Device]

A cured film formed by the curable composition of the present invention can be suitably applied as a so-called light-shielding film. Further, such the light-shielding film can be suitably applied to a solid-state imaging device.

The configuration of the solid-state imaging device of the present invention is not particularly limited as long as the solid-state imaging device is configured to include the light-shielding film of the present invention or the color filter of the present invention which will be described later, and function as a solid-state imaging device. However, examples thereof include the following configuration.

The solid-state imaging device has a configuration in which a plurality of photodiodes constituting a light receiving area of a solid-state imaging element (a CCD image sensor, a CMOS image sensor, or the like) and a transfer electrode formed of polysilicon or the like is provided on a support, a light-shielding film formed of tungsten, having openings only over the light receiving portion of the photodiode, is provided on the photodiodes and the transfer electrodes, a device protecting film formed of silicon nitride or the like, which is formed to cover the entire surface of the light-shielding film and the light receiving portion of the photodiodes, is provided on the light-shielding film, and a color filter is provided on the device protecting film.

Furthermore, the solid-state imaging device may have a configuration in which a light collecting means (for example, a microlens, the same applies hereinafter) is disposed under the color filter (a side closer to the support) or on the color filter, on the device protecting film. In addition, the color filter may have a structure in which a cured film forming each color pixel is embedded in, for example, a space partitioned in a lattice form by a partition wall. The partition wall in this case preferably has a low refractive index for each color pixel. Examples of an imaging device having such a structure include the devices described in JP2012-227478A and JP2014-179577A.

For the solid-state imaging device of the present invention, at least one of the light-shielding film or the color filter may be a cured film formed by the curable composition of the present invention.

[Color Filter]

Moreover, a cured film formed using the curable composition of the present invention can also be used in a color filter.

Furthermore, the color filter can be suitably used for a solid-state imaging element such as a charge coupled device (CCD) and a complementary metal-oxide semiconductor (CMOS), and is particularly suitable for a CCD, a CMOS, and the like with a high resolution, having more than 1,000,000 pixels. The color filter can be used as, for example, a color filter disposed between a light-receiving section each pixel constituting a CCD or a CMOS and a microlens for collecting light. Details thereof are the same as described above.

Furthermore, the color filter can be preferably used for an organic electroluminescence (organic EL) element. As the organic EL element, a white organic EL element is preferable. The organic EL element preferably has a tandem structure. The tandem structure of the organic EL element is described in JP2003-45676A, "Forefront of Organic EL Technology Development—Know-How Collection of High Brightness/High Precision/Long Life-", reviewed by Mikami Akiyoshi, Technical Information Institute, pp. 326 to 328, 2008, and the like. Examples of the tandem structure of the organic EL element include a structure in which an organic EL layer is provided between a lower electrode with light reflectivity and an upper electrode with light-transmitting properties on one side of a substrate. The lower electrode is preferably configured with a material having a sufficient reflectivity in a visible light wavelength range. The organic EL layer preferably has a lamination structure (tandem structure) including a plurality of light emitting layers, with the plurality of the light emitting layers laminated. The plurality of light emitting layers of the organic EL layer can include, for example, a red light emitting layer, a green light emitting layer, and a blue light emitting layer. Further, the organic EL layer preferably has a plurality of light emitting auxiliary layers for light emission of the light emitting layers, in addition to the plurality of light emitting layers. The organic EL layer can have, for example, a lamination structure in which a light emitting layer and a light emitting auxiliary layer are alternately laminated. An organic EL element having an organic EL layer such a structure can emit white light. In this case, it is preferable that a spectrum of white light which the organic EL element emits has strong maximum light emitting peaks at a blue region (430 nm to 485 nm), a green region (530 nm to 580 nm), and a yellow region (580 nm to 620 nm). It is more preferable that the spectrum additionally has a strong maximum light emitting peak at a red region (650 nm to 700 nm), in addition to the light emitting peaks. By combining an organic EL element (white organic EL element) that emits white light with the color filter of the present invention, an excellent spectrum in terms of color reproducibility is obtained, and thus, a clearer image or image can be displayed.

The film thickness of the colored pattern (colored pixel) in the color filter is preferably 2.0 μm or less, more preferably 1.0 μm or less, and still more preferably 0.7 μm or less. The lower limit can be set to, for example, 0.1 μm or more, or also to 0.2 μm or more.

Incidentally, the size (pattern width) of the colored pattern (colored pixel) is preferably 2.5 μm or less, more preferably 2.0 μm or less, and particularly preferably 1.7 μm or less. The lower limit can be set to, for example, 0.1 μm or more, or also to 0.2 μm or more.

The method for manufacturing a color filter includes a pattern forming method of the above-mentioned cured film, and further, a suitable aspect thereof is also the same.

[Image Display Device]

A cured film (a color filter, a light-shielding film, or the like) formed using the curable composition of the present invention can be used for an image display device such as a liquid crystal display device and an organic electroluminescence display device.

The definition of display devices or the details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter in the present invention may be used for a liquid crystal display device using a color Thin Film Transistor (TFT) system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching mode such as In Plane Switching (IPS), a pixel division system such as Multi-domain Vertical Alignment (MVA), or the like, or to Super-Twist Nematic (STN), Twisted Nematic (TN), Vertical Alignment (VA), on-chip spacer (OCS), fringe field switching (FFS), Reflective Optically Compensated Bend (R-OCB), and the like.

In addition, the color filter in the present invention can be provided to a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a peeling solution in some cases, in addition to the generally required characteristics as described above. Since the color filter of the present invention has excellent light resistance or the like, a liquid crystal display device in a COA system which has high resolution and excellent long-term durability can be provided. In addition, in order to satisfy the characteristics required for a low dielectric constant, a resin coating film may be provided on the color filter layer.

These image display systems are described in, for example, p. 43 of "EL, PDP and LCD Display—Technologies and Recent Trend in Market—(TORAY RESEARCH CENTER, Research Department, published in 2001)", and the like.

The liquid crystal display device is constituted with various members such as an electrode substrate, a polarizing film, a retardation film, a backlight, a spacer, and a view angle compensation film, in addition to the color filter in the present invention. The color filter of the present invention can be applied to a liquid crystal display device constituted with these known members. These members are described in, for example, "'94 Market of Peripheral Materials And Chemicals of Liquid Crystal Display (Kentaro Shima, CMC Publishing Co., Ltd., published in 1994)" and "2003 Current Situation of Market Relating to Liquid Crystal and Prospects (Vol. 2) (Ryokichi Omote, Fuji Chimera Research Institute, Inc., published in 2003)".

The backlight is described in SID Meeting Digest 1380 (2005) (A. Konno. et al.), December Issue of Monthly "Display", 2005, pp. 18 to 24 (Yasuhiro Shima) and pp. 25 to 30 (Takaaki Yagi) of the document, and the like.

[Infrared Sensor]

The infrared sensor of the present invention includes the color filter of the present invention. Since the color filter of the present invention includes an infrared ray-absorbing coloring agent, it has an effect of reducing noises due to infrared light.

The configuration of the infrared sensor of the present invention is not particularly limited as long as it is a configuration in which the infrared sensor includes a color filter formed of the curable composition of the present invention, and functions as a solid-state imaging element, but examples thereof include the following configurations.

The infrared sensor has a plurality of photodiodes constituting a light receiving area of a solid-state imaging element (a CCD sensor, a CMOS sensor, an organic CMOS sensor, or the like) and a transfer electrode formed of polysilicon or the like, on a substrate; has a light-shielding film formed of tungsten or the like onto the photodiodes and the transfer electrodes, which has openings only over the light receiving section of the photodiode; has a device protecting film formed of silicon nitride or the like, which is formed to cover the entire surface of the light-shielding film and the light receiving section of the photodiodes, on the light-shielding film; and also has the color filter of the present invention on the device protecting film.

In addition, the infrared sensor may also be configured, for example, such that it has a light collecting means (for example, a microlens, which shall apply hereinafter) on a device protecting layer under a color filter (a side closer to the substrate), or has a light-collecting means on a color filter.

Furthermore, the cured film formed by curing the curable composition of the present invention can be used in portable devices such as a personal computer, a tablet, a mobile phone, a smart phone, and a digital camera; office automation (OA) equipment such as a multifunction printer and a scanner; industrial equipment such as a surveillance cameras, a bar code reader, an automated teller machine (ATM), a high-speed camera, and authentication using a face image authentication; onboard camera equipment; medical camera equipment such as an endoscope, a capsule endoscope, and a catheter; and a light-shielding member or a light-shielding layer of an optical filter or module, used in a biological sensor, a biosensor, a military surveillance camera, a camera for a three-dimensional map, a camera for weather or ocean observation, a land resource exploration camera, or astronomical equipment such as an exploration camera for targeting astronomical or deep spaces, or the like. In addition, the cured film of the present invention can be used in an anti-reflection member and an anti-reflection layer of the optical filter and module.

Moreover, the cured film formed by curing the curable composition of the present invention can also be used in applications such as a micro-light emitting diode (LED) and a micro-organic light emitting diode (OLED). Although not being particularly limited, the cured film is suitably used in members that imparts a light-shielding function and an anti-reflection function, in addition to an optical filter and an optical film used in the micro-LED and the micro OLED.

Examples of the micro-LED and the micro OLED include those described in JP2015-500562A and JP2014-533890A.

Furthermore, the cured film formed by curing the curable composition of the present invention can also be used in applications such as a quantum dot display. Although not being particularly limited, the cured film is suitably used in members that impart a light-shielding function and an anti-reflection function, in addition to an optical filter and an optical film used in the quantum dot display.

Examples of the quantum dot display include those described in US2013/0335677A, US2014/0036536A, US2014/0036203A, and US2014/0035960A.

EXAMPLES

Hereinbelow, the present invention will be described in more detail with reference to Examples. The materials, the amounts of materials used, the proportions, the treatment details, the treatment procedure, or the like shown in the Examples below may be modified if appropriate as long as the modifications do not depart from the spirit of the present invention. Therefore, the scope of the present invention should not be construed as being limited to the Examples shown below.

[Preparation of Curable Composition]

<Visible Light-Absorbing Coloring Agent>

As the visible light-absorbing coloring agent, the following ones were used. These visible light-absorbing coloring agents have an absorption in a visible wavelength range, and have a maximum absorption wavelength at 780 nm or less.

(Bk-1) Carbon Black (maximum absorption wavelength of 300 nm or less, average primary particle diameter of 24 nm, manufactured by Mitsubishi Chemical Corporation)

(Bk-2) Titanium Black (maximum absorption wavelength of 300 nm or less, average primary particle diameter of 30 nm, manufactured by Mitsubishi Materials Corporation)

(Bk-3) Perylene Black (maximum absorption wavelength of 600 to 700 nm, average primary particle diameter of 30 nm, manufactured by BASF)

<Infrared Ray-Absorbing Coloring Agent>

As the infrared ray-absorbing coloring agent, the following ones were used. These infrared ray-absorbing coloring agents have an absorption in an infrared wavelength range, and have a maximum absorption wavelength at 780 nm or less.

(IR-1) Cesium Tungsten Oxide ($Cs_{0.33}WO_3$, maximum absorption wavelength of 1,100 nm or more, average primary particle diameter of 800 nm or less, manufactured by Sumitomo Metal Industries, Ltd.)

(IR-2) Diimmonium Colorant (maximum absorption wavelength of 1,073 nm, EPOLIGHT1178 (manufactured by Epolin, Inc.)

(Pyrrolopyrrole Pigment) Infrared ray-absorbing coloring agent having the following structure, which has an absorption maximum in a wavelength range of 800 to 900 nm (average primary particle diameter of 100 nm).

Furthermore, as the following compound, those synthesized by the method described in JP2009-263614A were used.

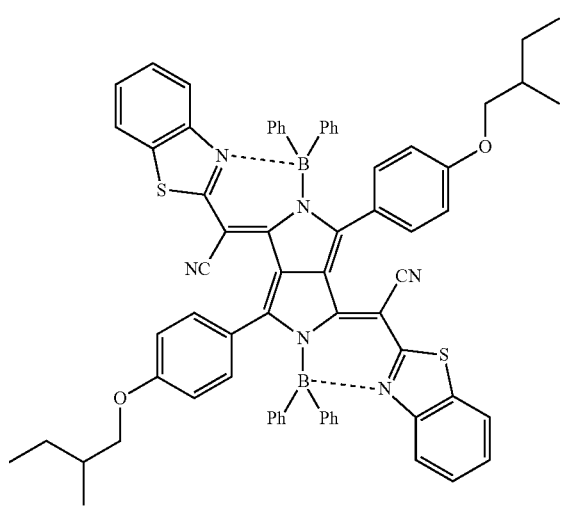

(Cyanine Pigment) Infrared ray-absorbing coloring agent having the following structure, which has an absorption maximum in a wavelength range of 800 to 900 nm (average primary particle diameter of 100 nm).

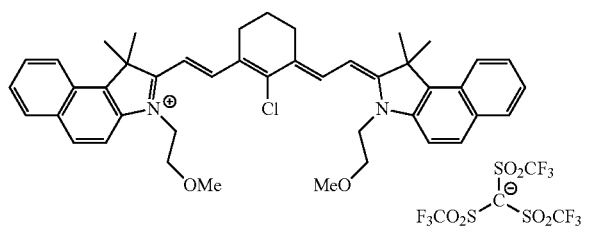

(Squarylium Pigment) Infrared ray-absorbing coloring agent (average primary particle diameter of 100 nm) having the following structure, which has an absorption maximum in a wavelength range of 800 to 900 nm.

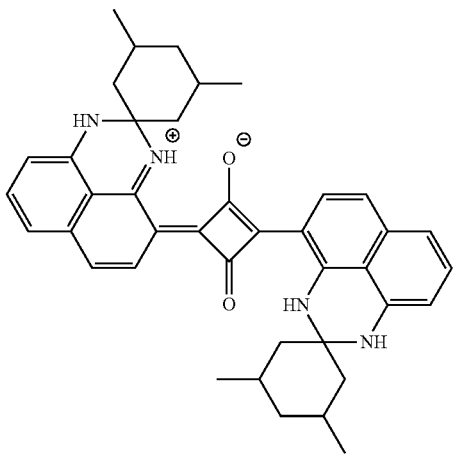

(Infrared Absorber 1) IRA842 (having an absorption maximum in a wavelength range of 800 to 900 nm, a naphthalocyanine compound, manufactured by Exiton, Inc.)

<Acrylic or Methacrylic Resin Having Adsorptive Group (Dispersing Resin)>

As the acrylic or methacrylic resin (dispersing resin) having an adsorptive group, the following ones were used.

(Dispersing resin 1) Trade name; BYK-111 (manufactured by BYK Corporation)

(Dispersing resin 2) Dispersing resins (weight-average molecular weight: 30,000) having the following structures were used.

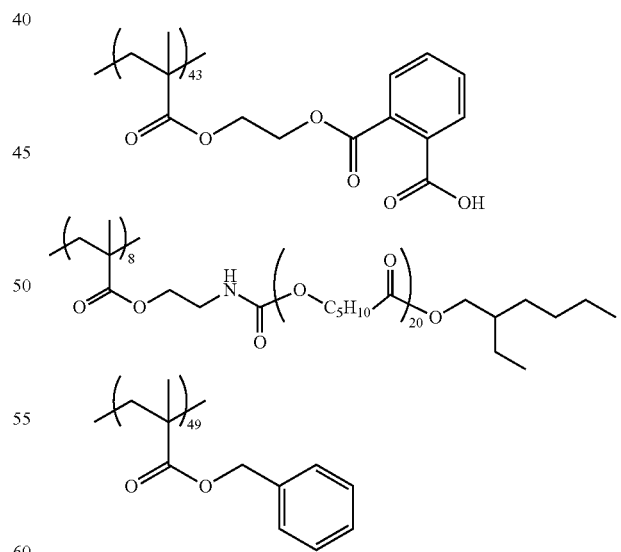

<Alkali-Soluble Resin>

As the alkali-soluble resin, the following ones were used.

(Alkali-Soluble Resin 1) Resins (weight-average molecular weight: 12,000) having the following structures were used.

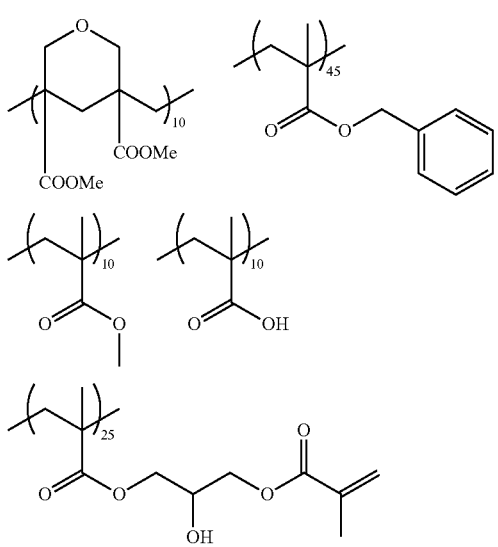

(Alkali-Soluble Resin 2) Trade name; CYCLOMER P Series "ACA230AA" (manufactured by Daicel Chemical Industries, Ltd.)

(Alkali-Soluble Resin 3) Trade name; ACRYBASE FF-426 (manufactured by Fujikura Kasei Co., Ltd.)

<Polymerizable Compound>

As the polymerizable compound, the following ones were used.

(M-1) Polymerizable compounds having the following structures.

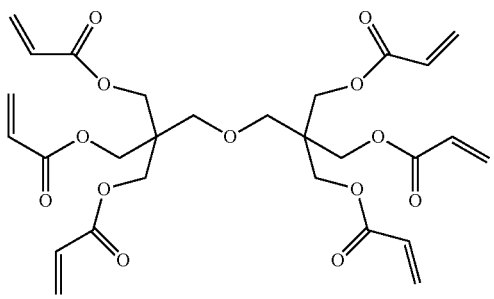

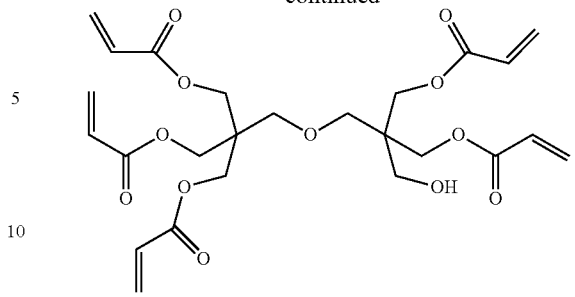

M-1 (Mixture at 7:3)

(M-2) "KAYARAD RP-1040" (manufactured by Nippon Kayaku Co., Ltd.)

(M-3) "NK OLIGO UA-7200" (manufactured by Shin-Nakamura Chemical Co., Ltd.)

<Photopolymerization Initiator>

As the photopolymerization initiator, the following ones were used.

(Oxime-Based Polymerization Initiator 1) Photopolymerization initiator having the following structure.

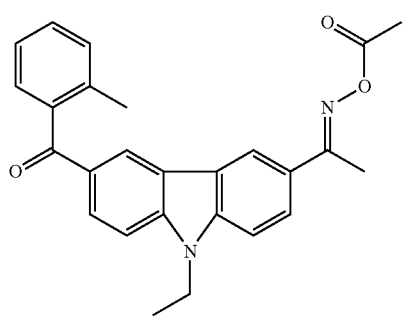 [SMILES: CCn1c2ccc(C(=O)c3ccccc3C)cc2c2cc(/C(C)=N/OC(C)=O)ccc21]

(Oxime-Based Polymerization Initiator 2) Trade name; ADEKA ARKLS NCI-831 (manufactured by ADEKA Corporation)

(Polymerization Initiator 1) Trade name; IRUGACURE-819 (manufactured by Ciba Japan K. K.)

(Polymerization Initiator 2) Trade name; IRUGACURE-127 (manufactured by Ciba Japan K. K.)

<Surfactant>

As the surfactant, the following ones were used.

(Surfactant 1) Mixture F-1 (weight-average molecular weight (Mw)=14,000) represented by the following structural formula

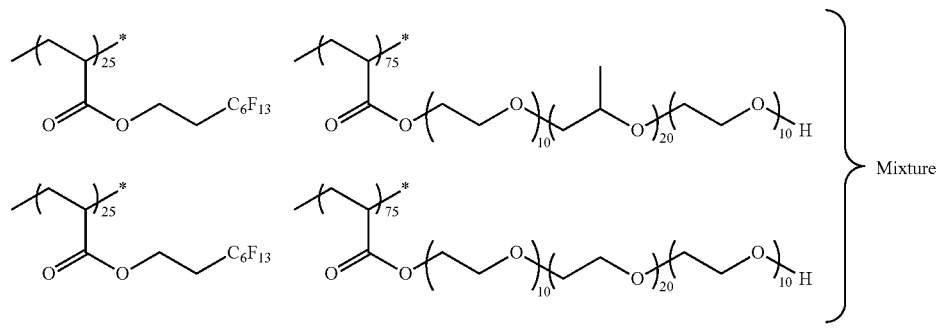

Moreover, the weight-average molecular weight (Mw) and the molecular weight distribution (Mw/Mn) of various resins used were calculated by a gel permeation chromatography (GPC) method under the following measurement conditions.

Device: HLC-8220GPC [manufactured by Tosoh Corporation]
Detector: Differential refractometer (RI detector)
Precolumn: TSK GUARD COLUMN MP (XL) 6 mm×40 mm [manufactured by Tosoh Corporation]
Columns for sample: The following four columns are directly connected [all manufactured by Tosoh Corporation]
TSK-GEL Multipore-HXL-M 7.8 mm×300 mm
Columns for reference: The same as those for the columns for the sample.
Constant-temperature tank temperature: 40° C.
Mobile phase: Tetrahydrofuran
Mobile phase flow rate for a sample: 1.0 mL/minute
Mobile phase flow rate for a reference: 0.3 mL/minute
Sample concentration: 0.1% by mass
Injection amount of a sample: 100
Data collection time: 16 minutes to 46 minutes after sample injection
Sampling pitch: 300 msec <Preparation of Pigment Dispersion Liquid>
(Preparation of Pigment Dispersion Liquid 1)

All of the components at the following composition were mixed, and stirred for 3 hours under a rotation speed of 3,000 rpm using a homogenizer, thereby obtaining a mixed solution.

<<Composition>>
Carbon black ("Bk-1", manufactured by Mitsubishi Chemical Corporation, MA100R) . . . 30 parts by mass
Cesium tungsten oxide ("IR-1", manufactured by Metal Mining Co., Ltd.) . . . 2 parts by mass
Dispersing resin 2 (20% by weight) . . . 30 parts by mass
Propylene glycol monomethyl ether acetate (PGMEA) . . . 9.4 parts by mass A dispersion treatment of the obtained mixed solution was initiated under the following dispersion conditions, using ULTRA APEX MILL UAM 015 manufactured by Kotobuki Industries Co., Ltd. as a dispersion apparatus (beads mill).

<<Dispersion Conditions>>
Beads diameter: φ0.05 mm
Beads filling rate: 75% by volume
Circumferential speed of mill: 12 m/sec
Amount of mixed solution to be subjected to a dispersion treatment: 680 g
Circulation flow rate (pump supply amount): 13 kg/hour
Temperature of treatment liquid: 25° C. to 30° C.
Cooling water: Tap water
Inner volume of circular path of beads mill: 0.15 L After the initiation of dispersion, a volume-average particle diameter was measured every 30 minutes (a time for one pass) while performing a dispersion treatment under the conditions. Here, the volume-average particle diameter decreased as the dispersion time (times of passes) increased, but a change amount was reduced. Further, at a point of time when a change in the volume-average particle diameter per pass with a further extension of the dispersion time by 30 minutes became 10 nm or less (that is, a point of time when a change in the volume-average particle diameter became 10 nm/pass or less; a process up to this stage is a "first-stage dispersion treatment"), a propylene glycol monomethyl ether acetate solution of a dispersing resin 2 shown below was added to this dispersion liquid.

<<Composition>>
Dispersing resin 2 (20% by weight) . . . 30 parts by mass

After addition of the solution (dispersing resin), 10 passes of a dispersion treatment were further continued, and at a point of time when a change in the volume-average particle diameter per pass (30 minutes) became 10 nm or less again (a process up to this stage is a "second-stage dispersion treatment"), a pigment dispersion liquid was completely obtained. In this manner, a pigment dispersion liquid 1 was prepared.

(Preparation of Pigment Dispersion Liquids 2 to 16, and 2-1 to 2-3)

By the same procedure as for the pigment dispersion liquid 1, pigment dispersion liquids 2 to 16, and 2-1 to 2-3 were each prepared such that they had the compositions as shown in First Table.

FIRST TABLE

| Pigment dispersion liquid | Visible light-absorbing coloring agent | | | | Infrared ray-absorbing coloring agent | | | | Dispersing resin | | Organic solvent | |
|---|---|---|---|---|---|---|---|---|---|---|---|---|
| | Type | Parts by mass | Type | Parts by mass | Type | Parts by mass | Type | Parts by mass | Type | Parts by mass | Type | Parts by mass |
| Pigment dispersion liquid 1 | Bk-1 | 30 | — | — | IR-1 | 2 | — | — | Dispersing resin 2 | 12 | PGMEA | 56 |
| Pigment dispersion liquid 2 | Bk-2 | 25 | — | — | IR-1 | 0.56 | — | — | Dispersing resin 2 | 7.5 | PGMEA | 66.94 |
| Pigment dispersion liquid 3 | Bk-1 | 30 | — | — | IR-1 | 1.3 | — | — | Dispersing resin 2 | 9.9 | PGMEA | 58.8 |
| Pigment dispersion liquid 4 | Bk-2 | 25 | — | — | IR-1 | 0.58 | — | — | Dispersing resin 2 | 7.5 | POMEA | 66.92 |
| Pigment dispersion liquid 5 | Bk-1 | 30 | — | — | IR-1 | 1.5 | — | — | Dispersing resin 2 | 11.1 | PGMEA | 57.4 |
| Pigment dispersion liquid 6 | Bk-2 | 25 | — | — | IR-1 | 0.49 | — | — | Dispersing resin 2 | 7.5 | PGMEA | 67.01 |
| Pigment dispersion liquid 7 | Bk-1 | 30 | — | — | Pyrrolopyrrole pigment | 2 | — | — | Dispersing resin 2 | 12 | PGMEA | 56 |
| Pigment dispersion liquid 8 | Bk-1 | 30 | — | — | Cyanine pigment | 2 | — | — | Dispersing resin 2 | 12 | PGMEA | 56 |
| Pigment dispersion liquid 9 | Bk-1 | 30 | — | — | Squarylium pigment | 2 | — | — | Dispersing resin 2 | 12 | PGMEA | 56 |
| Pigment dispersion liquid 10 | Bk-1 | 30 | — | — | Infrared absorber 1 | 2 | — | — | Dispersing resin 2 | 12 | PGMEA | 56 |
| Pigment dispersion liquid 11 | Bk-2 | 25 | — | — | Pyrrolopyrrole pigment | 0.56 | — | — | Dispersing resin 2 | 7.5 | PGMEA | 66.94 |

FIRST TABLE-continued

| Pigment dispersion liquid | Visible light-absorbing coloring agent | | | | Infrared ray-absorbing coloring agent | | | | Dispersing resin | | Organic solvent | |
|---|---|---|---|---|---|---|---|---|---|---|---|---|
| | Type | Parts by mass | Type | Parts by mass | Type | Parts by mass | Type | Parts by mass | Type | Parts by mass | Type | Parts by mass |
| Pigment dispersion liquid 12 | Bk-2 | 25 | — | — | Cyanine pigment | 0.56 | — | — | Dispersing resin 2 | 7.5 | PGMEA | 66.94 |
| Pigment dispersion liquid 13 | Bk-2 | 25 | — | — | Squarylium pigment | 0.56 | — | — | Dispersing resin 2 | 7.5 | PGMEA | 66.94 |
| Pigment dispersion liquid 14 | Bk-2 | 25 | — | — | Infrared absorber 1 | 0.56 | — | — | Dispersing resin 2 | 7.5 | PGMEA | 66.94 |
| Pigment dispersion liquid 15 | Bk-1 | 20 | Bk-2 | 10 | IR-1 | 2 | — | — | Dispersing resin 2 | 12 | PGMEA | 56 |
| Pigment dispersion liquid 16 | Bk-1 | 30 | — | — | Cyanine pigment | 1 | Pyrrolopyrrole pigment | 1 | Dispersing resin 2 | 12 | PGMEA | 56 |
| Pigment dispersion liquid 2-1 | Bk-3 | 20 | — | — | — | — | — | — | Dispersing resin 1 | 12 | PGMEA | 68 |
| Pigment dispersion liquid 2-2 | Bk-3 | 20 | — | — | IR-1 | 2 | — | — | Dispersing resin 1 | 12 | PGMEA | 66 |
| Pigment dispersion liquid 2-3 | Bk-3 | 20 | — | — | IR-1 | 0.92 | — | — | Dispersing resin 1 | 12 | PGMEA | 67.08 |

The respective components were stirred and mixed such that they had the amounts of the respective components as shown in Second to Twentieth Tables which will be described later, thereby preparing curable compositions. Further, the curable compositions were prepared with PGMEA solvents such that the concentrations of solid content became 30% by mass.

Furthermore, in the preparation of the curable compositions of Examples 1, 4, and 7, the pigment dispersion liquid 1 was used; in the preparation of the curable compositions of Examples 2, 6, and 9, the pigment dispersion liquid 2 was used; in the preparation of the curable compositions of Examples 3, 5, and 8, the pigment dispersion liquid 3 was used; in the preparation of the curable composition of Example 10, the pigment dispersion liquid 4 was used; in the preparation of the curable composition of Example 11, the pigment dispersion liquid 5 was used; in the preparation of the curable composition of Example 12, the pigment dispersion liquid 6 was used; and in the preparation of the curable compositions of Examples 13 to 15, Example 15-A, and Example 15-B, the pigment dispersion liquid 2-2 was used. Further, the dispersant resin 1 was additionally added to the curable composition of Example 15-B, and the curable composition was prepared such that the content of the dispersant resin 1 became 36.9% by mass with respect to the solid content of the composition. In addition, in the preparation of the curable compositions of Comparative Examples 1 to 5, the pigment dispersion liquid 2-1 was used; and in the preparation of the curable composition of Comparative Example 6, the pigment dispersion liquid 2-3 was prepared.

Furthermore, (IR-2) a diimmonium colorant as the infrared ray-absorbing coloring agent was further added to the curable compositions of Comparative Example 3 and Comparative Example 4 such that it had the composition in Fifth Table, in addition to the pigment dispersion liquid 2-1.

Moreover, in the preparation of the curable composition of Example 16, the pigment dispersion liquid 11 was used; in the preparation of the curable composition of Example 17, the pigment dispersion liquid 12 was used; in the preparation of the curable composition of Example 18, the pigment dispersion liquid 13 was used; in the preparation of the curable composition of Example 19, the pigment dispersion liquid 14 was used; in the preparation of the curable compositions of Examples 20 to 26, the pigment dispersion liquid 2 was used; in the preparation of the curable composition of Example 27, the pigment dispersion liquid 7 was used; in the preparation of the curable composition of Example 28, the pigment dispersion liquid 8 was used; in the preparation of the curable composition of Example 29, the pigment dispersion liquid 9 was used; in the preparation of the curable compositions of Examples 30 and 31, the pigment dispersion liquid 10 was used; and in the preparation of the curable compositions of Examples 32 to 34, the pigment dispersion liquid 1 was used. Further, in the preparation of the curable composition of Example 35, the pigment dispersion liquid 15 was used; and in the preparation of the curable composition of Example 36, the pigment dispersion liquid 16 was used.

In addition, in Second to Twentieth Tables, the amounts of the respective components are in "% by mass" and the content ratios of the respective components are in "mass ratios".

[Evaluation of Curable Composition]

With regard to the respective curable compositions obtained above, the optical density characteristics were evaluated.

The optical density was measured by the following method.

<Measurement of Each of Optical Densities>

As a measurement sample, a coating film formed such that the film thickness after drying became 1.5 μm by applying the curable compositions (a concentration of solid content of 30% by mass) in Second to Twentieth Tables onto a transparent substrate (glass substrate) was used.

Subsequently, with respect to the obtained coating film, the optical density at a wavelength of 380 to 1,100 nm was calculated using V-7200F (manufactured by JASCO Corporation). From the obtained data, a minimum value (ODmin/1.0 μm) in optical densities per 1 μm of a film thickness in a wavelength range of 380 to 1,100 nm of the coating film; a minimum value (OD1) in optical densities per 1 μm of a film thickness in a wavelength range from 380 nm to 780 nm of the coating film; and a minimum value (OD2) in optical densities per 1 μm of a film thickness in a wavelength range of more than 780 nm and 1,100 nm or less of the coating film were calculated.

In addition, in each of the tables, the minimum value (ODmin/1.5 μm) in optical densities per 1.5 μm of a film thickness in a wavelength range of 380 to 1,100 nm of the coating film was also shown.

Furthermore, from the obtained measured values, OD1/OD2, an Δ optical density (|OD1−OD2|), and an average ODmin ((OD1+OD2)/2) were calculated.

[Preparation and Evaluation of Light-Shielding Film]
[Coating Film Forming Step]

Any one of the respective curable compositions was uniformly applied onto a silicon wafer [support], adjusting the rotation speed of the spin coat such that the film thickness after the application and heating treatments became 1.5 and then a heating treatment was carried out for 120 seconds, using a hot plate at a surface temperature of 100° C., thereby obtaining a coating film [black curable coating film] having a film thickness of 1.5 μm.

[Exposing Step]

Subsequently, the coating film was irradiated (exposed) through a linear 20-μm mask (a width of 20 μm and a length of 4 mm) at an exposure dose of 400 mJ/cm$^2$ (exposure time: 0.5 seconds), using an i-ray stepper, FPA-3000iS+ [manufactured by CANON Inc.].

[Heating Step]

Then, the obtained cured film obtained by patternwise curing was subjected to a heating treatment for 120 seconds, using a hot plate at a surface temperature of 100° C., thereby obtaining a coating film [black curable coating film] having a film thickness of 1.5 μm.

[Developing Step]

After the irradiation (exposure), the coating film was subjected to puddle development with a 0.3%-by-mass aqueous tetramethylammonium hydroxide (TMAH) solution at 23° C. for a predetermined time.

The coating film after exposure was repeatedly subjected to puddle development five times with a 0.3%-by-mass aqueous tetramethylammonium hydroxide solution at 23° C. for 60 seconds. Thereafter, the coating film was rinsed by spin shower and further washed with pure water.

[Post-Baking Step]

The coating film was further subjected to a heating treatment at 220° C. for 300 seconds, using a clean oven CLH-21CDH (manufactured by Koyo Thermo Systems Co., Ltd.).

Then, the obtained cured film that had been formed by patternwise curing was subjected to a heating treatment for 300 seconds, using a hot plate at a surface temperature of 220° C.

[Evaluation]

The patterns obtained as above were evaluated as follows.

<Linearity>

20-Micron patterns obtained through the [Post-Baking Step] were imaged by a scanning electron microscope, and the line width roughness (LWR) of the portion of the 20-micron patterns was measured to evaluate the linearity. The evaluation was carried out based on the following standard.

"A": LWR≤1 μM
"B": 1 μm<LWR≤2 μm
"C": 2 μm<LWR≤3 μm
"D": 3 μm<LWR

SECOND TABLE

| | | | Example 1 | Example 3 | Example 4 | Example 5 | Example 7 | Example 8 | Example 11 |
|---|---|---|---|---|---|---|---|---|---|
| Various optical densities | Minimum value (ODmin/1.5 μm) in optical densities per 1.5 μm of film thickness | | 1.50 | 1.50 | 3.00 | 2.00 | 4.50 | 3.00 | 4.50 |
| | Minimum value (ODmin/1.0 μm) in optical densities per 1.0 μm of film thickness | | 1.00 | 1.00 | 2.00 | 1.33 | 3.00 | 2.00 | 3.00 |
| | OD1 | | 1.00 | 1.50 | 2.00 | 2.00 | 3.00 | 3.00 | 4.00 |
| | OD2 | | 1.00 | 1.00 | 2.00 | 1.33 | 3.00 | 2.00 | 3.00 |
| | OD1/OD2 | | 1.00 | 1.50 | 1.00 | 1.50 | 1.00 | 1.50 | 1.33 |
| | Δ Optical density( |OD1 − OD2| ) | | 0.00 | 0.50 | 0.00 | 0.67 | 0.00 | 1.00 | 1.00 |
| | Average ODmin ((OD1 + OD2)/2) | | 1.00 | 1.25 | 2.00 | 1.67 | 3.00 | 2.50 | 3.50 |
| Composition (% by mass) | Visible light-absorbing coloring agent | Bk-1 | 15.00 | 23.00 | 30.00 | 30.00 | 45.00 | 45.00 | 60.00 |
| | Infrared ray-absorbing coloring agent | IR-1 | 1.00 | 1.00 | 2.00 | 1.30 | 3.00 | 1.95 | 3.00 |
| | Dispersing resin (dispersant) | Dispersing resin 2 | 6.00 | 7.66 | 12.00 | 10.00 | 18.00 | 15.00 | 22.00 |
| | Alkali-soluble resin | Alkali-soluble resin 1 | 25.90 | 23.24 | 19.00 | 15.00 | 2.00 | 5.00 | 0.00 |
| | Polymerizable compound | M-1 | 40.00 | 35.00 | 28.00 | 33.60 | 25.00 | 25.00 | 12.00 |
| | Photopolymerization initiator | Oxime-based polymerization initiator 1 | 12.00 | 10.00 | 8.91 | 10.00 | 6.90 | 7.95 | 2.90 |
| | Surfactant | Surfactant 1 | 0.10 | 0.10 | 0.09 | 0.10 | 0.10 | 0.10 | 0.10 |
| Content ratio of respective components (mass ratio) | Visible light-absorbing coloring agent/infrared ray-absorbing coloring agent | | 15.00 | 23.00 | 15.00 | 23.08 | 15.00 | 23.08 | 20.00 |
| | Dispersing resin/visible light-absorbing coloring agent | | 0.40 | 0.33 | 0.40 | 0.33 | 0.40 | 0.33 | 0.37 |
| | Polymerizable compound/dispersing resin | | 6.67 | 4.57 | 2.33 | 3.36 | 1.39 | 1.67 | 0.55 |
| | Photopolymerization initiator/dispersing resin | | 2.00 | 1.31 | 0.74 | 1.00 | 0.38 | 0.53 | 0.13 |
| | Alkali-soluble resin/dispersing resin | | 4.32 | 3.03 | 1.58 | 1.50 | 0.11 | 0.33 | 0.00 |
| Evaluation | Linearity of pattern | | A | A | A | A | A | A | A |

THIRD TABLE

|  |  | Example 2 | Example 6 | Example 9 | Example 10 | Example 12 |
|---|---|---|---|---|---|---|
| Various optical densities | Minimum value (ODmin/1.5 μm) in optical densities per 1.5 μm of film thickness | 2.00 | 3.00 | 4.01 | 5.00 | 6.00 |
|  | Minimum value (ODmin/1.0 μm) in optical densities per 1.0 μm of film thickness | 1.33 | 2.00 | 2.67 | 3.33 | 4.00 |
|  | OD1 | 1.33 | 2.00 | 2.67 | 3.33 | 4.00 |
|  | OD2 | 1.50 | 2.25 | 3.00 | 4.00 | 4.00 |
|  | OD1/OD2 | 0.89 | 0.89 | 0.89 | 0.83 | 1.00 |
|  | Δ Optical density( |OD1 − OD2| ) | 0.17 | 0.25 | 0.33 | 0.67 | 0.00 |
|  | Average ODmin ((OD1 + OD2)/2) | 1.42 | 2.13 | 2.84 | 3.67 | 4.00 |
| Composition (% by mass) | Visible light-absorbing coloring agent    Bk-2 | 45.00 | 50.00 | 55.00 | 60.00 | 65.00 |
|  | Infrared ray-absorbing coloring agent    IR-1 | 1.00 | 1.11 | 1.22 | 1.40 | 1.28 |
|  | Dispersing resin (dispersant)    Dispersing resin 2 | 13.50 | 15.00 | 16.50 | 18.00 | 19.50 |
|  | Alkali-soluble resin    Alkali-soluble resin 1 | 6.40 | 4.00 | 2.00 | 1.00 | 0.00 |
|  | Polymerizable compound    M-1 | 28.00 | 24.00 | 20.00 | 15.00 | 11.00 |
|  | Photopolymerization initiator    Oxime-based polymerization initiator 1 | 6.00 | 5.80 | 5.18 | 4.50 | 3.12 |
|  | Surfactant    Surfactant 1 | 0.10 | 0.09 | 0.10 | 0.10 | 0.10 |
| Content ratio of respective components (mass ratio) | Visible light-absorbing coloring agent/infrared ray-absorbing coloring agent | 45.00 | 45.05 | 45.08 | 42.86 | 50.78 |
|  | Dispersing resin/visible light-absorbing coloring agent | 0.30 | 0.30 | 0.30 | 0.30 | 0.30 |
|  | Polymerizable compound/dispersing resin | 2.07 | 1.60 | 1.21 | 0.83 | 0.56 |
|  | Photopolymerization initiator/dispersing resin | 0.44 | 0.39 | 0.31 | 0.25 | 0.16 |
|  | Alkali-soluble resin/dispersing resin | 0.47 | 0.27 | 0.12 | 0.06 | 0.00 |
| Evaluation | Linearity of pattern | A | A | A | A | A |

FOURTH TABLE

|  |  |  | Example 13 | Example 14 | Example 15 | Example 15-A | Example 15-B |
|---|---|---|---|---|---|---|---|
| Various optical densities | Minimum value (ODmin/1.5 μm) in optical densities per 1.5 μm of film thickness | | 1.50 | 1.50 | 1.50 | 1.50 | 1.50 |
|  | Minimum value (ODmin/1.0 μm) in optical densities per 1.0 μm of film thickness | | 1.00 | 1.00 | 1.00 | 1.00 | 1.00 |
|  | OD1 | | 1.00 | 1.00 | 1.00 | 1.00 | 1.00 |
|  | OD2 | | 1.00 | 1.00 | 1.00 | 1.00 | 1.00 |
|  | OD1/OD2 | | 1.00 | 1.00 | 1.00 | 1.00 | 1.00 |
|  | Δ Optical density( |OD1 − OD2|) | | 0.00 | 0.00 | 0.00 | 0.00 | 0.00 |
|  | Average ODmin ((OD1 + OD2)/2) | | 1.00 | 1.00 | 1.00 | 1.00 | 1.00 |
| Composition (% by mass) | Visible light-absorbing coloring agent | Bk-3 | 15.00 | 15.00 | 10.00 | 10.00 | 10.00 |
|  | Infrared ray-absorbing coloring agent | IR-1 | 1.50 | 1.50 | 1.00 | 1.00 | 1.00 |
|  | Dispersing resin (dispersant) | Dispersing resin 1 | 9.00 | 9.00 | 6.00 | 6.00 | 36.90 |
|  | Alkali-soluble resin | Alkali-soluble resin 1 | 33.60 | 32.10 | 42.10 | 29.00 | 29.00 |
|  | Polymerizable compound | M-1 | 40.00 | 22.30 | 34.80 | 47.90 | 17.00 |
|  | Photopolymerization initiator | Oxime-based polymerization initiator 1 | 0.80 | 20.00 | 6.00 | 6.00 | 6.00 |
|  | Surfactant | Surfactant 1 | 0.10 | 0.10 | 0.10 | 0.10 | 0.10 |
| Content ratio of respective components (mass ratio) | Visible light-absorbing coloring agent/infrared ray-absorbing coloring agent | | 10.00 | 10.00 | 10.00 | 10.00 | 10.00 |
|  | Dispersing resin/visible light-absorbing coloring agent | | 0.60 | 0.60 | 0.60 | 0.60 | 3.69 |
|  | Polymerizable compound/dispersing resin | | 4.44 | 2.48 | 5.80 | 7.98 | 0.46 |
|  | Photopolymerization initiator/dispersing resin | | 0.09 | 2.22 | 1.00 | 1.00 | 0.16 |
|  | Alkali-soluble resin/dispersing resin | | 3.73 | 3.57 | 7.02 | 4.83 | 0.79 |
| Evaluation | Linearity of pattern | | B | B | B | B | B |

FIFTH TABLE

|  |  | Comparative Example 1 | Comparative Example 2 | Comparative Example 3 | Comparative Example 4 | Comparative Example 5 |
|---|---|---|---|---|---|---|
| Various optical densities | Minimum value (ODmin/1.5 μm) in optical densities per 1.5 μm of film thickness | 0.00 | 0.00 | 0.75 | 0.75 | 0.00 |
|  | Minimum value (ODmin/1.0 μm) in optical densities per 1.0 μm of film thickness | 0.00 | 0.00 | 0.50 | 0.50 | 0.00 |
|  | OD1 | 1.00 | 2.00 | 4.00 | 4.00 | 1.00 |
|  | OD2 | 0.00 | 0.00 | 0.50 | 0.50 | 0.00 |
|  | OD1/OD2 | — | — | 8.00 | 8.00 | — |
|  | Δ Optical density (\|OD1 − OD2\|) | 1.00 | 2.00 | 3.50 | 3.50 | 1.00 |
|  | Average ODmin((OD1 + OD2)/2) | 0.50 | 1.00 | 2.25 | 2.25 | 0.50 |
| Composition (% by mass) | Visible light-absorbing coloring agent  Bk-3 | 10.00 | 20.00 | 40.00 | 40.00 | 10.00 |
|  | Infrared ray-absorbing coloring agent  IR-2 | 0.00 | 0.00 | 3.00 | 3.00 | 0.00 |
|  | Dispersing resin (dispersant)  Dispersing resin 1 | 6.00 | 12.00 | 24.00 | 24.00 | 6.00 |
|  | Alkali-soluble resin  Alkali-soluble resin 1 | 30.90 | 22.90 | 18.00 | 14.90 | 28.90 |
|  | Polymerizable compound  M-1 | 41.00 | 35.00 | 10.00 | 8.00 | 45.00 |
|  | Photopolymerization initiator  Oxime-based polymerization initiator 1 | 12.00 | 10.00 | 4.90 | 10.00 | 10.00 |
|  | Surfactant  Surfactant 1 | 0.10 | 0.10 | 0.10 | 0.10 | 0.10 |
| Content ratio of respective components (mass ratio) | Visible light-absorbing coloring agent/infrared ray-absorbing coloring agent | — | — | 13.33 | 13.33 | — |
|  | Dispersing resin/visible light-absorbing coloring agent | 0.60 | 0.60 | 0.60 | 0.60 | 0.60 |
|  | Polymerizable compound/dispersing resin | 6.83 | 2.92 | 0.42 | 0.33 | 7.50 |
|  | Photopolymerization initiator/dispersing resin | 2.00 | 0.83 | 0.20 | 0.42 | 1.67 |
|  | Alkali-soluble resin/dispersing resin | 5.15 | 1.91 | 0.75 | 0.62 | 4.82 |
| Evaluation | Linearity of pattern | D | D | D | D | D |

(Sixth Table)

| Sixth Table |  | Comparative Example 6 |
|---|---|---|
| Various optical densities | Minimum value (ODmin/1.5 μm) in optical densities per 1.5 μm of film thickness | 4.50 |
|  | Minimum value (ODmin/1.0 μm) in optical densities per 1.0 μm of film thickness | 3.00 |
|  | OD1 | 5.50 |
|  | OD2 | 3.00 |
|  | OD1/OD2 | 1.83 |
|  | Δ Optical density (\|OD1 − OD2\|) | 2.50 |
|  | Average ODmin ((OD1 + OD2)/2) | 4.25 |
| Composition (% by mass) | Visible light-absorbing coloring agent  Bk-3 | 55.00 |
|  | Infrared ray-absorbing coloring agent  IR-1 | 3.00 |
|  | Dispersing resin (dispersant)  Dispersing resin 1 | 33.00 |
|  | Alkali-soluble resin  Alkali-soluble resin 1 | 0.00 |
|  | Polymerizable compound  M-1 | 7.00 |
|  | Photopolymerization initiator  Oxime-based polymerization initiator 1 | 1.90 |
|  | Surfactant  Surfactant 1 | 0.10 |
| Content ratio of respective components (mass ratio) | Visible light-absorbing coloring agent/infrared ray-absorbing coloring agent | 18.33 |
|  | Dispersing resin/visible light-absorbing coloring agent | 0.60 |
|  | Polymerizable compound/dispersing resin | 0.21 |
|  | Photopolymerization initiator/dispersing resin | 0.06 |
|  | Alkali-soluble resin/dispersing resin | 0.00 |
| Evaluation | Linearity of pattern | D |

(Seventh Table)

| Seventh Table |  | Example 16 |
|---|---|---|
| Various optical densities | Minimum value (ODmin/1.5 μm) in optical densities per 1.5 μm of film thickness | 3.00 |
|  | Minimum value (ODmin/1.0 μm) in optical densities per 1.0 μm of film thickness | 2.00 |
|  | OD1 | 2.00 |

-continued

| (Seventh Table) | | |
|---|---|---|
| Seventh Table | | Example 16 |
| | OD2 | 2.00 |
| | OD1/OD2 | 1.00 |
| | Δ Optical density (|OD1 − OD2|) | 0.00 |
| | Average ODmin ((OD1 + OD2)/2) | 2.00 |
| Composition (% by mass) | Visible light-absorbing coloring agent Bk-2 | 50.00 |
| | Infrared ray-absorbing coloring agent Pyrrolopyrrole pigment | 1.11 |
| | Dispersing resin (dispersant) Dispersing resin 2 | 15.00 |
| | Alkali-soluble resin Alkali-soluble resin 1 | 4.00 |
| | Polymerizable compound M-1 | 24.00 |
| | Photopolymerization initiator Oxime-based polymerization initiator 1 | 5.80 |
| | Surfactant Surfactant 1 | 0.09 |
| Content ratio of respective components (mass ratio) | Visible light-absorbing coloring agent/infrared ray-absorbing coloring agent | 45.05 |
| | Dispersing resin/visible light-absorbing coloring agent | 0.30 |
| | Polymerizable compound/dispersing resin | 1.60 |
| | Photopolymerization initiator/dispersing resin | 0.39 |
| | Alkali-soluble resin/dispersing resin | 0.27 |
| Evaluation | Linearity of pattern | A |

| (Eighth Table) | | |
|---|---|---|
| Eighth Table | | Example 17 |
| Various optical densities | Minimum value (ODmin/1.5 μm) in optical densities per 1.5 μm of film thickness | 3.00 |
| | Minimum value (ODmin/1.0 μm) in optical densities per 1.0 μm of film thickness | 2.00 |
| | OD1 | 2.00 |
| | OD2 | 2.10 |
| | OD1/OD2 | 0.95 |
| | Δ Optical density (|OD1 − OD2|) | 0.10 |
| | Average ODmin ((OD1 + OD2)/2) | 2.05 |
| Composition (% by mass) | Visible light-absorbing coloring agent Bk-2 | 50.00 |
| | Infrared ray-absorbing coloring agent Cyanine pigment | 1.11 |
| | Dispersing resin (dispersant) Dispersing resin 2 | 15.00 |
| | Alkali-soluble resin Alkali-soluble resin 1 | 4.00 |
| | Polymerizable compound M-1 | 24.00 |
| | Photopolymerization initiator Oxime-based polymerization initiator 1 | 5.80 |
| | Surfactant Surfactant 1 | 0.09 |
| Content ratio of respective components (mass ratio) | Visible light-absorbing coloring agent/infrared ray-absorbing coloring agent | 45.05 |
| | Dispersing resin/visible light-absorbing coloring agent | 0.30 |
| | Polymerizable compound/dispersing resin | 1.60 |
| | Photopolymerization initiator/dispersing resin | 0.39 |
| | Alkali-soluble resin/dispersing resin | 0.27 |
| Evaluation | Linearity of pattern | A |

| (Ninth Table) | | |
|---|---|---|
| Ninth Table | | Example 18 |
| Various optical densities | Minimum value (ODmin/1.5 μm) in optical densities per 1.5 μm of film thickness | 3.00 |
| | Minimum value (ODmin/1.0 μm) in optical densities per 1.0 μm of film thickness | 2.00 |
| | OD1 | 2.00 |
| | OD2 | 2.05 |
| | OD1/OD2 | 0.98 |
| | Δ Optical density (|OD1 − OD2|) | 0.05 |
| | Average ODmin ((OD1 + OD2)/2) | 2.03 |
| Composition (% by mass) | Visible light-absorbing coloring agent Bk-2 | 50.00 |
| | Infrared ray-absorbing coloring agent Squarylium pigment | 1.11 |
| | Dispersing resin (dispersant) Dispersing resin 2 | 15.00 |
| | Alkali-soluble resin Alkali-soluble resin 1 | 4.00 |
| | Polymerizable compound M-1 | 24.00 |
| | Photopolymerization initiator Oxime-based polymerization initiator 1 | 5.80 |
| | Surfactant Surfactant 1 | 0.09 |

| (Ninth Table) | | |
|---|---|---|
| | Ninth Table | Example 18 |
| Content ratio of respective components (mass ratio) | Visible light-absorbing coloring agent/infrared ray-absorbing coloring agent | 45.05 |
| | Dispersing resin/visible light-absorbing coloring agent | 0.30 |
| | Polymerizable compound/dispersing resin | 1.60 |
| | Photopolymerization initiator/dispersing resin | 0.39 |
| | Alkali-soluble resin/dispersing resin | 0.27 |
| Evaluation | Linearity of pattern | A |

| (Tenth Table) | | |
|---|---|---|
| | Ninth Table | Example 19 |
| Various optical densities | Minimum value (ODmin/1.5 μm) in optical densities per 1.5 μm of film thickness | 3.00 |
| | Minimum value (ODmin/1.0 μm) in optical densities per 1.0 μm of film thickness | 2.00 |
| | OD1 | 2.00 |
| | OD2 | 2.20 |
| | OD1/OD2 | 0.91 |
| | Δ Optical density (|OD1 − OD2|) | 0.20 |
| | Average ODmin ((OD1 + OD2)/2) | 2.10 |
| Composition (% by mass) | Visible light-absorbing coloring agent Bk-2 | 50.00 |
| | Infrared ray-absorbing coloring agent Infrared absorber 1 | 1.11 |
| | Dispersing resin (dispersant) Dispersing resin 2 | 15.00 |
| | Alkali-soluble resin Alkali-soluble resin 1 | 4.00 |
| | Polymerizable compound M-1 | 24.00 |
| | Photopolymerization initiator Oxime-based polymerization initiator 1 | 5.80 |
| | Surfactant Surfactant 1 | 0.09 |
| Content ratio of respective components (mass ratio) | Visible light-absorbing coloring agent/infrared ray-absorbing coloring agent | 45.05 |
| | Dispersing resin/visible light-absorbing coloring agent | 0.30 |
| | Polymerizable compound/dispersing resin | 1.60 |
| | Photopolymerization initiator/dispersing resin | 0.39 |
| | Alkali-soluble resin/dispersing resin | 0.27 |
| Evaluation | Linearity of pattern | A |

| (Eleventh Table) | | |
|---|---|---|
| | Eleventh Table | Example 20 |
| Various optical densities | Minimum value (ODmin/1.5 μm) in optical densities per 1.5 μm of film thickness | 3.00 |
| | Minimum value (ODmin/1.0 μm) in optical densities per 1.0 μm of film thickness | 2.00 |
| | OD1 | 2.00 |
| | OD2 | 2.20 |
| | OD1/OD2 | 0.91 |
| | Δ Optical density (|OD1 − OD2|) | 0.20 |
| | Average ODmin ((OD1 + OD2)/2) | 2.10 |
| Composition (% by mass) | Visible light-absorbing coloring agent Bk-2 | 50.00 |
| | Infrared ray-absorbing coloring agent IR-1 | 1.11 |
| | Dispersing resin (dispersant) Dispersing resin 2 | 15.00 |
| | Alkali-soluble resin Alkali-soluble resin 2 | 4.00 |
| | Polymerizable compound M-1 | 24.00 |
| | Photopolymerization initiator Oxime-based polymerization initiator 1 | 5.80 |
| | Surfactant Surfactant 1 | 0.09 |
| Content ratio of respective components (mass ratio) | Visible light-absorbing coloring agent/infrared ray-absorbing coloring agent | 45.05 |
| | Dispersing resin/visible light-absorbing coloring agent | 0.30 |
| | Polymerizable compound/dispersing resin | 1.60 |
| | Photopolymerization initiator/dispersing resin | 0.39 |
| | Alkali-soluble resin/dispersing resin | 0.27 |
| Evaluation | Linearity of pattern | A |

(Twelfth Table)

| Twelfth Table | | Example 21 | Example 22 |
|---|---|---|---|
| Various optical densities | Minimum value (ODmin/1.5 μm) in optical densities per 1.5 μm of film thickness | 3.00 | 3.00 |
| | Minimum value (ODmin/1.0 μm) in optical densities per 1.0 μm of film thickness | 2.00 | 2.00 |
| | OD1 | 2.00 | 2.00 |
| | OD2 | 2.20 | 2.20 |
| | OD1/OD2 | 0.91 | 0.91 |
| | Δ Optical density (|OD1 − OD2|) | 0.20 | 0.20 |
| | Average ODmin ((OD1 + OD2)/2) | 2.10 | 2.10 |
| Composition (% by mass) | Visible light-absorbing coloring agent  Bk-2 | 50.00 | 50.00 |
| | Infrared ray-absorbing coloring agent  IR-1 | 1.11 | 1.11 |
| | Dispersing resin (dispersant)  Dispersing resin 2 | 15.00 | 15.00 |
| | Alkali-soluble resin  Alkali-soluble resin 3 | 4.00 | 4.09 |
| | Polymerizable compound  M-1 | 24.00 | 24.00 |
| | Photopolymerization initiator  Oxime-based polymerization initiator 1 | 5.80 | 5.80 |
| | Surfactant  Surfactant 1 | 0.09 | — |
| Content ratio of respective components (mass ratio) | Visible light-absorbing coloring agent/infrared ray-absorbing coloring agent | 45.05 | 45.05 |
| | Dispersing resin/visible light-absorbing coloring agent | 0.30 | 0.30 |
| | Polymerizable compound/dispersing resin | 1.60 | 1.60 |
| | Photopolymerization initiator/dispersing resin | 0.39 | 0.39 |
| | Alkali-soluble resin/dispersing resin | 0.27 | 0.27 |
| Evaluation | Linearity of pattern | A | A |

(Thirteenth Table)

| Thirteenth Table | | Example 23 | Example 24 |
|---|---|---|---|
| Various optical densities | Minimum value (ODmin/1.5 μm) in optical densities per 1.5 μm of film thickness | 3.00 | 3.00 |
| | Minimum value (ODmin/1.0 μm) in optical densities per 1.0 μm of film thickness | 2.00 | 2.00 |
| | OD1 | 2.00 | 2.00 |
| | OD2 | 2.20 | 2.20 |
| | OD1/OD2 | 0.91 | 0.91 |
| | Δ Optical density (|OD1 − OD2|) | 0.20 | 0.20 |
| | Average ODmin ((OD1 + OD2)/2) | 2.10 | 2.10 |
| Composition (% by mass) | Visible light-absorbing coloring agent  Bk-2 | 50.00 | 50.00 |
| | Infrared ray-absorbing coloring agent  IR-1 | 1.11 | 1.11 |
| | Dispersing resin (dispersant)  Dispersing resin 2 | 15.00 | 15.00 |
| | Alkali-soluble resin  Alkali-soluble resin 2 | 4.00 | 4.00 |
| | Polymerizable compound  M-1 | 24.00 | 24.00 |
| | Photopolymerization initiator  Oxime-based polymerization initiator 1 | | 2.40 |
| | Photopolymerization initiator  Oxime-based polymerization initiator 2 | 5.80 | 2.40 |
| | Surfactant  Surfactant 1 | 0.09 | 0.09 |
| Content ratio of respective components (mass ratio) | Visible light-absorbing coloring agent/infrared ray-absorbing coloring agent | 45.05 | 45.05 |
| | Dispersing resin/visible light-absorbing coloring agent | 0.30 | 0.30 |
| | Polymerizable compound/dispersing resin | 1.60 | 1.60 |
| | Photopolymerization initiator/dispersing resin | 0.39 | 0.39 |
| | Alkali-soluble resin/dispersing resin | 0.27 | 0.27 |
| Evaluation | Linearity of pattern | A | A |

(Fourteenth Table)

| Fourteenth Table | | Example 25 | Example 26 |
|---|---|---|---|
| Various optical densities | Minimum value (ODmin/1.5 μm) in optical densities per 1.5 μm of film thickness | 3.00 | 3.00 |
| | Minimum value (ODmin/1.0 μm) in optical densities per 1.0 μm of film thickness | 2.00 | 2.00 |
| | OD1 | 2.00 | 2.00 |

Fourteenth Table (continued)

| Fourteenth Table | | | Example 25 | Example 26 |
|---|---|---|---|---|
| | | OD2 | 2.20 | 2.20 |
| | | OD1/OD2 | 0.91 | 0.91 |
| | | Δ Optical density (|OD1 − OD2|) | 0.20 | 0.20 |
| | | Average ODmin ((OD1 + OD2)/2) | 2.10 | 2.10 |
| Composition (% by mass) | Visible light-absorbing coloring agent | Bk-2 | 50.00 | 50.00 |
| | Infrared ray-absorbing coloring agent | IR-1 | 1.11 | 1.11 |
| | Dispersing resin (dispersant) | Dispersing resin 2 | 15.00 | 15.00 |
| | Alkali-soluble resin | Alkali-soluble resin 2 | 4.00 | 4.00 |
| | Polymerizable compound | M-1 | 24.00 | 24.00 |
| | Photopolymerization initiator | Polymerization initiator 1 | 5.80 | 2.40 |
| | Photopolymerization initiator | Polymerization initiator 2 | — | 2.40 |
| | Surfactant | Surfactant 1 | 0.09 | 0.09 |
| Content ratio of respective components (mass ratio) | Visible light-absorbing coloring agent/infrared ray-absorbing coloring agent | | 45.05 | 45.05 |
| | Dispersing resin/visible light-absorbing coloring agent | | 0.30 | 0.30 |
| | Polymerizable compound/dispersing resin | | 1.60 | 1.60 |
| | Photopolymerization initiator/dispersing resin | | 0.39 | 0.39 |
| | Alkali-soluble resin/dispersing resin | | 0.27 | 0.27 |
| Evaluation | Linearity of pattern | | B | B |

Fifteenth Table

| Fifteenth Table | | | Example 27 |
|---|---|---|---|
| Various optical densities | Minimum value (ODmin/1.5 μm) in optical densities per 1.5 μm of film thickness | | 2.70 |
| | Minimum value (ODmin/1.0 μm) in optical densities per 1.0 μm of film thickness | | 1.80 |
| | | OD1 | 2.00 |
| | | OD2 | 1.80 |
| | | OD1/OD2 | 1.11 |
| | | Δ Optical density (|OD1 − OD2|) | 0.20 |
| | | Average ODmin ((OD1 + OD2)/2) | 1.90 |
| Composition (% by mass) | Visible light-absorbing coloring agent | Bk-1 | 30.00 |
| | Infrared ray-absorbing coloring agent | Pyrrolopyrrole pigment | 2.00 |
| | Dispersing resin (dispersant) | Dispersing resin 2 | 12.00 |
| | Alkali-soluble resin | Alkali-soluble resin 1 | 19.00 |
| | Polymerizable compound | M-1 | 28.00 |
| | Photopolymerization initiator | Oxime-based polymerization initiator 1 | 8.91 |
| | Surfactant | Surfactant 1 | 0.09 |
| Content ratio of respective components (mass ratio) | Visible light-absorbing coloring agent/infrared ray-absorbing coloring agent | | 15.00 |
| | Dispersing resin/visible light-absorbing coloring agent | | 0.40 |
| | Polymerizable compound/dispersing resin | | 2.33 |
| | Photopolymerization initiator/dispersing resin | | 0.74 |
| | Alkali-soluble resin/dispersing resin | | 1.58 |
| Evaluation | Linearity of pattern | | A |

Sixteenth Table

| Sixteenth Table | | | Example 28 |
|---|---|---|---|
| Various optical densities | Minimum value (ODmin/1.5 μm) in optical densities per 1.5 μm of film thickness | | 2.85 |
| | Minimum value (ODmin/1.0 μm) in optical densities per 1.0 μm of film thickness | | 1.90 |
| | | OD1 | 2.00 |
| | | OD2 | 1.90 |
| | | OD1/OD2 | 1.05 |
| | | Δ Optical density (|OD1 − OD2|) | 0.10 |
| | | Average ODmin ((OD1 + OD2)/2) | 1.95 |

Sixteenth Table

| Sixteenth Table | | | Example 28 |
|---|---|---|---|
| Composition (% by mass) | Visible light-absorbing coloring agent | Bk-1 | 30.00 |
| | Infrared ray-absorbing coloring agent | Cyanine pigment | 2.00 |
| | Dispersing resin (dispersant) | Dispersing resin 2 | 12.00 |
| | Alkali-soluble resin | Alkali-soluble resin 1 | 19.00 |
| | Polymerizable compound | M-1 | 28.00 |
| | Photopolymerization initiator | Oxime-based polymerization initiator 1 | 8.91 |
| | Surfactant | Surfactant 1 | 0.09 |
| Content ratio of respective components (mass ratio) | Visible light-absorbing coloring agent/infrared ray-absorbing coloring agent | | 15.00 |
| | Dispersing resin/visible light-absorbing coloring agent | | 0.40 |
| | Polymerizable compound/dispersing resin | | 2.33 |
| | Photopolymerization initiator/dispersing resin | | 0.74 |
| | Alkali-soluble resin/dispersing resin | | 1.58 |
| Evaluation | Linearity of pattern | | A |

20

Seventeenth Table

| Seventeenth Table | | | Example 29 |
|---|---|---|---|
| Various optical densities | Minimum value (ODmin/1.5 μm) in optical densities per 1.5 μm of film thickness | | 2.78 |
| | Minimum value (ODmin/1.0 μm) in optical densities per 1.0 μm of film thickness | | 1.85 |
| | OD1 | | 2.00 |
| | OD2 | | 1.85 |
| | OD1/OD2 | | 1.08 |
| | Δ Optical density (|OD1 − OD2|) | | 0.15 |
| | Average ODmin ((OD1 + OD2)/2) | | 1.93 |
| Composition (% by mass) | Visible light-absorbing coloring agent | Bk-1 | 30.00 |
| | Infrared ray-absorbing coloring agent | Squarylium pigment | 2.00 |
| | Dispersing resin (dispersant) | Dispersing resin 2 | 12.00 |
| | Alkali-soluble resin | Alkali-soluble resin 1 | 19.00 |
| | Polymerizable compound | M-1 | 28.00 |
| | Photopolymerization initiator | Oxime-based polymerization initiator 1 | 8.91 |
| | Surfactant | Surfactant 1 | 0.09 |
| Content ratio of respective components (mass ratio) | Visible light-absorbing coloring agent/infrared ray-absorbing coloring agent | | 15.00 |
| | Dispersing resin/visible light-absorbing coloring agent | | 0.40 |
| | Polymerizable compound/dispersing resin | | 2.33 |
| | Photopolymerization initiator/dispersing resin | | 0.74 |
| | Alkali-soluble resin/dispersing resin | | 1.58 |
| Evaluation | Linearity of pattern | | A |

Eighteenth Table

| Eighteenth Table | | | Example 30 | Example 31 |
|---|---|---|---|---|
| Various optical densities | Minimum value (ODmin/1.5 μm) in optical densities per 1.5 μm of film thickness | | 2.93 | 2.93 |
| | Minimum value (ODmin/1.0 μm) in optical densities per 1.0 μm of film thickness | | 1.95 | 1.95 |
| | OD1 | | 2.00 | 2.00 |
| | OD2 | | 1.95 | 1.95 |
| | OD1/OD2 | | 1.03 | 1.03 |
| | Δ Optical density (|OD1 − OD2|) | | 0.05 | 0.05 |
| | Average ODmin ((OD1 + OD2)/2) | | 1.98 | 1.98 |
| Composition (% by mass) | Visible light-absorbing coloring agent | Bk-1 | 30.00 | 30.00 |
| | Infrared ray-absorbing coloring agent | Infrared absorber 1 | 2.00 | 2.00 |

(Eighteenth Table)

| Eighteenth Table | | | Example 30 | Example 31 |
|---|---|---|---|---|
| | Infrared ray-absorbing coloring agent | IR-2 | — | 1.00 |
| | Dispersing resin (dispersant) | Dispersing resin 2 | 12.00 | 12.00 |
| | Alkali-soluble resin | Alkali-soluble resin 1 | 19.00 | 18.00 |
| | Polymerizable compound | M-1 | 28.00 | 28.00 |
| | Photopolymerization initiator | Oxime-based polymerization initiator 1 | 8.91 | 8.91 |
| | Surfactant | Surfactant 1 | 0.09 | 0.09 |
| Content ratio of respective components (mass ratio) | Visible light-absorbing coloring agent/infrared ray-absorbing coloring agent | | 15.00 | 10.00 |
| | Dispersing resin/visible light-absorbing coloring agent | | 0.40 | 0.40 |
| | Polymerizable compound/dispersing resin | | 2.33 | 2.33 |
| | Photopolymerization initiator/dispersing resin | | 0.74 | 0.74 |
| | Alkali-soluble resin/dispersing resin | | 1.58 | 1.58 |
| Evaluation | Linearity of pattern | | A | A |

(Nineteenth Table)

| Nineteenth Table | | | Example 32 | Example 33 | Example 34 |
|---|---|---|---|---|---|
| Various optical densities | Minimum value (ODmin/1.5 μm) in optical densities per 1.5 μm of film thickness | | 2.93 | 2.93 | 2.93 |
| | Minimum value (ODmin/1.0 μm) in optical densities per 1.0 μm of film thickness | | 1.95 | 1.95 | 1.95 |
| | OD1 | | 2.00 | 2.00 | 2.00 |
| | OD2 | | 1.95 | 1.95 | 1.95 |
| | OD1/OD2 | | 1.03 | 1.03 | 1.03 |
| | Δ Optical density (|OD1 − OD2|) | | 0.05 | 0.05 | 0.05 |
| | Average ODmin ((OD1 + OD2)/2) | | 1.98 | 1.98 | 1.98 |
| Composition (% by mass) | Visible light-absorbing coloring agent | Bk-1 | 30.00 | 30.00 | 30.00 |
| | Infrared ray-absorbing coloring agent | IR-1 | 2.00 | 2.00 | 2.00 |
| | Dispersing resin (dispersant) | Dispersing resin 2 | 12.00 | 12.00 | 12.00 |
| | Alkali-soluble resin | Alkali-soluble resin 1 | 19.00 | 19.00 | 19.00 |
| | Polymerizable compound | M-1 | — | — | 14.00 |
| | Polymerizable compound | M-2 | 28.00 | — | 7.00 |
| | Polymerizable compound | M-3 | — | 28.00 | 7.00 |
| | Photopolymerization initiator | Oxime-based polymerization initiator 1 | 8.91 | 8.91 | 8.91 |
| | Surfactant | Surfactant 1 | 0.09 | 0.09 | 0.09 |
| Content ratio of respective components (mass ratio) | Visible light-absorbing coloring agent/infrared ray-absorbing coloring agent | | 15.00 | 15.00 | 15.00 |
| | Dispersing resin/visible light-absorbing coloring agent | | 0.40 | 0.40 | 0.40 |
| | Polymerizable compound/dispersing resin | | 2.33 | 2.33 | 2.33 |
| | Photopolymerization initiator/dispersing resin | | 0.74 | 0.74 | 0.74 |
| | Alkali-soluble resin/dispersing resin | | 1.58 | 1.58 | 1.58 |
| Evaluation | Linearity of pattern | | A | A | A |

(Twentieth Table)

| Twentieth Table | | | Example 35 | Example 36 |
|---|---|---|---|---|
| Various optical densities | Minimum value (ODmin/1.5 μm) in optical densities per 1.5 μm of film thickness | | 2.84 | 1.50 |
| | Minimum value (ODmin/1.0 μm) in optical densities per 1.0 μm of film thickness | | 1.89 | 1.00 |
| | OD1 | | 1.89 | 1.00 |
| | OD2 | | 2.00 | 1.00 |
| | OD1/OD2 | | 0.95 | 1.00 |
| | Δ Optical density (|OD1 − OD2|) | | 0.11 | 0.00 |
| | Average ODmin ((OD1 + OD2)/2) | | 1.95 | 1.00 |
| Composition (% by mass) | Visible light-absorbing coloring agent | Bk-1 | 30.00 | 30.00 |
| | Visible light-absorbing coloring agent | Bk-2 | 15.00 | — |

(Twentieth Table)

| | Twentieth Table | | Example 35 | Example 36 |
|---|---|---|---|---|
| | Infrared ray-absorbing coloring agent | IR-1 | 3.00 | — |
| | Infrared ray-absorbing coloring agent | Cyanine pigment | — | 1.00 |
| | Infrared ray-absorbing coloring agent | Pyrrolopyrrole pigment | — | 1.00 |
| | Dispersing resin (dispersant) | Dispersing resin 2 | 18.00 | 12.00 |
| | Alkali-soluble resin | Alkali-soluble resin 1 | 6.40 | 19.00 |
| | Polymerizable compound | M-1 | 21.50 | 28.00 |
| | Photopolymerization initiator | Oxime-based polymerization initiator 1 | 6.00 | 8.91 |
| | Surfactant | Surfactant 1 | 0.10 | 0.09 |
| Content ratio of respective components (mass ratio) | Visible light-absorbing coloring agent/infrared ray-absorbing coloring agent | | 15.00 | 15.00 |
| | Dispersing resin/visible light-absorbing coloring agent | | 0.40 | 0.40 |
| | Polymerizable compound/dispersing resin | | 1.19 | 2.33 |
| | Photopolymerization initiator/dispersing resin | | 0.33 | 0.74 |
| | Alkali-soluble resin/dispersing resin | | 0.36 | 1.58 |
| Evaluation | Linearity of pattern | | A | A |

It was confirmed that all of the cured films formed from the curable compositions of Examples had excellent linearity of a pattern.

In comparison of Examples 1 to 12 with Examples 13 and 14, it was confirmed that the pattern linearity was more excellent by setting the content of the photopolymerization initiator with respect to the acrylic or methacrylic resin having an adsorptive group to 0.1 to 2 in terms of a mass ratio. It is presumed that in a case where the amount of the photopolymerization initiator was less than 0.1 in terms of a mass ratio with respect to the acrylic or methacrylic resin having an adsorptive group as in the curable composition of Example 13, curing in the exposed area becomes insufficient due to lack of the amount of the radicals, a part of the film is dissolved in the development, and thus, the pattern linearity decreases.

On the other hand, it is presumed that by setting the amount of the photopolymerization initiator to more than 2 in terms of a mass ratio with respect to the acrylic or methacrylic resin having an adsorptive group as in the curable composition of Example 14, dissolution in the developer is not performed since even the unexposed area is cured, and thus, the pattern linearity decreases.

In comparison of Examples 1 to 12 with Example 15, it was confirmed that by setting the content of the alkali-soluble resin with respect to the acrylic or methacrylic resin having an adsorptive group to 5 or less in terms of a mass ratio, the pattern linearity became more excellent. It is thought that in a case where the amount of the alkali-soluble resin is more than 5 in terms of a mass ratio with respect to the acrylic or methacrylic resin having an adsorptive group as in the curable composition of Example 15, the interaction of the alkali-soluble resin with the pigment and the acrylic or methacrylic resin is inhibited by the alkali-soluble resin, aggregations among the pigments occurs, and thus, the pattern linearity decreases.

In comparison of Examples 1 to 12 with Examples 15-A and 15-B, it was confirmed that by setting the content of the polymerizable compound with respect to the acrylic or methacrylic resin having an adsorptive group to 0.5 to 7 in terms of a mass ratio, the pattern linearity became more excellent.

In addition, in comparison of Examples 23 and 24 with Examples 25 and 26, it was confirmed that by using an oxime-based polymerization initiator, the pattern linearity became more excellent.

On the other hand, all of the cured films formed from the curable compositions of Comparative Examples did not satisfy desired requirements for the linearity of a pattern.

What is claimed is:

1. A curable composition comprising:
a visible light-absorbing coloring agent;
an infrared ray-absorbing coloring agent;
a polymerizable compound; and
a photopolymerization initiator,
wherein a minimum value in optical densities per 1 μm of a film thickness in a wavelength range of 380 to 1,100 nm of a coating film of the curable composition is 1 or more, and
the Δ optical density calculated by Formula (1) is 1 or less, $$\Delta \text{ Optical density} = |OD1-OD2| \quad \text{Formula (1)}$$

in Formula (1), OD1 represents a minimum value in optical densities per 1 μm of a film thickness in a wavelength range from 380 nm to 780 nm of the coating film, and OD2 represents a minimum value in optical densities per 1 μm of a film thickness in a wavelength range of more than 780 nm and 1,100 nm or less of the coating film.

2. The curable composition according to claim 1, wherein the average value of OD1 and OD2 is from 1 to 4.

3. The curable composition according to claim 2, wherein the infrared ray-absorbing coloring agent includes at least one selected from a pyrrolopyrrole-based compound, a phthalocyanine-based compound, a naphthalocyanine-based compound, a squarylium-based compound, a cyanine-based compound, a diimmonium-based compound, and a tungsten oxide-based compound.

4. The curable composition according to claim 2, wherein the visible light-absorbing coloring agent includes at least one selected from titanium oxynitride, titanium nitride, carbon black, perylene black, Irgaphor Black, a red color-based organic pigment, a blue color-based organic pigment, a yellow color-based organic pigment, and a purple color-based organic pigment.

5. The curable composition according to claim 1, wherein the infrared ray-absorbing coloring agent includes at least one selected from a pyrrolopyrrole-based compound, a phthalocyanine-based compound, a naphthalocyanine-based compound, a squarylium-based compound, a cyanine-based compound, a diimmonium-based compound, and a tungsten oxide-based compound.

6. The curable composition according to claim 5, wherein the visible light-absorbing coloring agent includes at least one selected from titanium oxynitride, titanium nitride, carbon black, perylene black, Irgaphor Black, a red color-based organic pigment, a blue color-based organic pigment, a yellow color-based organic pigment, and a purple color-based organic pigment.

7. The curable composition according to claim 1, wherein the visible light-absorbing coloring agent includes at least one selected from titanium oxynitride, titanium nitride, carbon black, perylene black, Irgaphor Black, a red color-based organic pigment, a blue color-based organic pigment, a yellow color-based organic pigment, and a purple color-based organic pigment.

8. The curable composition according to claim 1, further comprising an acrylic or methacrylic resin having an adsorptive group.

9. The curable composition according to claim 1, further comprising an alkali-soluble resin.

10. The curable composition according to claim 1, used for manufacturing a color filter.

11. A light-shielding film formed by curing the curable composition according to claim 1.

12. A color filter formed by curing the curable composition according to claim 1.

13. A solid-state imaging device comprising the color filter according to claim 12.

14. An infrared sensor comprising the color filter according to claim 12.

15. A pattern forming method comprising:
a coating film forming step of forming a coating film on a substrate, using the curable composition according to claim 1;
an exposing step of patternwise exposing the coating film; and
a developing step of removing an unexposed area by development to form a cured film in a pattern shape,
wherein a heating step is further provided after the exposing step or a heating treatment is further performed during the exposing step.

16. A method for manufacturing a color filter, comprising the pattern forming method according to claim 15.

* * * * *